US011950495B2

(12) United States Patent
Ko et al.

(10) Patent No.: US 11,950,495 B2
(45) Date of Patent: Apr. 2, 2024

(54) ORGANIC LIGHT-EMITTING DEVICE AND ORGANOMETALLIC COMPOUND

(71) Applicant: Samsung Display Co., Ltd., Yongin-si (KR)

(72) Inventors: Soobyung Ko, Yongin-si (KR); Mina Jeon, Yongin-si (KR); Sungbum Kim, Yongin-si (KR); Sujin Shin, Yongin-si (KR); Eunsoo Ahn, Yongin-si (KR); Eunyoung Lee, Yongin-si (KR); Jaesung Lee, Yongin-si (KR); Jihyung Lee, Yongin-si (KR); Hyunjung Lee, Yongin-si (KR); Junghoon Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 379 days.

(21) Appl. No.: 16/889,067

(22) Filed: Jun. 1, 2020

(65) Prior Publication Data

US 2020/0395557 A1 Dec. 17, 2020

(30) Foreign Application Priority Data

Jun. 14, 2019 (KR) ........................ 10-2019-0071060

(51) Int. Cl.

| | |
|---|---|
| ***C07F 15/00*** | (2006.01) |
| ***C09K 11/06*** | (2006.01) |
| ***H01L 51/50*** | (2006.01) |
| ***H10K 85/30*** | (2023.01) |
| *H10K 50/11* | (2023.01) |
| *H10K 50/12* | (2023.01) |
| *H10K 101/00* | (2023.01) |
| *H10K 101/10* | (2023.01) |

(52) U.S. Cl.

CPC ....... *H10K 85/346* (2023.02); *C07F 15/0086* (2013.01); *C09K 11/06* (2013.01); *C07B 2200/05* (2013.01); *C09K 2211/1044* (2013.01); *C09K 2211/1059* (2013.01); *C09K 2211/185* (2013.01); *H10K 50/11* (2023.02); *H10K 50/121* (2023.02); *H10K 2101/10* (2023.02); *H10K 2101/90* (2023.02)

(58) Field of Classification Search

CPC .. C07F 15/0086; H01L 51/50; H01L 51/0087; H10K 50/00

USPC ............ 546/10; 544/225; 548/101; 313/498, 313/504

See application file for complete search history.

(56) References Cited

U.S. PATENT DOCUMENTS

| | | | |
|---|---|---|---|
| 7,381,479 | B2 | 6/2008 | Lamansky et al. |
| 7,393,599 | B2 | 7/2008 | Thompson et al. |
| 7,585,573 | B2 | 9/2009 | Lee et al. |
| 7,776,458 | B2 | 8/2010 | Ragini et al. |
| 8,106,199 | B2 | 1/2012 | Jabbour et al. |
| 8,389,725 | B2 | 3/2013 | Li et al. |
| 8,669,364 | B2 | 3/2014 | Li et al. |
| 8,680,760 | B2 | 3/2014 | Cheng et al. |
| 8,816,080 | B2 | 8/2014 | Li et al. |
| 8,846,940 | B2 | 9/2014 | Li et al. |
| 8,946,417 | B2 | 2/2015 | Jian et al. |
| 9,051,344 | B2 | 6/2015 | Lin et al. |
| 9,076,974 | B2 | 7/2015 | Li et al. |
| 9,142,791 | B2 | 9/2015 | Adamovich et al. |
| 9,203,039 | B2 | 12/2015 | Li et al. |
| 9,221,857 | B2 | 12/2015 | Li et al. |
| 9,224,963 | B2 | 12/2015 | Li et al. |
| 9,238,668 | B2 | 1/2016 | Li et al. |
| 9,312,502 | B2 | 4/2016 | Li et al. |
| 9,324,957 | B2 | 4/2016 | Li et al. |
| 9,382,273 | B2 | 7/2016 | Li et al. |
| 9,425,415 | B2 | 8/2016 | Li et al. |
| 9,543,532 | B2 | 1/2017 | Kwong |

(Continued)

FOREIGN PATENT DOCUMENTS

| | | |
|---|---|---|
| CN | 104370974 A | 2/2015 |
| JP | 2007-45742 A | 2/2007 |

(Continued)

OTHER PUBLICATIONS

Luo, Y. et al.: Strategy used for controlling the photostability of tridentate Pt (II) complex to enhance the device lifetimes of blue phosphorescent organic light-emitting diodes : The role of the Pt-C(NHC) bond and auxillary ligand. Journal of Physical Chemistry C, vol. 122, pp. 16872-16878, 2018.*

*Primary Examiner* — Charanjit Aulakh

(74) *Attorney, Agent, or Firm* — Lewis Roca Rothgerber Christie LLP

(57) ABSTRACT

Provided are an organometallic compound represented by Formula 1 and an organic light-emitting device including a first compound represented by Formula 1. The organic light-emitting device includes: a first electrode; a second electrode facing the first electrode; and an organic layer between the first electrode and the second electrode and including an emission layer, wherein the organic layer includes the first compound represented by Formula 1:

Formula 1

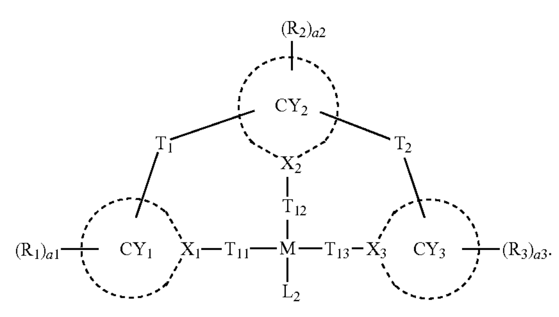

16 Claims, 8 Drawing Sheets

(56) References Cited

U.S. PATENT DOCUMENTS

| | | | |
|---|---|---|---|
| 2005/0287394 | A1 | 12/2005 | Yang et al. |
| 2008/0018221 | A1 | 1/2008 | Egen et al. |
| 2011/0301351 | A1 | 12/2011 | Li et al. |
| 2012/0121936 | A1 | 5/2012 | Baek et al. |
| 2014/0309428 | A1 | 10/2014 | Egen et al. |
| 2019/0109287 | A1 | 4/2019 | Wu et al. |

FOREIGN PATENT DOCUMENTS

| | | | |
|---|---|---|---|
| KR | 10-0730115 | B1 | 6/2007 |
| KR | 10-2014-0033091 | A | 3/2014 |
| KR | 10-2016-0045508 | A | 4/2016 |
| WO | WO 2012/121936 | A2 | 9/2012 |

* cited by examiner

ORGANIC LIGHT-EMITTING DEVICE AND ORGANOMETALLIC COMPOUND

CROSS-REFERENCE TO RELATED APPLICATION

This application claims priority to and the benefit of Korean Patent Application No. 10-2019-0071060, filed on Jun. 14, 2019, in the Korean Intellectual Property Office, the entire content of which is incorporated herein by reference.

BACKGROUND

1. Field

One or more embodiments relate to an organic light-emitting device and an organometallic compound.

2. Description of the Related Art

Organic light-emitting devices are self-emission devices that have wide viewing angles, high contrast ratios, short response times, and excellent characteristics in terms of brightness, driving voltage, and response speed, as compared to other devices in the art.

An example of such organic light-emitting devices may include a first electrode on a substrate, and a hole transport region, an emission layer, an electron transport region, and a second electrode, which are sequentially on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transit (e.g., transition or relax) from an excited state to a ground state, thereby generating light.

SUMMARY

One or more embodiments include an organic light-emitting device having high luminescence efficiency and a long lifespan, and an organometallic compound.

Additional aspects of embodiments will be set forth in part in the description which follows and, in part, will be apparent from the description, or may be learned by practice of the presented embodiments.

An aspect of an embodiment of the present disclosure provides an organic light-emitting device including:

a first electrode;

a second electrode facing the first electrode; and an organic layer between the first electrode and the second electrode and including an emission layer, wherein the organic layer includes a first compound represented by Formula 1:

Formula 1

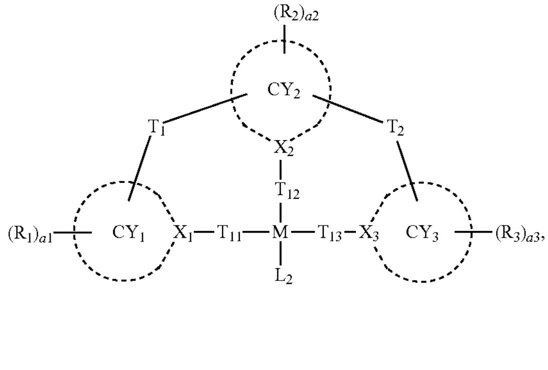

wherein, in Formula 1,

M may be a transition metal, but may not be iridium, and $L_2$ may be a monodentate ligand represented by Formula 2-1 or 2-2, but may be none of —F, —Cl, —Br, and —I:

2-1

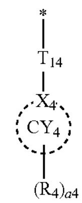

2-2

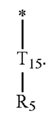

In Formulae 1, 2-1, and 2-2, $X_1$ to $X_4$ may each independently be N or C, wherein at least one of $X_1$ to $X_3$ may be a carbon atom (C) of a carbene moiety, $T_{11}$ to $T_{14}$ may each independently be a chemical bond, *—O—*', *—S—*', *—B(R')—*', *—N(R')—*', *—P(R')—*', *—C(R')(R")—*', *—Si(R')(R")—*', *—Ge(R')(R")—*', *—C(═O)—*', or *—C(═S)—*', $T_{15}$ may be a chemical bond, *—O—*', *—S—*', *—B(R')—*', *—N(R')—*', *—P(R')—*', *—C(R')(R")—*', *—Si(R')(R")—*', *—Ge(R')(R")—*', *—C(═O)—*', *—C(═S)—*', *—O—C(═O)—*', *—S—C(═O)—*', *—O—C(═S)—*', *—S—C(═S)—*', *—C(R')═C(R")—*', *—C≡C—*', *—C≡C—C(═O)—*', or *—C≡C—C(═S)—*', when $T_{11}$ is a chemical bond, $X_1$ and M may be directly linked to each other, when $T_{12}$ is a chemical bond, $X_2$ and M may be directly linked to each other, when $T_{13}$ is a chemical bond, $X_3$ and M may be directly linked to each other, and when $T_{14}$ or $T_{15}$ is a chemical bond, $X_4$ or $R_5$ and M may be directly linked to each other, two bonds selected from i) a bond between $X_1$ or $T_{11}$ and M, ii) a bond between $X_2$ or $T_{12}$ and M, iii) a bond between $X_3$ or $T_{13}$ and M, and iv) a bond between $X_4$, $T_{14}$, $R_5$, or $T_{15}$ and M may each be a coordinate bond, and the other two bonds may each be a covalent bond, $T_1$ may be a single bond, a double bond, *—N($R_6$)—*', *—B($R_6$)*', *—P($R_6$)—*', *—C($R_{6a}$)($R_{6b}$)—*', *—Si($R_{6a}$)($R_{6b}$)—*', *—Ge($R_{6a}$)($R_{6b}$)—*', *—S—*', *—Se—*', *—O—*', *—C(═O)—*', *—S(═O)—*', *—S(═O)$_2$*', *—C($R_6$)═*', *═C($R_6$)—*', *—C($R_{6a}$)═C($R_{6b}$)—*', *—C(═S)*', or *—C≡C—*', $T_2$ may be a single bond, a double bond, *—N($R_7$)—*', *—B($R_7$)—*', *—P($R_7$)—*', *—C($R_{7a}$)($R_{7b}$)—*', *—Si($R_{7a}$)($R_{7b}$)—*', *—Ge($R_{7a}$)($R_{7b}$)—*', *—S—*', *—Se—*', *—O—*', *—C(═O)—*', *—S(═O)—*', *—S(═O)$_2$*', *—C($R_7$)═*', *═C($R_7$)—*', *—C($R_{7a}$)═C($R_{7b}$)—*', *—C(═S)*' or *—C≡C*', ring $CY_1$ to ring $CY_4$ may each independently be a $C_5$-$C_{30}$ carbocyclic group or a $C_1$-$C_{30}$ heterocyclic group, $R_1$ to $R_4$, $R_6$, $R_{6a}$, $R_{6b}$, $R_7$, $R_{7a}$, $R_{7b}$, R', and R" may each independently be hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), $R_5$ may be hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), wherein, when $T_{15}$ in Formula 2-2 is a chemical bond, $R_5$ may be none of —F, —Cl, —Br, and —I, a1 to a4 may each independently be an integer from 0 to 20, two or more of the $R_1$(s) (e.g., $R_1$(s) in the number of a1) may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of the $R_2$(s) (e.g., $R_2$(s) in the number of a2) may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of the $R_3$(s) (e.g., $R_3$(s) in the number of a3) may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of the $R_4$(s) (e.g., $R_4$(s) in the number of a4) may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ may be the same as defined in connection with $R_1$, and $R_{10a}$ is not hydrogen, and *' each indicate a binding site to a neighboring atom, a substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, and the substituted monovalent non-aromatic condensed heteropolycyclic group may be:

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —O($Q_{11}$), —S($Q_{11}$), —Si($Q_{11}$)($Q_{12}$)($Q_{13}$), —N($Q_{11}$)($Q_{12}$), —B($Q_{11}$)($Q_{12}$), —P($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, or a monovalent non-aromatic condensed heteropolycyclic group, each unsubstituted or substituted with deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —O($Q_{21}$), —S($Q_{21}$), —Si($Q_{21}$)($Q_{22}$)($Q_{23}$), —N($Q_{21}$)($Q_{22}$), —B($Q_{21}$)($Q_{22}$), —P($Q_{21}$)($Q_{22}$), —C(=O)($Q_{21}$), —S(=O)$_2$($Q_{21}$), —P(=O)($Q_{21}$)($Q_{22}$), or any combination thereof;

—O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)$_2$($Q_{31}$), or —P(=O)($Q_{31}$)($Q_{32}$); or any combination thereof, and $Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —C;

—Br; —I; a hydroxyl group; a cyano group; a nitro group; an amidino group; a hydrazine group; a hydrazone group; a $C_1$-$C_{60}$ alkyl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; $C_2$-$C_{60}$ alkenyl group; $C_2$-$C_{60}$ alkynyl group; $C_1$-$C_{60}$ alkoxy group; $C_3$-$C_{10}$ cycloalkyl group; $C_1$-$C_{10}$ heterocycloalkyl group; $C_3$-$C_{10}$ cycloalkenyl group; $C_1$-$C_{10}$ heterocycloalkenyl group; $C_6$-$C_{60}$ aryl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; $C_6$-$C_{60}$ aryloxy group; $C_6$-$C_{60}$ arylthio group; $C_1$-$C_{60}$ heteroaryl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; a monovalent non-aromatic condensed polycyclic group; or a monovalent non-aromatic condensed heteropolycyclic group.

Another aspect of an embodiment of the present disclosure provides an organometallic compound represented by Formula 1.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
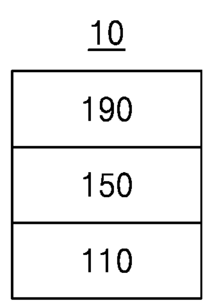
FIG. 1 is a schematic cross-sectional view of an organic light-emitting device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Expressions such as "at least one of," when preceding a list of elements, modify the entire list of elements and do not modify the individual elements of the list.

An aspect of an embodiment of the present disclosure provides an organic light-emitting device including: a first electrode; a second electrode facing the first electrode; and an organic layer between the first electrode and the second electrode and including an emission layer, wherein the organic layer includes a first compound represented by Formula 1 below:

Formula 1

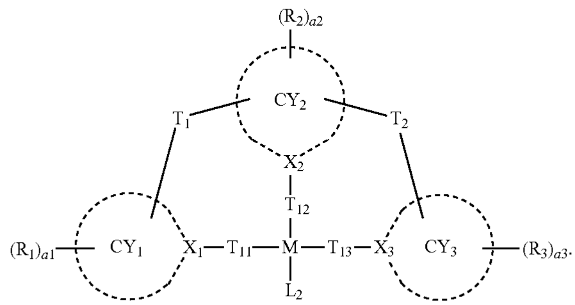

Formula 1 may be the same as described herein above.

The organic layer may further include, in addition to the first compound represented by Formula 1, a second compound represented by Formula 2, a third compound including a group represented by Formula 3, or any combination thereof:

Formula 2

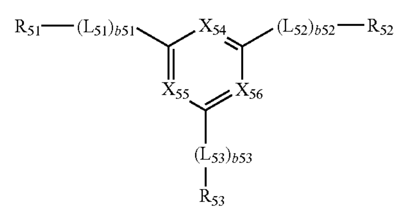

Formula 3

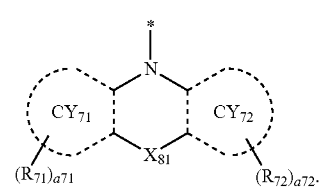

Formulae 2 and 3 may each independently be the same as described herein above.

The second compound and the third compound may be different from each other.

In one embodiment, the organic layer may include the second compound and the third compound.

In one or more embodiments, the organic layer may include the first compound, the second compound, and the third compound, and the first compound, the second compound, and the third compound may be all included in the emission layer.

M in Formula 1 may be a transition metal, but may not be iridium.

For example, M may be titanium (Ti), cobalt (Co), copper (Cu), ruthenium (Ru), rhodium (Rh), palladium (Pd), platinum (Pt), gold (Au), osmium (Os), or rhenium (Re).

In one embodiment, M in Formula 1 may be Pt, Pd, or Au.

$L_2$ in Formula 1 may be a monodentate ligand represented by Formula 2-1 or 2-2, but may be none of —F, —Cl, —Br, and —I:

2-1

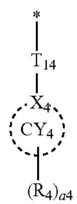

2-2

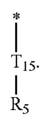

Formulae 2-1 and 2-2 may each independently be the same as described herein.

$X_1$ to $X_4$ in Formulae 1 and 2-1 may each independently be N or C, wherein at least one of $X_1$ to $X_3$ may be a carbon atom (C) of a carbene moiety.

For example, $X_1$ and $X_3$ in Formula 1 may each be a carbon atom (C) of a carbene moiety.

$T_{11}$ to $T_{14}$ in Formulae 1 and 2-1 may each independently be a chemical bond (for example, a single bond), *—O—*', *—S—*', *—B(R')—*', *—N(R')—*', *—P(R')—*', *—C(R')(R'')—*', *—Si(R')(R'')—*', *—Ge(R')(R'')—*', *—C(=O)—*', or *—C(=S)—*', and $T_{15}$ in Formula 2-2 may be a chemical bond (for example, a single bond), *—O—*', *—S—*', *—B(R')*', *—N(R')—*', *—P(R')—*', *—C(R')(R'')—*', *—Si(R')(R'')—*', *—Ge(R')(R'')—*', *—C(=O)—*', *—C(=S)—*', *—O—C(=O)—*', *—S—C(=O)—*', *—O—C(=S)—*', *—S—C(=S)—*', *—C(R')=C(R'')—*', *—C≡C—*', *—C≡C—, C(=O)—*', or *—C≡C—C(=S)—*'.

In Formulae 1, 2-1, and 2-2, when $T_{11}$ is a chemical bond (e.g., a single bond), $X_1$ and M may be directly linked to each other, when $T_{12}$ is a chemical bond (e.g., a single bond), $X_2$ and M may be directly linked to each other, when $T_{13}$ is a chemical bond (e.g., a single bond), $X_3$ and M may be directly linked to each other, and when $T_{14}$ or $T_{15}$ is a chemical bond (e.g., a single bond), $X_4$ or $R_5$, respectively, and M may be directly linked to each other.

For example, in Formulae 1, 2-1, and 2-2, $T_{11}$ to $T_{13}$ may each independently be a chemical bond (e.g., a single bond), and $T_{14}$ and $T_{15}$ may be a chemical bond (e.g., a single bond), O, or S, but embodiments of the present disclosure are not limited thereto.

In Formulae 1, 2-1, and 2-2, two bonds selected from i) a bond between $X_1$ or $T_{11}$ and M, ii) a bond between $X_2$ or $T_{12}$ and M, iii) a bond between $X_3$ or $T_{13}$ and M, and iv) a bond between $X_4$, $T_{14}$, $R_5$, or $T_{15}$ and M may each be a coordinate bond (which may also be referred to as a coordinate covalent bond or a dative bond), and the other two bonds may each be covalent bond. Therefore, the first compound represented by Formula 1 may be electrically neutral (e.g., the first compound represented by Formula 1 may have no or substantially no electric charge).

In one embodiment, in Formula 1, $T_{11}$ to $T_{13}$ may each be a chemical bond (e.g., a single bond), a bond between $X_1$ and M and a bond between $X_3$ and M may each be a coordinate bond (which may also be referred to as a coordinate covalent bond or a dative bond), a bond between $X_2$ and M may be a covalent bond, and a bond between $X_4$, $T_{14}$, $R_5$, or $T_{15}$ and M may be a covalent bond, but embodiments of the present disclosure are not limited thereto.

In Formula 1, $T_1$ may be a single bond, a double bond, *—N($R_6$)—*', *—B($R_6$)—*', *—P($R_6$)—*', *—C($R_{6a}$)($R_{6b}$)—*', *—Si($R_{6a}$)($R_{6b}$)—*', *—Ge($R_{6a}$)($R_{6b}$)*', *—S—*', *—Se—*', *—O—*', *—C(=O)—*' *—S(=O)—*', *—S(=O)$_2$—*', *—C($R_6$)=*', *=C($R_6$)—*', *—C($R_{6a}$)=C($R_{6b}$)*', *—C(=S)—*', or *—C≡C—*', and $T_2$ may be a single bond, a double bond, *—N($R_7$)—*', *—B($R_7$)—*', *—P($R_7$)*', *—C($R_{7a}$)($R_{7b}$)—*', *—Si($R_{7a}$)($R_{7b}$)—*', *—Ge($R_{7a}$)($R_{7b}$)*', *—S—*', *—Se—*', *—O—*', *—C(=O)*', *—S(=O)—*', *—S(=O)$_2$*', *—C($R_7$)=*', *=C($R_7$)—*', *—C($R_{7a}$)=C($R_{7b}$)*', *—C(=S)—*' or *—C≡C*'.

For example, $T_1$ and $T_2$ in Formula 1 may be a single bond.

In Formulae 1, 2-1, and 3, ring $CY_1$ to ring $CY_4$, ring $CY_{71}$, and ring $CY_{72}$ may each independently be a $C_5$-$C_{30}$ carbocyclic group or a $C_1$-$C_{30}$ heterocyclic group.

In one embodiment, in Formulae 1, 2-1, and 3, ring $CY_1$ to ring $CY_4$, ring $CY_{71}$, and ring $CY_{72}$ may each independently be i) a first ring, ii) a second ring, iii) a condensed ring in which two or more first rings are condensed with each other (e.g., combined together), iv) a condensed ring in which two or more second rings are condensed with each other (e.g., combined together), or v) a condensed ring in which one or more first rings are condensed (e.g., combined together) with one or more second rings.

The first ring may be a cyclopentane group, a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group.

The second ring may be an adamantane group, a norbornane group, a norbornene group, a cyclohexane group, a cyclohexene group, a benzene group, a pyridine group, a pyrimidine group, a pyrazine group, a pyridazine group, a triazine group, an oxasiline group, a thiasiline group, a dihydroazasiline group, a dihydrodisiline group, a dihydrosiline group, a dioxine group, an oxathiine group, an oxazine group, a pyran group, a dithiine group, a thiazine group, a thiopyran group, a cyclohexadiene group, a dihydropyridine group, or a dihydropyrazine group.

In one or more embodiments, in Formula 1, ring $CY_1$ and ring $CY_3$ may each independently be i) a first ring, iii) a condensed ring in which two or more first rings are condensed with each other (e.g., combined together), or v) a condensed ring in which one or more first rings are condensed (e.g., combined together) with one or more second rings, and ring $CY_2$ may be ii) a second ring, iv) a condensed ring in which two or more second rings are condensed with each other (e.g., combined together), or v) a condensed ring in which one or more first rings are condensed (e.g., combined together) with one or more second rings.

In one or more embodiments, in Formulae 1, 2-1, and 3, ring $CY_1$ to ring $CY_4$, ring $CY_{71}$, and ring $CY_{72}$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzoboracyclohexadiene group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a phenothiazine 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In one or more embodiments, in Formulae 1 and 2-1, ring $CY_1$ and ring $CY_3$ may each independently be an imidazole group, a triazole group, an oxazole group, an isoxazole group, a thiazole group, an isothiazole group, an oxadiazole group, a thiadiazole group, a benzimidazole group, a benzoxazole group, a benzothiazole group, a benzoxadiazole group, a benzothiadiazole group, an azabenzimidazole group, an azabenzoxazole group, an azabenzothiazole group, an azabenzoxadiazole group, or an azabenzothiadiazole group, ring $CY_2$ may be a benzene group, a naphthalene group, an anthracene group, a phenanthrene group, a triphenylene group, a pyrene group, a chrysene group, a 1,2,3,4-tetrahydronaphthalene group, a pyridine group, a pyrimidine group, a pyrazine group, a pyridazine group, a triazine group, a quinoline group, an isoquinoline group, a quinoxaline group, a quinazoline group, a phenanthroline group, a 5,6,7,8-tetrahydroisoquinoline group, or a 5,6,7,8-tetrahydroquinoline group, and ring $CY_4$ may be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzoboracyclohexadiene group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a phenothiazine 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

In Formula 2, $L_{51}$ to $L_{53}$ may each independently be a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$.

For example, in Formula 2, $L_{51}$ to $L_{53}$ may each independently be a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenyl fluorenyl group, a carbazolyl group, a phenylcarbazolyl group, a dibenzofuranyl group, a dibenzothiophenyl group (or, a dibenzothienyl group), a dibenzosilolyl group, a dimethyl dibenzosilolyl group, a diphenyl dibenzosilolyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In one embodiment, in Formula 2, a bond between $L_{51}$ and $R_{51}$, a bond between $L_{52}$ and $R_{52}$, a bond between $L_{53}$ and $R_{53}$, a bond between two or more $L_{51}$(s), a bond between two or more $L_{52}$(s), a bond between two or more $L_{53}$(s), a bond between $L_{51}$ and carbon between $X_{54}$ and $X_{55}$ in Formula 2, a bond between $L_{52}$ and carbon between $X_{54}$ and $X_{56}$ in Formula 2, and a bond between $L_{53}$ and carbon between $X_{55}$ and $X_{56}$ in Formula 2 may each be a "carbon-carbon single bond," but embodiments of the present disclosure are not limited thereto.

In Formula 2, b51 to b53 each indicate the number of $L_{51}$(s) to $L_{53}$(s), and may each independently be an integer from 0 to 5, wherein, when b51 is 0, $*\text{-}(L_{51})_{b51}\text{-}*'$ may be a single bond, when b52 is 0, $*\text{-}(L_{52})_{b52}\text{-}*'$ may be a single bond, when b53 is 0, $*\text{-}(L_{53})_{b53}\text{-}*'$ may be a single bond, when b51 is 2 or more, two or more $L_{51}$(s) may be identical to or different from each other, when b52 is 2 or more, two or more $L_{52}$(s) may be identical to or different from each other, and when b53 is 2 or more, two or more $L_{53}$(s) may be identical to or different from each other. For example, b51 to b53 may each independently be 0, 1, or 2.

In Formula 2, $X_{54}$ may be N or C($R_{54}$), $X_{55}$ may be N or C($R_{55}$), $X_{56}$ may be N or C($R_{56}$), and at least one of $X_{54}$ to $X_{56}$ may be N. $R_{54}$ to $R_{56}$ may each independently be the same as described herein above. For example, two or three of $X_{54}$ to $X_{56}$ may each independently be N.

In Formula 3, $X_{81}$ may be a single bond, O, S, N($R_{81}$), B($R_{81}$), C($R_{81a}$)($R_{81b}$), or Si($R_{81a}$)($R_{81b}$). $R_{81}$, $R_{81a}$, and $R_{81b}$ may each independently be the same as described herein above.

$R_1$ to $R_4$, $R_6$, $R_{6a}$, $R_{6b}$, $R_7$, $R_{7a}$, $R_{7b}$, R', R", $R_{51}$ to $R_{56}$, $R_{71}$, $R_{72}$, $R_{81}$, $R_{81a}$, and $R_{81b}$ may each independently be hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), wherein $Q_1$ to $Q_3$ may be understood by referring to corresponding description provided herein.

$R_{10a}$ may be the same as defined in connection with $R_1$, and $R_{10a}$ is not hydrogen.

For example, $R_1$ to $R_4$, R, $R_{6a}$, $R_{6b}$, $R_7$, $R_{7a}$, $R_{7b}$, R', R", $R_{51}$ to $R_{56}$, $R_{71}$, $R_{72}$, $R_{81}$, $R_{81a}$, and $R_{81b}$ may each independently be:

hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a $C_1$-$C_{10}$ alkyl group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group (or, a thienyl group), a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group (or, a benzothienyl group), an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)$_2$($Q_{31}$), —P(=O)($Q_{31}$)($Q_{32}$), or any combination thereof; or —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), and $Q_1$ to $Q_3$ and $Q_{31}$ to $Q_{33}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof, but embodiments of the present disclosure are not limited thereto:

Formula 91

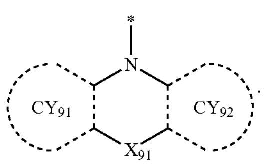

In Formula 91, ring $CY_{91}$ and ring $CY_{92}$ may each independently be a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $X_{91}$ may be a single bond, O, S, N($R_{91}$), B($R_1$), C($R_{91a}$)($R_{91b}$), or Si($R_{91a}$)($R_{91b}$), $R_{91}$, $R_{91a}$, and $R_{91b}$ may each independently be the same as defined in connection with $R_{81}$, $R_{81a}$, and $R_{1b}$, $R_{10a}$ may be the same as defined in connection with $R_1$, and $R_{10a}$ is not hydrogen, and indicates a binding site to a neighboring atom.

For example, in Formula 91, ring $CY_{91}$ and ring $CY_{92}$ may each independently be a benzene group, a pyridine group, a pyrimidine group, a pyrazine group, a pyridazine group, or a triazine group, each unsubstituted or substituted with at least one $R_{10a}$, $R_{91}$, $R_{91a}$, and $R_{91b}$ may each independently be:

hydrogen or a $C_1$-$C_{10}$ alkyl group; or a phenyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof, but embodiments of the present disclosure are not limited thereto.

In Formula 2-2, $R_5$ may be hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), wherein, when $T_{15}$ in Formula 2-2 is a chemical bond (e.g., a single bond), $R_5$ may be none of —F, —Cl, —Br, and —I.

For example, $R_5$ may be:

deuterium, —F, —Cl, —Br, —I, a hydroxyl group, a cyano group, a nitro group, an amidino group, a hydrazine group, a hydrazone group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a $C_1$-$C_{10}$ alkyl group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof; or —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), and $Q_1$ to $Q_3$ are the same as described herein above.

In one or more embodiments, $R_1$ to $R_4$, $R_6$, $R_{6a}$, $R_{6b}$, $R_7$, $R_{7a}$, $R_{7b}$, R', R", $R_{51}$ to $R_{56}$, $R_{71}$, $R_{72}$, $R_{81}$, $R_{81a}$, and $R_{81b}$ may each independently be hydrogen, deuterium, —F, a cyano group, a nitro group, —$CH_3$, —$CD_3$, —$CD_2H$, —$CDH_2$, —$CF_3$, —$CF_2H$, —$CFH_2$, a group represented by one of Formulae 9-1 to 9-19, a group represented by one of Formulae 10-1 to 10-243, —C($Q_1$)($Q_2$)($Q_3$), —Si($Q_1$)($Q_2$)($Q_3$), or —P(=O)($Q_1$)($Q_2$), and $R_5$ may be deuterium, —F, a cyano group, a nitro group, —$CH_3$, —$CD_3$, —$CD_2H$, —$CDH_2$, —$CF_3$, —$CF_2H$, —$CFH_2$, a group represented by one of Formulae 9-1 to 9-19, —C($Q_1$)($Q_2$)($Q_3$), —Si($Q_1$)($Q_2$)($Q_3$), or —P(=O)($Q_1$)($Q_2$) (wherein $Q_1$ to $Q_3$ are the same as described herein above), but embodiments of the present disclosure are not limited thereto:

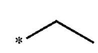

9-1

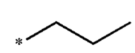

9-2

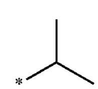

9-3

-continued
9-4
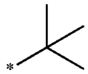
9-5
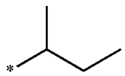
9-6
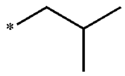
9-7
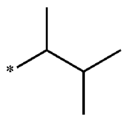
9-8
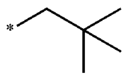
9-9
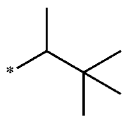
9-10
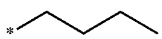
9-11
9-12
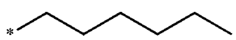
9-13
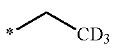
9-14
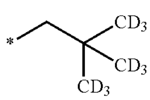
9-15
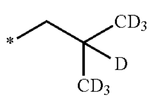
9-16
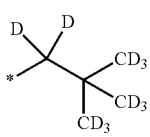
9-17
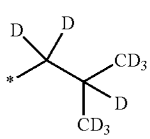
9-18
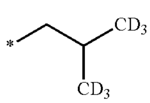
9-19
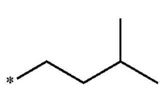
10-1
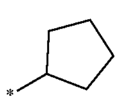
-continued
10-2
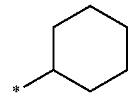
10-3
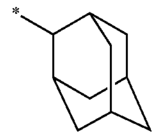
10-4
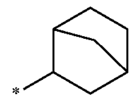
10-5
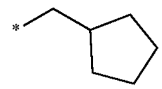
10-6
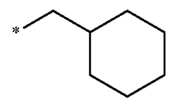
10-7
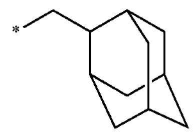
10-8
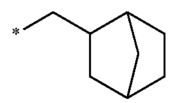
10-9
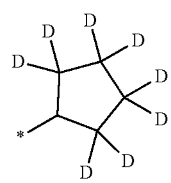
10-10
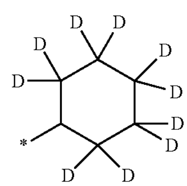
10-11
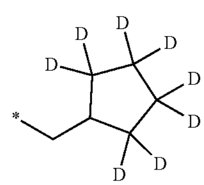
10-12
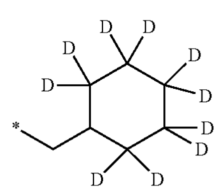

-continued
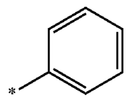
10-13
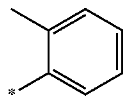
10-14
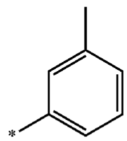
10-15
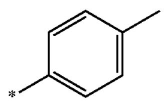
10-16
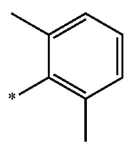
10-17
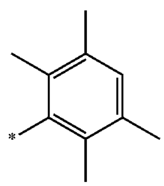
10-18
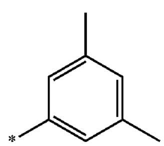
10-19
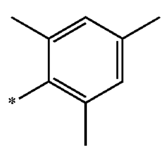
10-20
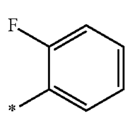
10-21
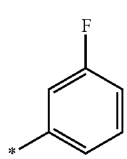
10-22
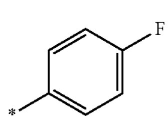
10-23
-continued
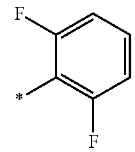
10-24
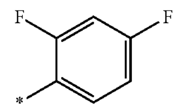
10-25
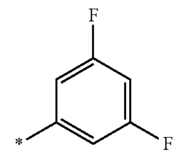
10-26
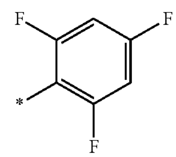
10-27
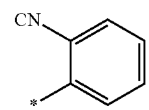
10-28
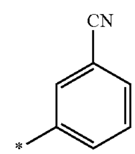
10-29
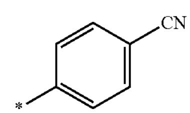
10-30
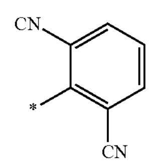
10-31
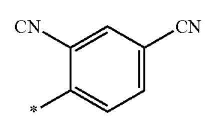
10-32
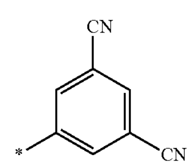
10-33
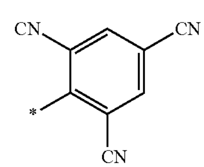
10-34

-continued
10-35
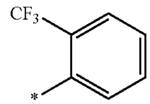
10-36
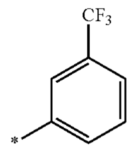
10-37
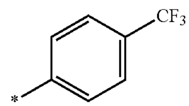
10-38
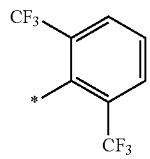
10-39
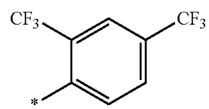
10-40
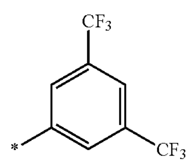
10-41
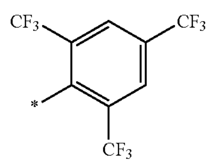
10-42
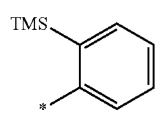
10-43
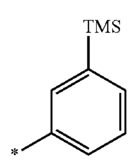
10-44
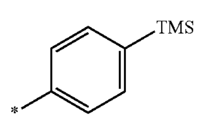
-continued
10-45
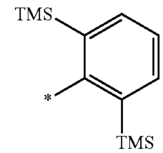
10-46
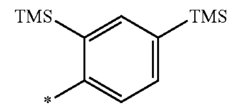
10-47
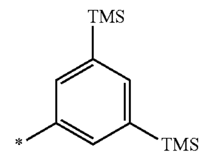
10-48
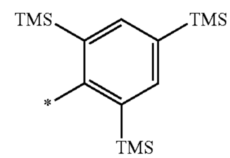
10-49
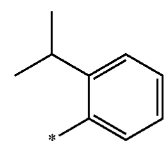
10-50
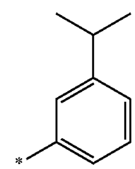
10-51
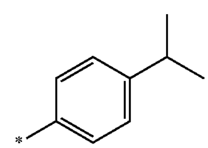
10-52
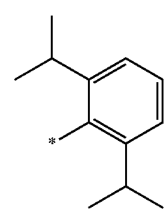
10-53
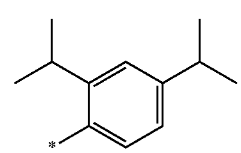

-continued
10-54
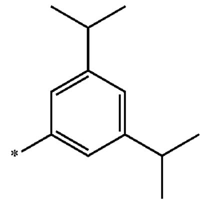
10-55
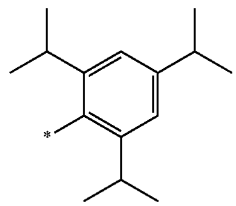
10-56
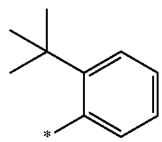
10-57
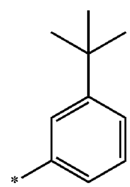
10-58
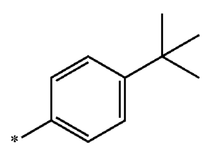
10-59
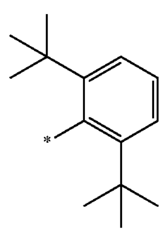
10-60
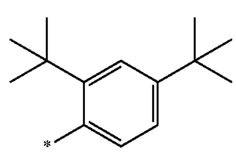
10-61
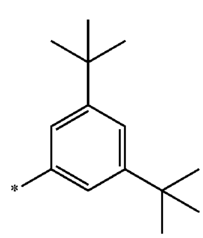
-continued
10-62
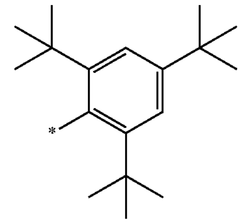
10-63
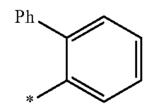
10-64
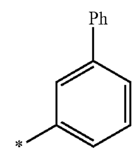
10-65
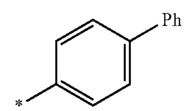
10-66
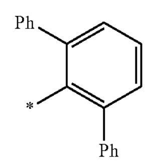
10-67
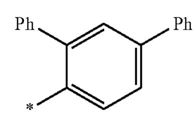
10-68
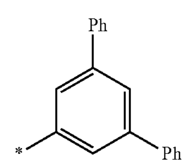
10-69
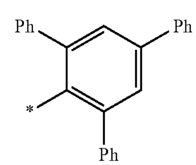
10-70
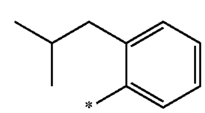

-continued
10-71
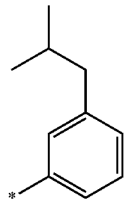
10-72
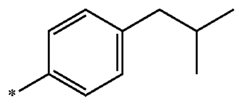
10-73
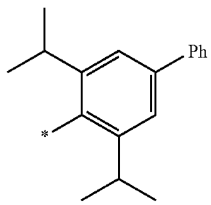
10-74
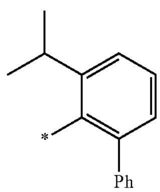
10-75
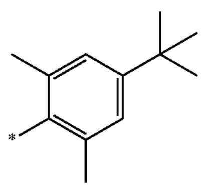
10-76
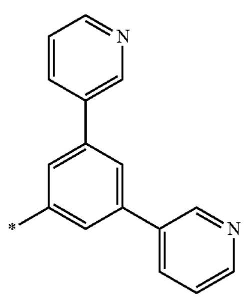
10-77
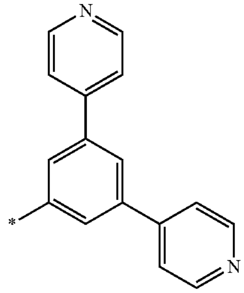
-continued
10-78
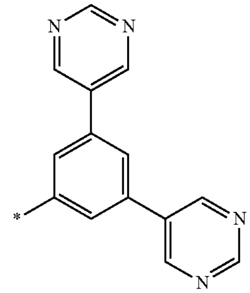
10-79
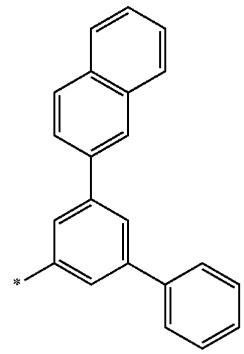
10-80
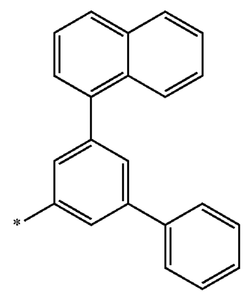
10-81
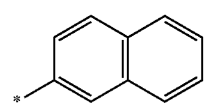
10-82
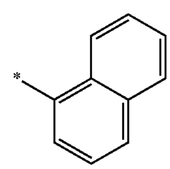
10-83
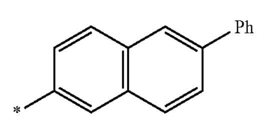
10-84
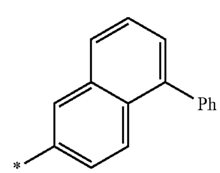

-continued
10-85
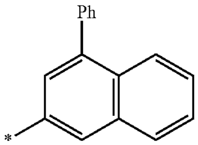
10-86
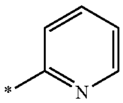
10-87
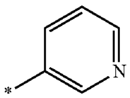
10-88
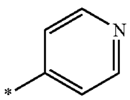
10-89
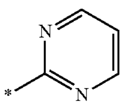
10-90
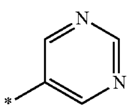
10-91
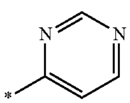
10-92
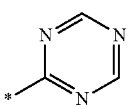
10-93
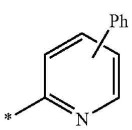
10-94
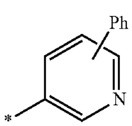
10-95
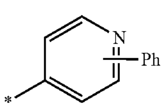
10-96
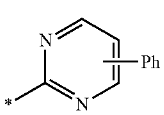
10-97
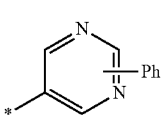
-continued
10-98
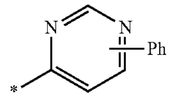
10-99
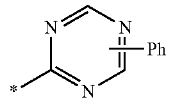
10-100
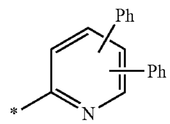
10-101
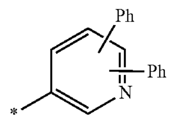
10-102
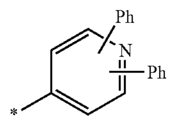
10-103
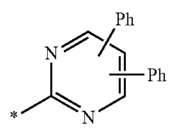
10-104
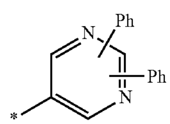
10-105
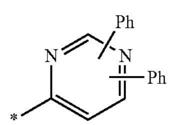
10-106
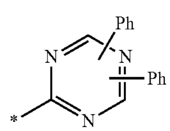
10-107
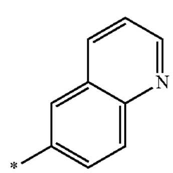
10-108
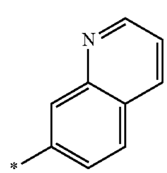

-continued
10-109
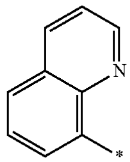
10-110
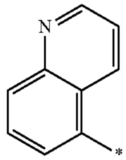
10-111
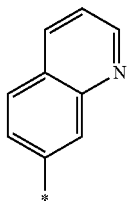
10-112
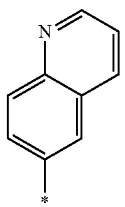
10-113
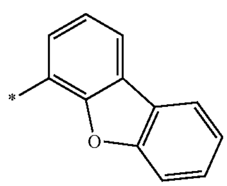
10-114
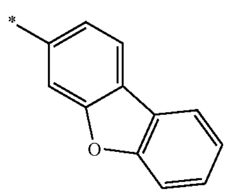
10-115
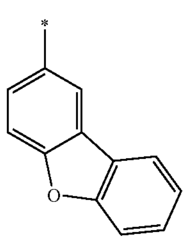
10-116
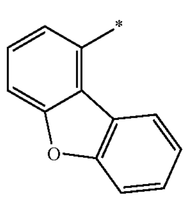
-continued
10-117
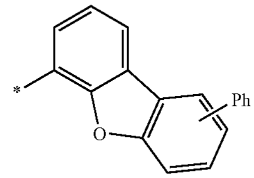
10-118
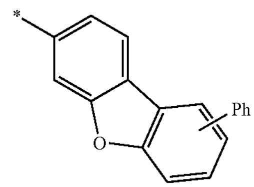
10-119
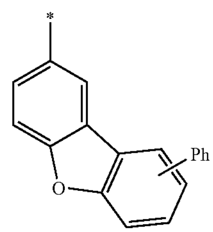
10-120
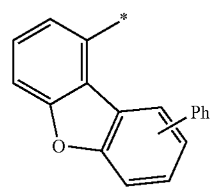
10-121
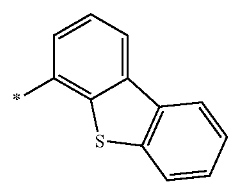
10-122
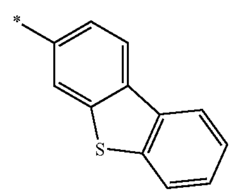
10-123
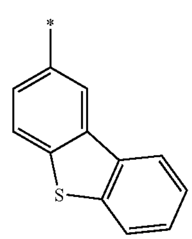
10-124
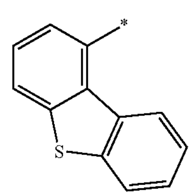

-continued
10-125
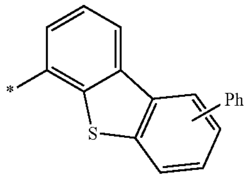
10-126
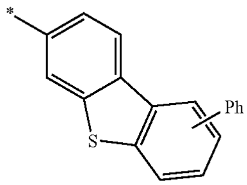
10-127
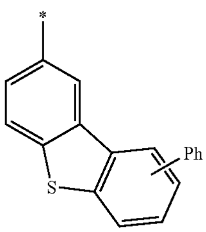
10-128
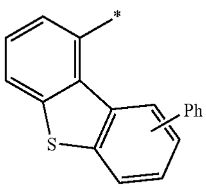
10-129
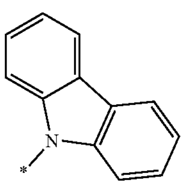
10-130
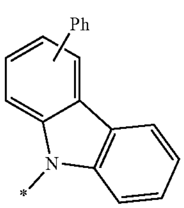
10-131
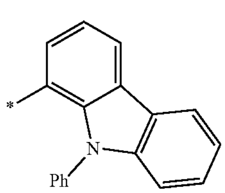
10-132
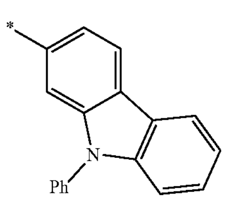
-continued
10-133
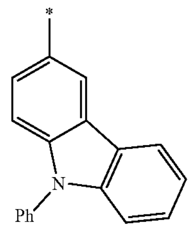
10-134
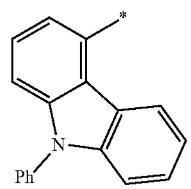
10-135
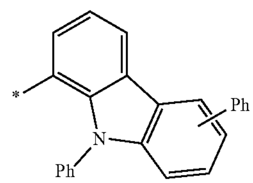
10-136
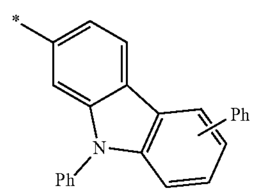
10-137
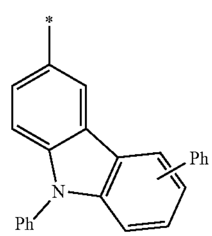
10-138
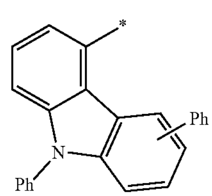
10-139
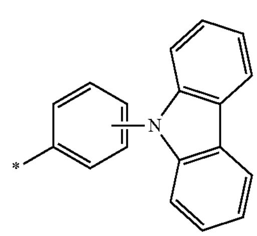

-continued
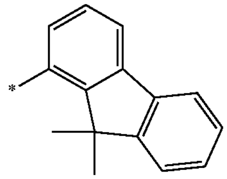
10-140
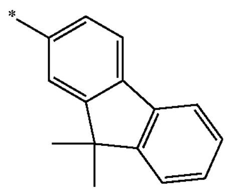
10-141
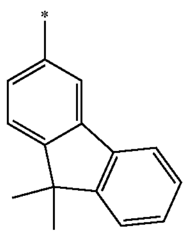
10-142
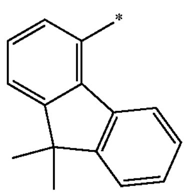
10-143
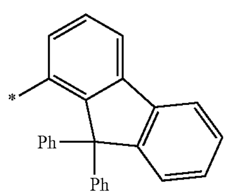
10-144
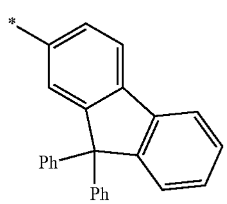
10-145
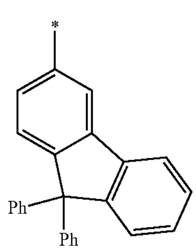
10-146
-continued
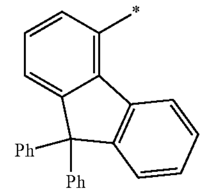
10-147
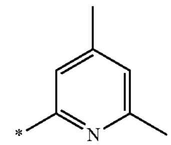
10-148
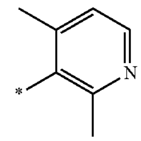
10-149
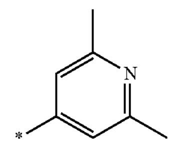
10-150
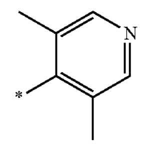
10-151
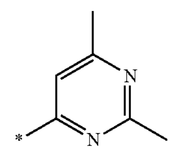
10-152
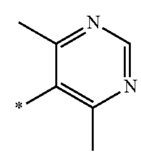
10-153
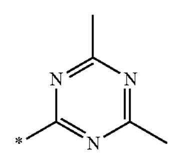
10-154
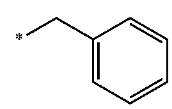
10-155
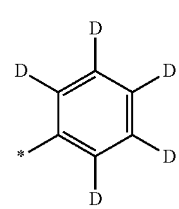
10-156

-continued
10-157
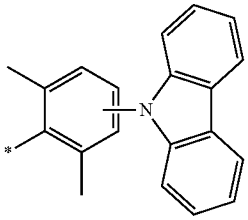
10-158
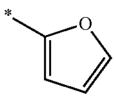
10-159
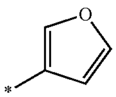
10-160
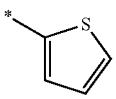
10-161
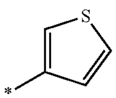
10-162
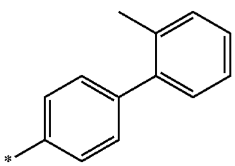
10-163
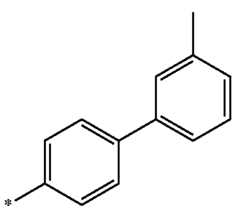
10-164
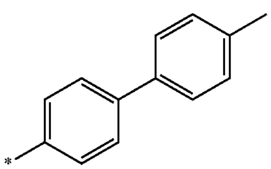
10-165
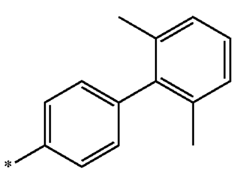
10-166
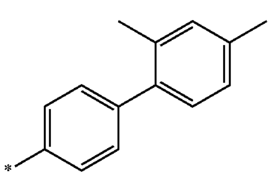
-continued
10-167
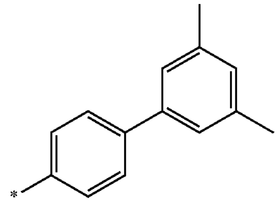
10-168
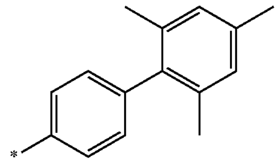
10-169
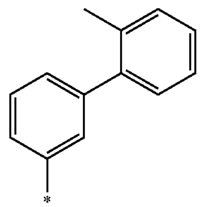
10-170
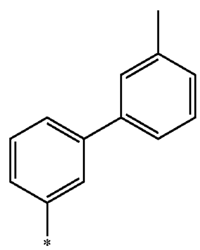
10-171
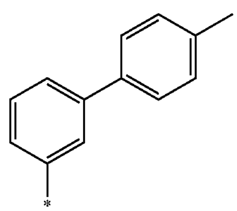
10-172
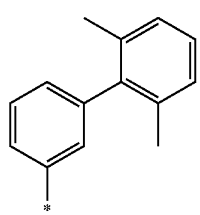
10-173
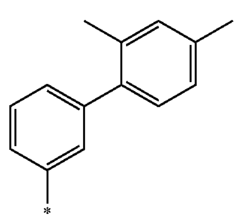

-continued
10-174
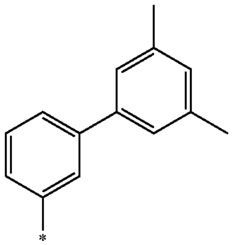
10-175
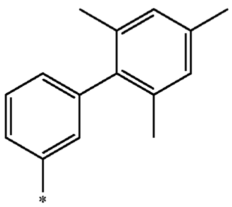
10-176
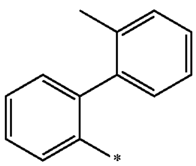
10-177
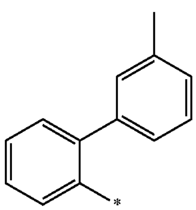
10-178
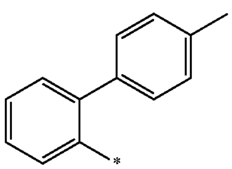
10-179
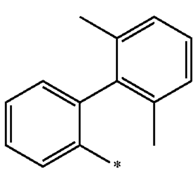
10-180
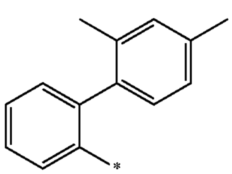
10-181
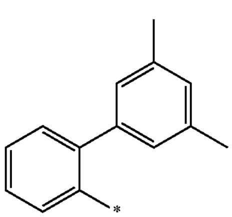
-continued
10-182
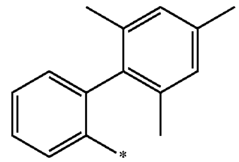
10-183
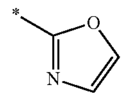
10-184
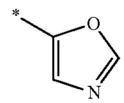
10-185
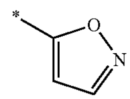
10-186
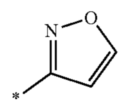
10-187
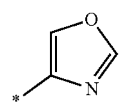
10-188
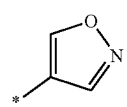
10-189
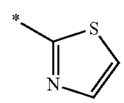
10-190
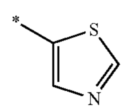
10-191
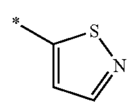
10-192
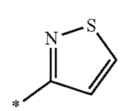
10-193
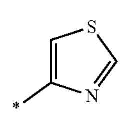
10-194
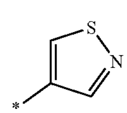
10-195
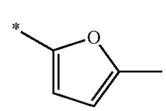

-continued
10-196
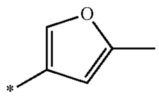
10-197
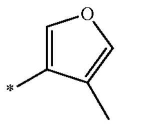
10-198
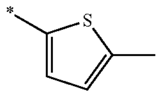
10-199
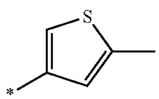
10-200
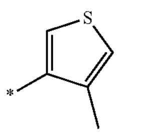
10-201
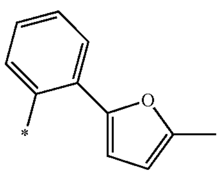
10-202
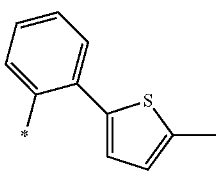
10-203
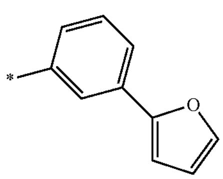
10-204
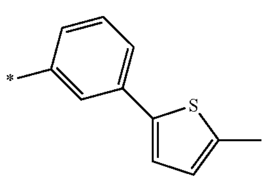
10-205
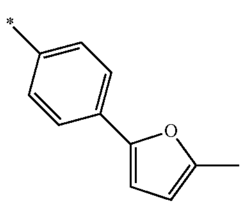
-continued
10-206
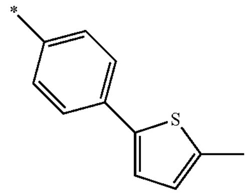
10-207
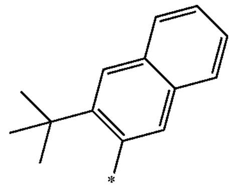
10-208
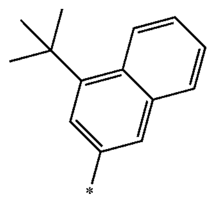
10-209
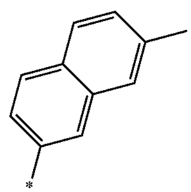
10-210
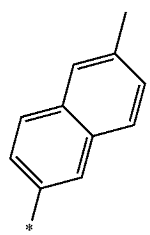
10-211
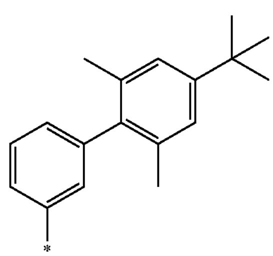
10-212
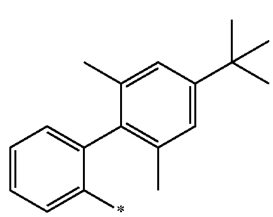

10-213
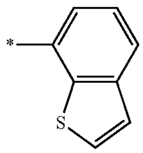
10-214
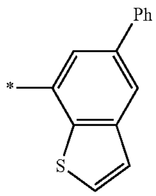
10-215
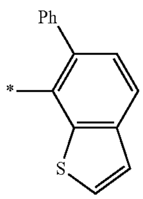
10-216
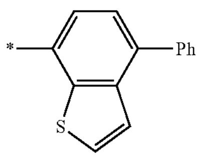
10-217
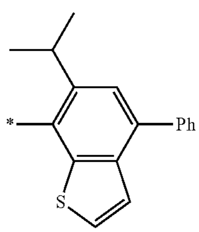
10-218
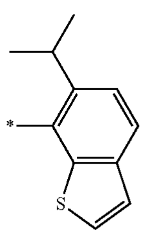
10-219
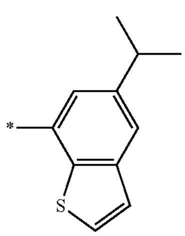
10-220
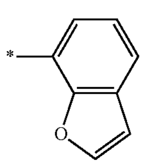
10-221
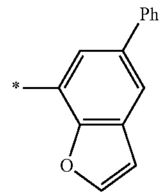
10-222
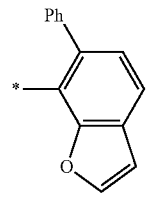
10-223
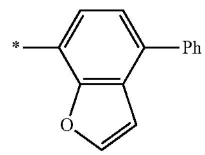
10-224
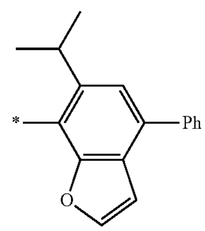
10-225
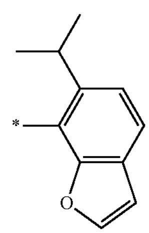
10-226
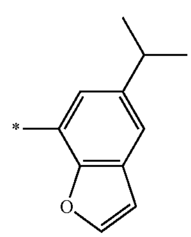
10-227
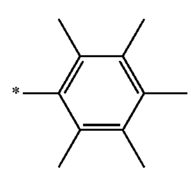

-continued
10-228
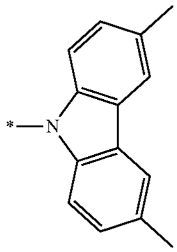
10-229
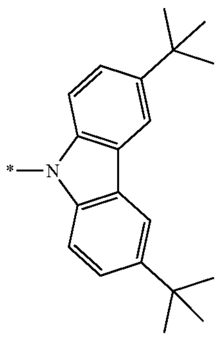
10-230
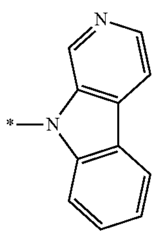
10-231
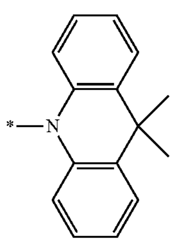
10-232
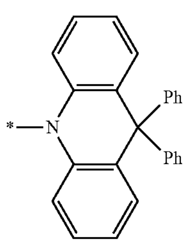
10-233
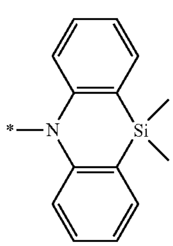
-continued
10-234
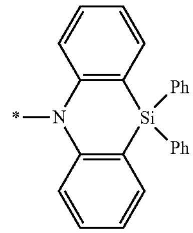
10-235
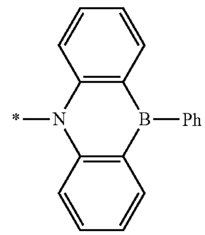
10-236
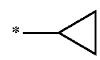
10-237
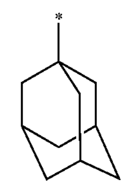
10-238
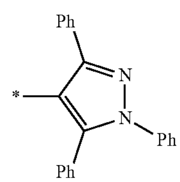
10-239
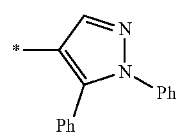
10-240
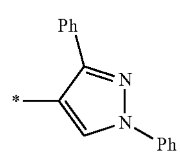
10-241
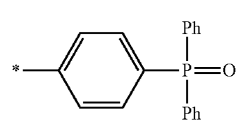
10-242
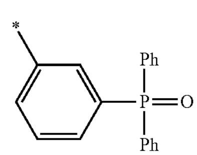

-continued 10-243

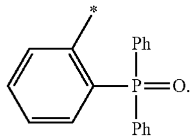

In Formulae 9-1 to 9-19 and 10-1 to 10-243, * indicates a binding site to a neighboring atom, Ph indicates a phenyl group, and TMS indicates a trimethylsilyl group.

$R_{10a}$ may be the same as defined in connection with $R_1$, and $R_{10a}$ is not hydrogen, In one embodiment, at least one of the $R_2$(s) (e.g., $R_2$ in the number of a2) in Formula 1 may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, or a substituted or unsubstituted monovalent non-aromatic condensed heteropolycyclic group.

For example, at least one of the $R_2$(s) (e.g., $R_2$ in the number of a2) in Formula 1 may each independently be a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_1$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof.

In one or more embodiments, at least one of the $R_4$(s) (e.g., $R_4$ in the number of a4) in Formula 2-1 may be:

a cyano group; or a $C_1$-$C_{20}$ alkyl group unsubstituted or substituted with —F, a cyano group, or any combination thereof (for example, $—CF_3$ or the like), but embodiments of the present disclosure are not limited thereto.

In Formulae 1, 2-1, and 3, a1 to a4, a71, and a72 each indicate the number of $R_1$(s) to $R_4$(s), $R_{71}$(s), and $R_{72}$(s), and may each independently be an integer from 0 to 20 (for example, an integer from 0 to 5). When a1 is 2 or more, two or more $R_1$(s) may be identical to or different from each other, and this may be equally applied to a2 to a4, a71 and a72, and $R_2$ to $R_4$, $R_1$, and $R_{72}$.

In Formula 1, i) two or more of the $R_1$(s) (e.g., $R_1$(s) in the number of a1) may optionally linked to each other (for example, via a single bond, a double bond, or a first linking group) to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, ii) two or more of the $R_2$(s) (e.g., $R_2$(s) in the number of a2) may optionally be linked to each other (for example, via a single bond, a double bond, or a first linking group) to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iii) two or more of the $R_3$(s) (e.g., $R_3$(s) in the number of a3) may optionally be linked to each other (for example, via a single bond, a double bond, or a first linking group) to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, and iv) two or more of the $R_4$(s) (e.g., $R_4$(s) in the number of a4) may optionally be linked to each other (for example, via a single bond, a double bond, or a first linking group) to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$. $R_{10a}$ may be the same as defined in connection with $R_1$, and $R_{10a}$ is not hydrogen. The first linking group may be selected from $*—N(R_{95})—*'$, $*—B(R_{95})—*'$, $*—P(R_{95})—*'$, $*—C(R_{95a})(R_{95b})—*'$, $*—Si(R_{95a})(R_{95b})—*'$, $*—Ge(R_{95a})(R_{95b})*'$, $*—S*'$, $*—Se—*'$, $*-O*'$, $*—C(=O)—*'$, $*—S(=O)—*'$ $*—S(=O)_2—*'$,

*—C($R_{95}$)═*', *═C($R_{95}$)—*', *—C($R_{95a}$)═C($R_{95b}$)—*', *—C(═S)*', and *—C≡C—*', and $R_{95}$, $R_{95a}$, and $R_{95b}$ may each independently be the same as defined in connection with $R_1$. As described herein, "$C_5$-$C_{30}$ carbocyclic group" and the "$C_1$-$C_{30}$ heterocyclic group" may be understood by referring to the description provided herein in connection with ring $CY_1$.

In one embodiment, a group represented by

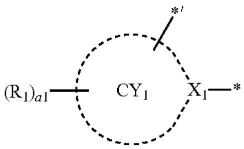

in Formula 1 may be a group represented by one of Formulae A1-1(1) to A-1(55):

A1-1(1)

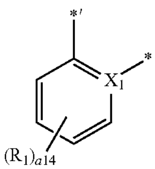

A1-1(2)

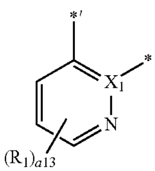

A1-1(3)

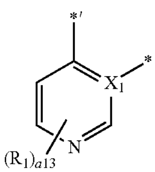

A1-1(4)

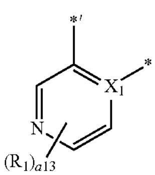

A1-1(5)

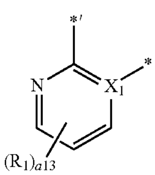

A1-1(6)

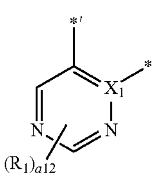

-continued

A1-1(7)

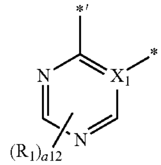

A1-1(8)

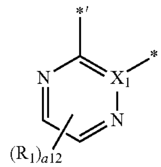

A1-1(9)

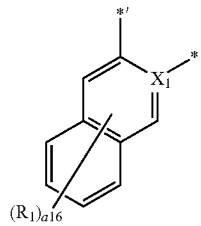

A1-1(10)

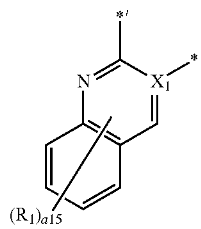

A1-1(11)

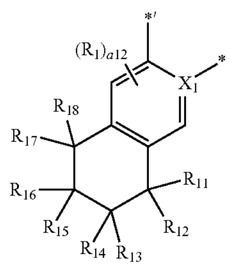

A1-1(12)

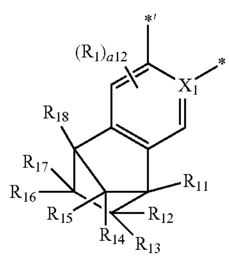

A1-1(13)

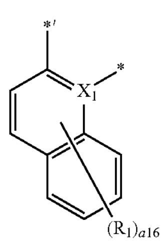

-continued
A1-1(14)
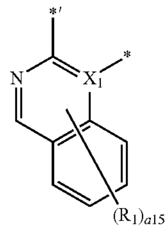
A1-1(15)
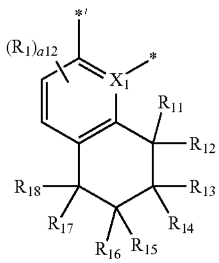
A1-1(16)
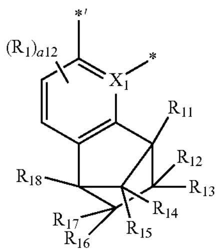
A1-1(17)
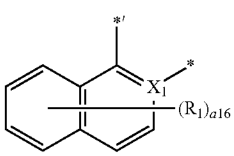
A1-1(18)
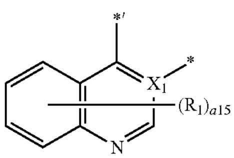
A1-1(19)
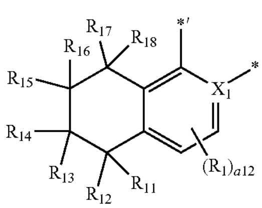
A1-1(20)
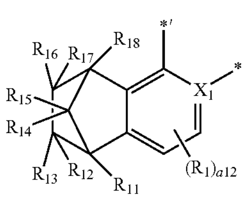
-continued
A1-1(21)
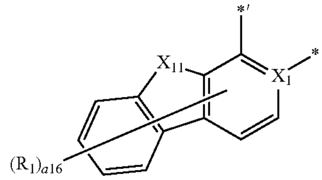
A1-1(22)
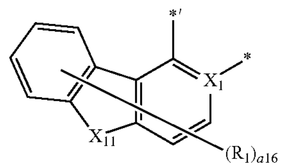
A1-1(23)
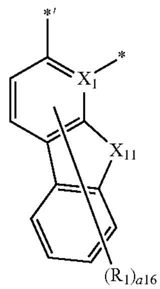
A1-1(24)
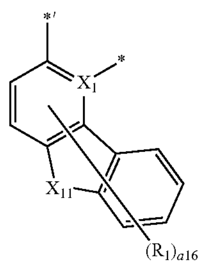
A1-1(25)
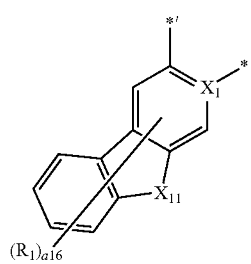
A1-1(26)
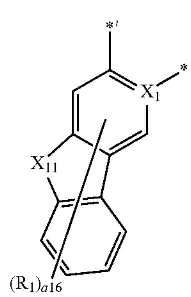
A1-1(27)
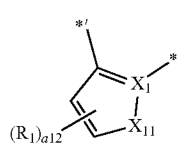

-continued
A1-1(28)
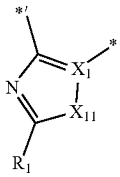
A1-1(29)
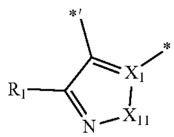
A1-1(30)
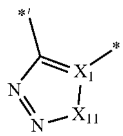
A1-1(31)
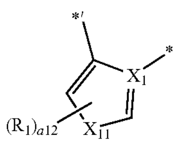
A1-1(32)
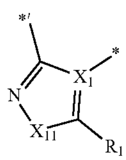
A1-1(33)
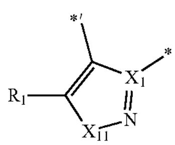
A1-1(34)
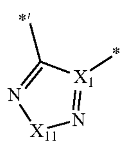
A1-1(35)
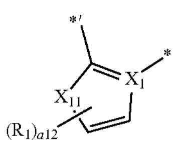
A1-1(36)
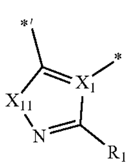
A1-1(37)
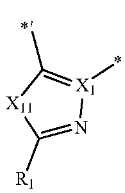
-continued
A1-1(38)
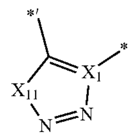
A1-1(39)
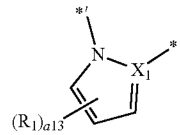
A1-1(40)
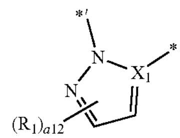
A1-1(41)
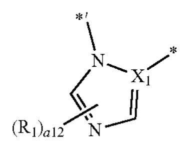
A1-1(42)
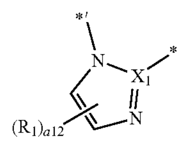
A1-1(43)
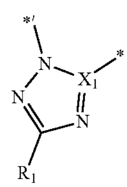
A1-1(44)
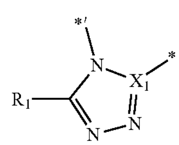
A1-1(45)
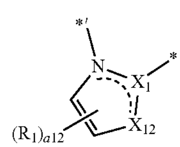
A1-1(46)
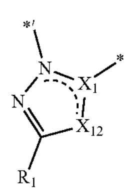
A1-1(47)
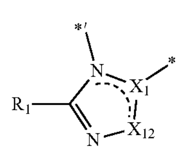

-continued

A1-1(48)

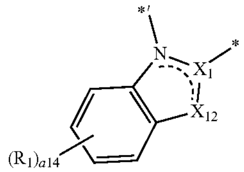

A1-1(49)

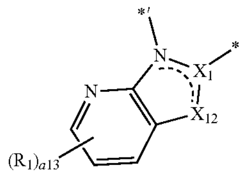

A1-1(50)

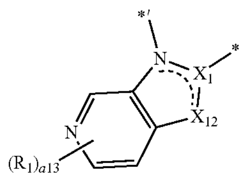

A1-1(51)

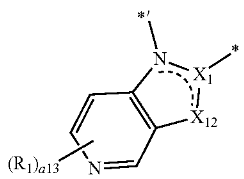

A1-1(52)

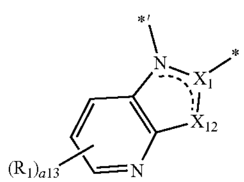

A1-1(53)

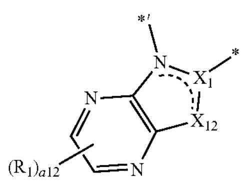

A1-1(54)

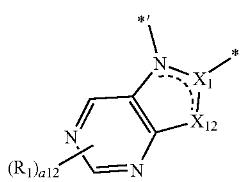

A1-1(55)

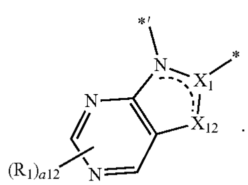

In Formulae A1-1(1) to A1-1(55), $X_1$ and $R_1$ may each independently be the same as described herein, $X_{11}$ may be O, S, $C(R_{11})(R_{12})$, $Si(R_{11})(R_{12})$, or $N(R_{12})$, $X_{12}$ may be O, S, or $N(R_{12})$, $R_{11}$ to $R_{18}$ may each independently be the same as defined in connection with $R_1$, a16 may be an integer from 0 to 6, a15 may be an integer from 0 to 5, a14 may be an integer from 0 to 4, a13 may be an integer from 0 to 3, a12 may be an integer from 0 to 2,

* indicates a binding site to $T_{11}$ or M in Formula 1, and

*' indicates a binding site to $T_1$ in Formula 1.

In one or more embodiments, a group represented by

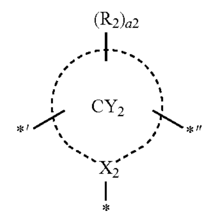

in Formula 1 may be a group represented by one of Formulae A2-1(1) to A2-1(15):

A2-1(1)

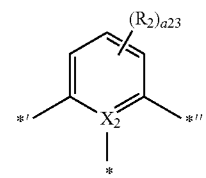

A2-1(2)

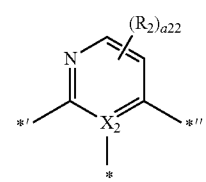

A2-1(3)

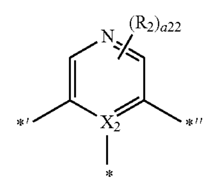

A2-1(4)

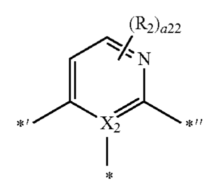

A2-1(5)

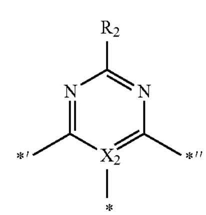

-continued

A2-1(6)

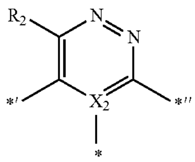

A2-1(7)

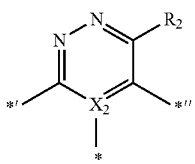

A2-1(8)

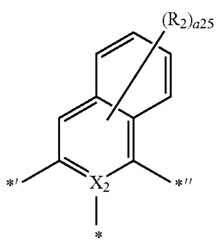

A2-1(9)

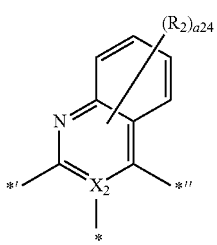

A2-1(10)

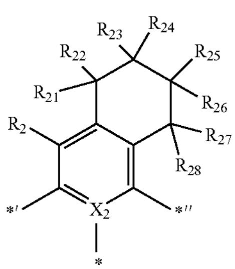

A2-1(11)

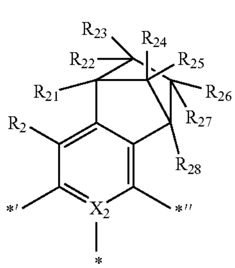

-continued

A2-1(12)

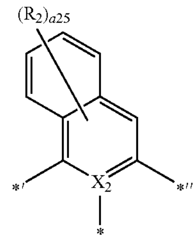

A2-1(13)

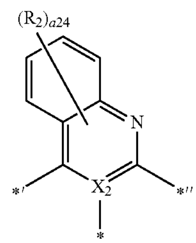

A2-1(14)

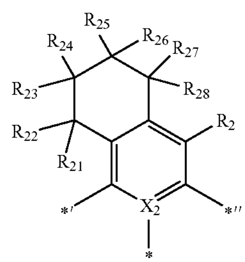

A2-1(15)

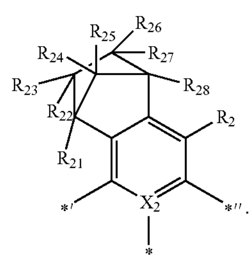

In Formulae A2-1(1) to A2-1(15), $X_2$ and $R_2$ may each independently be the same as described herein, $R_{21}$ to $R_{28}$ may each independently be the same as defined in connection with $R_2$, a25 may be an integer from 0 to 5, a24 may be an integer from 0 to 4, a23 may be an integer from 0 to 3, a22 may be an integer from 0 to 2,

* indicates a binding site to $T_{12}$ or M in Formula 1,

*' indicates a binding site to $T_1$ in Formula 1, and

*" indicates a binding site to $T_2$ in Formula 1.

In one or more embodiments, a group represented by

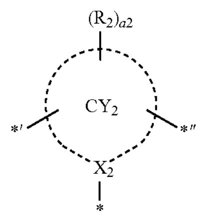

in Formula 1 may be a group represented by Formula CY2-1:

CY2-1

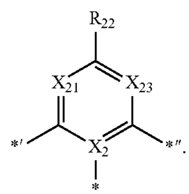

In Formula CY2-1, $X_2$ may be the same as described herein above, $X_{21}$ may be N or $C(R_{21})$, and $X_{23}$ may be N or $C(R_{23})$, $R_{21}$ and $R_{23}$ may each independently be the same as defined in connection with $R_2$, $R_{22}$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$—$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, or a substituted or unsubstituted monovalent non-aromatic condensed heteropolycyclic group,

* indicates a binding site to $T_{12}$ or M in Formula 1,

*' indicates a binding site to $T_1$ in Formula 1, and

*" indicates a binding site to $T_2$ in Formula 1.

In one or more embodiments, a group represented by

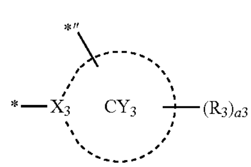

in Formula 1 may be a group represented by one of Formulae A3-1(1) to A3-1(55):

A3-1(1)

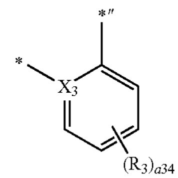

A3-1(2)

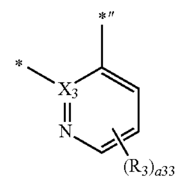

A3-1(3)

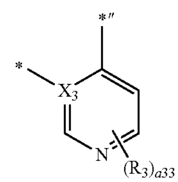

A3-1(4)

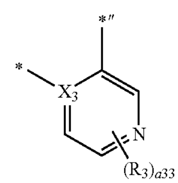

A3-1(5)

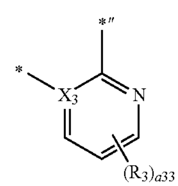

A3-1(6)

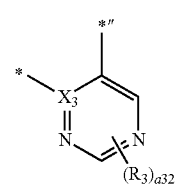

A3-1(7)

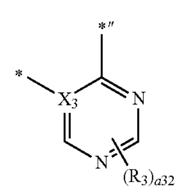

A3-1(8)

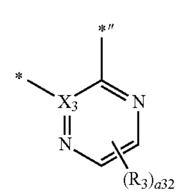

-continued
A3-1(9)
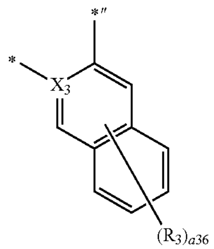
A3-1(10)
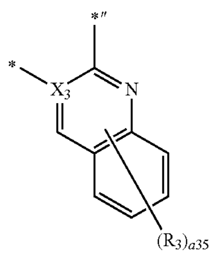
A3-1(11)
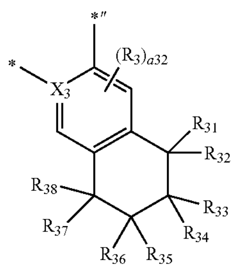
A3-1(12)
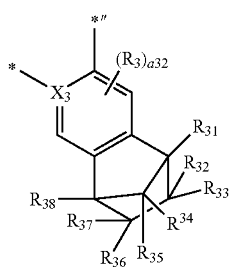
A3-1(13)
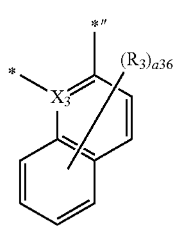
A3-1(14)
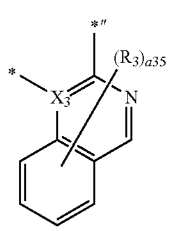
-continued
A3-1(15)
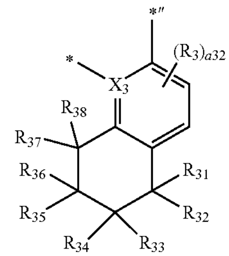
A3-1(16)
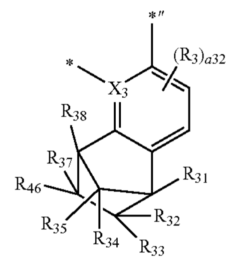
A3-1(17)
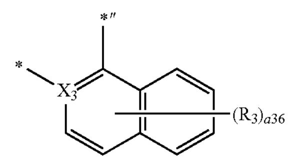
A3-1(18)
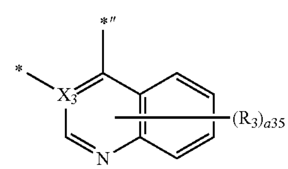
A3-1(19)
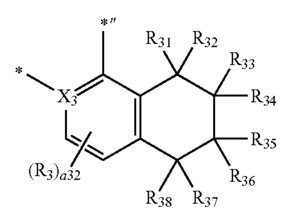
A3-1(20)
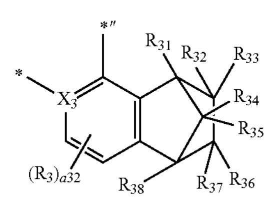
A3-1(21)
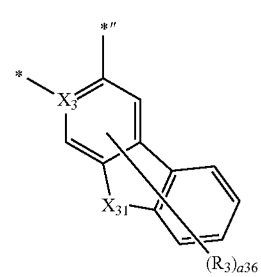

-continued
A3-1(22)
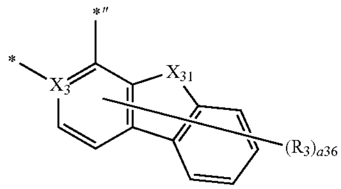
A3-1(23)
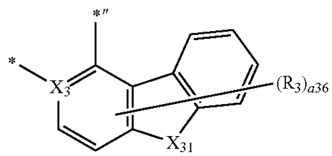
A3-1(24)
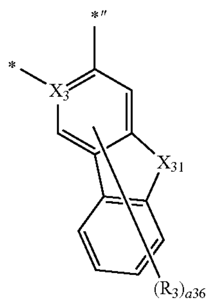
A3-1(25)
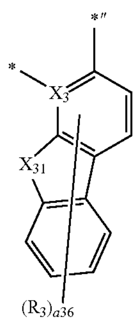
A3-1(26)
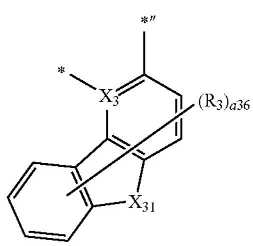
A3-1(27)
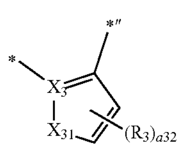
A3-1(28
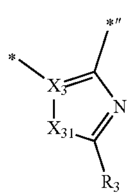
-continued
A3-1(29)
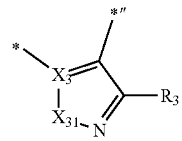
A3-1(30)
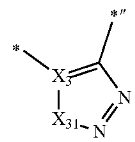
A3-1(31)
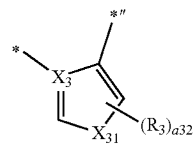
A3-1(32)
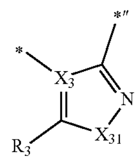
A3-1(33)
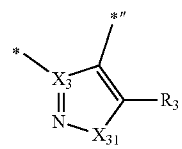
A3-1(34)
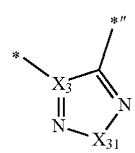
A3-1(35)
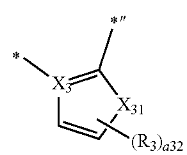
A3-1(36)
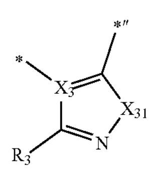
A3-1(37)
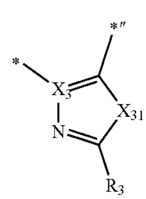

A3-1(38)
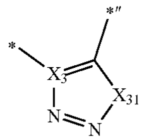
A3-1(39)
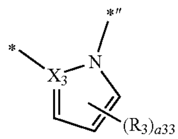
A3-1(40)
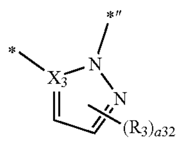
A3-1(41)
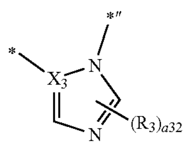
A3-1(42)
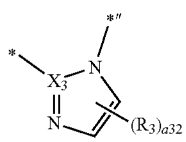
A3-1(43)
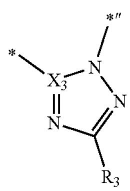
A3-1(44)
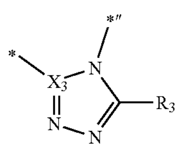
A3-1(45)
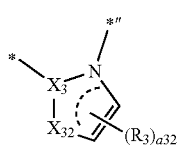
A3-1(46)
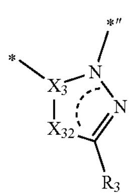
A3-1(47)
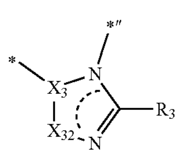
A3-1(48)
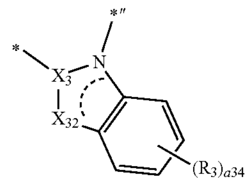
A3-1(49)
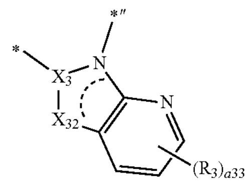
A3-1(50)
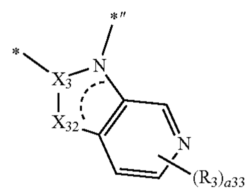
A3-1(51)
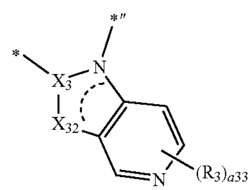
A3-1(52)
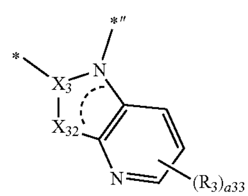
A3-1(53)
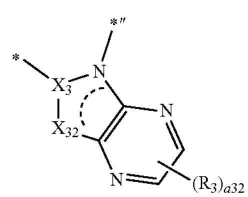
A3-1(54)
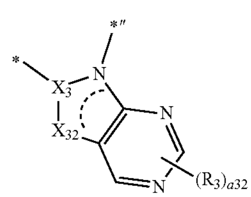
A3-1(55)
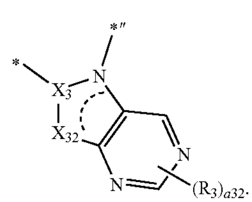

In Formulae A3-1(1) to A3-1(55), $X_3$ and $R_3$ may each independently be the same as described herein, $X_{31}$ may be O, S, $C(R_{31})(R_{32})$, $Si(R_{31})(R_{32})$, or $N(R_{32})$, $X_{32}$ may be O, S, or $N(R_{32})$, $R_{31}$ to $R_{38}$ may each independently be the same as defined in connection with $R_3$, a36 may be an integer from 0 to 6, a35 may be an integer from 0 to 5, a34 may be an integer from 0 to 4, a33 may be an integer from 0 to 3, a32 may be an integer from 0 to 2,

* indicates a binding site to $T_{13}$ or M in Formula 1, and

*" indicates a binding site to $T_2$ in Formula 1.

In one embodiment, i) in Formula 1, $X_1$ may be C, and a group represented by

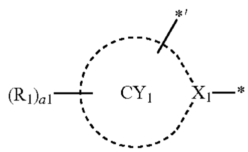

may be a group represented by one of Formulae A1-1(44) to A1-1(55), and/or ii) in Formula 1, $X_3$ may be C, and a group represented by

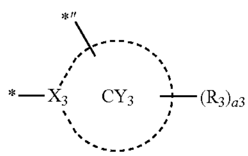

may be a group represented by one of Formulae A3-1(44) to A3-1(55).

In one or more embodiments, $L_2$ in Formula 1 may be a ligand represented by one of Formulae A4-1(1) to A4-1(4):

A4-1(1)

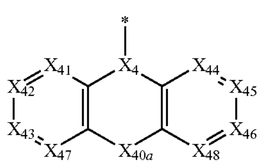

A4-1(2)

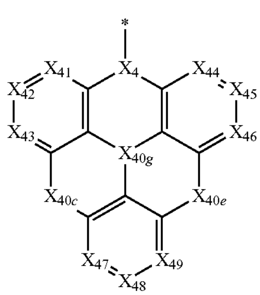

A4-1(3)

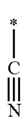

-continued

A4-1(4)

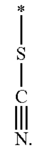

In Formulae A4-1(1) to A4-1(4), $X_4$ may be the same as described herein above, $X_{40a}$ may be a single bond, O, S, $S(=O)_2$, $C(R_{40a})(R_{40b})$, $Si(R_{40a})(R_{40b})$, $N(R_{40a})$, or $B(R_{40a})$, $X_{40c}$ may be O, S, $C(R_{40c})(R_{40d})$, $Si(R_{40c})(R_{40d})$, or $N(R_{40c})$, $X_{40e}$ may be O, S, $C(R_{40e})(R_{40f})$, $Si(R_{40e})(R_{40f})$, or $N(R_{40e})$, $X_{40g}$ may be N, B, or P, $X_{41}$ may be N or $C(R_{41})$, $X_{42}$ may be N or $C(R_{42})$, $X_{43}$ may be N or $C(R_{43})$, $X_{44}$ may be N or $C(R_{44})$, $X_{45}$ may be N or $C(R_{45})$, $X_{46}$ may be N or $C(R_{46})$, $X_{47}$ may be N or $C(R_{47})$, $X_{48}$ may be N or $C(R_{48})$, and $X_{49}$ may be N or $C(R_{49})$, $R_{40a}$ to $R_{40f}$ and $R_{41}$ to $R_{49}$ may each independently be the same as defined in connection with $R_4$, and

* indicates a binding site to Min Formula 1.

In one or more embodiments, $L_2$ in Formula 1 may be a ligand represented by one of Formulae CY4-1 to CY4-8:

CY4-1

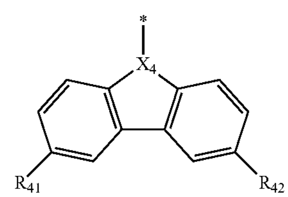

CY4-2

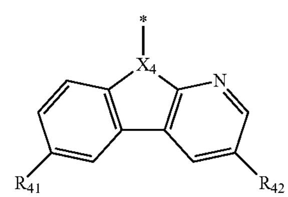

CY4-3

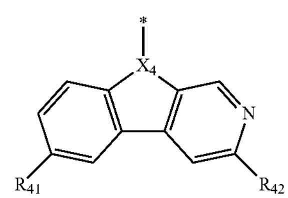

CY4-4

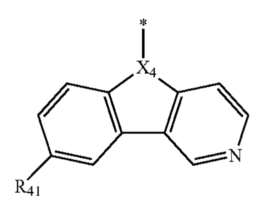

-continued

CY4-5

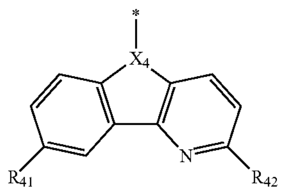

CY4-6

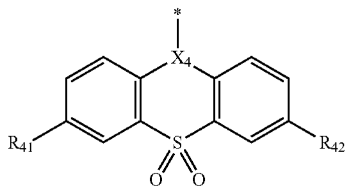

CY4-7

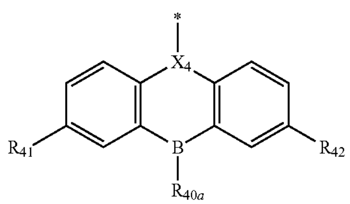

CY4-8

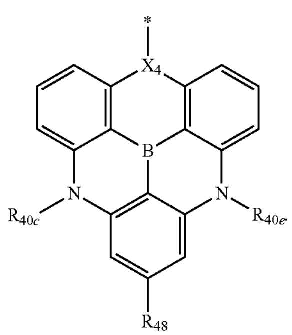

In Formulae CY4-1 to $CY_4$-8, $X_4$ may be the same as described herein above, $R_{40a}$, $R_{40c}$, $R_{40e}$, $R_{41}$, $R_{42}$, and $R_{48}$ may each independently be the same as defined in connection with $R_4$, and

* indicates a binding site to Min Formula 1.

In one embodiment, in Formulae CY4-1 to CY4-8, $X_4$ may be N, $R_{40a}$, $R_{40c}$, and $R_{40e}$ may each independently be phenyl group that is unsubstituted or substituted with deuterium, a $C_1$-$C_{20}$ alkyl group, a phenyl group, or any combination thereof, and $R_{41}$, $R_{42}$, and $R_{48}$ may each independently be:

hydrogen or a cyano group; or a $C_1$-$C_{20}$ alkyl group that is unsubstituted or substituted with —F, a cyano group, or any combination thereof.

In one or more embodiments, the first compound may be represented by Formula 1A, 1B, or 1C:

1A

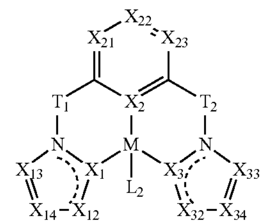

1B

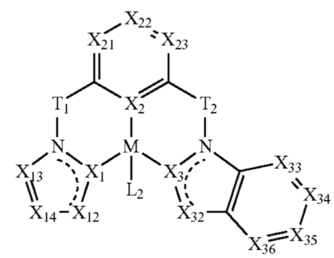

1C

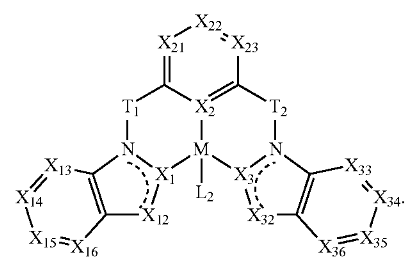

In Formulae 1A to 1C,

M, $L_2$, $X_1$ to $X_3$, $T_1$, and $T_2$ may each independently be the same as described herein, $X_{12}$ may be O, S, or $N(R_{12})$, $X_{13}$ may be N or $C(R_{13})$, $X_{14}$ may be N or $C(R_{14})$, $X_{15}$ may be N or $C(R_{15})$, $X_{16}$ may be N or $C(R_{16})$, and $R_{12}$ to $R_{16}$ may each independently be the same as defined in connection with $R_1$, $X_{21}$ may be N or $C(R_{21})$, $X_{22}$ may be N or $C(R_{22})$, $X_{23}$ may be N or $C(R_{23})$, and $R_{21}$ to $R_{23}$ may each independently be the same as defined in connection with $R_2$, $X_{32}$ may be O, S, or $N(R_{32})$, $X_{33}$ may be N or $C(R_{33})$, $X_{34}$ may be N or $C(R_{34})$, $X_{35}$ may be N or $C(R_{35})$, $X_{36}$ may be N or $C(R_{36})$, and $R_{32}$ to $R_{36}$ may each independently be the same as defined in connection with $R_3$, two or more of $R_{12}$ to $R_{16}$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more of $R_{21}$ to $R_{23}$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, and two or more of $R_{32}$ to $R_{36}$ may optionally be linked to each other to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$.

$R_{10a}$ may be the same as described herein above.

In one embodiment, $L_2$ in Formulae 1A to 1C may be a ligand represented by Formula A4-1(1) or A4-1(2) (or a ligand represented by one of Formulae CY4-1 to CY4-8).

In one or more embodiments, $X_{22}$ in Formulae 1A to 1C may be $C(R_{22})$, wherein $R_{22}$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, or a substituted or unsubstituted monovalent non-aromatic condensed heteropolycyclic group.

In Formula 2, a group represented by *-$(L_{51})_{b51}$-$R_{51}$ and a group represented by *-$(L_{52})_{b52}$-$R_{52}$ may not be a phenyl group.

In one embodiment, in Formula 2, a group represented by *-$(L_{51})_{b51}$-$R_{51}$ and a group represented by *-$(L_{52})_{b52}$-$R_{52}$ may be identical to each other.

In one or more embodiments, in Formula 2, a group represented by *-$(L_{51})_{b51}$-$R_{51}$ and a group represented by *-$(L_{52})_{b52}$-$R_{52}$ may be different from each other.

In one or more embodiments, in Formula 2, b51 and b52 may be 1, 2, or 3, $L_{51}$ and $L_{52}$ may each independently be a benzene group, a pyridine group, a pyrimidine group, a pyridazine group, a pyrazine group, or a triazine group, each unsubstituted or substituted with at least one $R_{10a}$, but embodiments of the present disclosure are not limited thereto.

$R_{10a}$ may be the same as described herein above.

For example, in Formula 2, $R_{51}$ and $R_{52}$ may each independently be a substituted or unsubstituted $C_3$-$C_{10}$ cycloalkyl group, a substituted or unsubstituted $C_1$-$C_{60}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, or —$Si(Q_1)(Q_2)(Q_3)$, and $Q_1$ to $Q_3$ may each independently be: a $C_1$-$C_{60}$ alkyl group substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; a $C_6$-$C_{60}$ aryloxy group; a $C_6$-$C_{60}$ arylthio group; a $C_1$-$C_{60}$ heteroaryl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; a monovalent non-aromatic condensed polycyclic group; or a monovalent non-aromatic condensed heteropolycyclic group, In one embodiment, a group represented by *-$(L_{51})_{b51}$-$R_{51}$ in Formula 2 may be a group represented by one of Formulae CY51-1 to CY51-22, and/or a group represented by *-$(L_{52})_{b52}$-$R_{52}$ in Formula 2 may be a group represented by one of Formulae CY52-1 to CY52-22, and/or a group represented by *-$(L_{53})_{b53}$-$R_{53}$ in Formula 2 may be a group represented by one of Formulae CY53-1 to CY53-18, —$C(Q_1)(Q_2)(Q_3)$, or —$Si(Q_1)(Q_2)(Q_3)$, but embodiments of the present disclosure are not limited thereto:

CY51-1

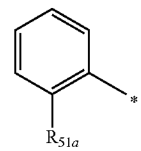

CY51-2

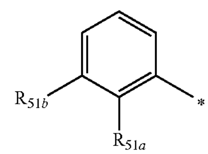

CY51-3

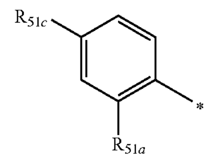

CY51-4

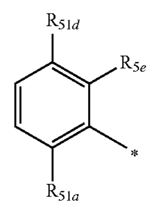

CY51-5

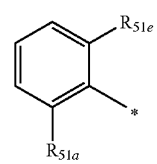

CY51-6

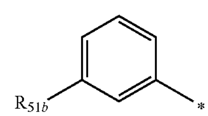

CY51-7

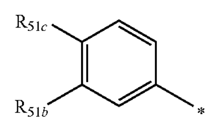

CY51-8

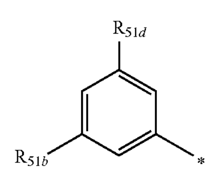

-continued
CY51-9
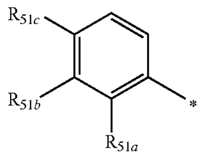
CY51-10
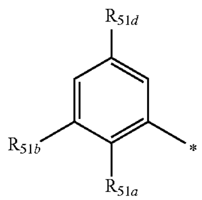
CY51-11
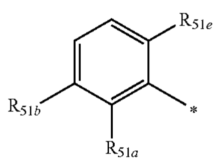
CY51-12
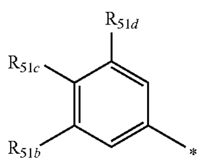
CY51-13
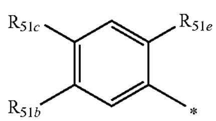
CY51-14
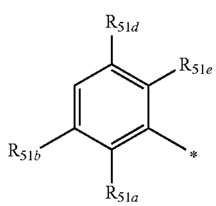
CY51-15
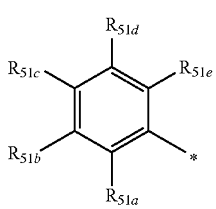
CY51-16
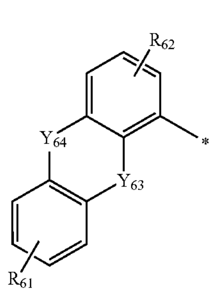
-continued
CY51-17
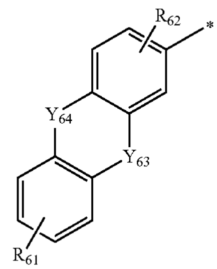
CY51-18
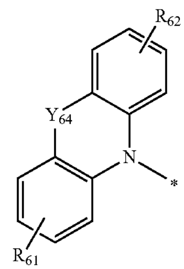
CY51-19
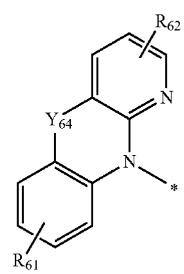
CY51-20
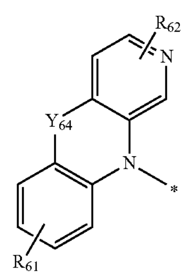
CY51-21
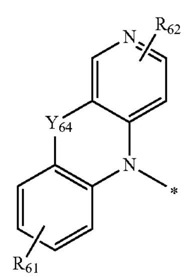
CY51-22
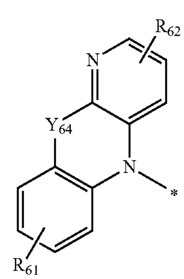

-continued
CY52-1
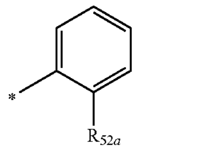
CY52-2
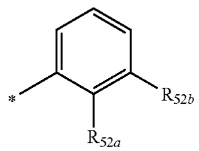
CY52-3
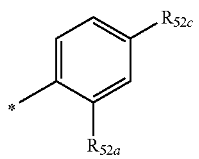
CY52-4
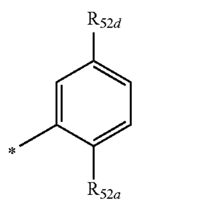
CY52-5
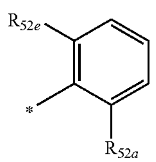
CY52-6
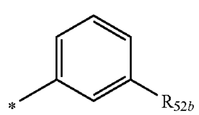
CY52-7
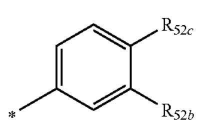
CY52-8
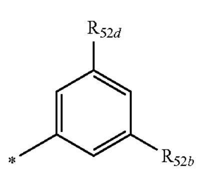
CY52-9
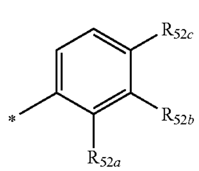
-continued
CY52-10
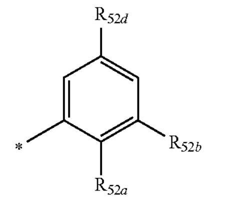
CY52-11
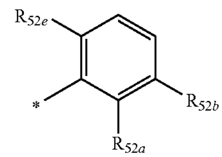
CY52-12
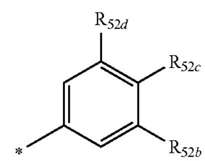
CY52-13
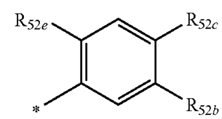
CY52-14
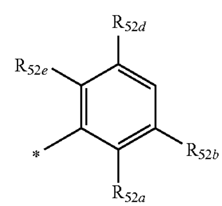
CY52-15
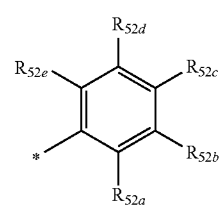
CY52-16
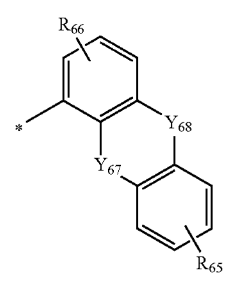
CY52-17
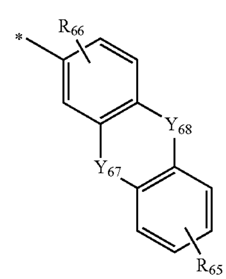

-continued
CY52-18
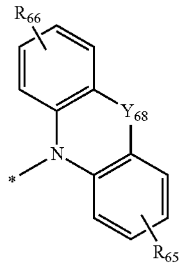
CY52-19
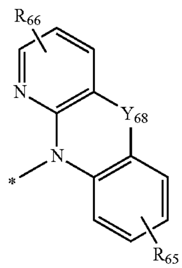
CY52-20
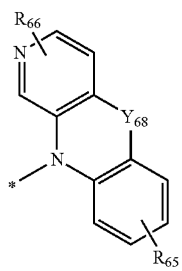
CY52-21
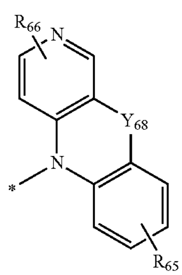
CY52-22
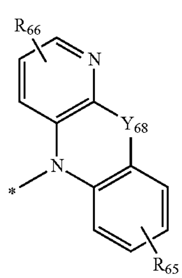
CY53-1
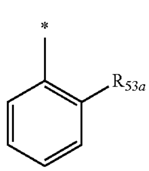
-continued
CY53-2
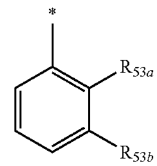
CY53-3
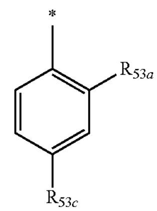
CY53-4
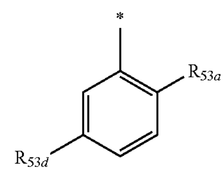
CY53-5
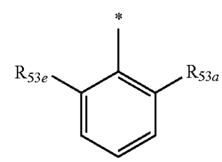
CY53-6
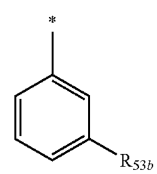
CY53-7
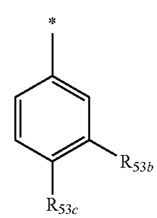
CY53-8
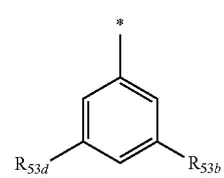
CY53-9
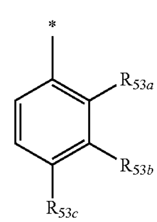

-continued

CY53-10

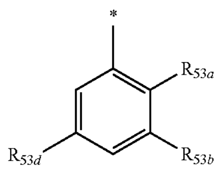

CY53-11

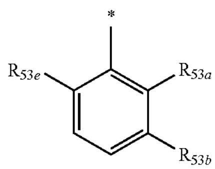

CY53-12

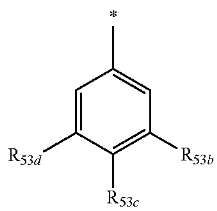

CY53-13

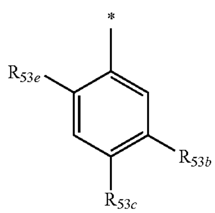

CY53-14

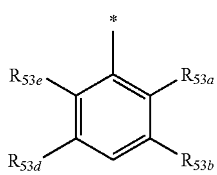

CY53-15

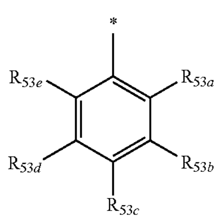

CY53-16

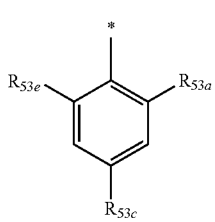

CY53-17

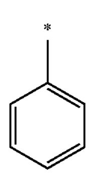

-continued

CY53-18

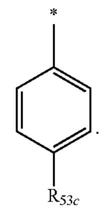

In Formulae CY51-1 to CY51-22, CY52-1 to CY52-22, and CY53-1 to CY53-18, $Y_{63}$ may be a single bond, O, S, $N(R_{63})$, $B(R_{63})$, $C(R_{63a})(R_{63b})$, or $Si(R_{63a})(R_{63b})$, $Y_{64}$ may be a single bond, O, S, $N(R_{64})$, $B(R_{64})$, $C(R_{64a})(R_{64b})$, or $Si(R_{64a})(R_{64b})$, $Y_{67}$ may be a single bond, O, S, $N(R_{67})$, $B(R_{67})$, $C(R_{67a})(R_{67b})$, or $Si(R_{67a})(R_{67b})$, $Y_{68}$ may be a single bond, O, S, $N(R_{68})$, $B(R_{68})$, $C(R_{68a})(R_{68b})$, or $Si(R_{68a})(R_{68b})$, in Formulae CY51-16 and CY51-17, $Y_{63}$ and $Y_{64}$ may not be a single bond at the same time, in Formulae CY52-16 and CY52-17, $Y_{67}$ and $Y_{68}$ may not be a single bond at the same time, $R_{51a}$ to $R_{51e}$, $R_{61}$ to $R_{64}$, $R_{63a}$, $R_{63b}$, $R_{64a}$, and $R_{64b}$ may each independently be the same as defined in connection with $R_{51}$, wherein each of $R_{51a}$ to $R_{51e}$ may not be hydrogen, $R_{52a}$ to $R_{52e}$, $R_{65}$ to $R_{68}$, $R_{67a}$, $R_{67b}$, $R_{68a}$, and $R_{68b}$ may each independently be the same as defined in connection with $R_{52}$, wherein each of $R_{52a}$ to $R_{52e}$ may not be hydrogen, $R_{53a}$ to $R_{53e}$ may each independently be the same as defined in connection with $R_{53}$, wherein each of $R_{53a}$ to $R_{53e}$ may not be hydrogen, and

* indicates a binding site to a neighboring atom.

For example, in Formulae CY51-1 to CY51-22 and CY52-1 to CY52-22, $R_{51a}$ to $R_{51e}$ and $R_{52a}$ to $R_{52e}$ may each independently be:

a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof; or $—C(Q_1)(Q_2)(Q_3)$ or $—Si(Q_1)(Q_2)(Q_3)$, and $Q_1$ to $Q_3$ may each independently be a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof.

In Formulae CY51-16 and CY51-17, i) $Y_{63}$ may be O or S, and $Y_{64}$ may be $Si(R_{64a})(R_{64b})$, or ii) $Y_{63}$ may be $Si(R_{63a})(R_{63b})$, and $Y_{64}$ may be O or S.

In Formulae CY52-16 and CY52-17, i) $Y_{67}$ may be O or S, and $Y_{68}$ may be $Si(R_{68a})(R_{68b})$, or ii) $Y_{67}$ may be $Si(R_{67a})(R_{67b})$, and $Y_{68}$ may be O or S, but embodiments of the present disclosure are not limited thereto.

In one embodiment, the third compound may be represented by one of Formulae 3-1 to 3-5:

3-1

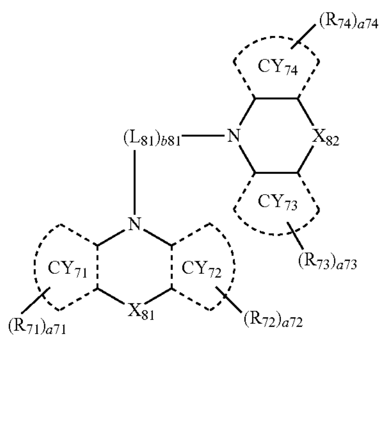

-continued 3-2

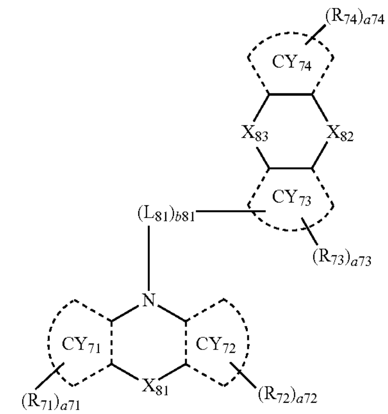

3-3

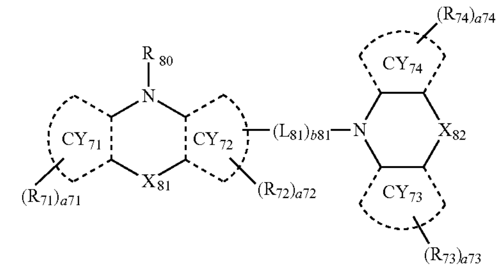

3-4

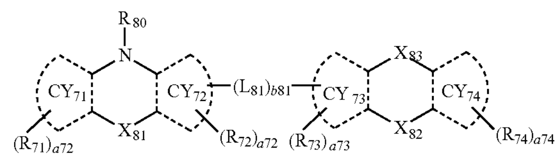

3-5

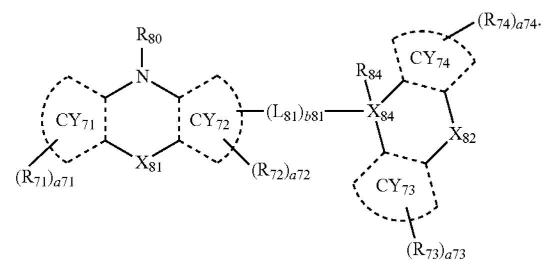

In Formulae 3-1 to 3-5, ring $CY_{71}$, ring $CY_{72}$, $X_{81}$, $R_{71}$, $R_{72}$, a71, and a72 may each independently be the same as described herein, ring $CY_{73}$, ring $CY_4$, $R_{73}$, $R_{74}$, a73, and a74 may each independently be the same as defined in connection with ring $CY_1$, ring $CY_{72}$, $R_{71}$, $R_{72}$, a71, and a72, $L_{81}$ may be $*—C(Q_4)(Q_5)-*'$, $*—Si(Q_4)(Q_5)-*'$, a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, wherein $Q_4$ and Q may each independently be the same as defined in connection with $Q_1$, $R_{10a}$ may be the same as described herein above.

b81 may be an integer from 0 to 5, wherein, when b81 is O, $*-(L_{81})_{b81}-*'$ may be a single bond, and when b81 is 2 or more, two or more $L_{81}$(s) may be identical to or different from each other, $X_{82}$ may be a single bond, O, S, $N(R_{82})$, $B(R_{82})$, $C(R_{82a})(R_{82b})$, or $Si(R_{82a})(R_{82b})$, $X_{83}$ may be a single bond, O, S, $N(R_{83})$, $B(R_{83})$, $C(R_{83a})(R_{83b})$, or $Si(R_{83a})(R_{83b})$, $X_{82}$ and $X_{83}$ in Formulae 3-2 and 3-4 may not be a single bond at the same time, $X_{84}$ may be C or Si, $R_{80}$, $R_{82}$, $R_{83}$, $R_{82a}$, $R_{82b}$, $R_{83a}$, $R_{83b}$, and $R_{84}$ may each independently be the same as defined in connection with $R_{81}$, and

* and *' each indicate a binding site to a neighboring atom.

For example, $L_{81}$ may be:

*—$C(Q_4)(Q_5)$-*' or *—$Si(Q_4)(Q_5)$*', or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenyl fluorenyl group, a carbazolyl group, a phenylcarbazolyl group, a dibenzofuranyl group, a dibenzothiophenyl group, a dibenzosilolyl group, a dimethyl dibenzosilolyl group, a diphenyl dibenzosilolyl group, —$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, —$P(=O)(Q_{31})(Q_{32})$, or any combination thereof, and $Q_4$, $Q_5$, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group, but embodiments of the present disclosure are not limited thereto.

In one embodiment, a group represented by,

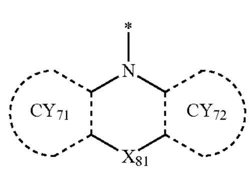

in Formulae 3-1 and 3-2 may be a group represented by one of Formulae CY71-1(1) to CY71-1(8), a group represented by

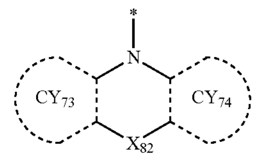

in Formulae 3-1 and 3-3 may be a group represented by one of Formulae CY71-2(1) to CY71-2(8), a group represented by

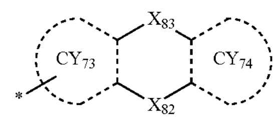

in Formulae 3-2 and 3-4 may be a group represented by one of Formulae CY71-3(1) to CY71-3(32), a group represented by

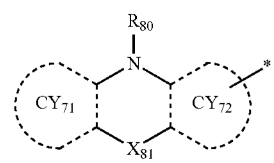

in Formulae 3-3 to 3-5 may be a group represented by one of Formulae CY71-4(1) to CY71-4(32), and/or a group represented by

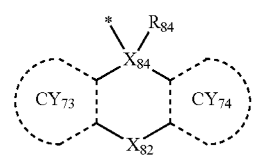

in Formula 3-5 may be a group represented by one of Formulae CY71-5(1) to CY71-5(8), but embodiments of the present disclosure are not limited thereto:

CY71-1(1)

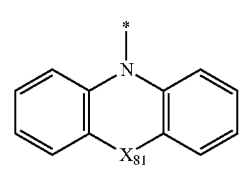

CY71-1(2)

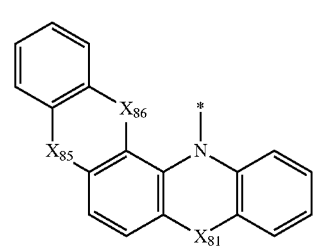

CY71-1(3)
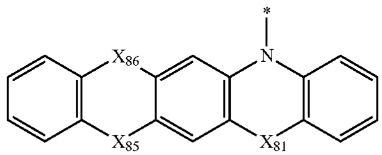
CY71-1(4)
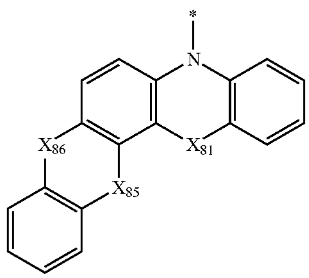
CY71-1(5)
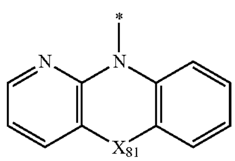
CY71-1(6)
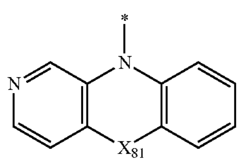
CY71-1(7)
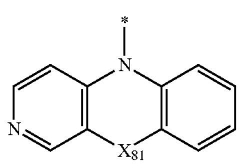
CY71-1(8)
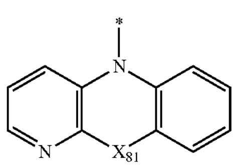
CY71-2(1)
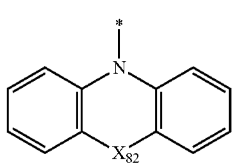
CY71-2(2)
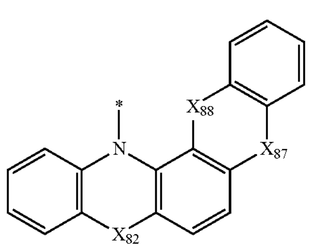
CY71-2(3)
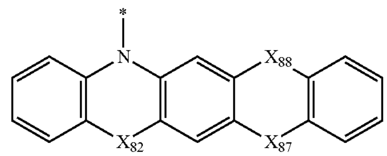
CY71-2(4)
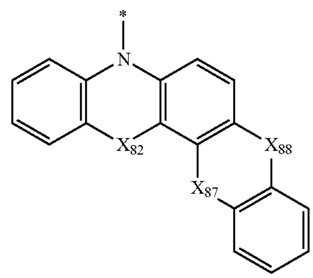
CY71-2(5)
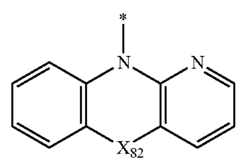
CY71-2(6)
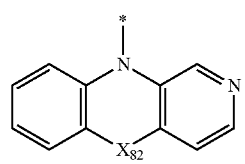
CY71-2(7)
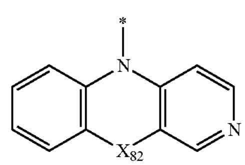
CY71-2(8)
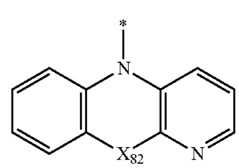
CY71-3(1)
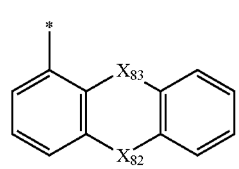
CY71-3(2)
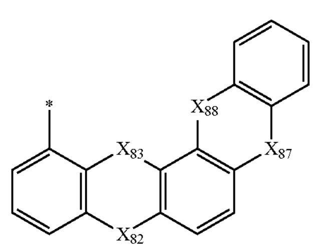

-continued
CY71-3(3)
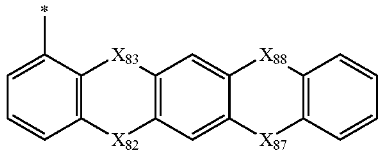
CY71-3(4)
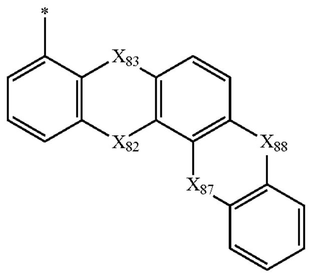
CY71-3(5)
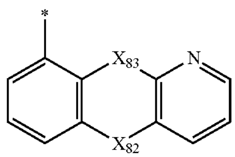
CY71-3(6)
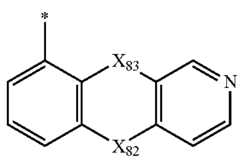
CY71-3(7)
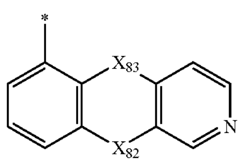
CY71-3(8)
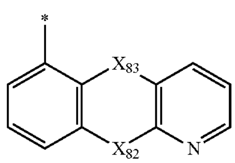
CY71-3(9)
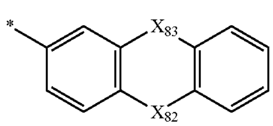
CY71-3(10)
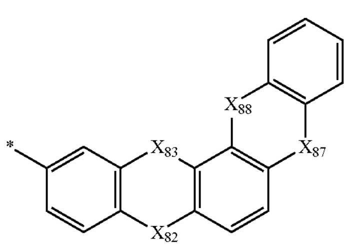
CY71-3(11)
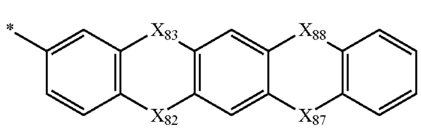
-continued
CY71-3(12)
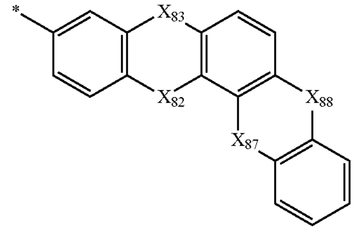
CY71-3(13)
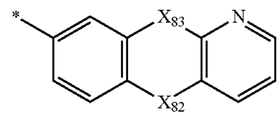
CY71-3(14)
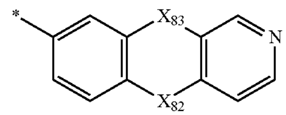
CY71-3(15)
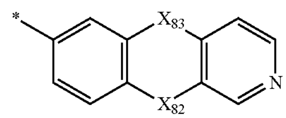
CY71-3(16)
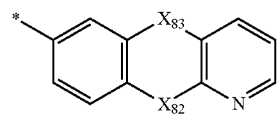
CY71-3(17)
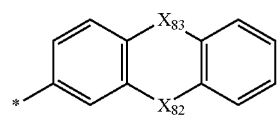
CY71-3(18)
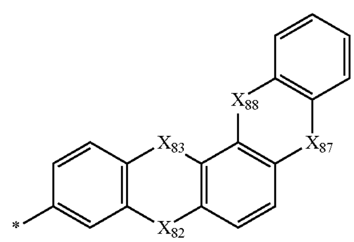
CY71-3(19)
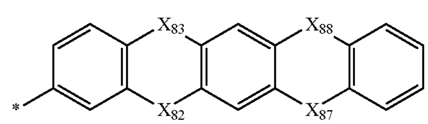
CY71-3(20)
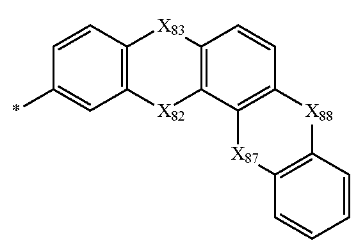
CY71-3(21)
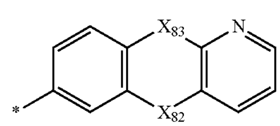

CY71-3(22)
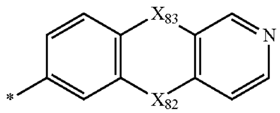
CY71-3(23)
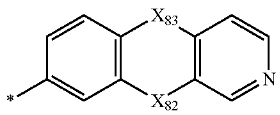
CY71-3(24)
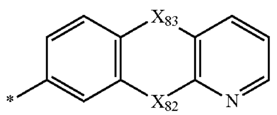
CY71-3(25)
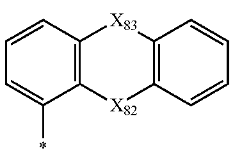
CY71-3(26)
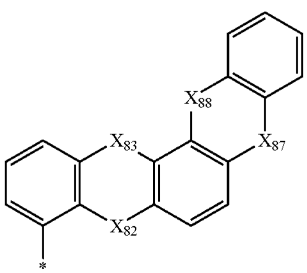
CY71-3(27)
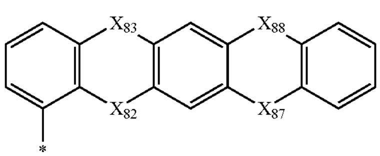
CY71-3(28)
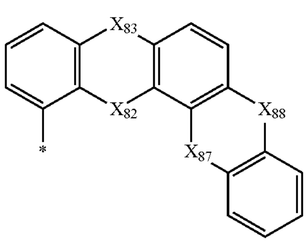
CY71-3(29)
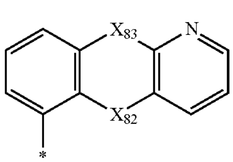
CY71-3(30)
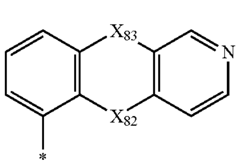
CY71-3(31)
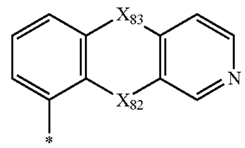
CY71-3(32)
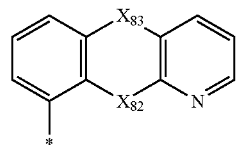
CY71-4(1)
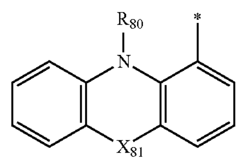
CY71-4(2)
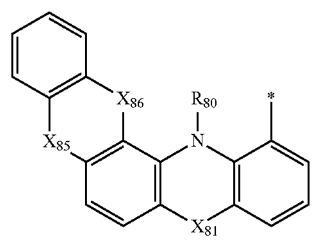
CY71-4(3)
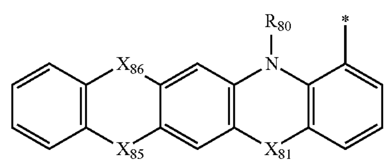
CY71-4(4)
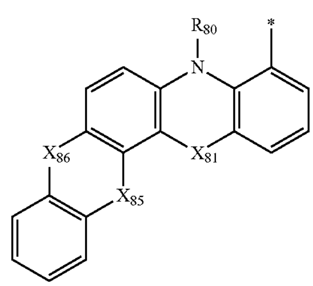
CY71-4(5)
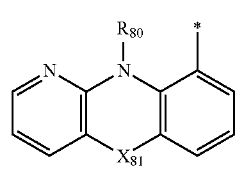
CY71-4(6)
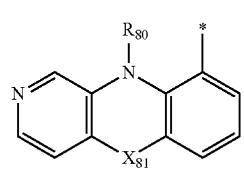

-continued
CY71-4(7)
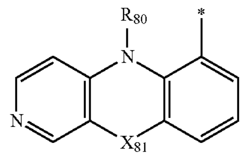
CY71-4(8)
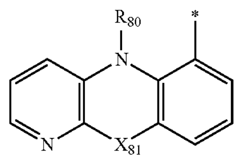
CY71-4(9)
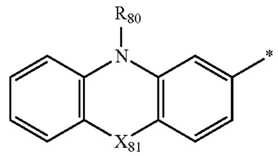
CY71-4(10)
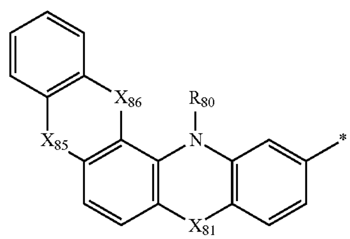
CY71-4(11)
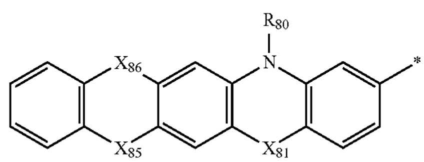
CY71-4(12)
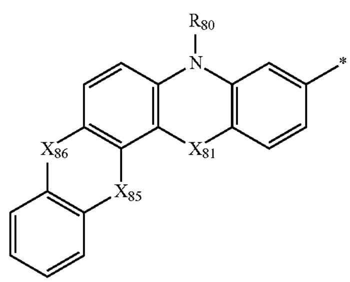
CY71-4(13)
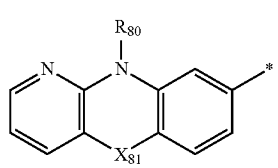
CY71-4(14)
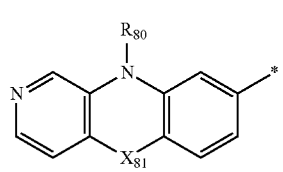
-continued
CY71-4(15)
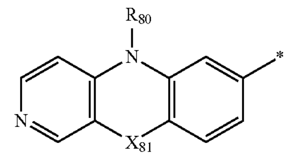
CY71-4(16)
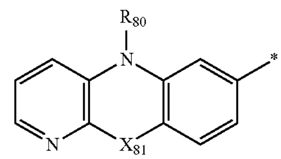
CY71-4(17)
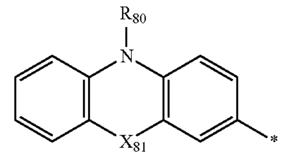
CY71-4(18)
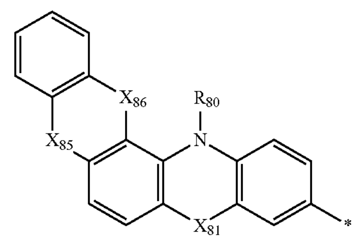
CY71-4(19)
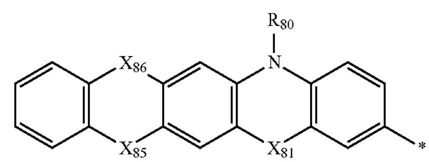
CY71-4(20)
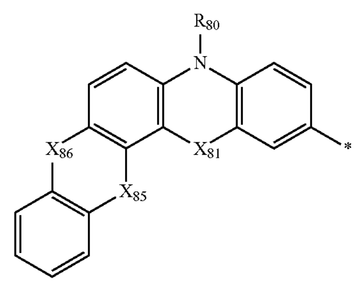
CY71-4(21)
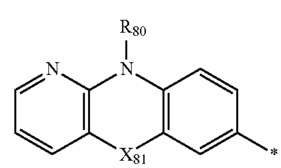
CY71-4(22)
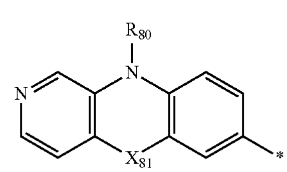

CY71-4(23)
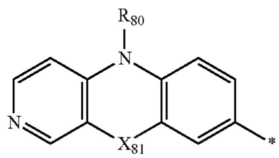
CY71-4(24)
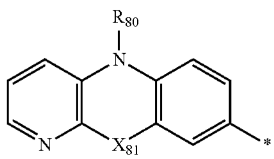
CY71-4(25)
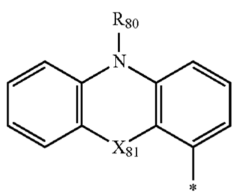
CY71-4(26)
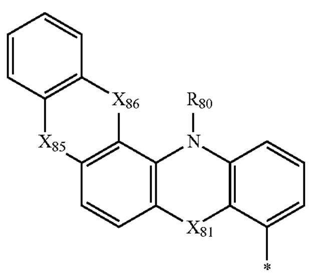
CY71-4(27)
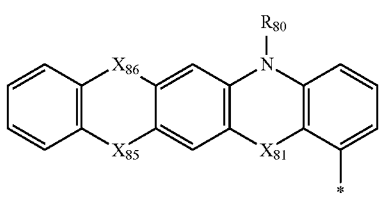
CY71-4(28)
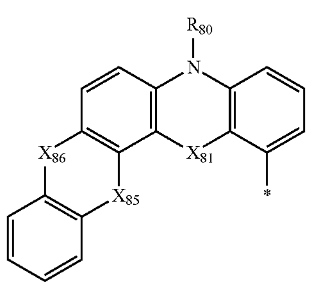
CY71-4(29)
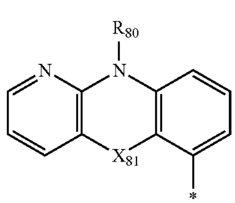
CY71-4(30)
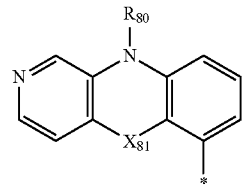
CY71-4(31)
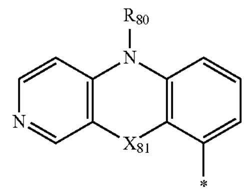
CY71-4(32)
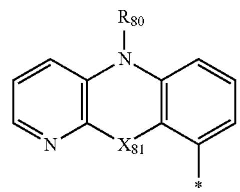
CY71-5(1)
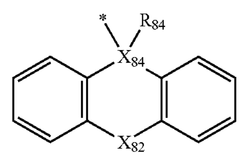
CY71-5(2)
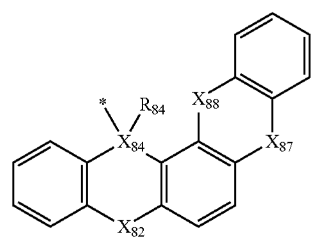
CY71-5(3)
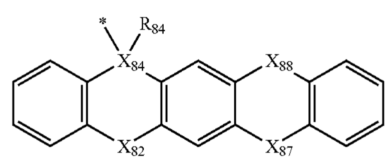
CY71-5(4)
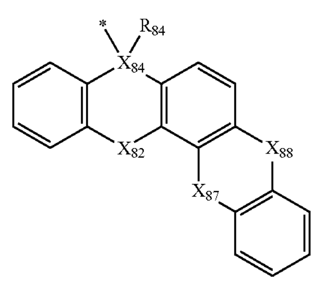

-continued

CY71-5(5)

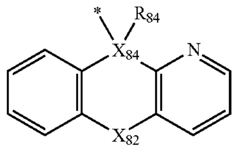

CY71-5(6)

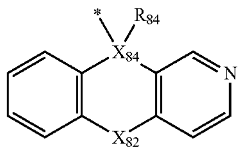

CY71-5(7)

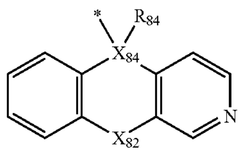

CY71-5(8)

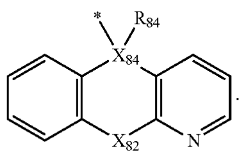

In Formulae CY71-1(1) to CY71-1(8), CY71-2(1) to CY71-2(8), CY71-3(1) to CY71-3(32), CY71-4(1) to CY71-4(32), and CY71-5(1) to CY71-5(8), $X_{81}$ to $X_{84}$, $R_{80}$, and $R_{84}$ may each independently be the same as described herein, $X_{85}$ may be a single bond, O, S, $N(R_{85})$, $B(R_{85})$, $C(R_{85a})(R_{85b})$, or $Si(R_{85a})(R_{85b})$, $X_{86}$ may be a single bond, O, S, $N(R_{86})$, $B(R_{86})$, $C(R_{86a})(R_{86b})$, or $Si(R_{86a})(R_{86b})$, $X_{85}$ and $X_{86}$ in Formulae CY71-1(1) to CY71-1(8) and CY71-4(1) to CY71-4(32) may not be a single bond at the same time, $X_{87}$ may be a single bond, O, S, $N(R_{87})$, $B(R_{87})$, $C(R_{87a})(R_{87b})$, or $Si(R_{87a})(R_{87b})$, $X_{88}$ may be a single bond, O, S, $N(R_{88})$, $B(R_{88})$, $C(R_{88a})(R_{88b})$, or $Si(R_{88a})(R_{88b})$, $X_{87}$ and $X_{88}$ in Formulae CY71-2(1) to CY71-2(8), CY71-3(1) to CY71-3(32), and CY71-5(1) to CY71-5(8) may not be a single bond at the same time, and $R_{85}$ to $R_{88}$, $R_{85a}$, $R_{85b}$, $R_{86a}$, $R_{86b}$, $R_{87a}$, $R_{87b}$, $R_{88a}$, and $R_{88b}$ may each independently be the same as defined in connection with $R_{81}$.

In Formula 1, $L_2$ may not be linked to neighboring $R_1$ and/or $R_3$. In other words, Formula 1 has one tridentate ligand and one monodentate ligand (for example, $L_2$).

In one embodiment, the first compound may be selected from Compounds BD1 to BD105, but embodiments of the present disclosure are not limited thereto:

BD1

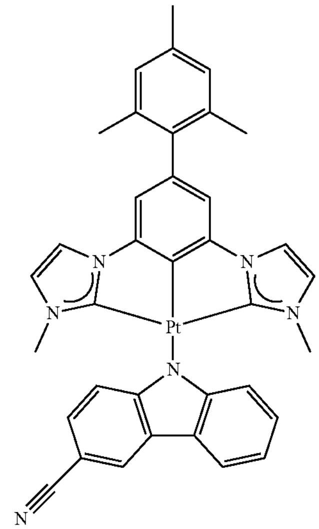

BD2

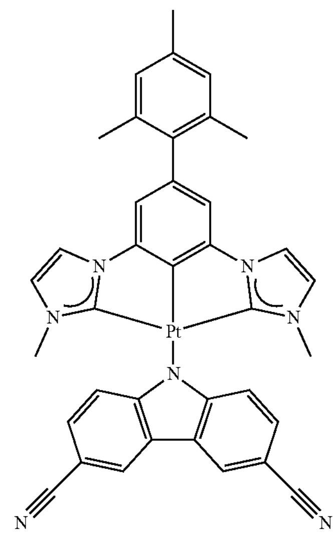

BD3

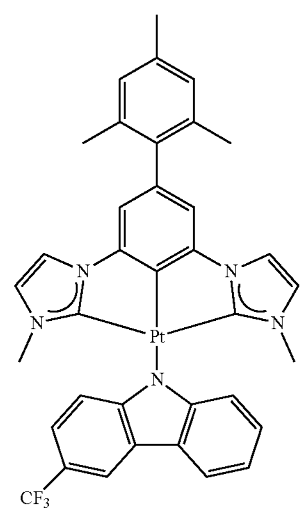

-continued
BD4
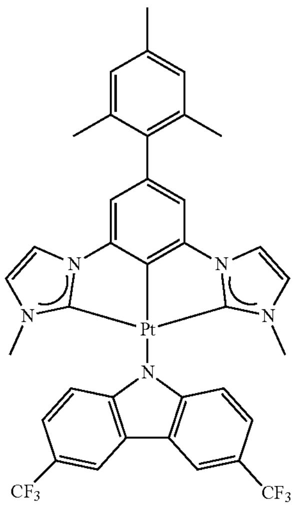
BD5
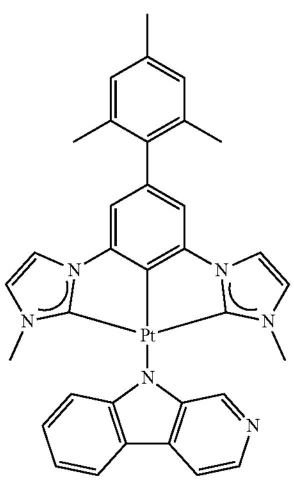
BD6
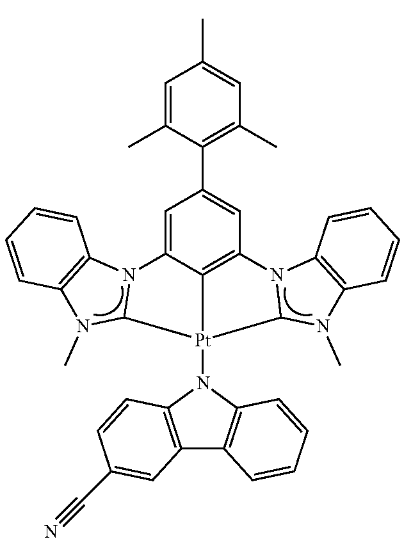
-continued
BD7
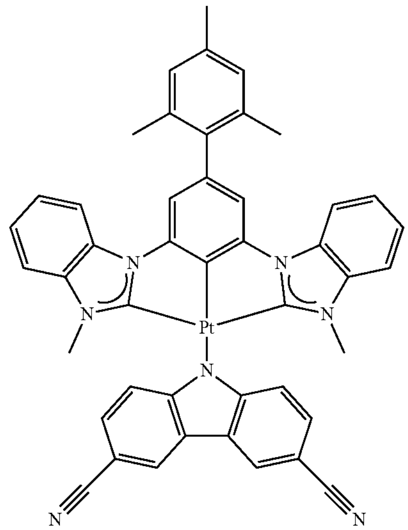
BD8
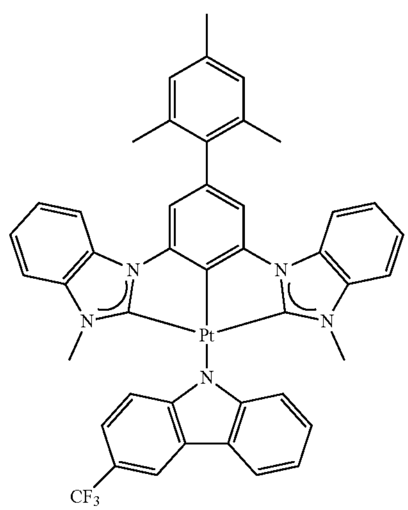
BD9
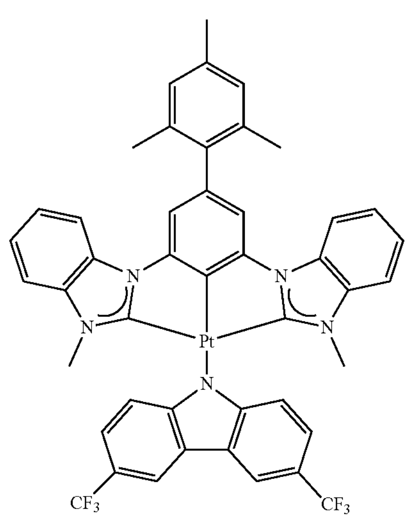

-continued
BD10
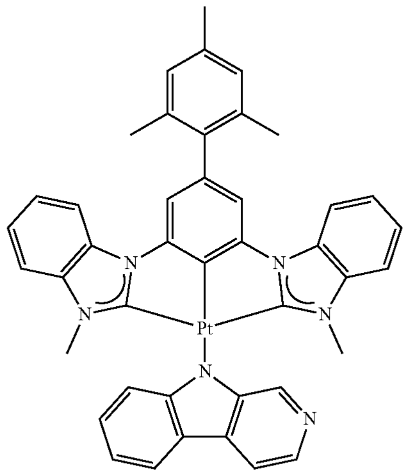
BD11
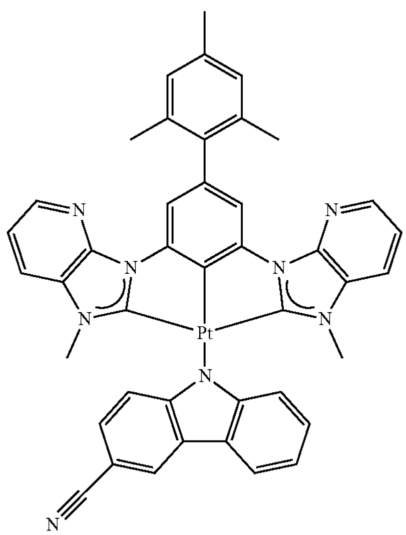
BD12
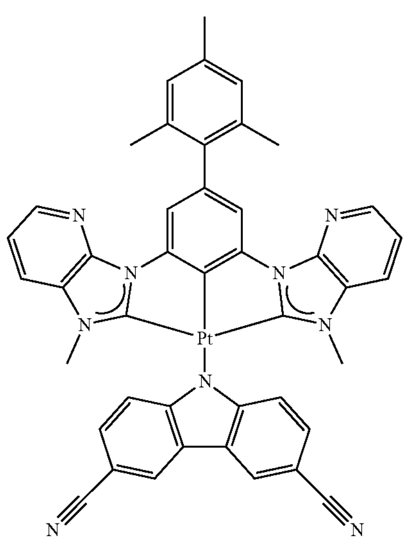
-continued
BD13
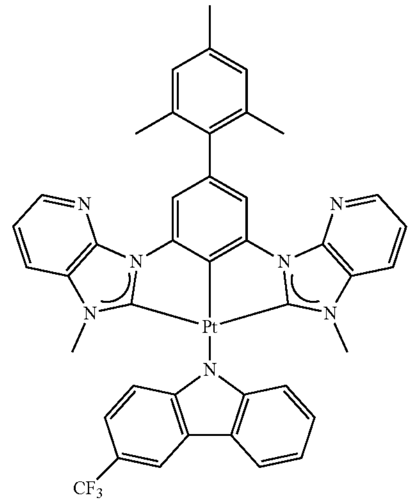
BD14
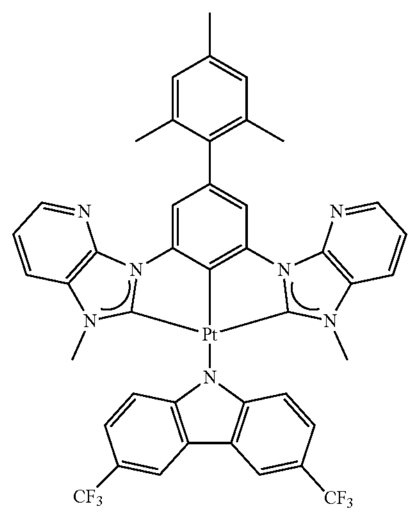
BD15
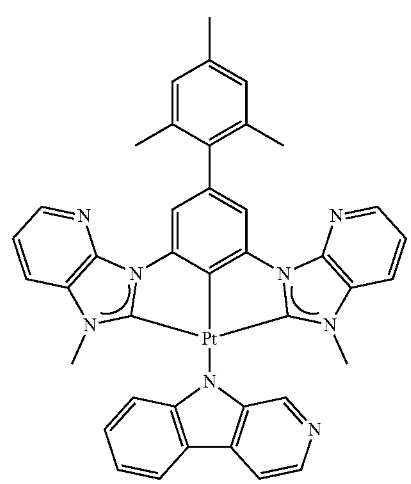

BD16
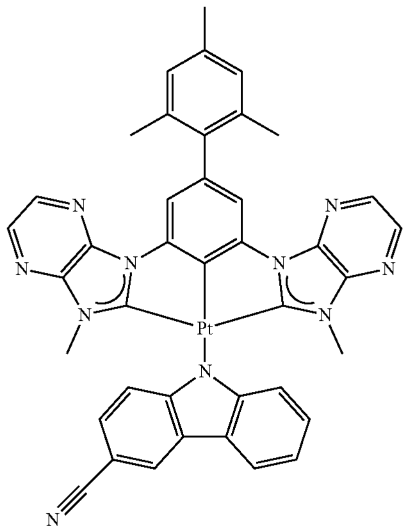
BD17
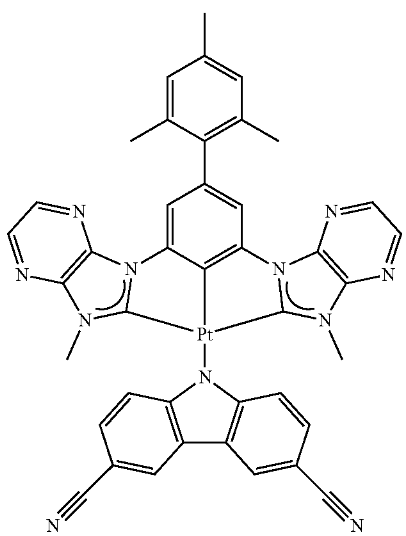
BD18
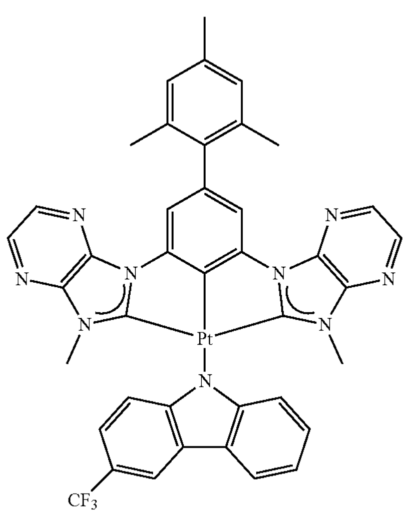
BD19
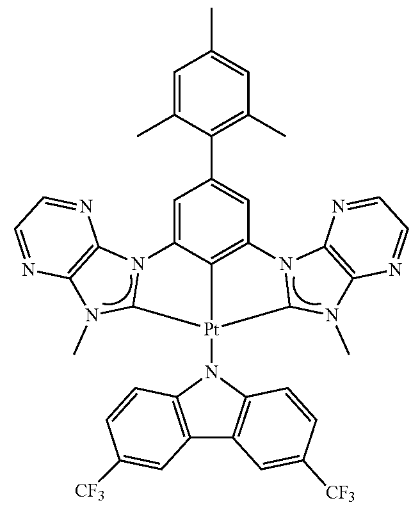
BD20
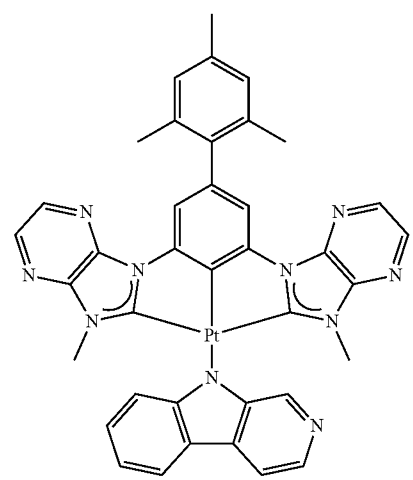
BD21
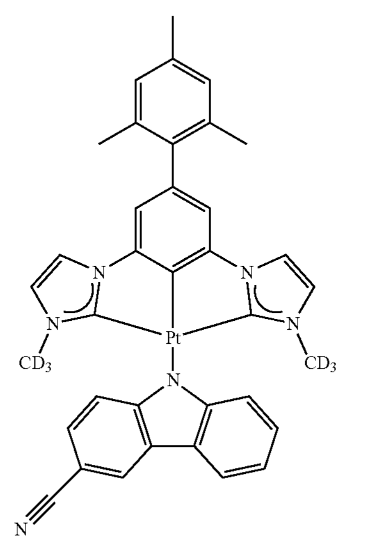

-continued
BD22
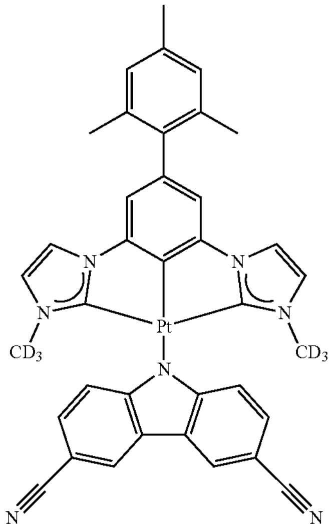
BD23
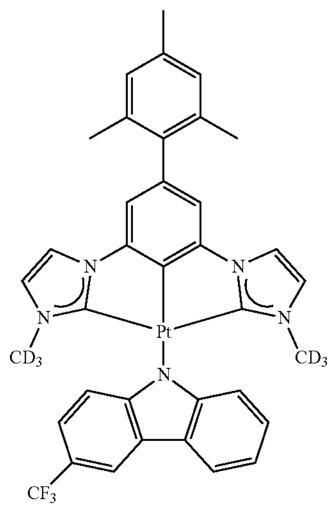
BD24
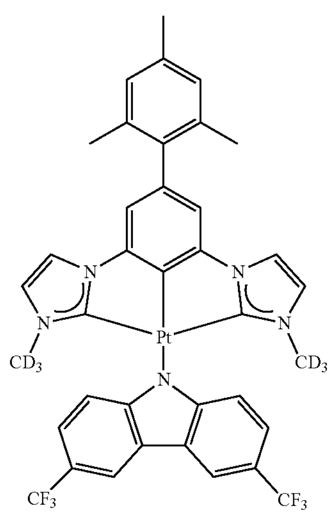
-continued
BD25
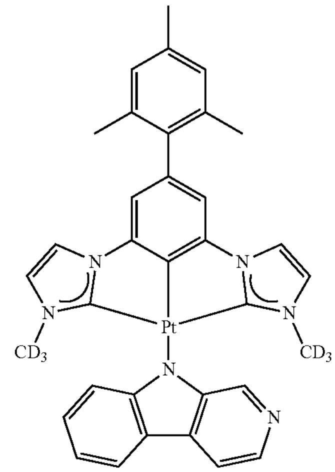
BD26
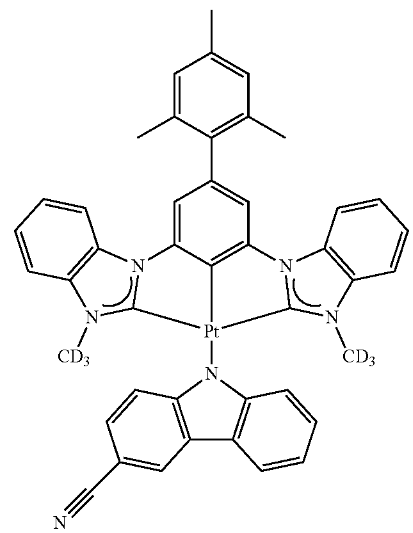
BD27
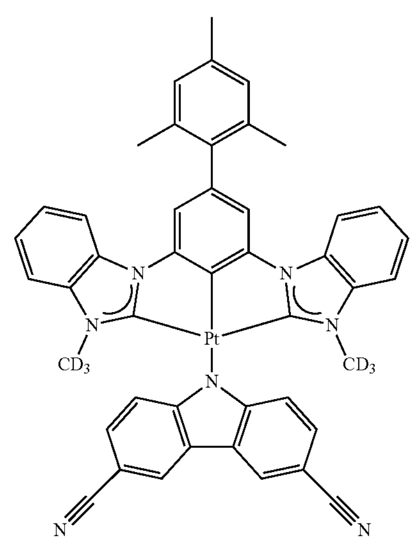

BD28
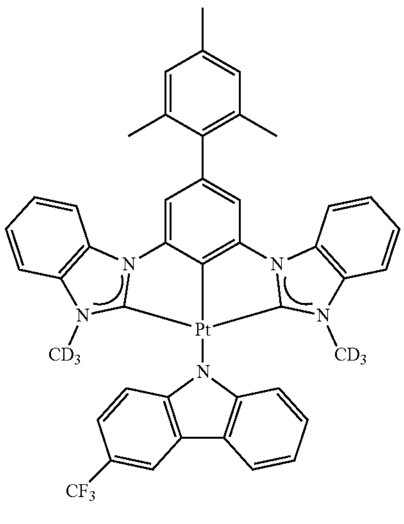
BD29
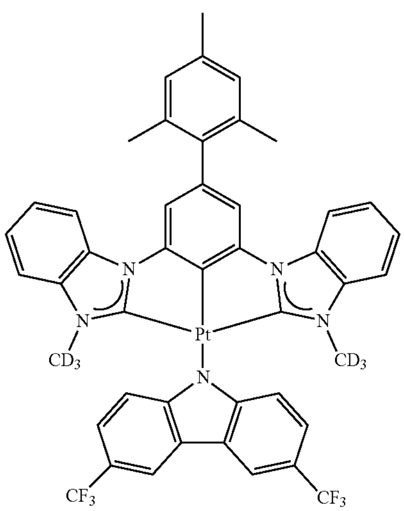
BD30
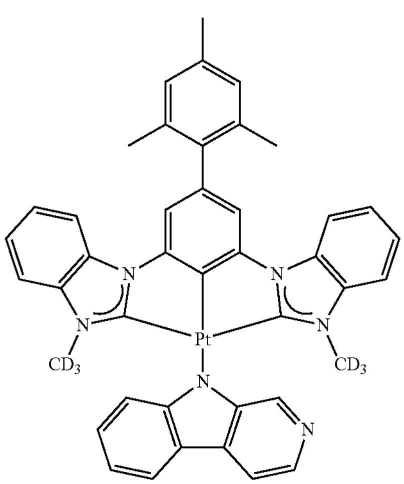
BD31
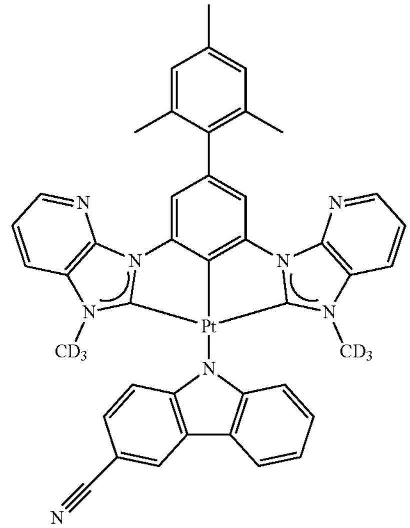
BD32
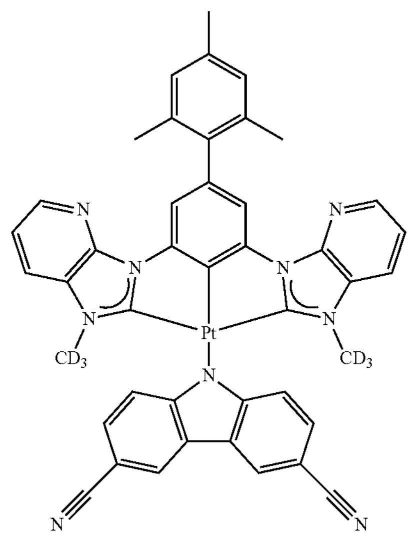
BD33
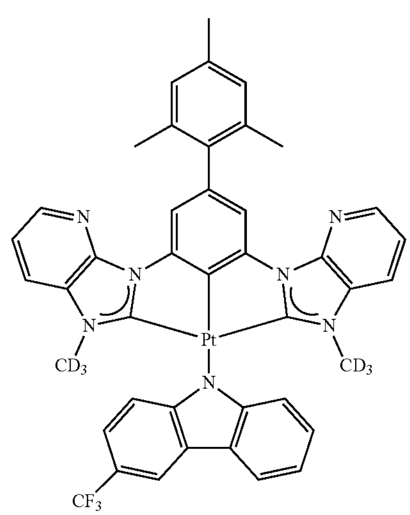

-continued
BD34
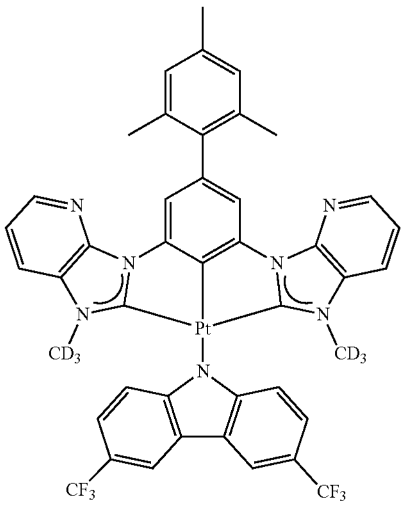
BD35
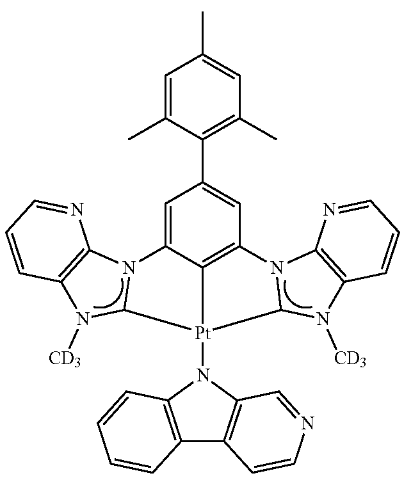
BD36
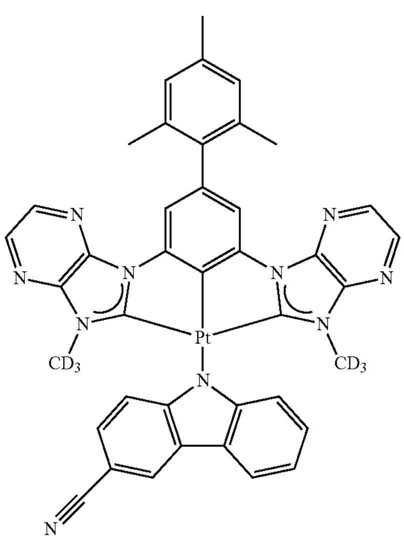
-continued
BD37
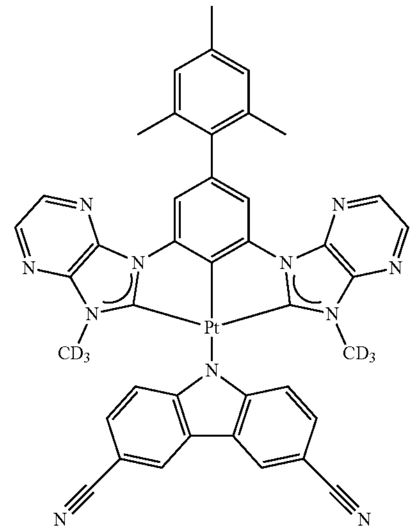
BD38
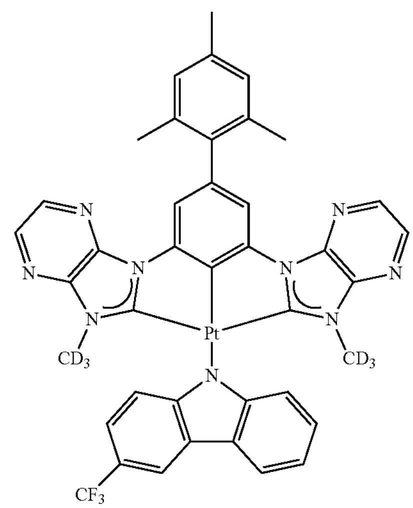
BD39
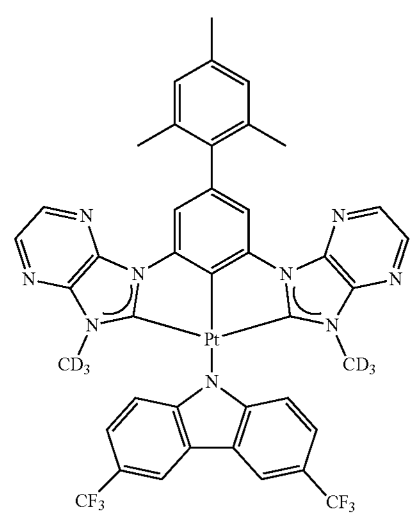

-continued
BD40
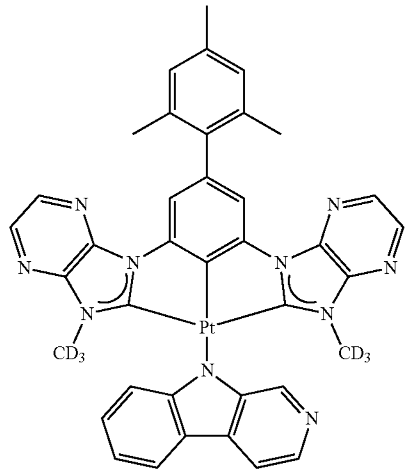
BD41
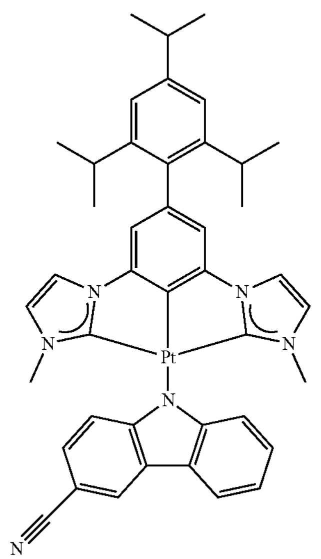
BD42
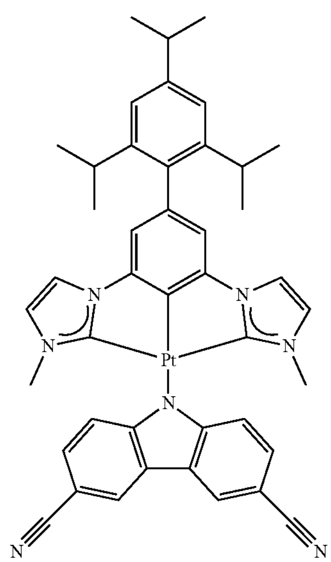
-continued
BD43
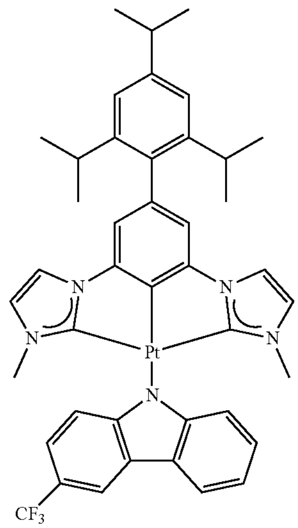
B44
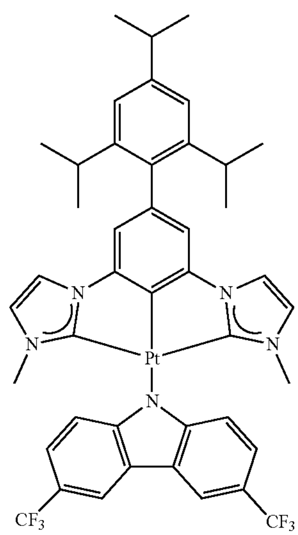
BD45
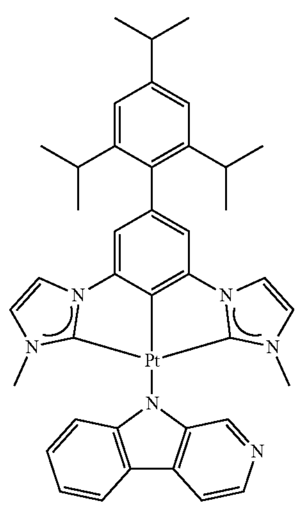

BD46
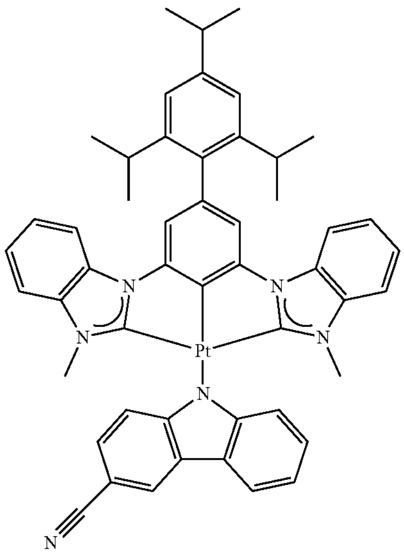
BD47
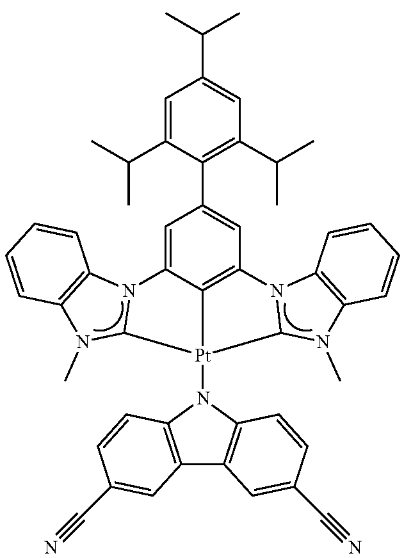
BD48
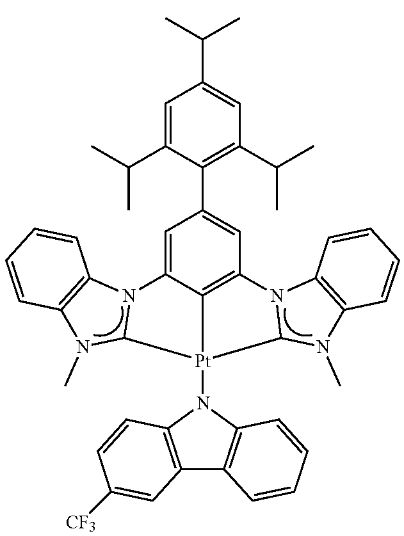
BD49
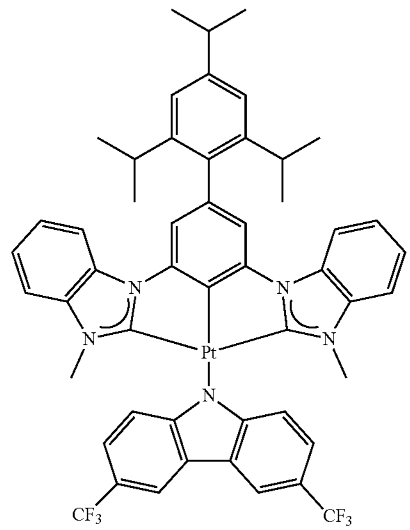
BD50
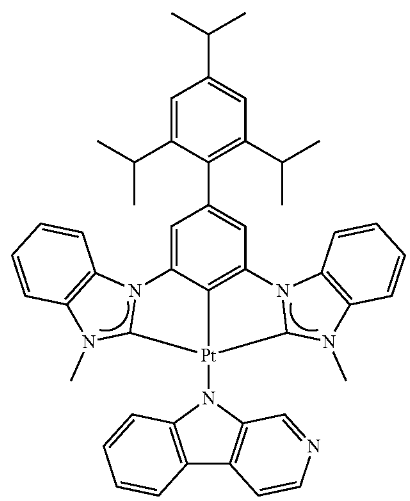
BD51
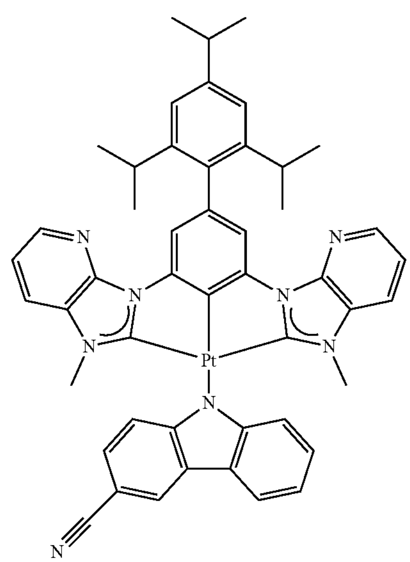

-continued
BD52
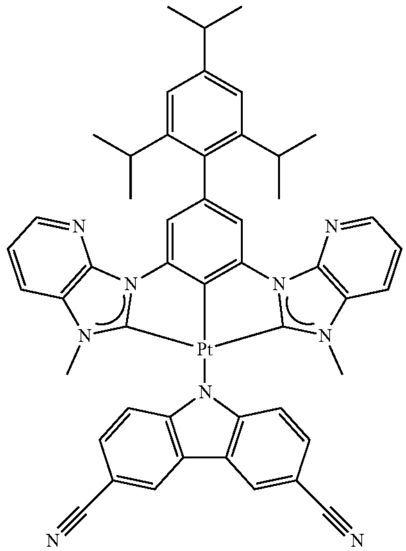
BD53
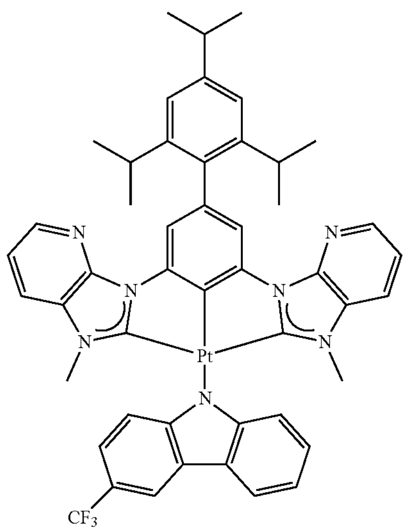
BD54
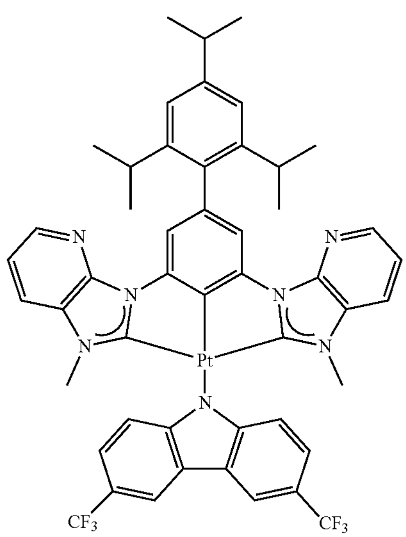
-continued
BD55
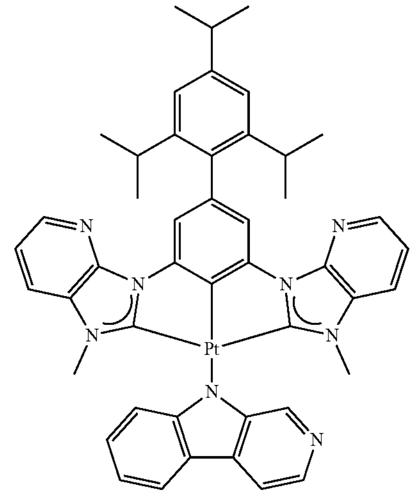
BD56
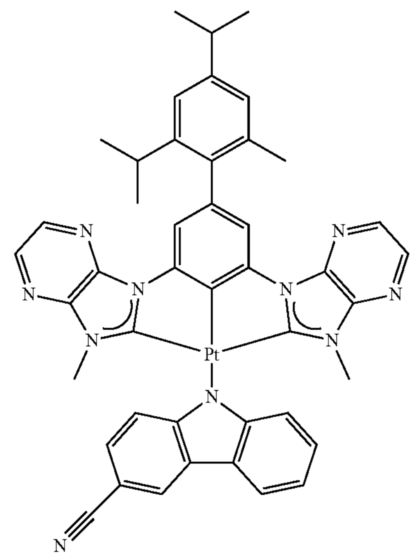
BD57
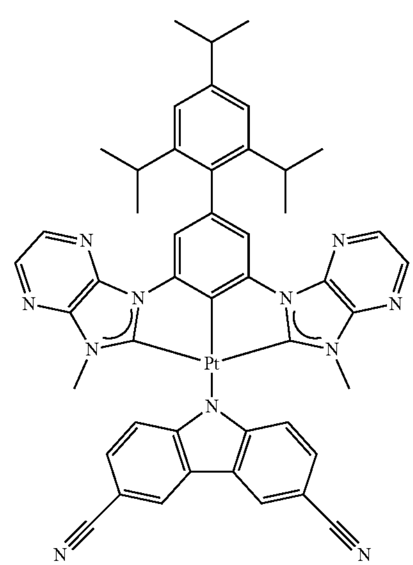

-continued
BD58
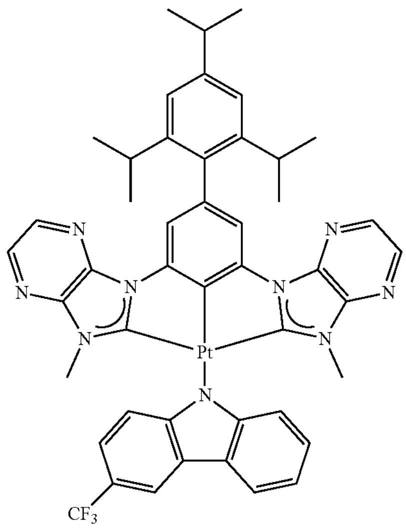
BD59
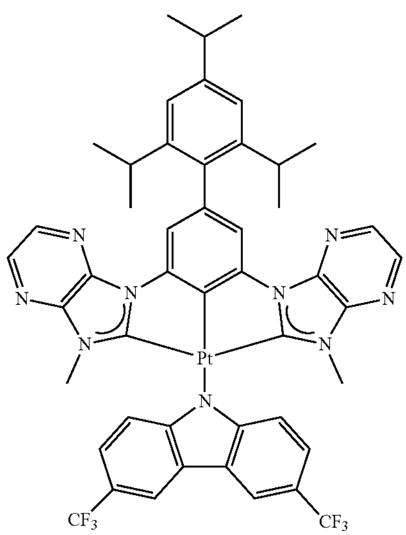
BD60
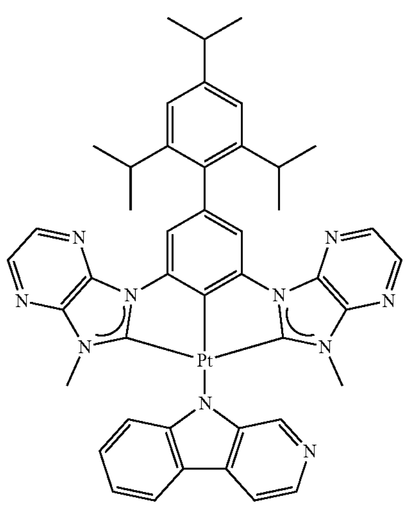
-continued
BD61
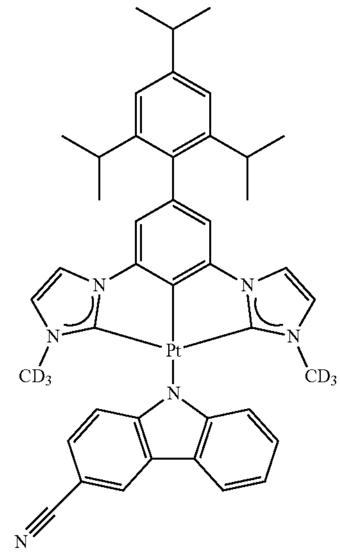
BD62
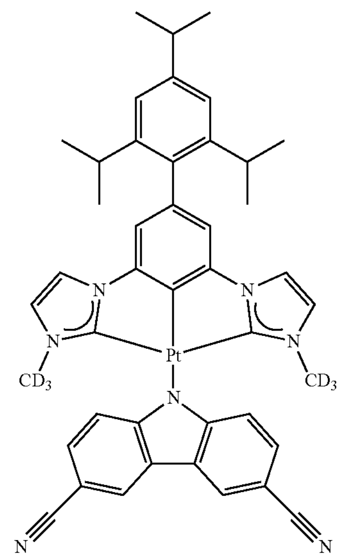
BD63
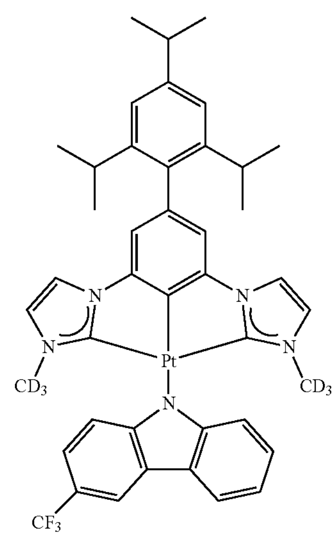

-continued
BD64
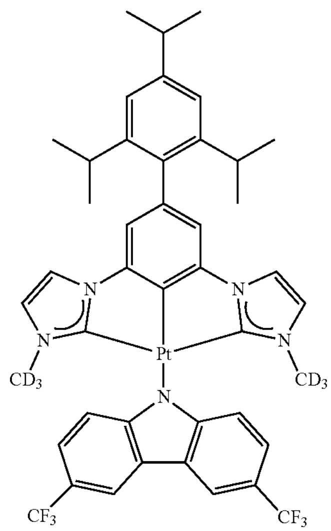
BD65
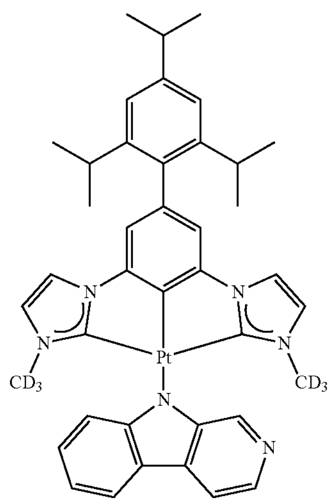
BD66
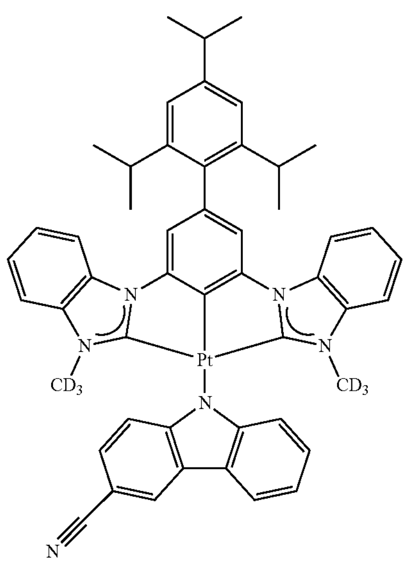
-continued
BD67
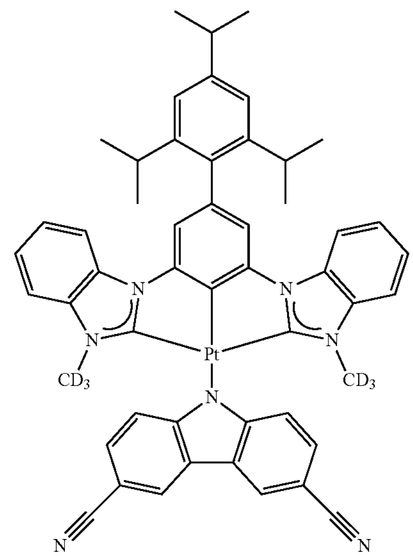
BD68
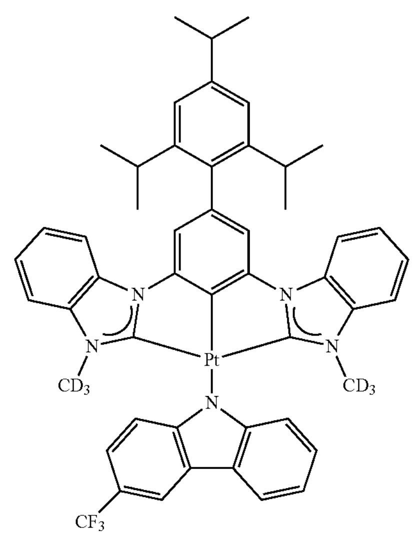
BD69
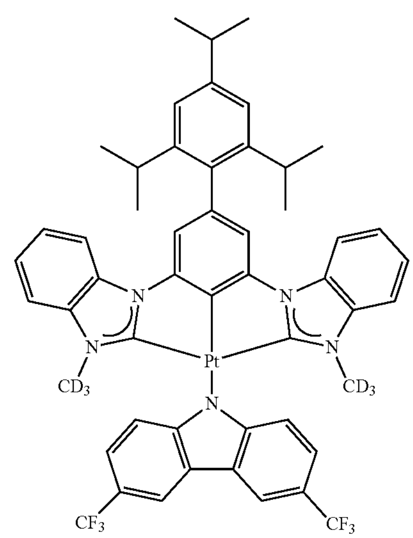

-continued
BD70
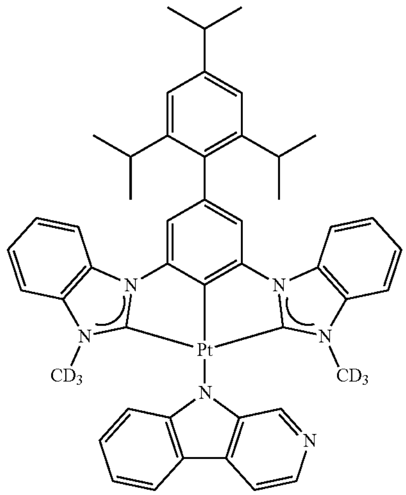
BD71
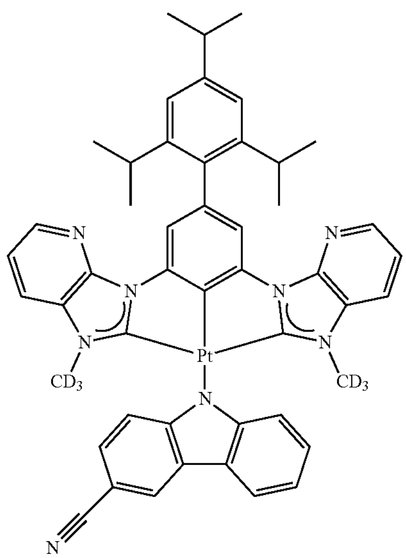
BD72
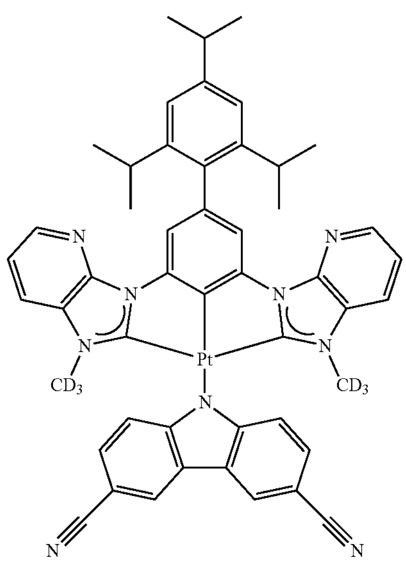
-continued
BD73
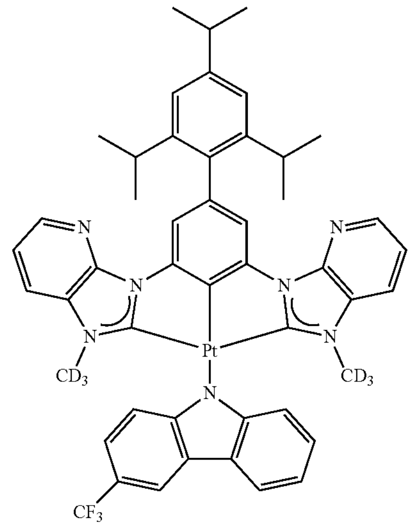
BD74
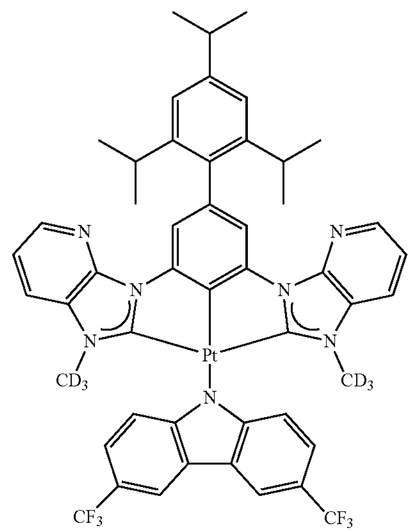
BD75
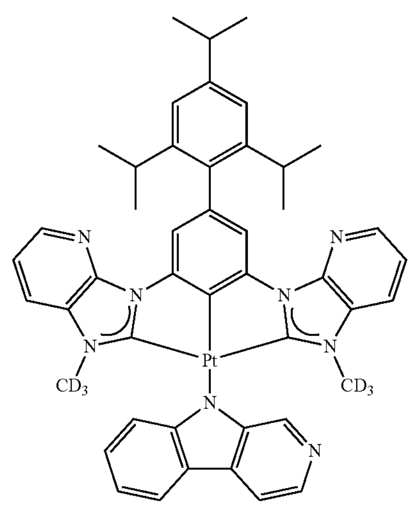

-continued
BD76
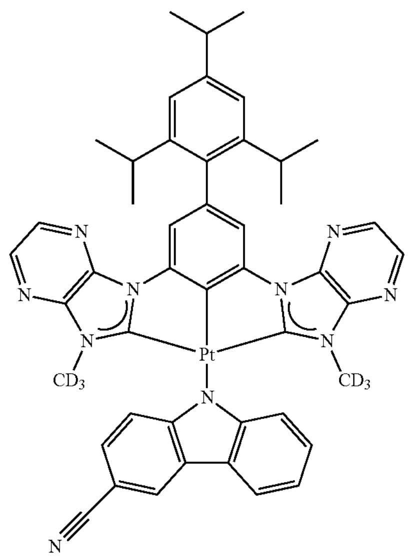
BD77
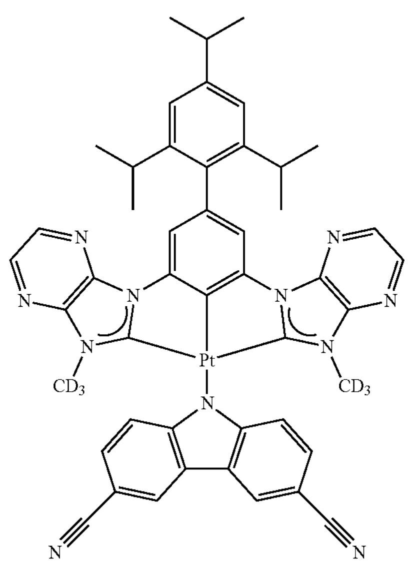
BD78
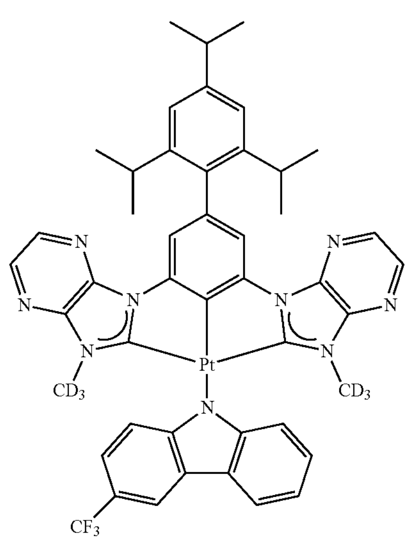
-continued
BD79
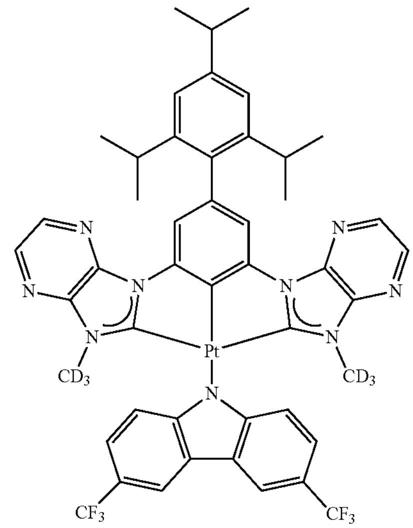
BD80
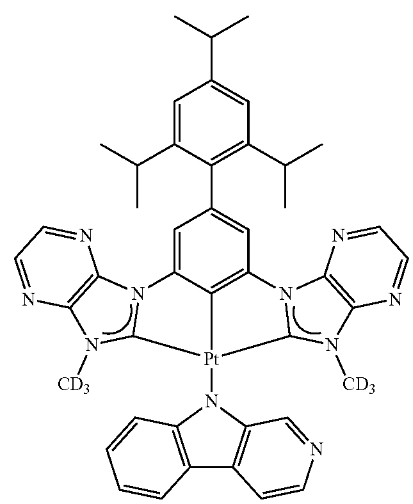
BD81
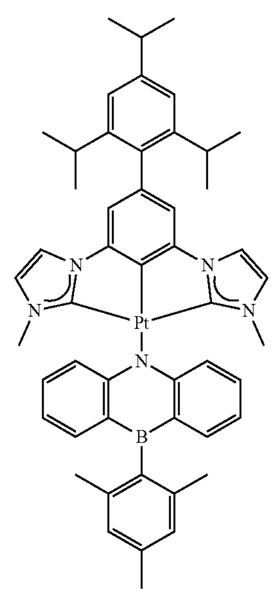

-continued
BD82
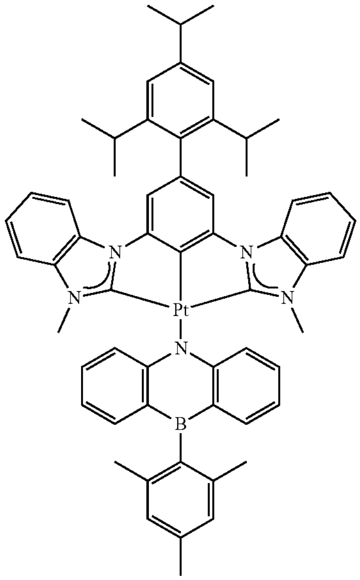
BD83
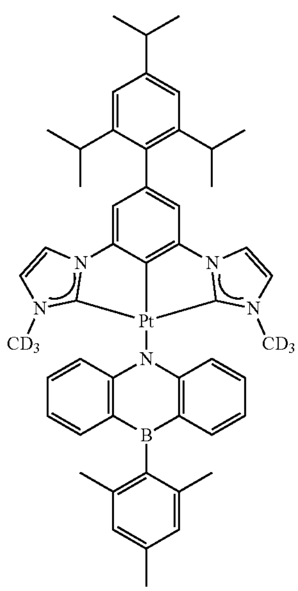
-continued
BD84
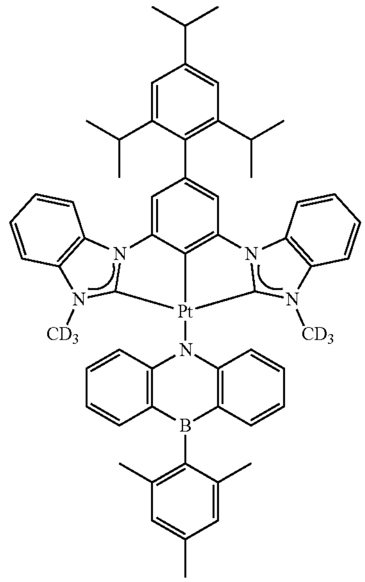
BD85
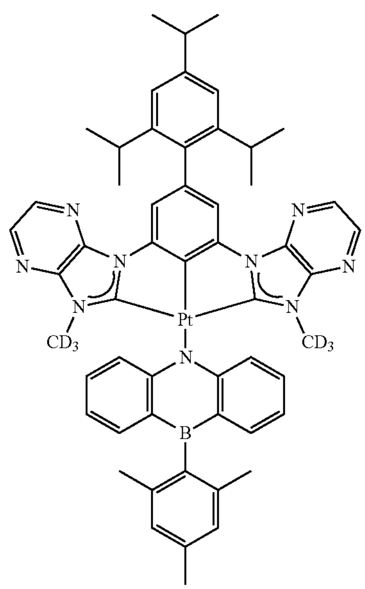

-continued
BD86
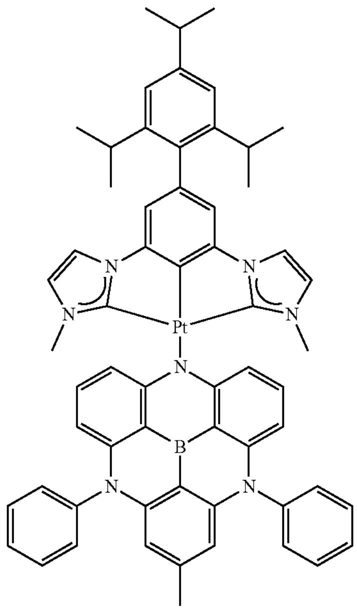
BD87
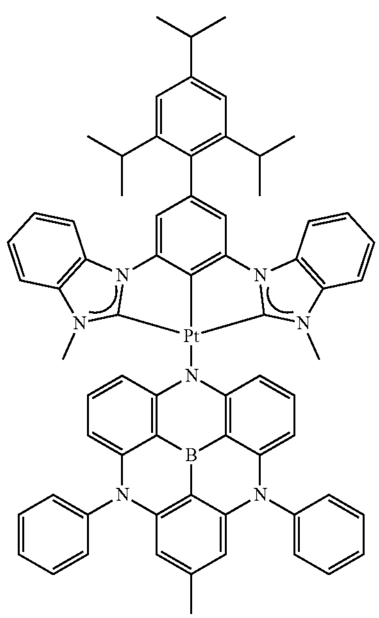
-continued
BD88
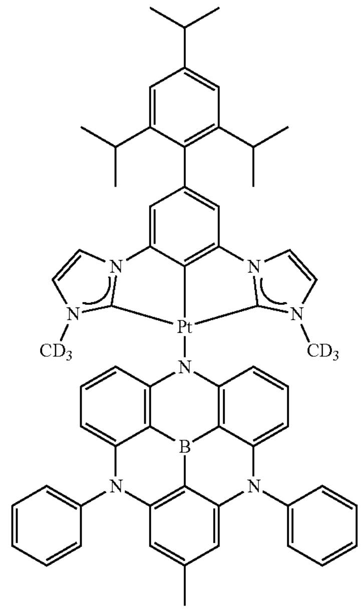
BD89
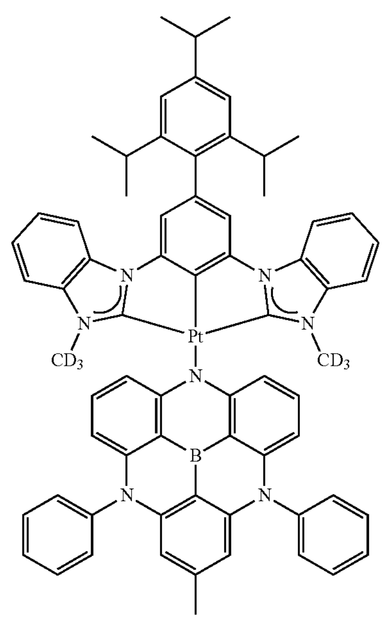

-continued
BD90
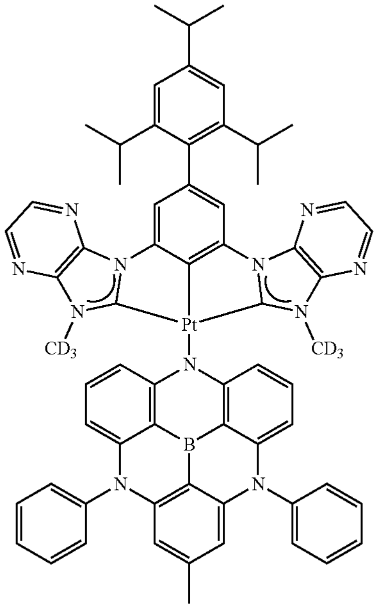
BD91
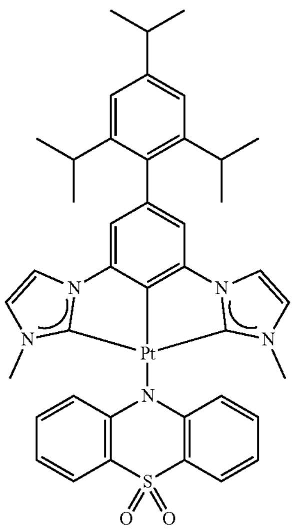
BD92
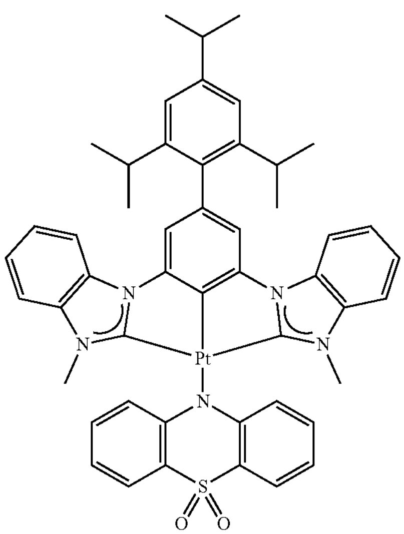
-continued
BD93
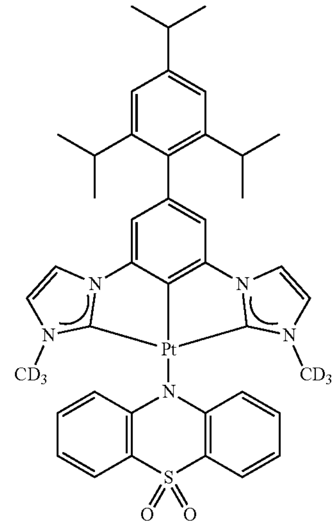
BD94
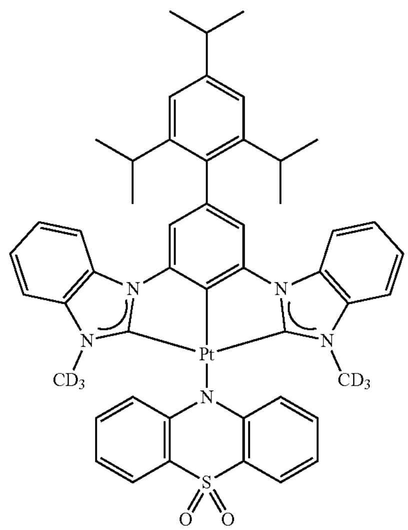
BD95
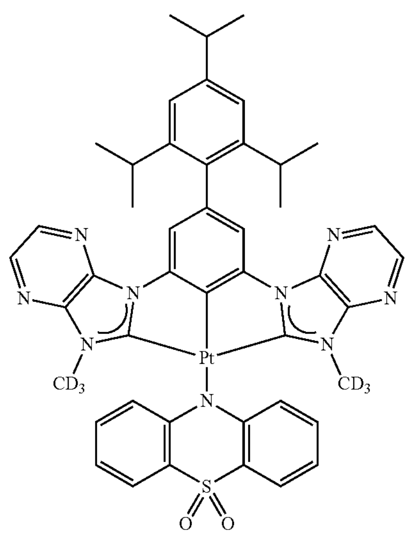

-continued
BD96
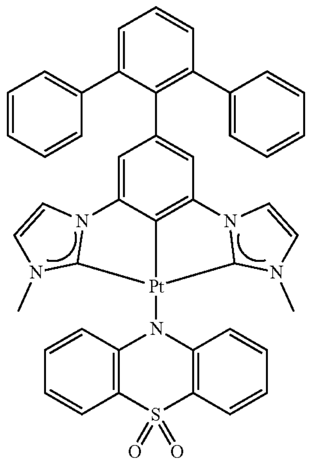
BD97
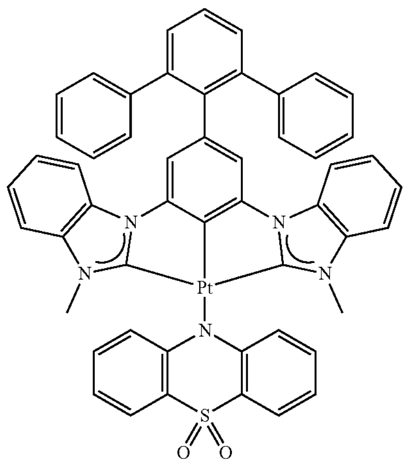
BD98
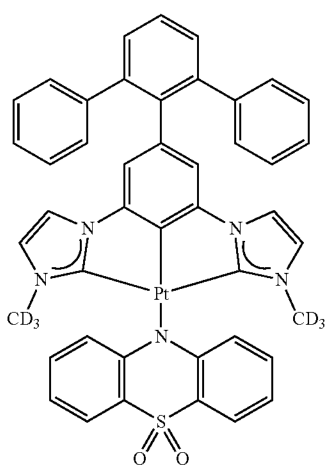
-continued
BD99
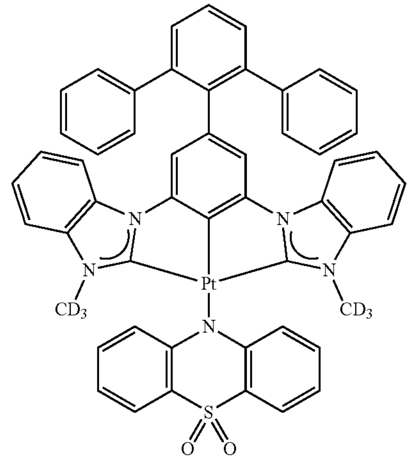
BD100
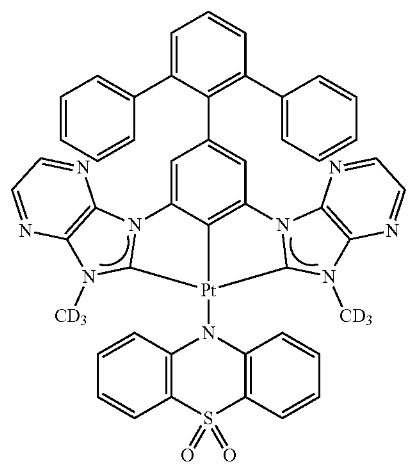
BD101
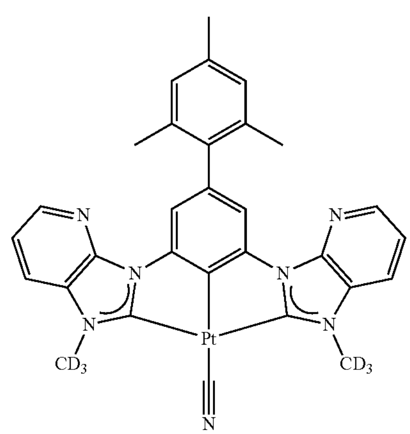

BD102
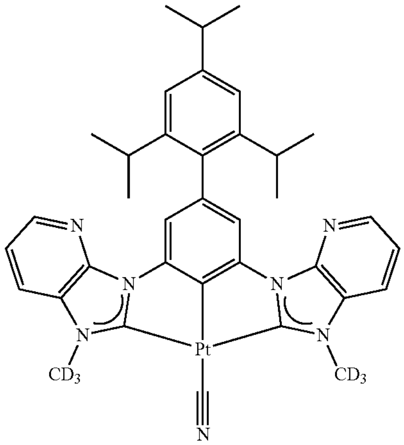
BD103
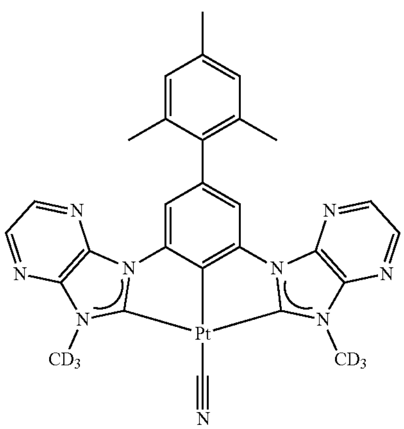
BD104
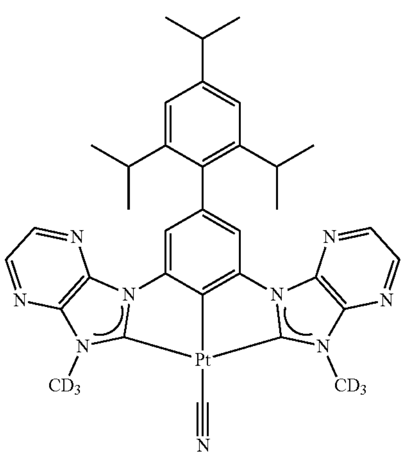
BD105
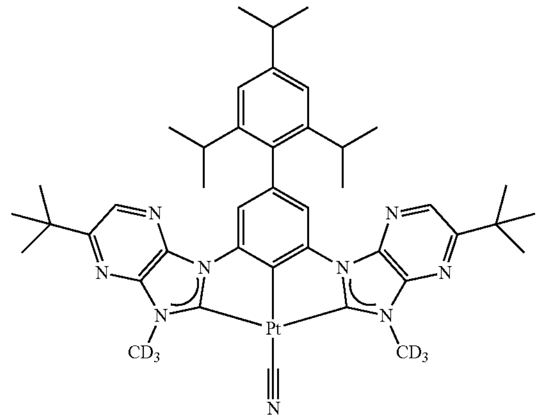
In one or more embodiments, the second compound may be selected from Compounds ETH1 to ETH80, but embodiments of the present disclosure are not limited thereto:
ETH1
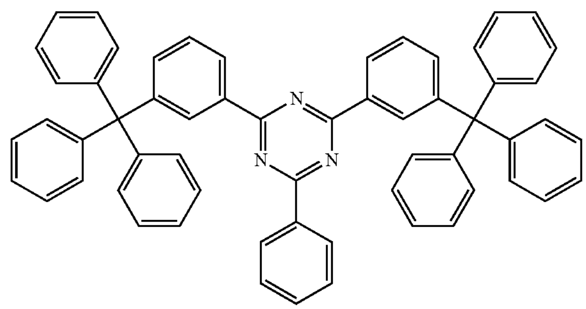
ETH2
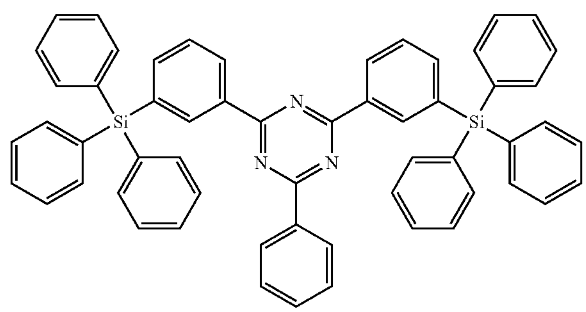
ETH3
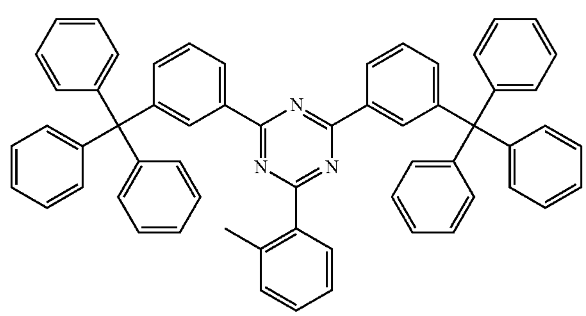

-continued
ETH4
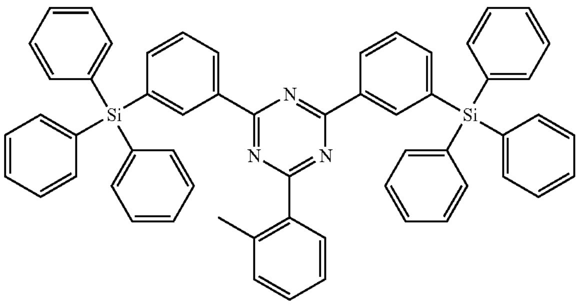
ETH5
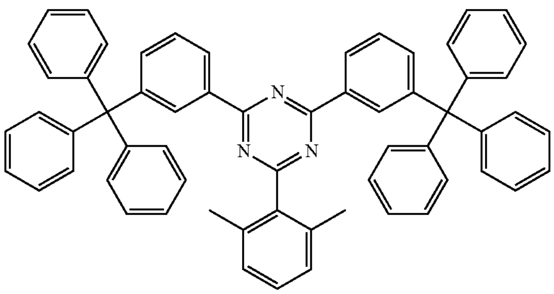
ETH6
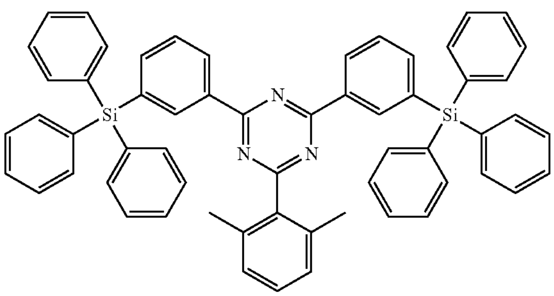
ETH7
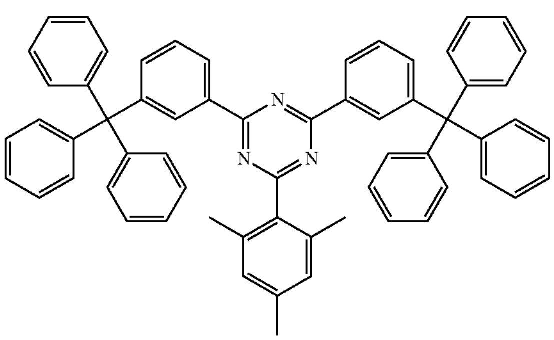
-continued
ETH8
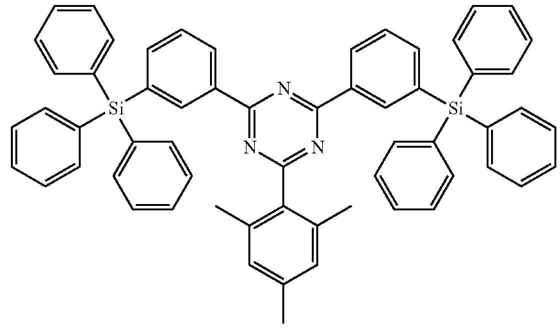
ETH9
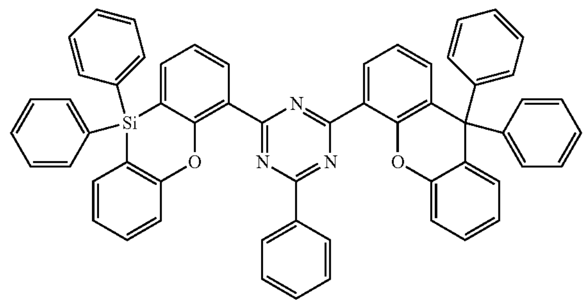
ETH10
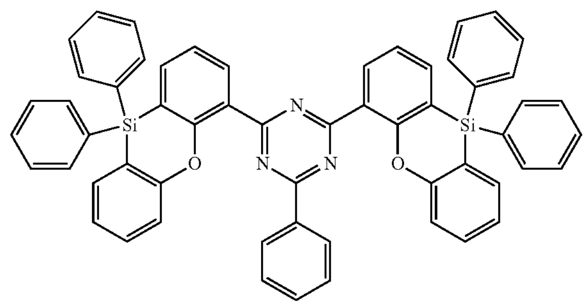
ETH11
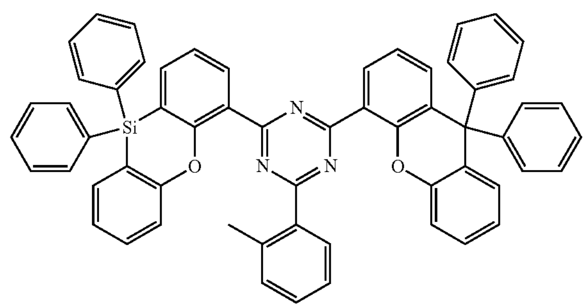
ETH12
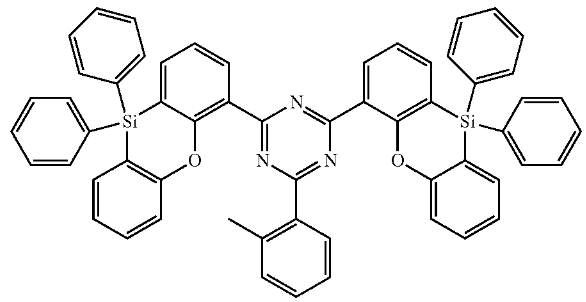

ETH13
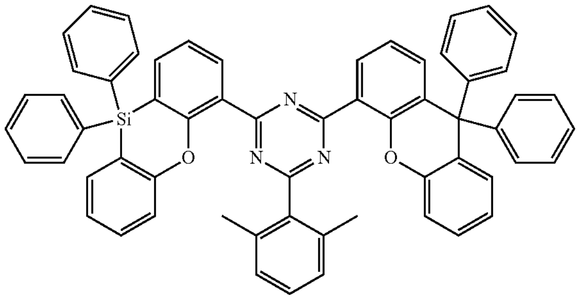
ETH14
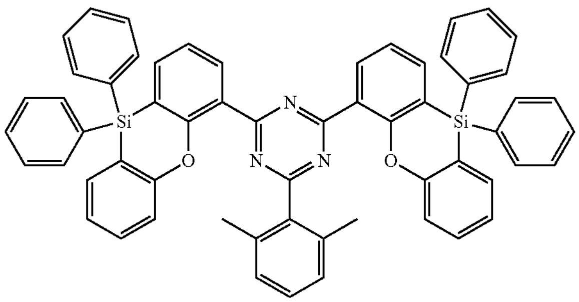
ETH15
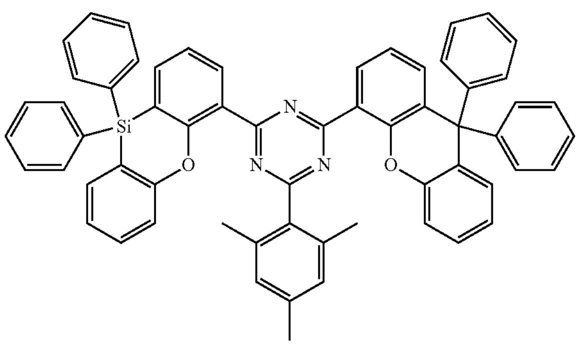
ETH16
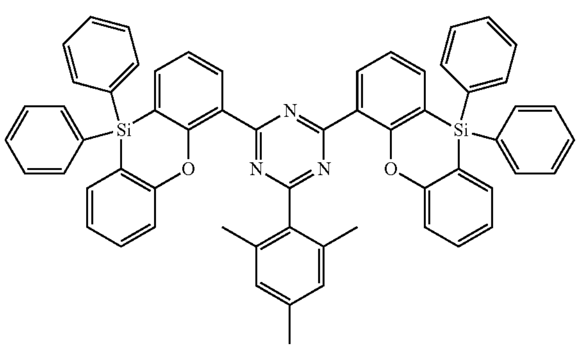
ETH17
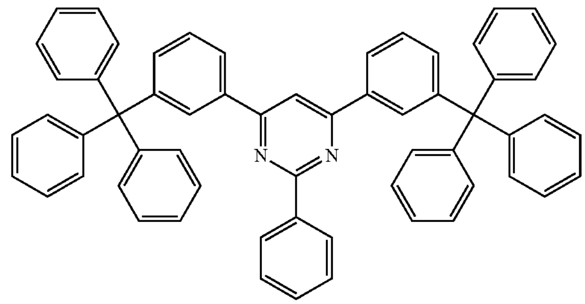
ETH18
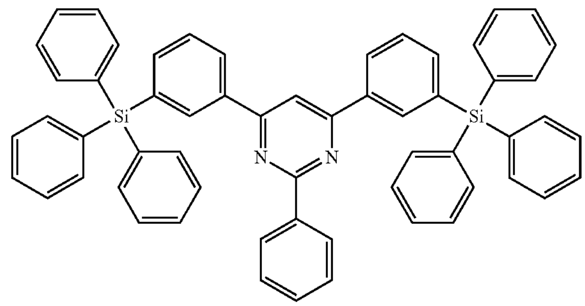
ETH19
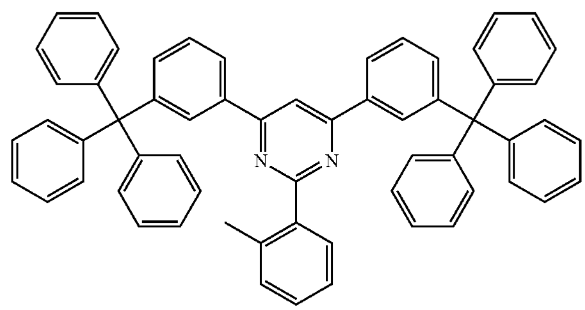
ETH20
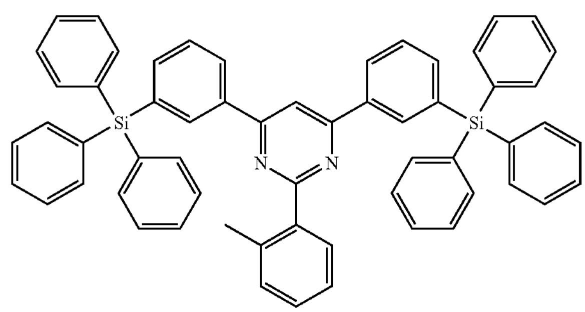
ETH21
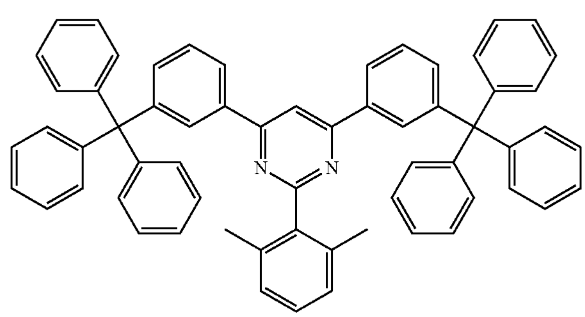

-continued
ETH22
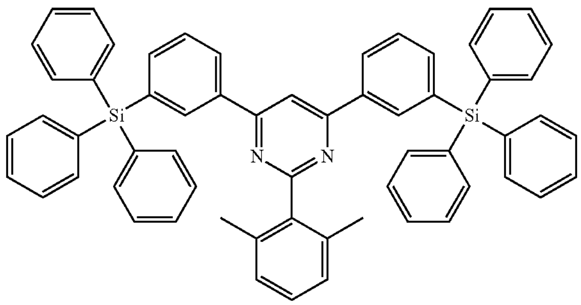
ETH23
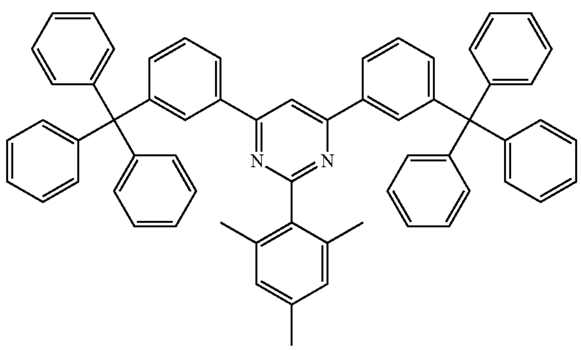
ETH24
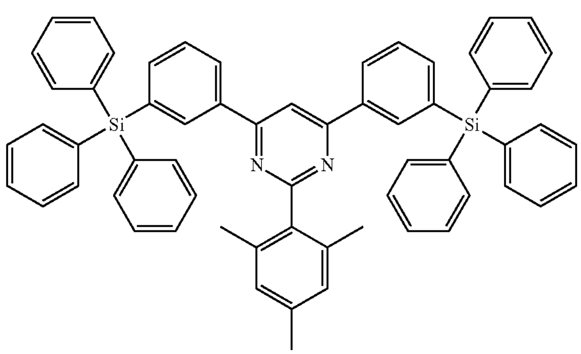
ETH25
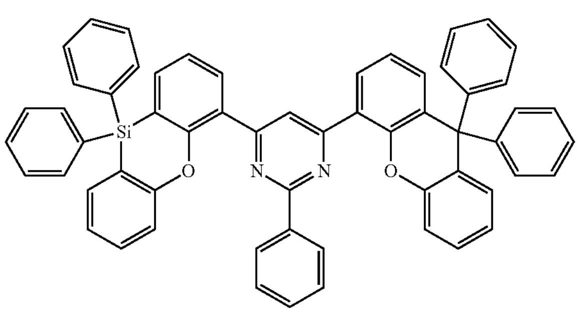
-continued
ETH26
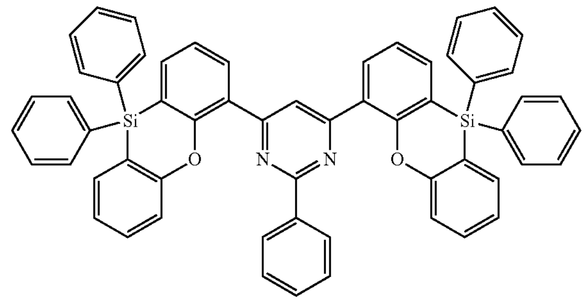
ETH27
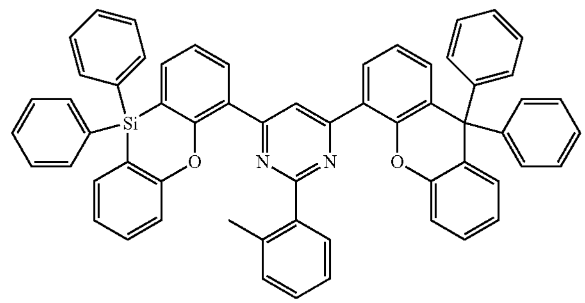
ETH28
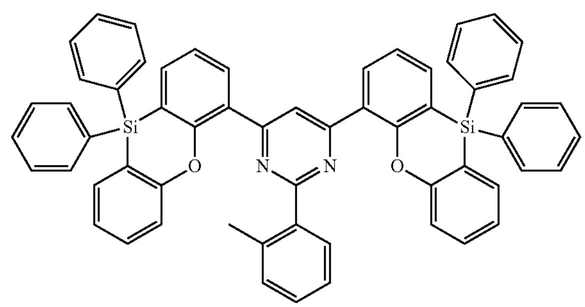
ETH29
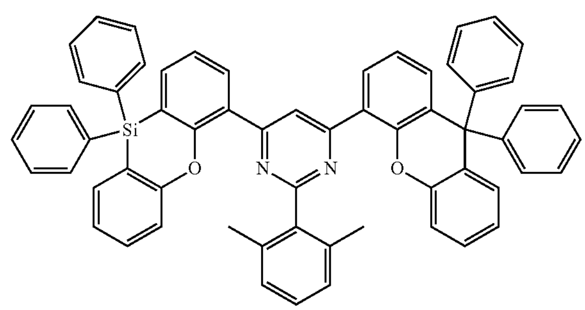
ETH30
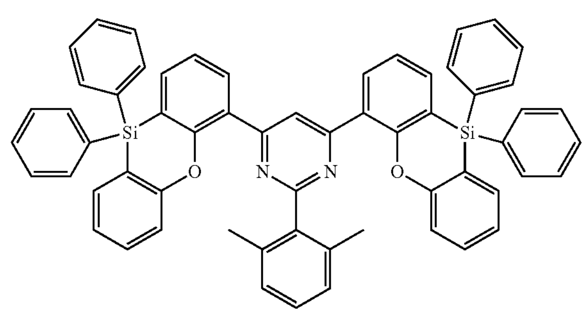

-continued
ETH31
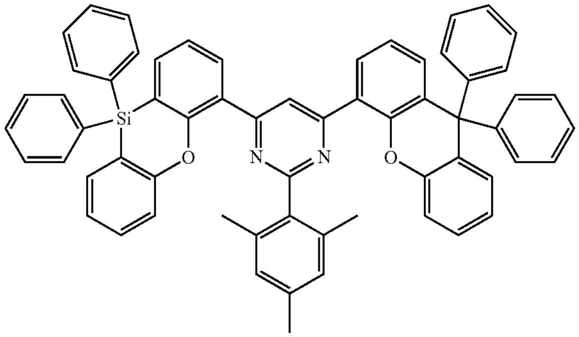
ETH32
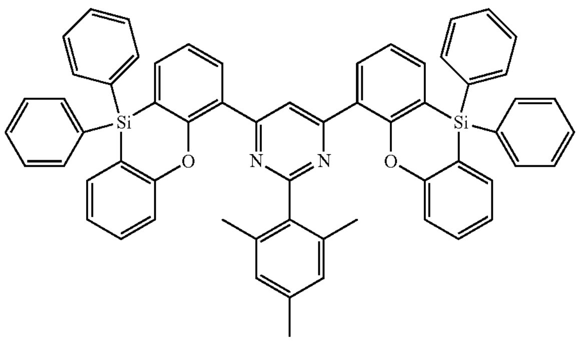
ETH33
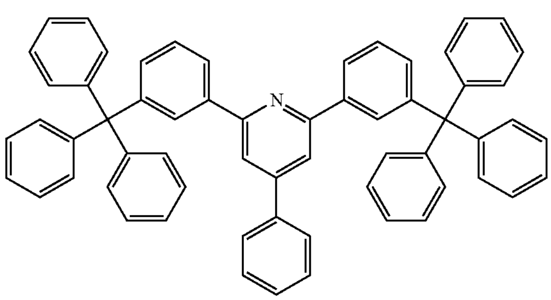
ETH34
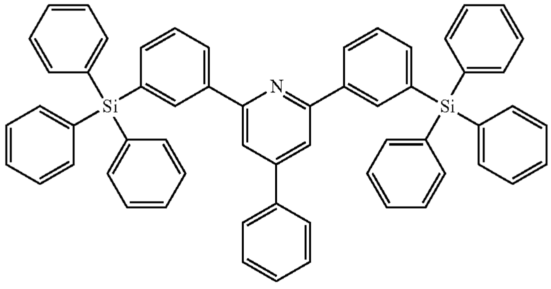
-continued
ETH35
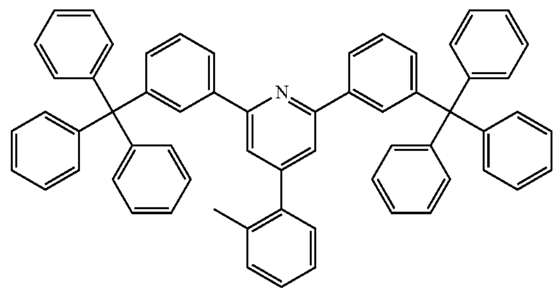
ETH36
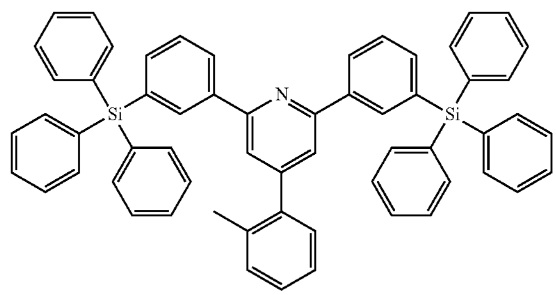
ETH37
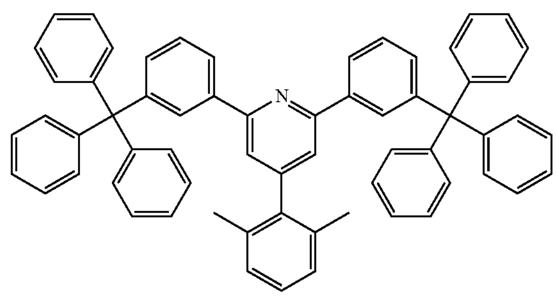
ETH38
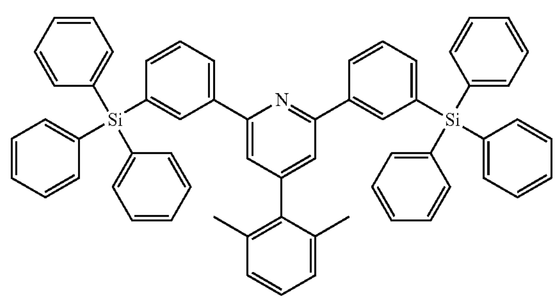
ETH39
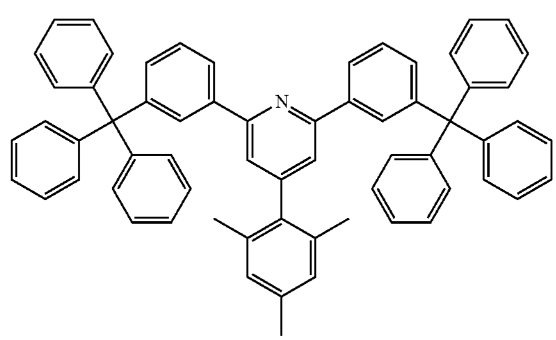

-continued
ETH40
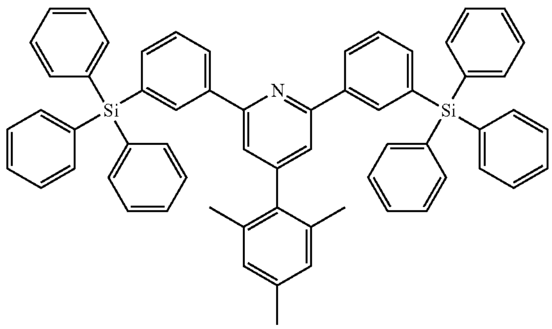
ETH41
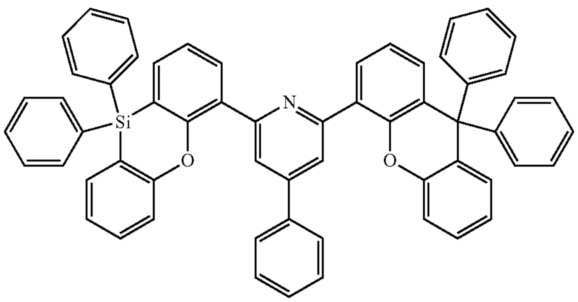
ETH42
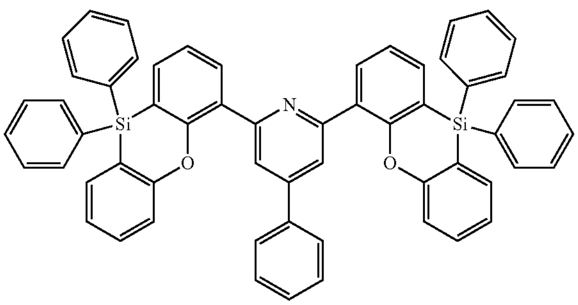
ETH43
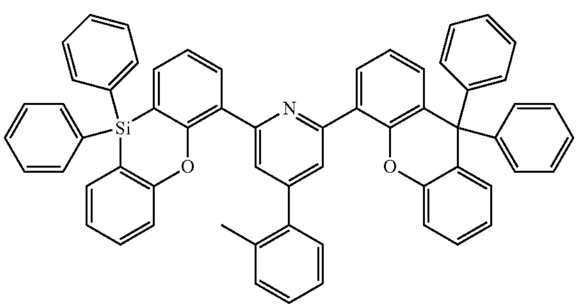
ETH44
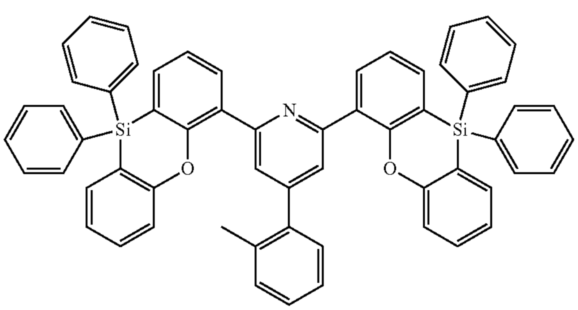
-continued
ETH45
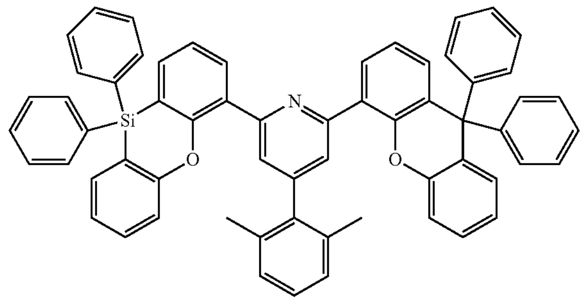
ETH46
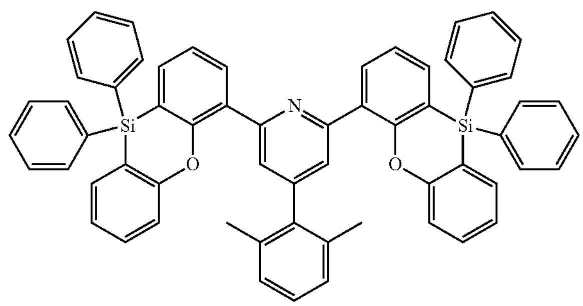
ETH47
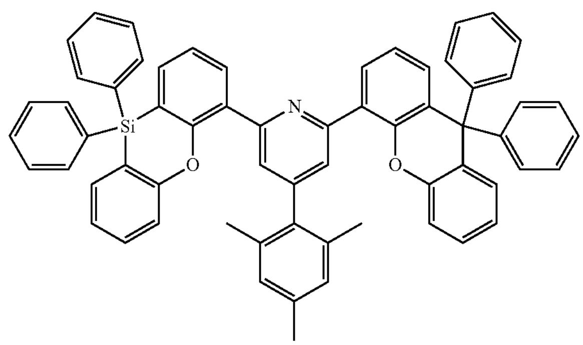
ETH48
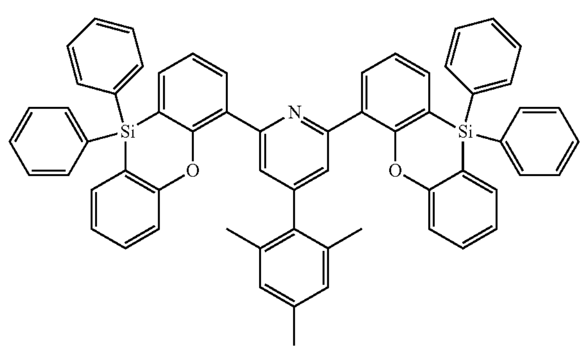

-continued
ETH49
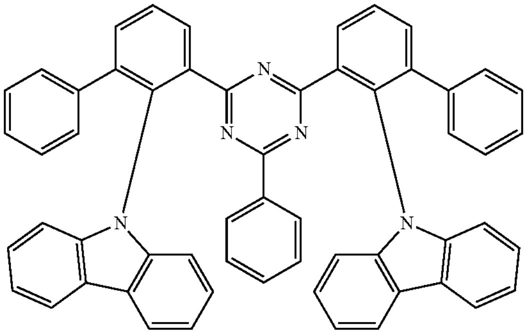
ETH50
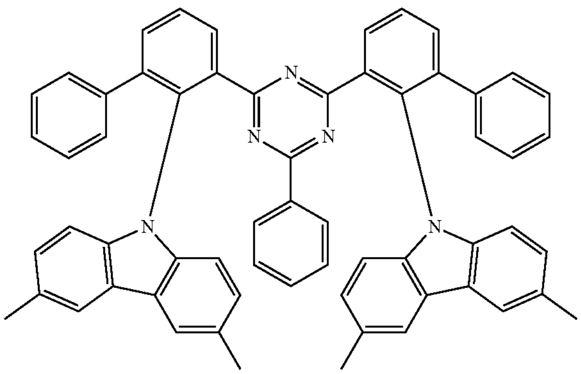
ETH51
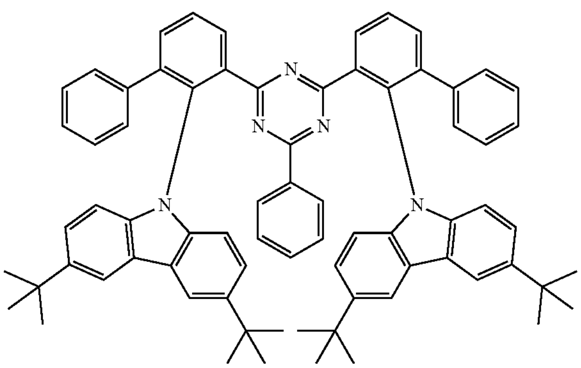
ETH52
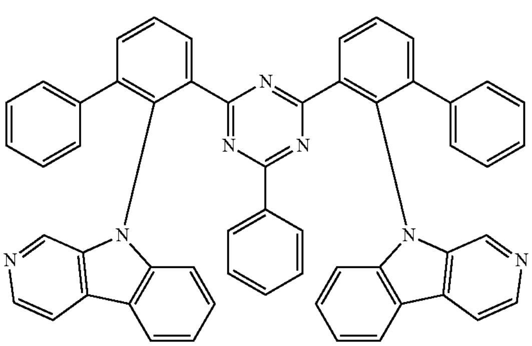
-continued
ETH53
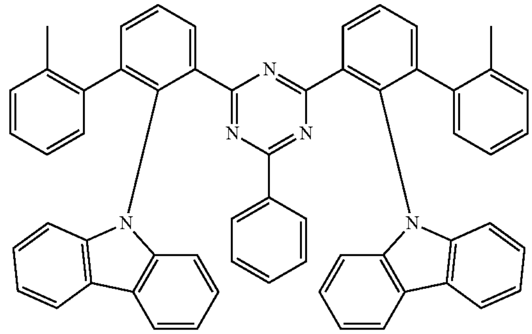
ETH54
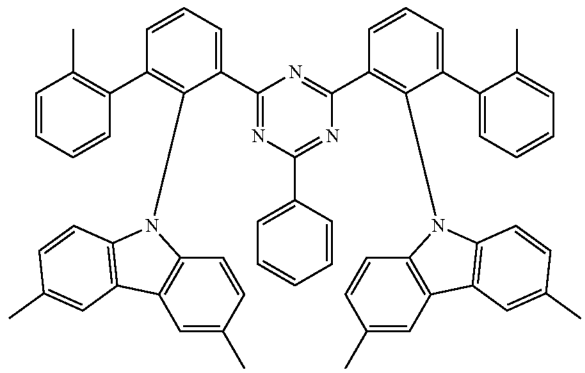
ETH55
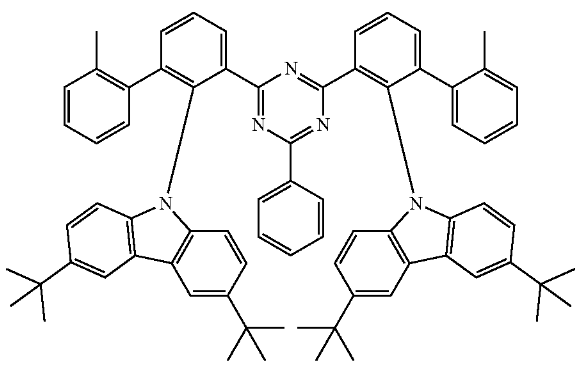
ETH56
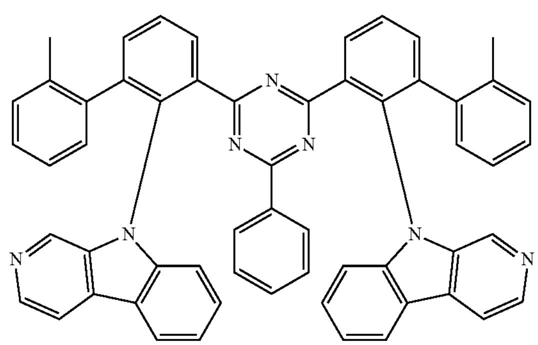

-continued
ETH57
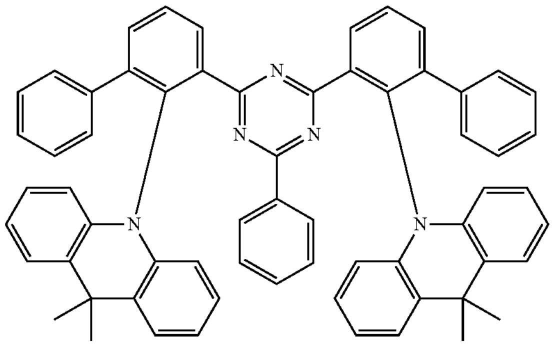
ETH58
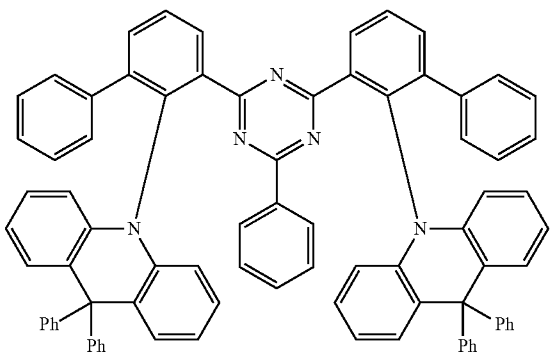
ETH59
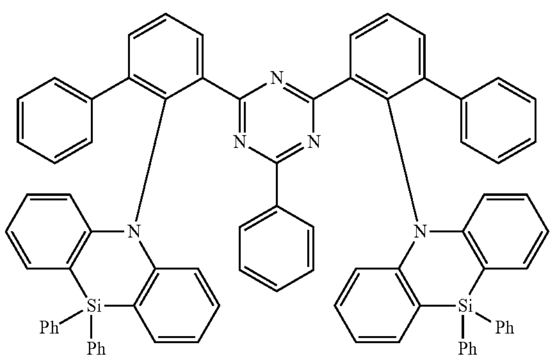
ETH60
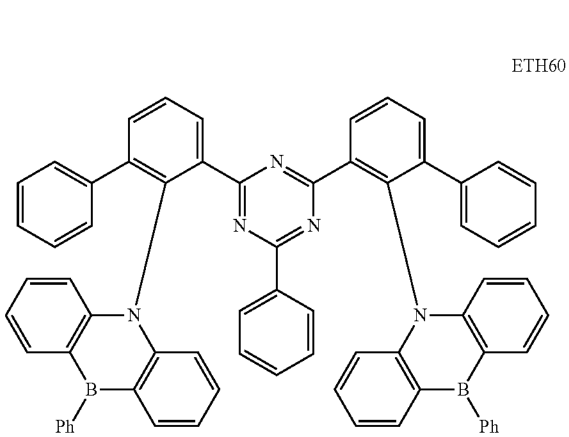
-continued
ETH61
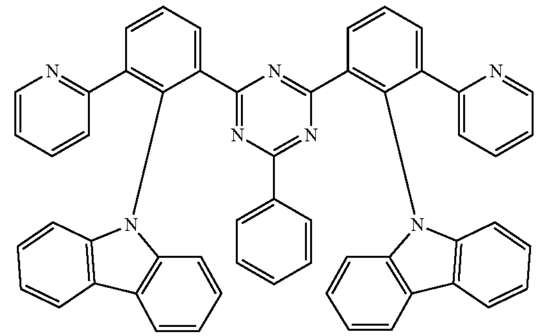
ETH62
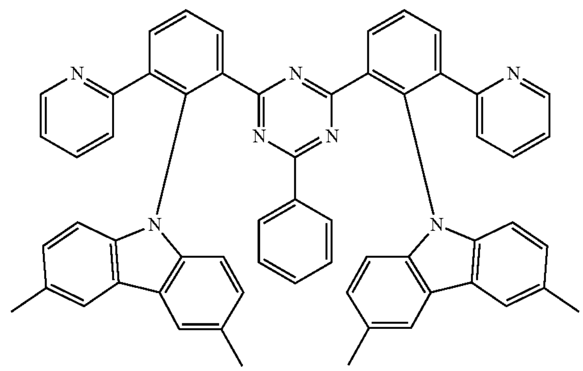
ETH63
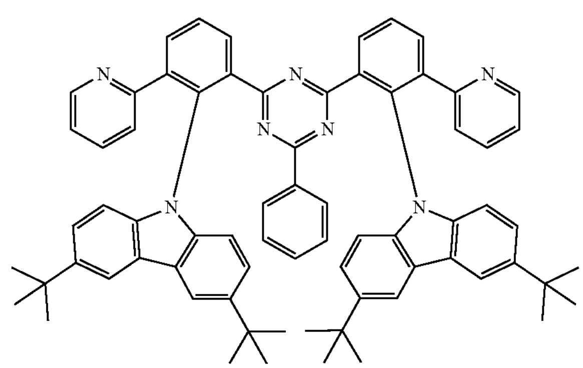
ETH64
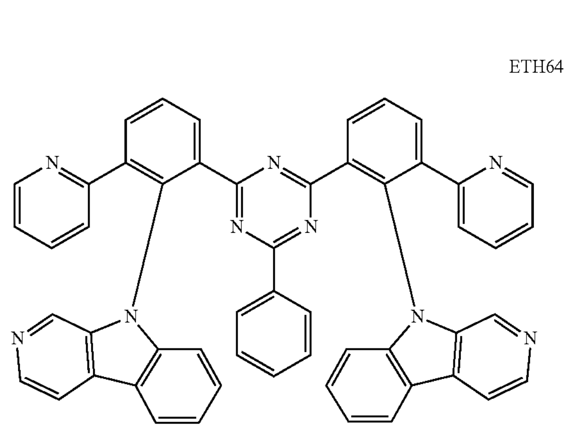

-continued
ETH65
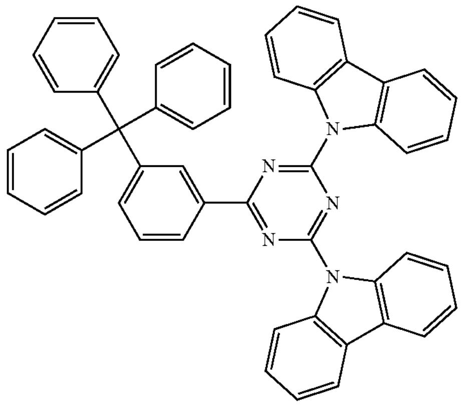
ETH66
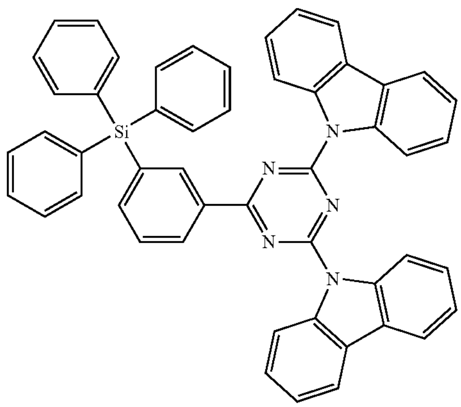
ETH67
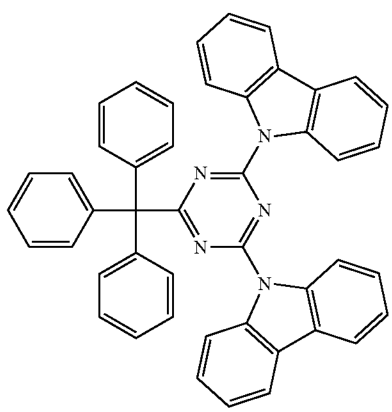
ETH68
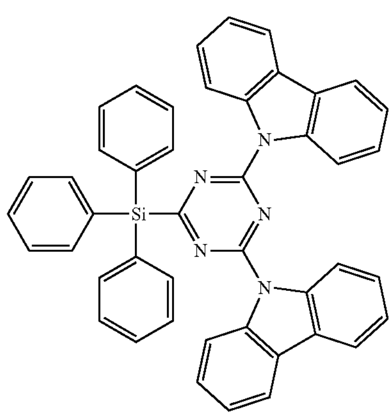
-continued
ETH69
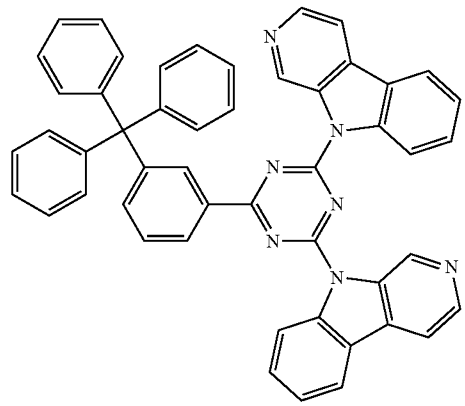
ETH70
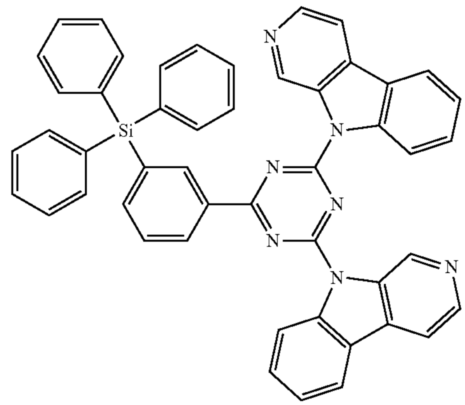
ETH71
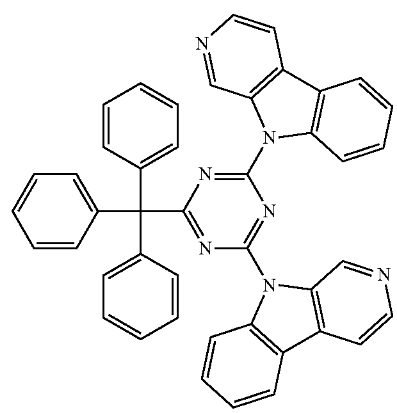
ETH72
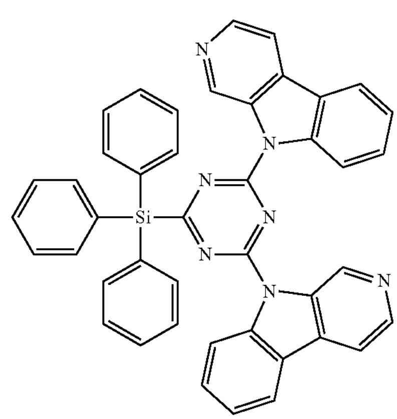

-continued
ETH73
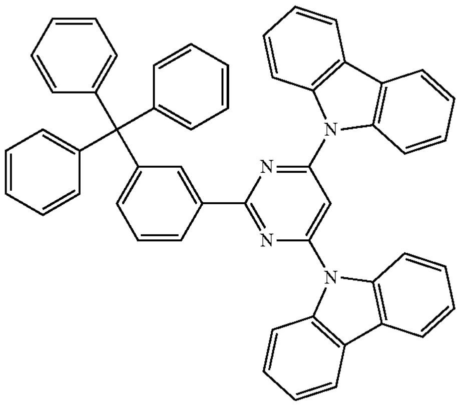
ETH74
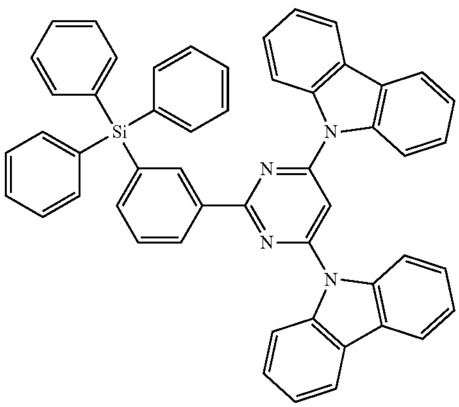
ETH75
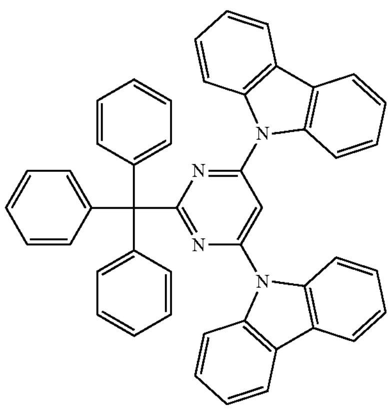
ETH76
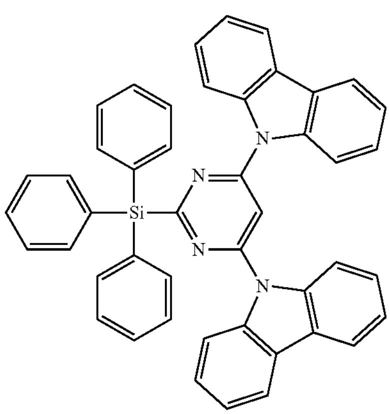
-continued
ETH77
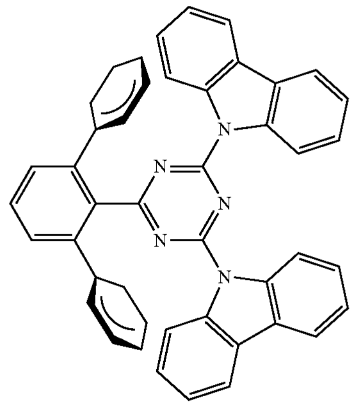
ETH78
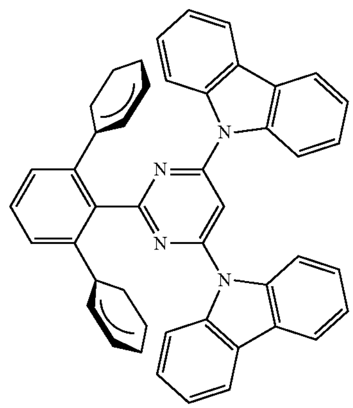
ETH79
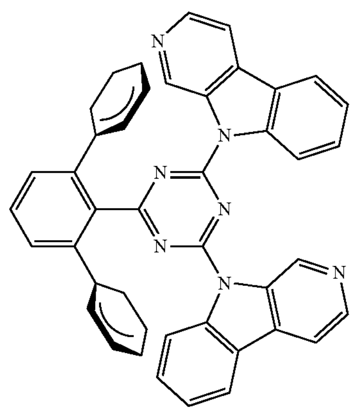
ETH80
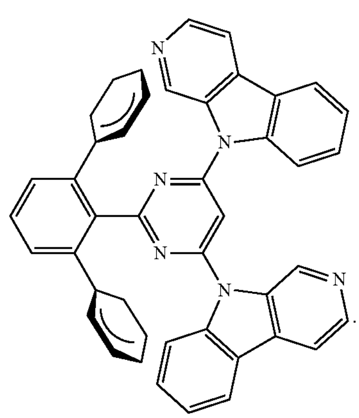

In one or more embodiments, the third compound may be selected from Compounds HTH1 to HTH28, but embodiments of the present disclosure are not limited thereto:
HTH1
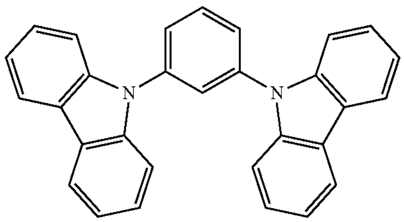
HTH2
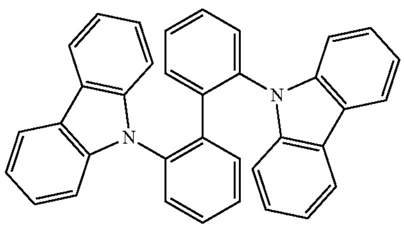
HTH3
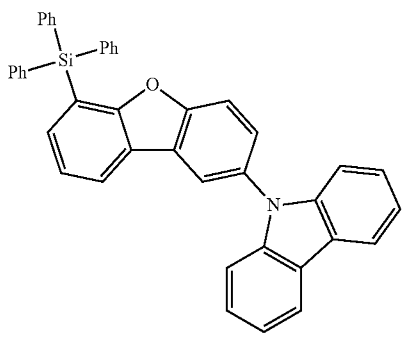
HTH4
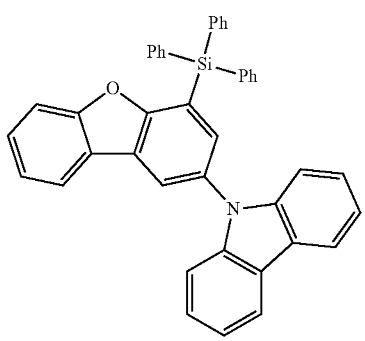
HTH5
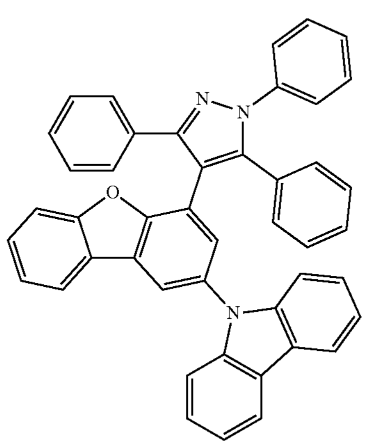
-continued
HTH6
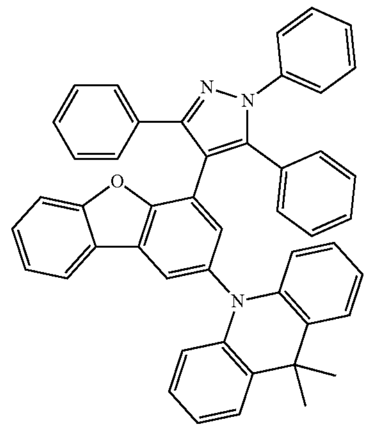
HTH7
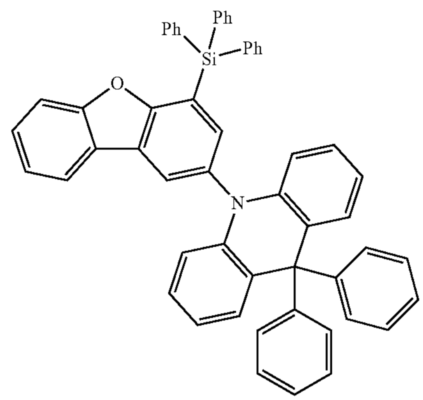
HTH8
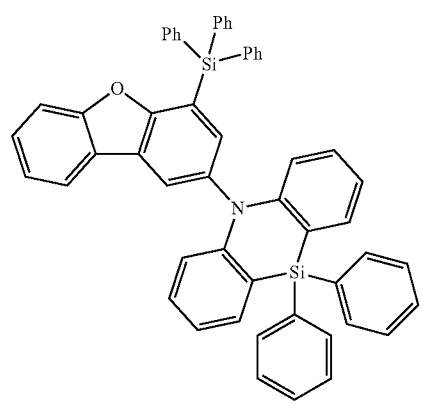
HTH9
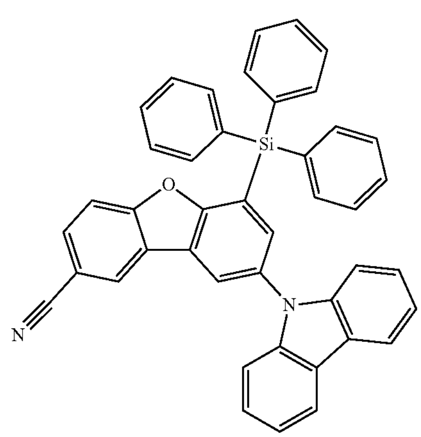

-continued
HTH10
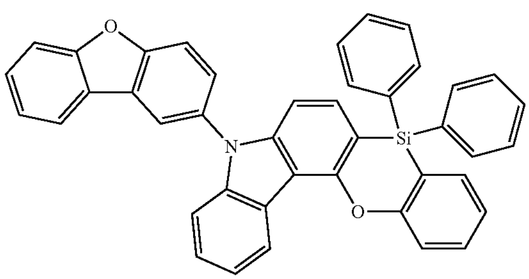
HTH11
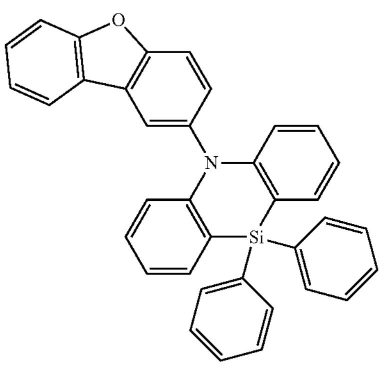
HTH12
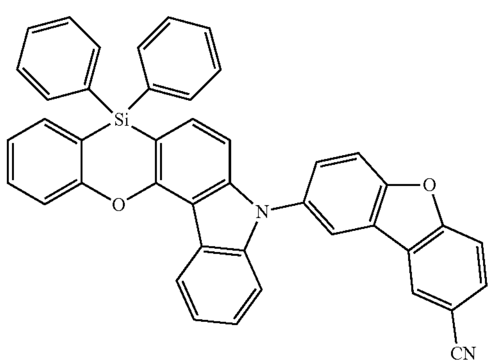
HTH13
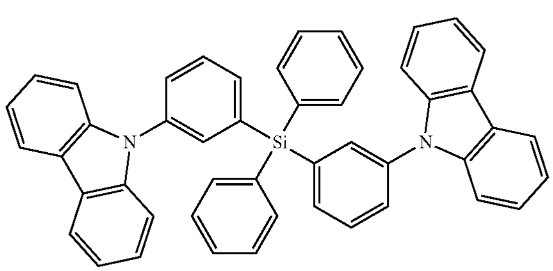
-continued
HTH14
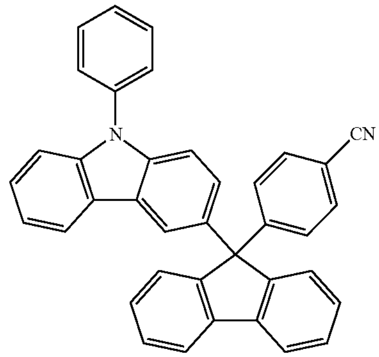
HTH15
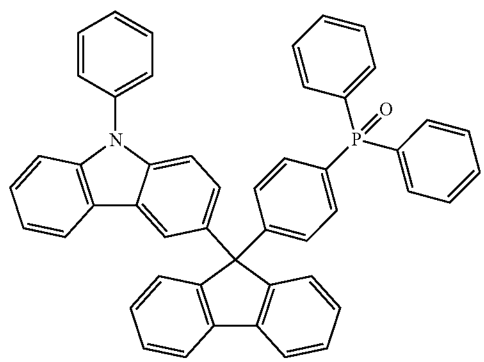
HTH16
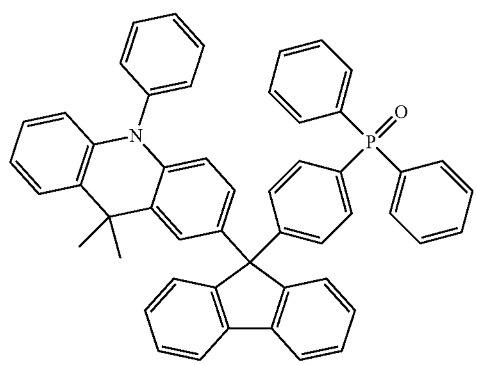
HTH17
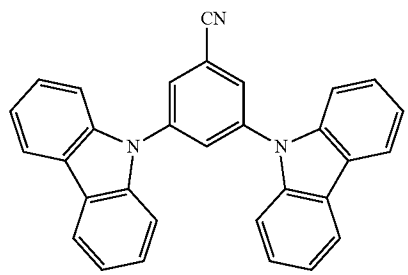

-continued
HTH18
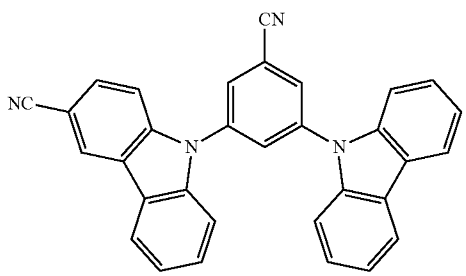
HTH19
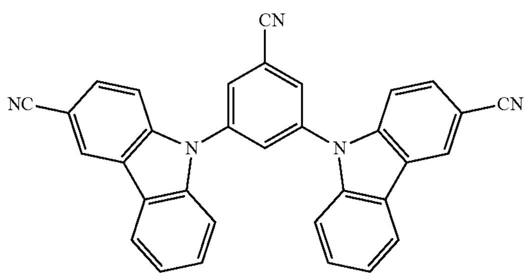
HTH20
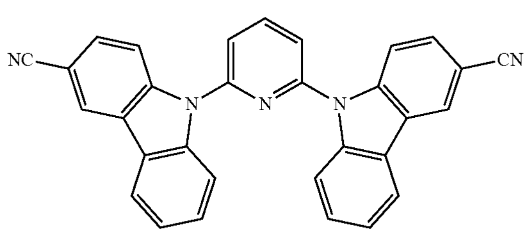
HTH21
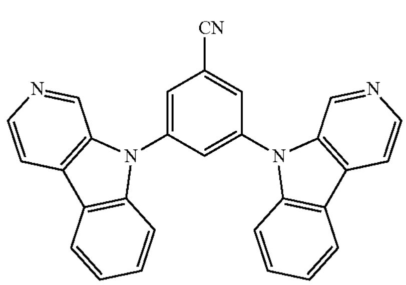
HTH22
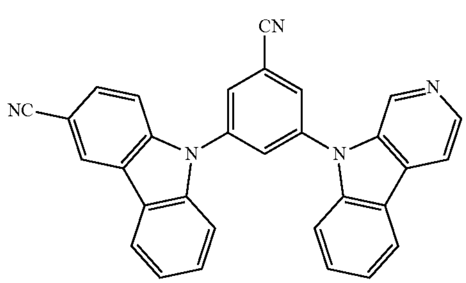
-continued
HTH23
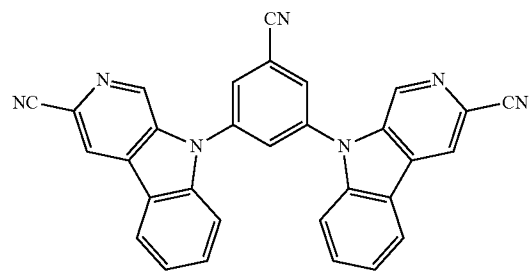
HTH24
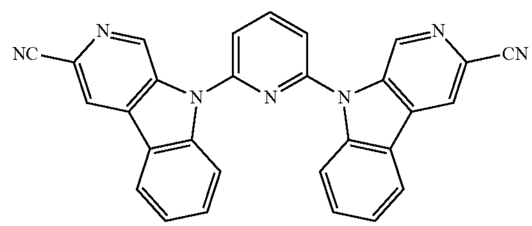
HTH25
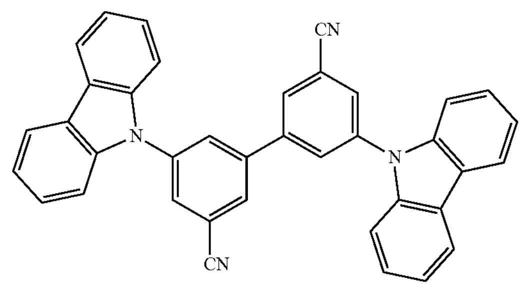
HTH26
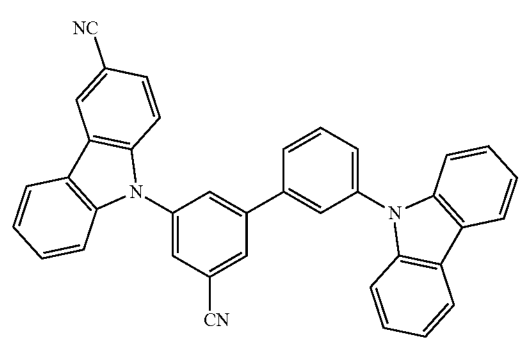
HTH27
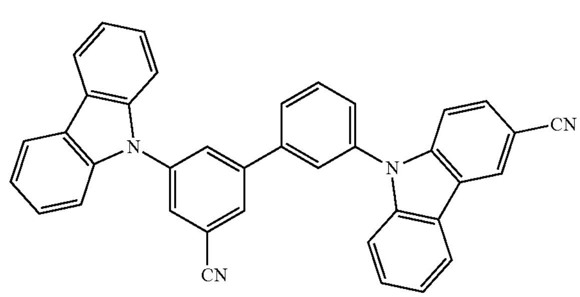

-continued

HTH28

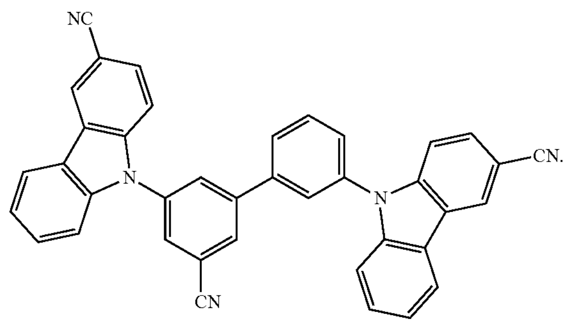

In one embodiment, a weight ratio of the second compound to the third compound may be in a range of 1:9 to 9:1, 2:8 to 8:2, 3:7 to 7:3 or 4:6 to 6:4.

In one embodiment, the organic light-emitting device may satisfy at least one of Condition 1 to Condition 4 below:

Condition 1 lowest unoccupied molecular orbital (LUMO) energy level (eV) of the third compound >LUMO energy level (eV) of the first compound Condition 2

LUMO energy level (eV) of the first compound >LUMO energy level (eV) of the second compound Condition 3 highest occupied molecular orbital (HOMO) energy level of the first compound >HOMO energy level (eV) of the third compound Condition 4

HOMO energy level (eV) of the third compound >HOMO energy level (eV) of the second compound The HOMO energy level and the LUMO energy level of each of the first compound, the second compound, and the third compound are negative values and may be actually measured by any suitable method such as, for example, a method described in Evaluation Example 1.

In one or more embodiments, an absolute value of a difference between the LUMO energy level of the first compound and the LUMO energy level of the second compound may be about 0.1 eV or more and about 1.0 eV or less. An absolute value of a difference between the LUMO energy level of the first compound and the LUMO energy level of the third compound may be about 0.1 eV or more and about 1.0 eV or less. An absolute value of a difference between the HOMO energy level of the first compound and the HOMO energy level of the second compound may be about 1.25 eV or less (for example, about 1.25 eV or less and about 0.2 eV or more). An absolute value of a difference between the HOMO energy level of the first compound and the HOMO energy level of the third compound may be about 1.25 eV or less (for example, about 1.25 eV or less and about 0.2 eV or more).

When the organic light-emitting device satisfies the relationship between the LUMO energy level and the HOMO energy level described herein, hole and electron injection balance to the emission layer may be achieved.

The organic light-emitting device may be prepared according to a first embodiment or according to a second embodiment, but the present disclosure is not limited thereto.

First Embodiment

In the organic light-emitting device according to the first embodiment, the first compound may be included in the emission layer, the emission layer may further include a host, the first compound and the host may be different from each other, and the emission layer may be configured to emit blue light emitted from the first compound.

For example, in the first embodiment, the first compound may act as a phosphorescence emitter (or a phosphorescent dopant).

In first embodiment, the blue light may be blue phosphorescence light emitted from the first compound.

Second Embodiment

In the organic light-emitting device according to the second embodiment, the first compound may be included in the emission layer, the emission layer may further include a host and a dopant (or an emitter), the first compound, the host, and the dopant may be different from each other, and the emission layer may be configured to emit phosphorescence light or fluorescence light (for example, delayed fluorescence light) emitted from the dopant.

For example, in the second embodiment, the first compound may act as not an emitter but as an auxiliary dopant for transferring energy to the dopant (or the emitter).

In the second embodiment, the first compound may act as the emitter and may also act as the auxiliary dopant for transferring energy to the dopant (or the emitter).

For example, in the second embodiment, phosphorescence light or fluorescence light emitted from the dopant (or the emitter) may be blue phosphorescence light or blue fluorescence light (for example, blue delayed fluorescence light).

In the organic light-emitting device according to the second embodiment, the first compound may be included in the emission layer, the emission layer may further include a host and a fluorescent dopant (for example, delayed fluorescence dopant), the fluorescent dopant does not include a transition metal, the first compound, the host, and the fluorescent dopant may be different from each other, the emission layer may be configured to emit both phosphorescence light from the first compound and fluorescence light (for example, delayed fluorescence light) from the fluorescent dopant.

In the second embodiment, the dopant (or the emitter) may be any suitable phosphorescent dopant material (for example, an organometalliccompound represented by Formula 1, an organometallic compound represented by Formula 401, or any combination thereof) or any suitable fluorescent dopant material (for example, a compound represented by Formula 501, a compound represented by Formula 502, or any combination thereof).

In the first embodiment and the second embodiment, the blue light may be blue light having a maximum emission wavelength of about 390 nm or more and about 500 nm or less (for example, about 430 nm or more and about 470 nm or less).

In the first embodiment and the second embodiment, the host may be any suitable host material (for example, a compound represented by Formula 301, a compound represented by Formula 301-1, a compound represented by Formula 301-2, or any combination thereof).

The above formulae 401, 501, 502, 301, 301-1 and 301-2 will be described below in detail.

In the first embodiment and the second embodiment, the host may be the second compound, the third compound, or any combination thereof, but embodiments of the present disclosure are not limited thereto.

In the first embodiment and the second embodiment, the host may be any suitable host material (for example, Compound ETH2, Compound ETH77, Compound HTH2, Compound HTH4, or any combination thereof), but embodiments of the present disclosure are not limited thereto.

Another aspect of an embodiment of the present disclosure provides an organometallic compound represented by Formula 1. Formula 1 may be the same as described herein above.

i) At least one of $X_1$ to $X_3$ in Formula 1 is a carbon atom (C) of a carbene moiety, ii) $L_2$ in Formula 1 is not —F, —Cl, —Br, and —I as described above, and iii) M in Formula 1 is not iridium. Although the present disclosure is not limited to any specific mechanism or theory, when a film is formed by using the organometallic compound represented by Formula 1, it is possible to minimize or reduce stacking between the organometallic compounds represented by Formula 1 (for example, the organometallic compounds represented by Formula 1 in which at least one of the $R_2$(s) (e.g., $R_2$(s) in the number of a2) is a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, or a substituted or unsubstituted monovalent non-aromatic condensed heteropolycyclic group). Therefore, an electronic device, for example, an organic light-emitting device, which includes the organometallic compound (or the first compound) represented by Formula 1 may have high luminescence efficiency and/or a long lifespan.

Another aspect of an embodiment of the present disclosure provides an electronic apparatus including the organic light-emitting device. The electronic apparatus may further include a thin-film transistor. For example, the electronic apparatus may further include a thin-film transistor including a source electrode and a drain electrode, and the first electrode of the organic light-emitting device may be electrically coupled with a source electrode or a drain electrode of the thin-film transistor.

Description of FIG. 1

FIG. 1 is a schematic cross-sectional view of an organic light-emitting device 10 according to an embodiment. The organic light-emitting device 10 includes a first electrode 110, an organic layer 150, and a second electrode 190.

Hereinafter, the structure of the organic light-emitting device 10 according to an embodiment and a method of manufacturing the organic light-emitting device 10 will be described in connection with FIG. 1.

First Electrode 110

In FIG. 1, a substrate may be additionally under the first electrode 110 or above the second electrode 190. The substrate may be a glass substrate or a plastic substrate, each having excellent mechanical strength, thermal stability, transparency, surface smoothness, ease of handling, and water resistance.

The first electrode 110 may be formed by depositing or sputtering a material for forming the first electrode 110 on the substrate. When the first electrode 110 is an anode, the material for a first electrode 110 may be a material having a high work function to facilitate hole injection.

The first electrode 110 may be a reflective electrode, a semi-transmissive electrode, or a transmissive electrode. When the first electrode 110 is a transmissive electrode, a material for forming a first electrode 110 may be indium tin oxide (ITO), indium zinc oxide (IZO), tin oxide ($SnO_2$), zinc oxide (ZnO), or any combinations thereof, but embodiments of the present disclosure are not limited thereto. In one or more embodiments, when the first electrode 110 is a semi-transmissive electrode or a reflective electrode, a material for forming the first electrode 110 may be magnesium (Mg), silver (Ag), aluminum (Al), aluminum-lithium (Al—Li), calcium (Ca), magnesium-indium (Mg—In), magnesium-silver (Mg—Ag), or any combination thereof, but embodiments of the present disclosure are not limited thereto.

The first electrode 110 may have a single-layered structure consisting of a single layer, or a multi-layered structure including two or more layers. For example, the first electrode 110 may have a three-layered structure of ITO/Ag/ITO, but the structure of the first electrode 110 is not limited thereto.

Organic Layer 150

The organic layer 150 is on the first electrode 110. The organic layer 150 may include an emission layer.

The organic layer 150 may include a hole transport region between the first electrode 110 and the emission layer, and an electron transport region between the emission layer and the second electrode 190.

Hole Transport Region in Organic Layer 150

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer.

For example, the hole transport region may have a single-layered structure including a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers are sequentially stacked from the first electrode 110 in this stated order, but the structure of the hole transport region is not limited thereto.

The hole transport region may include m-MTDATA, TDATA, 2-TNATA, NPB(NPD), β-NPB, TPD, spiro-TPD, spiro-NPB, methylated-NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS (polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

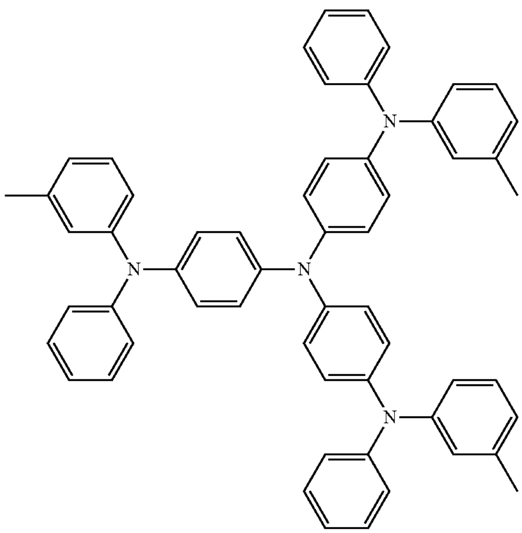
m-MTDATA
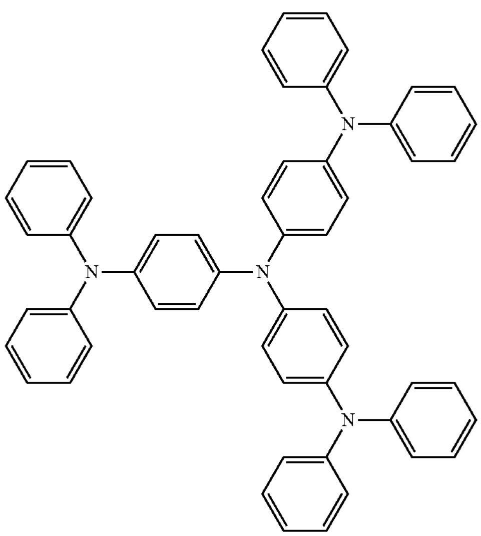
TDATA
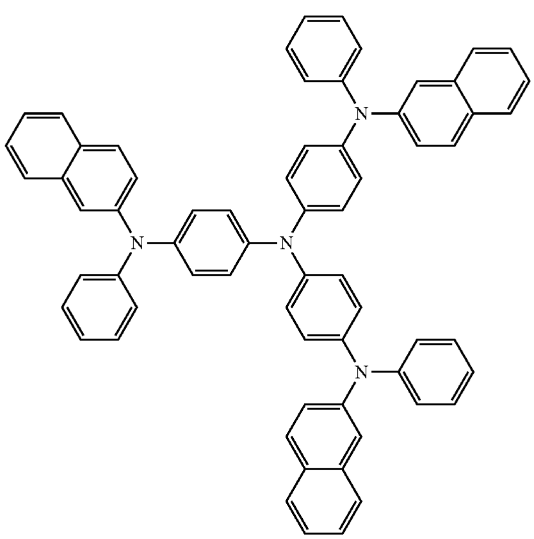
2-TNATA
-continued
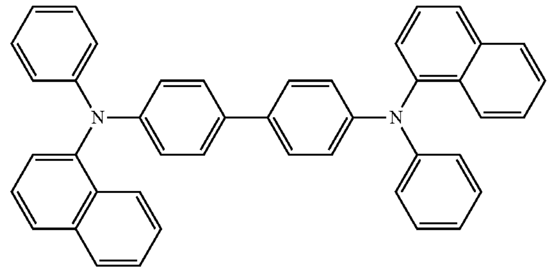
NPB
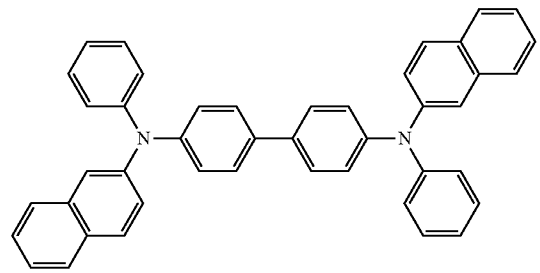
β-NPB
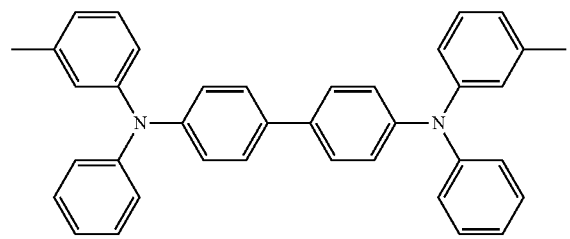
TPD
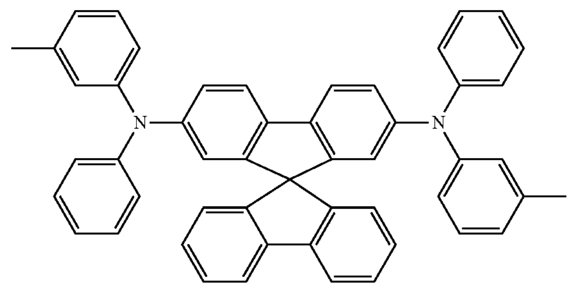
Spiro-TPD
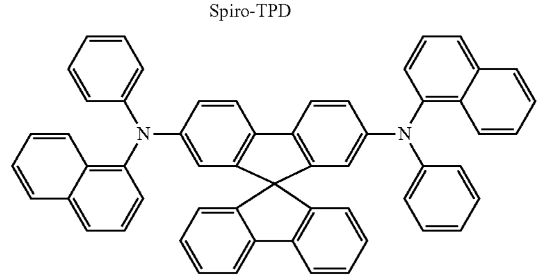
Spiro-NPB
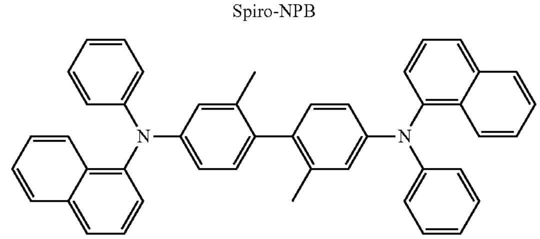
methylated NPB -continued

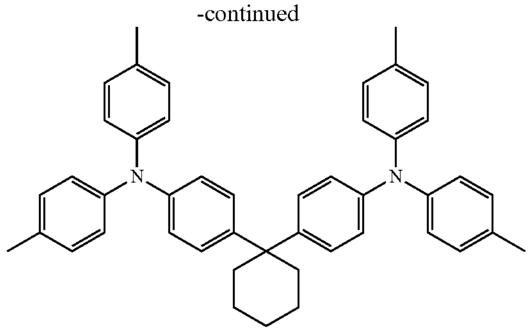

TAPC

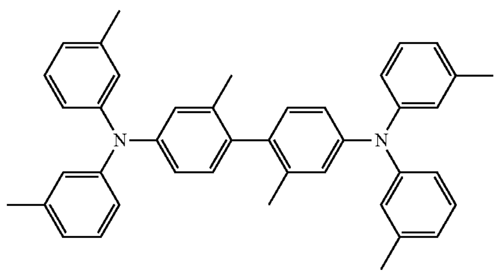

HMTPD

Formula 201

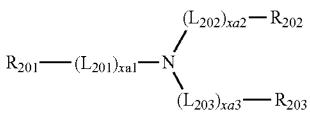

Formula 202

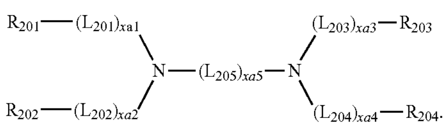

In Formulae 201 and 202, $L_{201}$ to $L_{204}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $L_{205}$ may be *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xa1 to xa4 may each independently be one of an integer from 0 to 3, xa5 may be one of an integer from 1 to 10, and $R_{201}$ to $R_{204}$ and $Q_{201}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

For example, in Formula 202, $R_{201}$ and $R_{202}$ may optionally be linked to each other via a single bond, a dimethyl-methylene group, or a diphenyl-methylene group, and $R_{203}$ and $R_{204}$ may optionally be linked to each other via a single bond, a dimethyl-methylene group, or a diphenyl-methylene group.

In one embodiment, in Formulae 201 and 202, $L_{201}$ to $L_{205}$ may each independently be:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, or a pyridinylene group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), —N($Q_{31}$)($Q_{32}$), or any combination thereof, and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

In one or more embodiments, xa1 to xa4 may each independently be 0, 1, or 2.

In one or more embodiments, xa5 may be 1, 2, 3, or 4.

In one or more embodiments, $R_{201}$ to $R_{204}$ and $Q_{201}$ may each independently be a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, or a pyridinyl group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, —$N(Q_{31})(Q_{32})$, or any combination thereof, and $Q_{31}$ to $Q_{33}$ are the same as described herein above.

In one or more embodiments, at least one of $R_{201}$ to $R_{203}$ in Formula 201 may each independently be a fluorenyl group, a spiro-bifluorenyl group, a carbazolyl group, a dibenzofuranyl group, or a dibenzothiophenyl group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, a dibenzothiophenyl group, or any combination thereof, but embodiments of the present disclosure are not limited thereto.

In one or more embodiments, in Formula 202, i) $R_{201}$ and $R_{202}$ may be linked to each other via a single bond, and/or ii) $R_{203}$ and $R_{204}$ may be linked to each other via a single bond.

In one or more embodiments, at least one of $R_{201}$ to $R_{204}$ in Formula 202 may be a carbazolyl group unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, a dibenzothiophenyl group, or any combination thereof, but embodiments of the present disclosure are not limited thereto.

In one embodiment, the compound represented by Formula 201 may be represented by Formula 201A below, but embodiments of the present disclosure are not limited thereto:

Formula 201A

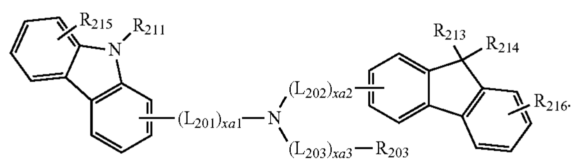

In one or more embodiments, the compound represented by Formula 201 may be represented by Formula 201A(1) below, but embodiments of the present disclosure are not limited thereto:

Formula 201A(1)

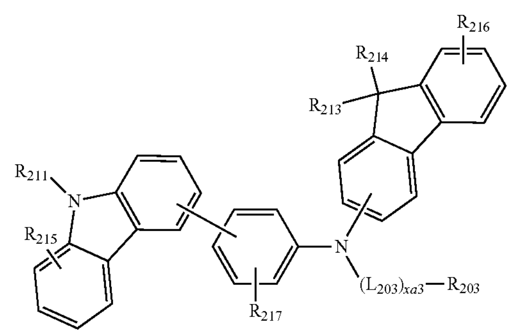

In one or more embodiments, the compound represented by Formula 201 may be represented by Formula 201A-1 below, but embodiments of the present disclosure are not limited thereto:

Formula 201A-1

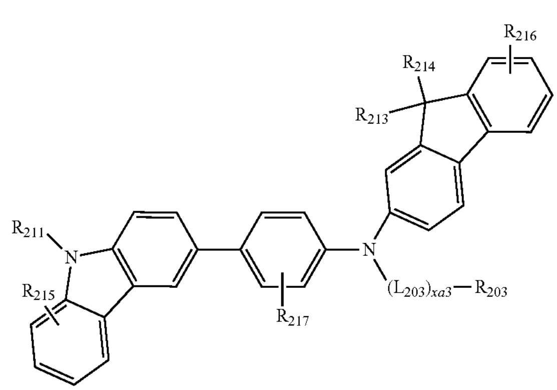

In one embodiment, the compound represented by Formula 202 may be represented by Formula 202A, but embodiments of the present disclosure are not limited thereto:

Formula 202A

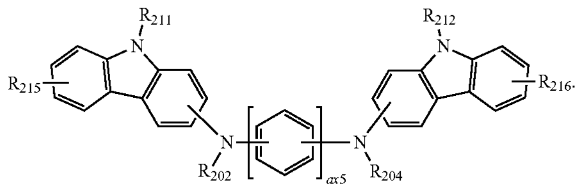

In one or more embodiments, the compound represented by Formula 202 may be represented by Formula 202A-1, but embodiments of the present disclosure are not limited thereto:

Formula 202A-1

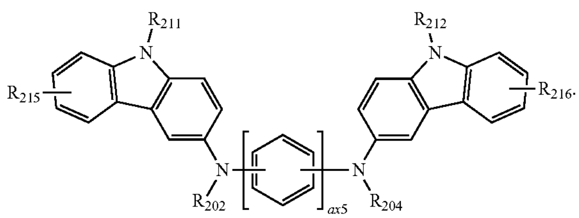

In Formulae 201A, 201A(1), 201A-1, 202A, and 202A-1, $L_{201}$ to $L_{203}$, xa1 to xa3, xa5, and $R_{202}$ to $R_{204}$ are the same as described herein above, $R_{211}$ and $R_{212}$ may be understood by referring to the description provided herein in connection with $R_{203}$, and $R_{213}$ to $R_{217}$ may each independently be hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, or a pyridinyl group.

A thickness of the hole transport region may be from about 100 Å to about 10,000 Å, for example, about 100 Å to about 3,000 Å. When the hole transport region includes at least one selected from a hole injection layer and a hole transport layer, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region, the hole injection layer, and the hole transport layer are within these ranges, suitable or satisfactory hole transporting characteristics may be obtained without a substantial increase in driving voltage.

The emission auxiliary layer may increase luminescence efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

p-dopant

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant.

In one embodiment, the p-dopant may have a lowest unoccupied molecular orbital (LUMO) energy level of about −3.5 eV or less.

The p-dopant may include at least one selected from a quinone derivative, a metal oxide, and a cyano group-containing compound, but embodiments of the present disclosure are not limited thereto.

In one embodiment, the p-dopant may include at least one selected from:

a quinone derivative, such as tetracyanoquinodimethane (TCNQ) and 2,3,5,6-tetrafluoro-7,7,8,8-tetracyanoquinodimethane (F4-TCNQ);

a metal oxide, such as tungsten oxide or molybdenum oxide;

1,4,5,8,9,12-hexaazatriphenylene-hexacarbonitrile (HAT-CN); and a compound represented by Formula 221, but embodiments of the present disclosure are not limited thereto:

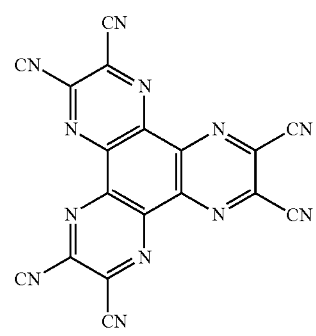

HAT-CN

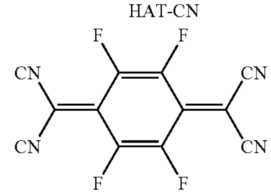

F4-TCNQ

-continued

Formula 221

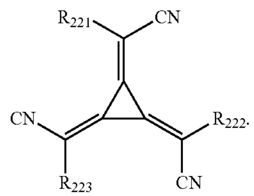

In Formula 221, $R_{221}$ to $R_{223}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, wherein at least one of $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission layer in organic layer 150

When the emission layer includes the dopant (or an emitter) described above and an auxiliary dopant, the dopant (or an emitter) and the auxiliary dopant may be different from each other.

In the present specification, the first compound may serve as the dopant (or an emitter) or the auxiliary dopant.

In the emission layer, an amount of the dopant (or an emitter) may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

When the organic light-emitting device 10 is a full-color organic light-emitting device, the emission layer may be patterned into a red emission layer, a green emission layer, or a blue emission layer, according to a sub-pixel. In one or more embodiments, the emission layer may have a stacked structure of two or more layers selected from a red emission layer, a green emission layer, and a blue emission layer, in which the two or more layers contact each other (e.g., physically contact each other) or are separated from each other. In one or more embodiments, the emission layer may include two or more materials selected from a red light-emitting material, a green light-emitting material, and a blue light-emitting material, in which the two or more materials are mixed with each other in a single layer configured to emit white light.

Host in Emission Layer

In one or more embodiments, the host may include a compound represented by Formula 301 below:

$$[Ar_{301}]_{xb11}\text{-}[(L_{301})_{xb1}\text{-}R_{301}]_{xb21}. \qquad \text{Formula 301}$$

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xb1 may be one of an integer from 0 to 5, $R_{301}$ may be hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, or $—P(=O)(Q_{301})(Q_{302})$, xb21 may be one of an integer from 1 to 5, and $Q_{301}$ to $Q_{303}$ may each independently be a $C_1$-$C_{10}$ alkyl group, a $C_1$-$C_{10}$ alkoxy group, a phenyl group, a biphenyl group, a terphenyl group, or a naphthyl group, but embodiments of the present disclosure are not limited thereto.

In one embodiment, $Ar_{301}$ in Formula 301 may be a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, or a dibenzothiophene group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group, but embodiments of the present disclosure are not limited thereto.

When xb11 in Formula 301 is 2 or more, two or more $Ar_{301}$(s) may be linked to each other via a single bond.

In one or more embodiments, the compound represented by Formula 301 may be represented by Formula 301-1 or 301-2 below:

Formula 301-1

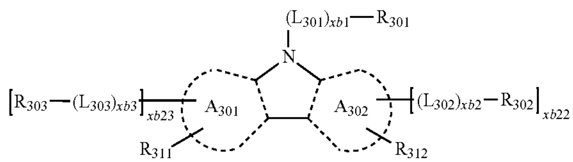

Formula 301-2

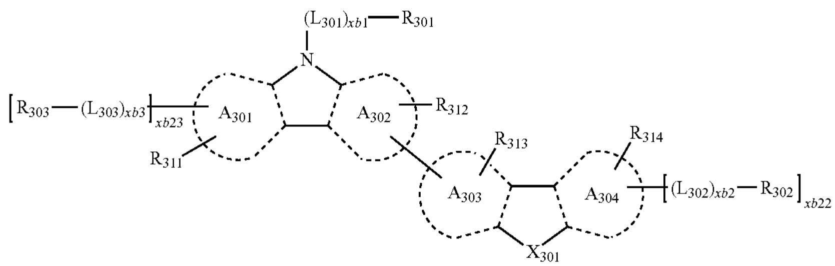

In Formulae 301-1 and 301-2, ring A301 to ring A304 may each independently be a benzene ring, a naphthalene ring, a phenanthrene ring, a fluoranthene ring, a triphenylene ring, a pyrene ring, a chrysene ring, a pyridine ring, a pyrimidine ring, an indene ring, a fluorene ring, a spiro-bifluorene ring, a benzofluorene ring, a dibenzofluorene ring, an indole ring, a carbazole ring, a benzocarbazole ring, a dibenzocarbazole ring, a furan ring, a benzofuran ring, a dibenzofuran ring, a naphthofuran ring, a benzonaphthofuran ring, a dinaphthofuran ring, a thiophene ring, a benzothiophene ring, a dibenzothiophene ring, a naphthothiophene ring, a benzonaphthothiophene ring, or a dinaphthothiophene ring, $X_{301}$ may be O, S, or N-[$(L_{304})_{xb4}$-$R_{304}$], $R_{311}$ to $R_{314}$ may each independently be hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), xb22 and xb23 may each independently be 0, 1, or 2, $L_{301}$, xb1, $R_{301}$, and $Q_{31}$ to $Q_{33}$ are the same as described herein above, $L_{302}$ to $L_{304}$ may each independently be the same as defined in connection with $L_{301}$, xb2 to xb4 may each independently be the same as defined in connection with xb1 and, $R_{302}$ to $R_{304}$ may each independently be the same as defined in connection with $R_{301}$.

For example, in Formulae 301, 301-1, and 301-2, $L_{301}$ to $L_{304}$ may each independently be a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an benzoisothiazolylene group, a benzoxazolylene group, an benzoisoxazolylene group, a triazolylene group, a tetrazolylene group, an imidazopyridinylene group, an imidazopyrimidinylene group, or an azacarbazolylene group, each unsubstituted or substituted deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an benzoisothiazolyl group, a benzoxazolyl group, an benzoisoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), —P(═O)($Q_{31}$)($Q_{32}$), or any combination thereof, and $Q_{31}$ to $Q_{33}$ are the same as described herein above.

In one embodiment, in Formulae 301, 301-1, and 301-2, $R_{301}$ to $R_{304}$ may each independently be a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an benzoisothiazolyl group, a benzoxazolyl group, an benzoisoxazolyl group, a triazolyl group, a tetrazolyl group, an imidazopyridinyl group, an imidazopyrimidinyl group, or an azacarbazolyl group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an benzoisothiazolyl group, a benzoxazolyl group, an benzoisoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), —P(═O)($Q_{31}$)($Q_{32}$), or any combination thereof, and $Q_{31}$ to $Q_{33}$ are the same as described herein above.

In one or more embodiments, the host may include an alkaline earth-metal complex. For example, the host may include a Be complex (for example, Compound H55), a Mg complex, a Zn complex, or any combination thereof.

The host may include 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), bis(4-(9H-carbazol-9-yl)phenyl)diphenylsilane (BCPDS), (4-(1-(4-(diphenylamino)phenyl)cyclohexyl)phenyl)diphenyl-phosphine oxide (POPCPA), one of Compounds H1 to H55, or any combination thereof, but embodiments of the present disclosure are not limited thereto:

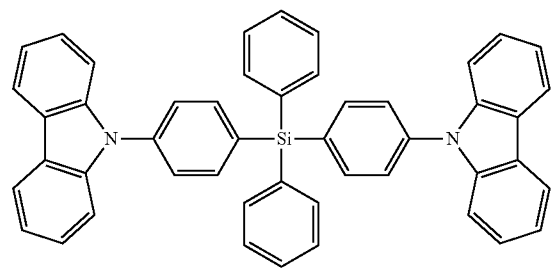

BCPDS

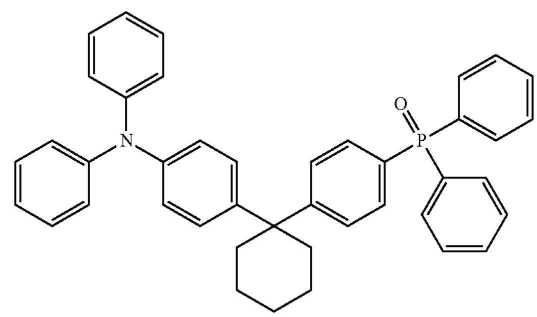

POPCPA

H1

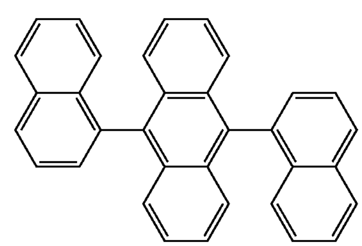

H2

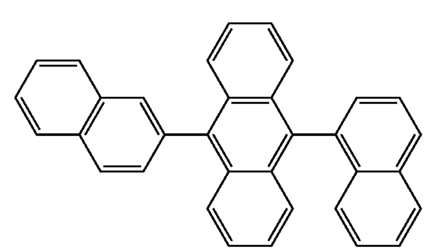

-continued
H3
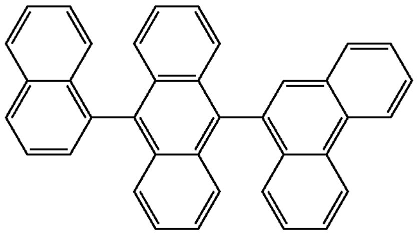
H4
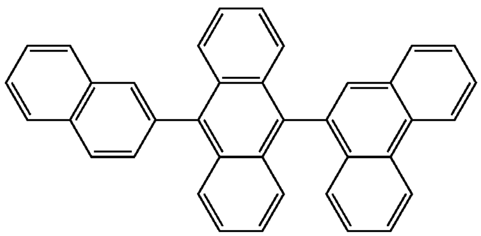
H5
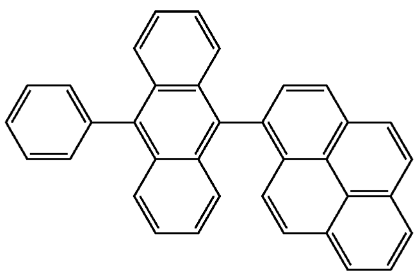
H6
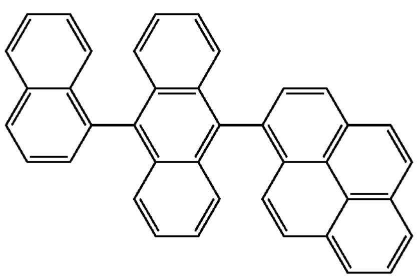
H7
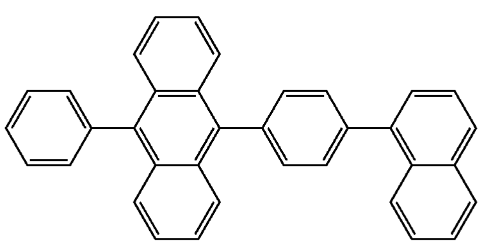
H8
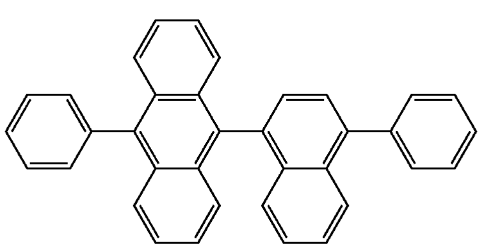
-continued
H9
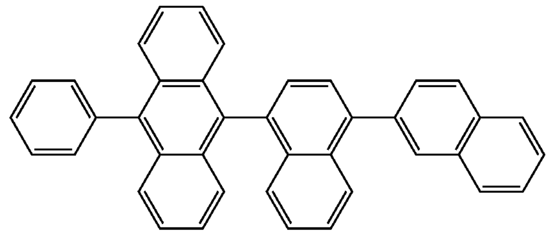
H10
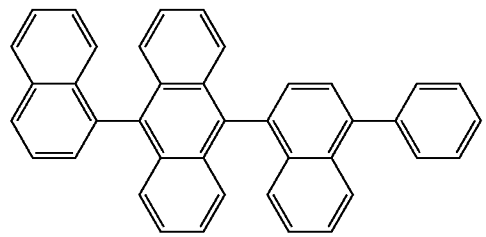
H11
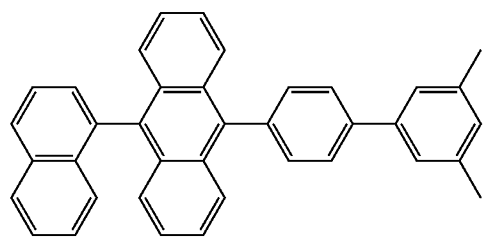
H12
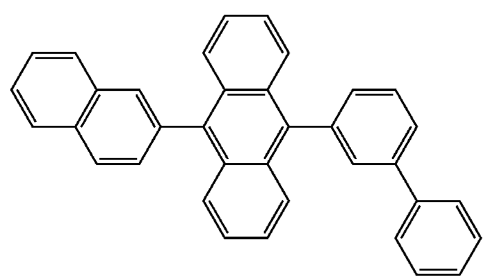
H13
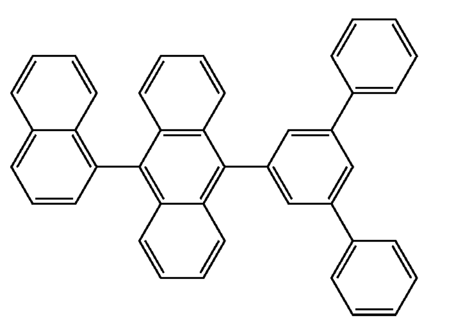

-continued
H14
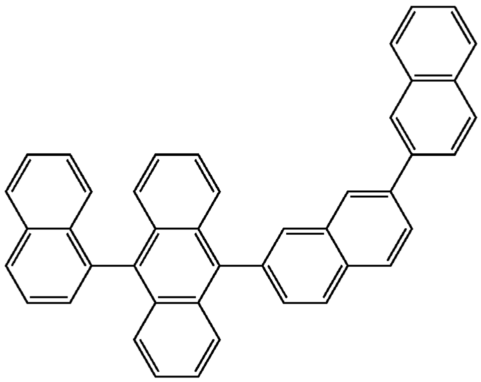
H15
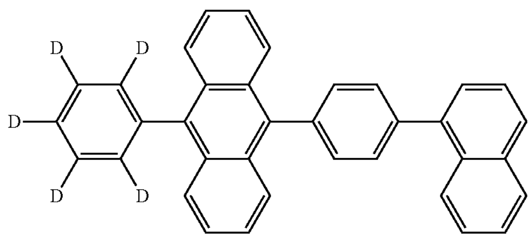
H16
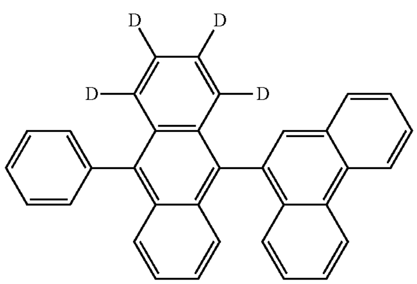
H17
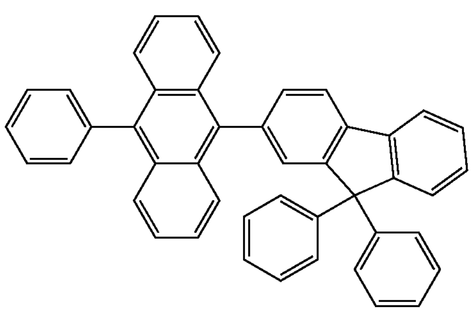
H18
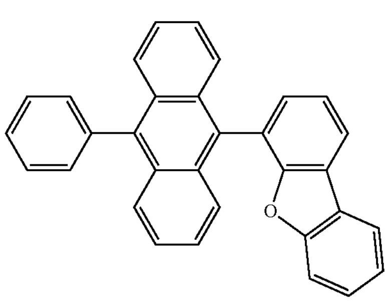
-continued
H19
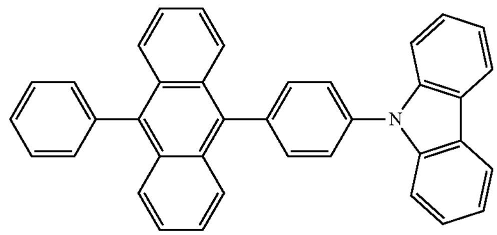
H20
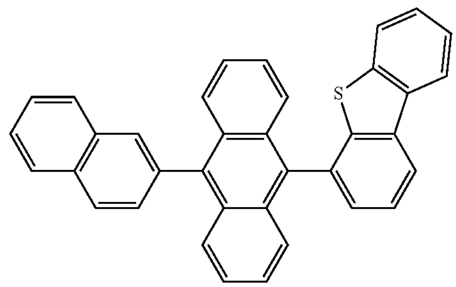
H21
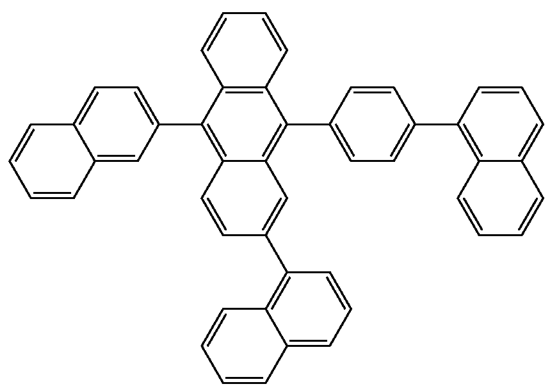
H22
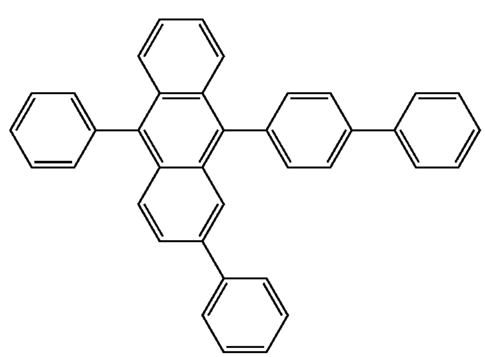

-continued
H23
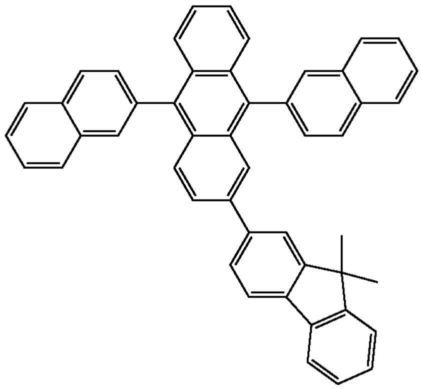
H24
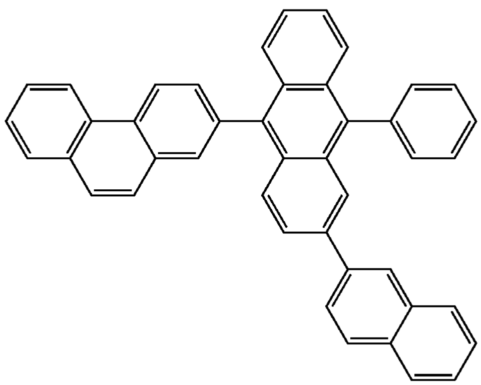
H25
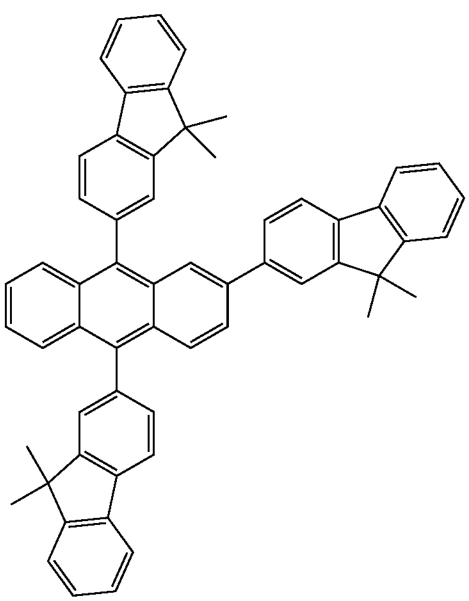
-continued
H26
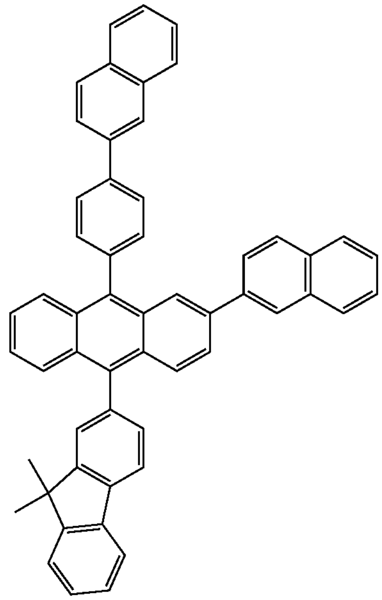
H27
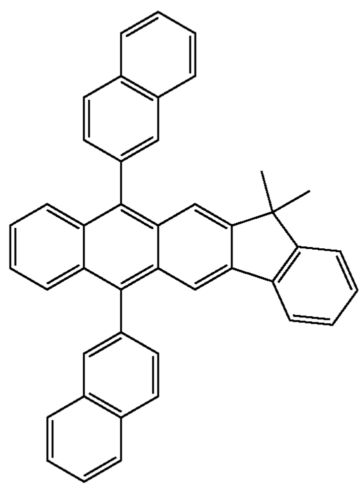
H28
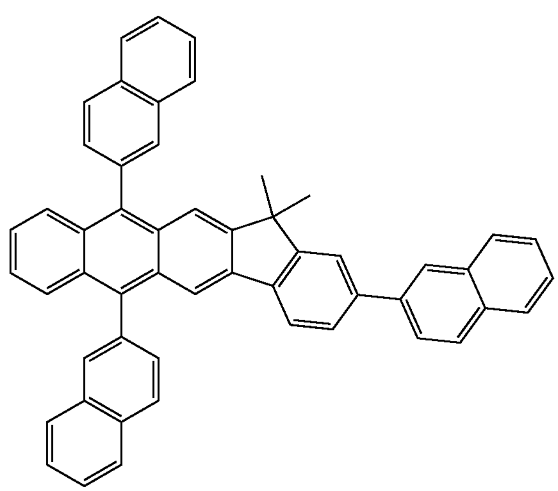

-continued
H29
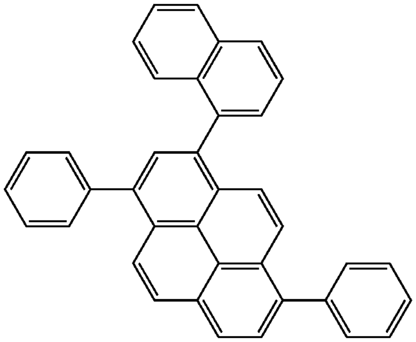
H30
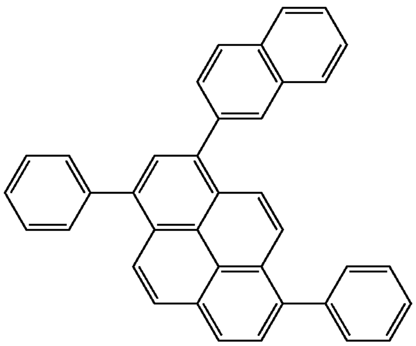
H31
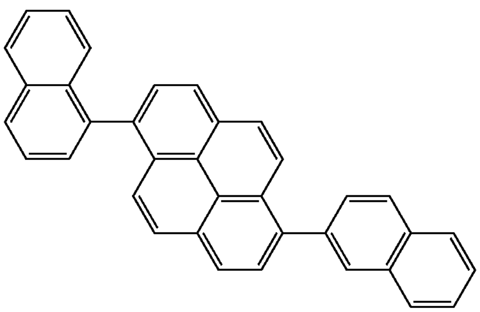
H32
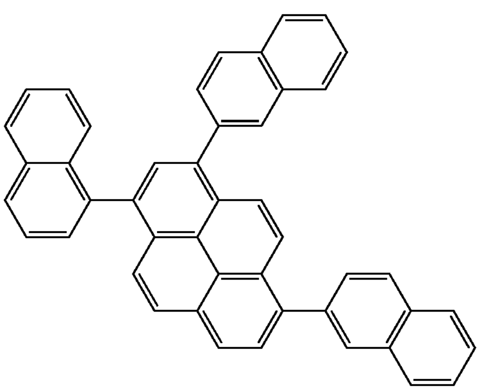
H33
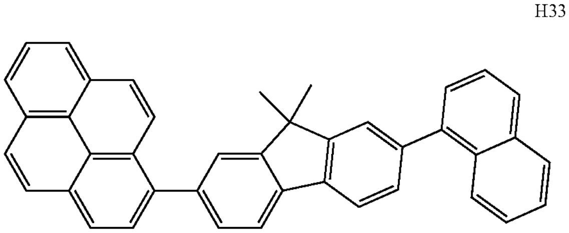
-continued
H34
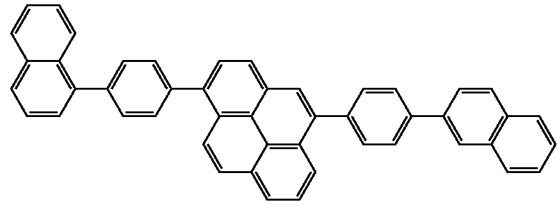
H35
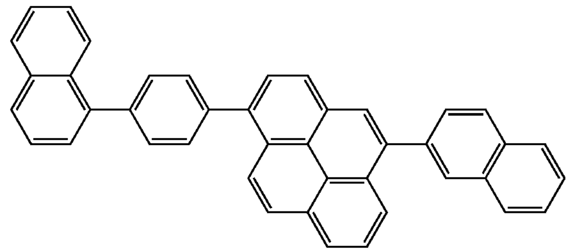
H36
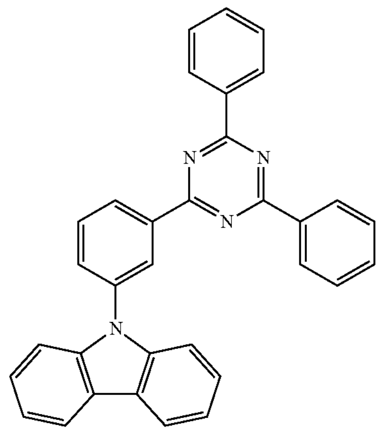
H37
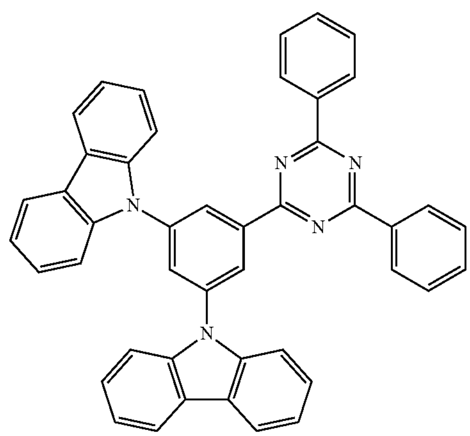
H38
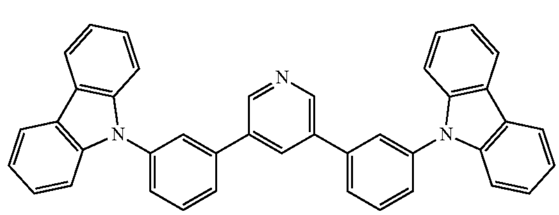

-continued
H39
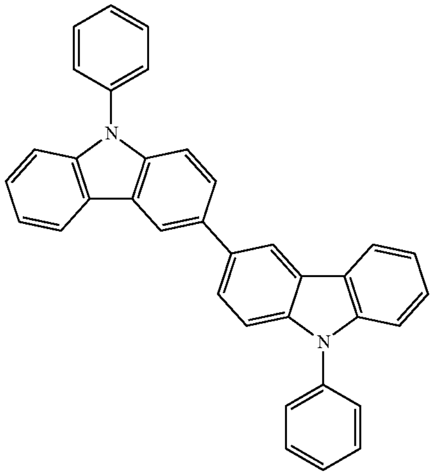
H40
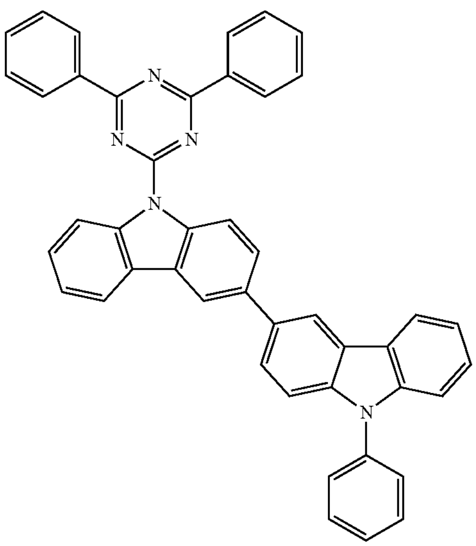
H41
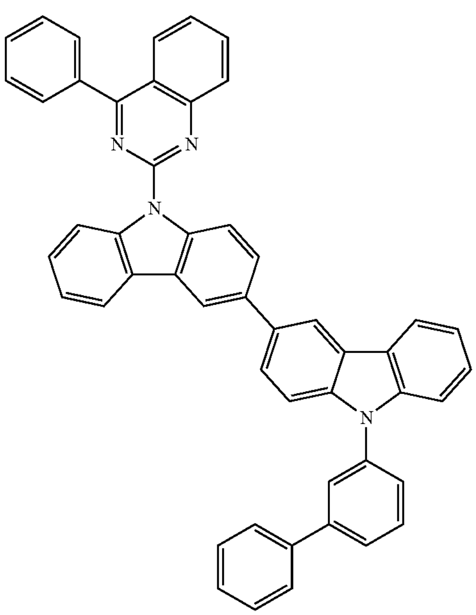
-continued
H42
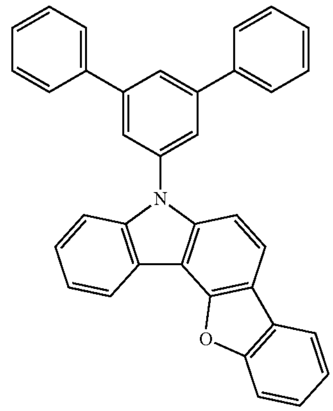
H43
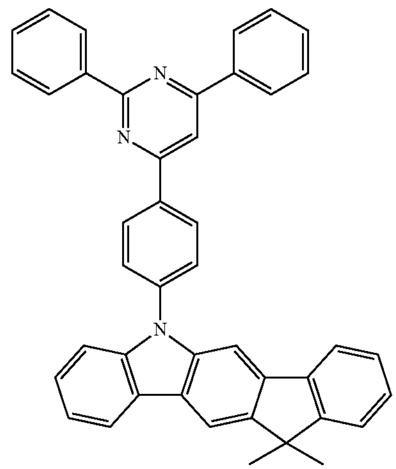
H44
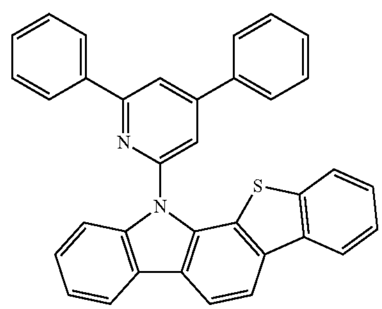
H45
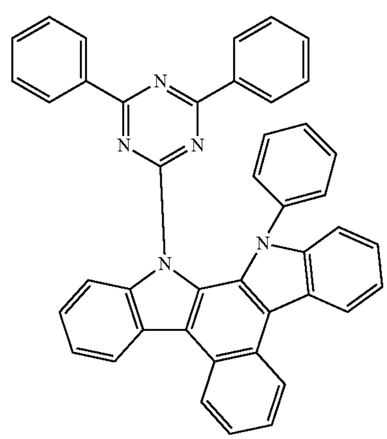

-continued

H46

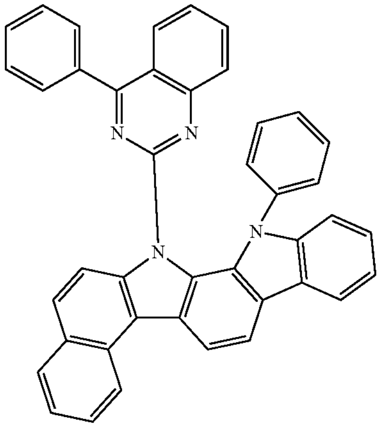

H47

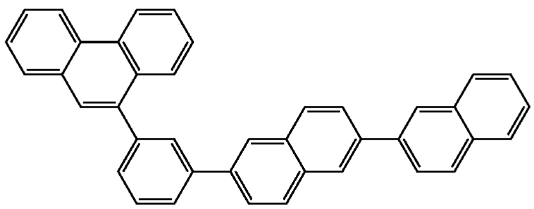

H48

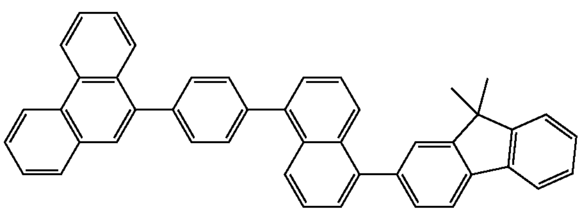

H49

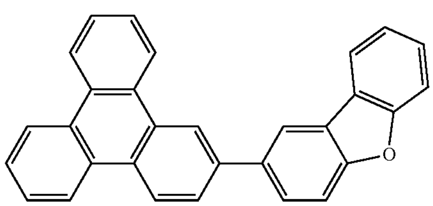

H50

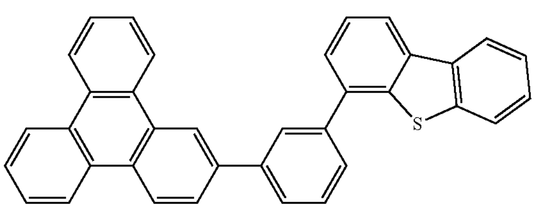

H51

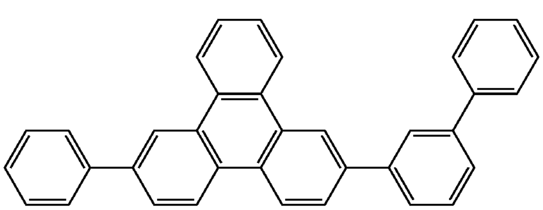

-continued

H52

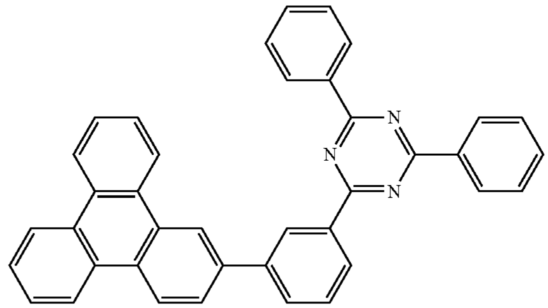

H53

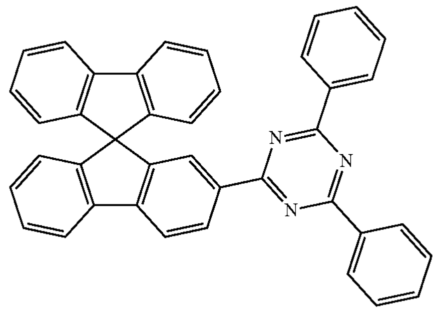

H54

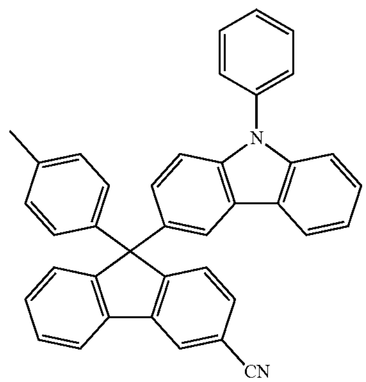

H55

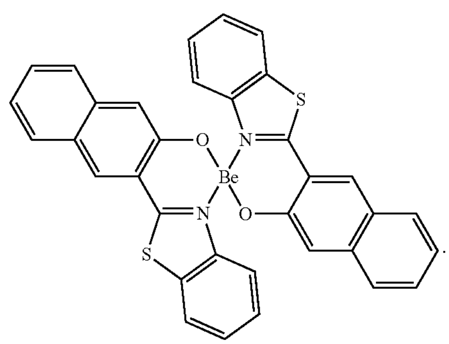

In one embodiment, the host may include a silicon-containing compound (for example, BPDS), a phosphine oxide-containing compound (for example, POPCPA), or any combination thereof.

However, embodiments of the present disclosure are not limited thereto. In one embodiment, the host may include only one compound, or two or more different compounds (for example, a host includes BPDS and POPCPA).

Phosphorescent dopant included in emission layer in organic layer 150

The phosphorescent dopant may be a transition metal-containing organometallic complex.

For example, the phosphorescent dopant may include an organometallic complex represented by Formula 401 below:

Formula 401

$$M(L_{401})_{xc1}(L_{402})_{xc2}$$

Formula 402

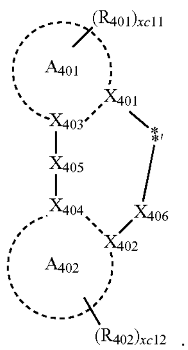

In Formulae 401 and 402,

M may be a transition metal (for example, iridium (Ir), platinum (Pt), palladium (Pd), osmium (Os), titanium ($T_1$), zirconium (Zr), hafnium (Hf), europium (Eu), terbium (Tb), rhodium (Rh), or thulium (Tm)), $L_{401}$ may be selected from ligands represented by Formula 402, and xc1 may be 1, 2, or 3, wherein, when xc1 is 2 or more, two or more $L_{401}$(s) may be identical to or different from each other, $L_{402}$ may be an organic ligand, and xc2 may be one of an integer from 0 to 4, wherein, when xc2 is 2 or more, two or more $L_{402}$(s) may be identical to or different from each other, $X_{401}$ to $X_{404}$ may each independently be nitrogen or carbon, $X_{401}$ and $X_{403}$ may be linked via a single bond or a double bond, and $X_{402}$ and $X_{404}$ may be linked via a single bond or a double bond, A401 and A402 may each independently be selected from a $C_5$-$C_{60}$ carbocyclic group or a $C_1$-$C_{60}$ heterocyclic group, $X_{405}$ may be a single bond, *—O—*', *—S—*', *—C(═O)—*', *—N($Q_{411}$)-*', *—C($Q_{411}$)($Q_{412}$)-*', *—C($Q_{411}$)═C($Q_{412}$)-*, *—C($Q_{411}$)═*', or *═C═*', wherein $Q_{411}$ and $Q_{412}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$), wherein $Q_{401}$ to $Q_{403}$ may each independently be a $C_1$-$C_{10}$ alkyl group, a $C_1$-$C_{10}$ alkoxy group, a $C_6$-$C_{20}$ aryl group, or a $C_1$-$C_{20}$ heteroaryl group, xc11 and xc12 may each independently be one of an integer from 0 to 10, and

* and *' in Formula 402 each indicate a binding site to M in Formula 401.

In one embodiment, $A_{401}$ and $A_{402}$ in Formula 402 may each independently be a benzene group, a naphthalene group, a fluorene group, a spiro-bifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an benzoisothiophene group, a benzoxazole group, an benzoisoxazole group, a triazole group, a tetrazole group, an oxadiazole group, a triazine group, a dibenzofuran group, or a dibenzothiophene group.

In one or more embodiments, in Formula 402, i) $X_{401}$ may be nitrogen, and $X_{402}$ may be carbon, or ii) $X_{401}$ and $X_{402}$ may each be nitrogen at the same time In one or more embodiments, $R_{401}$ and $R_{402}$ in Formula 402 may each independently be:

hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one selected from deuterium, —F, —Cl, —Br, —I, a hydroxyl group, a cyano group, a nitro group, an amidino group, a hydrazine group, a hydrazone group, a phenyl group, a naphthyl group, a cyclopentyl group, a cyclohexyl group, an adamantanyl group, a norbornanyl group, a norbornenyl group, or any combination thereof;

a cyclopentyl group, a cyclohexyl group, an adamantanyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, or a dibenzothiophenyl group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, a dibenzothiophenyl group, or any combination thereof; or —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$), and $Q_{401}$ to $Q_{403}$ may each independently be a $C_1$-$C_{10}$ alkyl group, a $C_1$-$C_{10}$ alkoxy group, a phenyl group, a biphenyl group, or a naphthyl group, but embodiments of the present disclosure are not limited thereto.

In one or more embodiments, in Formula 401, when xc1 is 2 or more, two $A_{401}$(s) in two or more $L_{401}$(s) may optionally be linked to each other via $X_{407}$, which is a linking group, or when xc1 is 2 or more, two $A_{402}$(s) in two or more $L_{401}$(s) may optionally be linked to each other via, $X_{408}$, which is a linking group (see Compounds PD1 to PD4 and PD7). $X_{407}$ and $X_{408}$ may each independently be a single bond, *—O—*' *—S—*', *—C(═O)—*', *—N($Q_{413}$)-*', *—C($Q_{413}$)($Q_{414}$)-*' or *—C($Q_{413}$)═C($Q_{414}$)-*' (wherein $Q_{413}$ and $Q_{414}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group), but embodiments of the present disclosure are not limited thereto.

$L_{402}$ in Formula 401 may be a monovalent, divalent, or trivalent organic ligand. For example, $L_{402}$ may be selected from halogen, diketone (for example, acetylacetonate), carboxylic acid (for example, picolinate), —C(═O), isonitrile, —CN, and phosphorus (for example, phosphine, or phosphite), but embodiments of the present disclosure are not limited thereto.

In one or more embodiments, the phosphorescent dopant may be selected from, for example, Compounds PD1 to PD25, but embodiments of the present disclosure are not limited thereto:

PD1

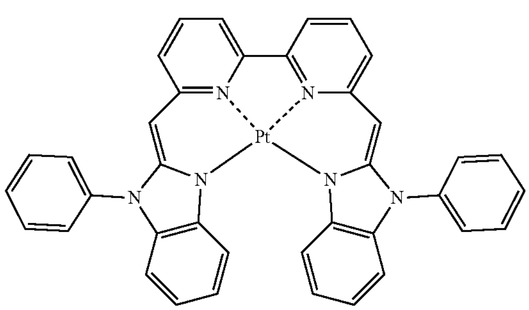

PD2

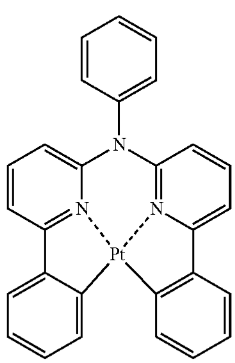

-continued

PD3

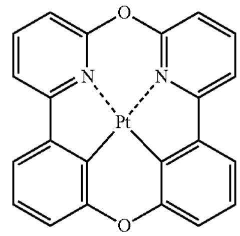

PD4

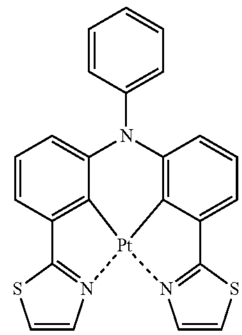

PD5

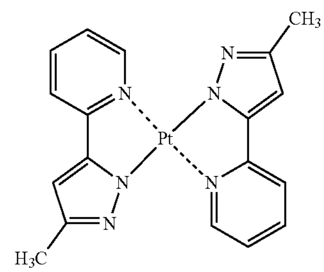

PD6

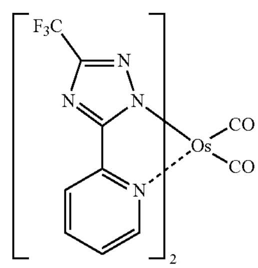

PD7

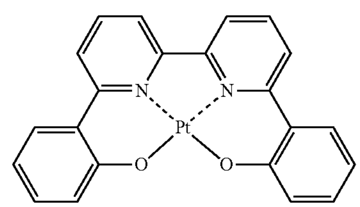

PD8

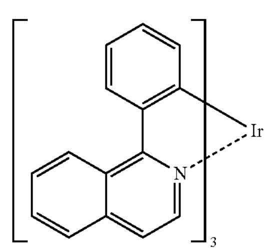

-continued
PD9
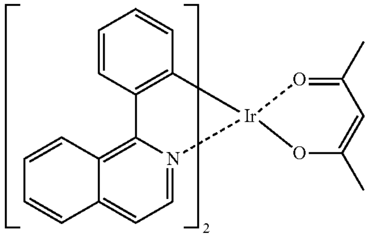
PD10
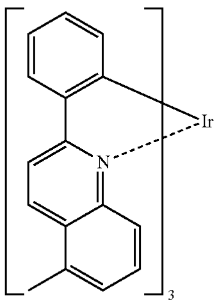
PD11
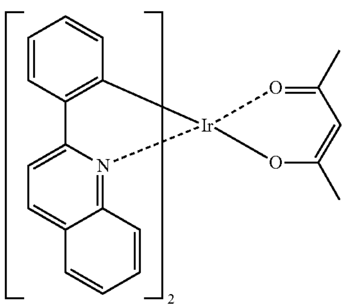
PD12
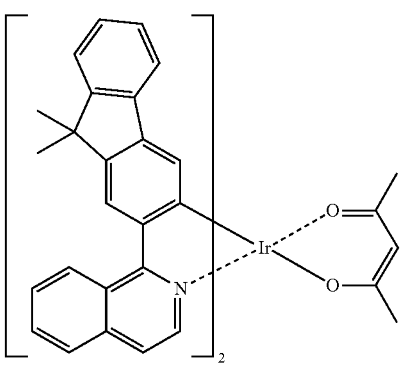
PD13
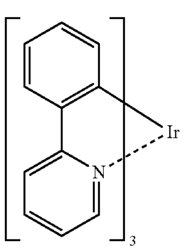
-continued
PD14
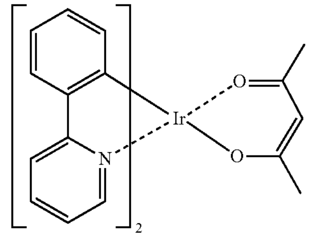
PD15
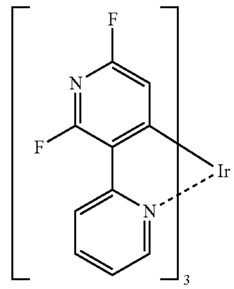
PD16
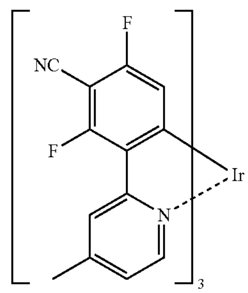
PD17
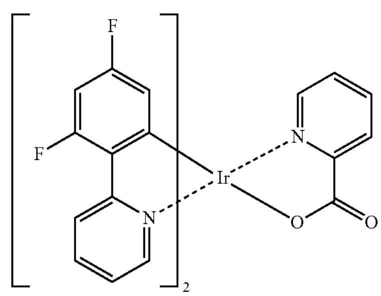
PD18
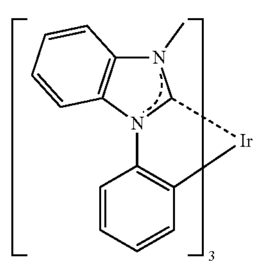

-continued

PD19

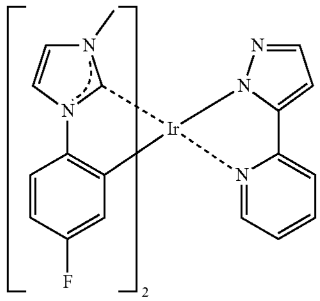

PD20

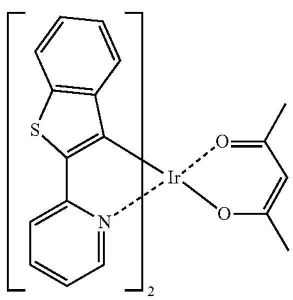

PD21

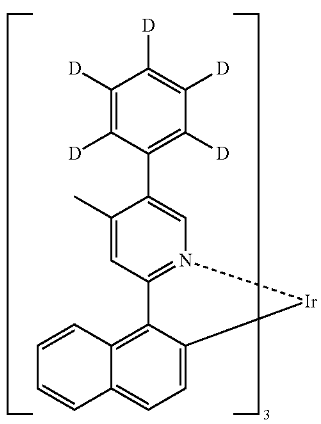

PD22

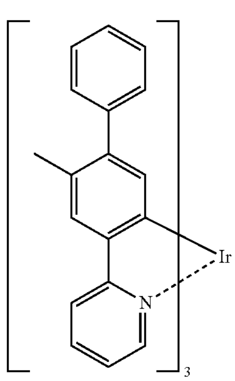

-continued

PD23

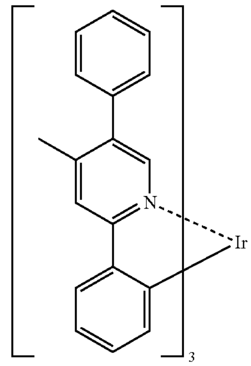

PD24

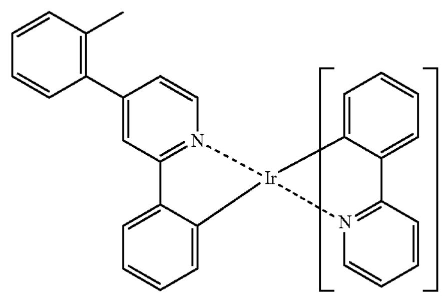

PD25

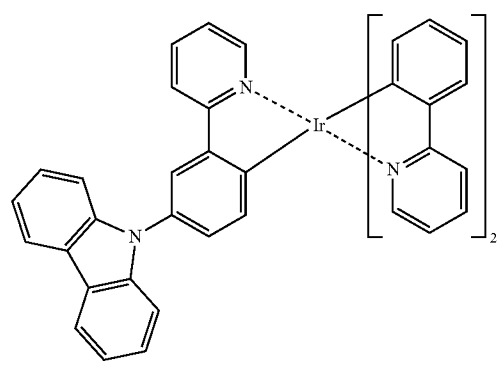

Fluorescent Dopant Included in Emission Layer in Organic Layer 150

The fluorescent dopant may include an arylamine compound, a styrylamine compound, a boron-containing compound, or any combination thereof.

For example, the fluorescent dopant may include a compound represented by Formula 501 below, a compound represented by Formula 502 below, or any combination thereof:

Formula 501

$$Ar_{501}-\left[(L_{503})_{xd3}-N\begin{matrix}(L_{501})_{xd1}-R_{501}\\(L_{502})_{xd2}-R_{502}\end{matrix}\right]_{xd4}$$

-continued

Formula 502

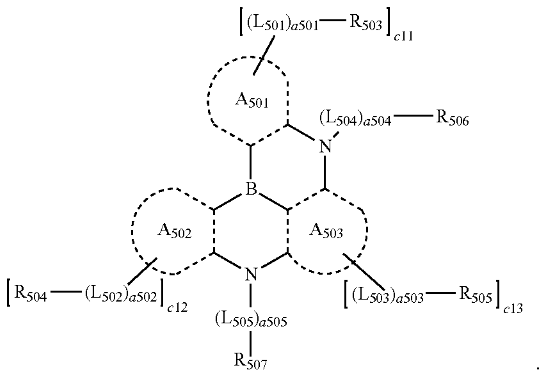

In Formulae 501 and 502, $Ar_{501}$ may be a substituted or unsubstituted $C_5$-$C_{60}$ carbocyclic group or a substituted or unsubstituted $C_1$-$C_{60}$ heterocyclic group, A501 to $A_{503}$ may each independently be a $C_5$-$C_{60}$ carbocyclic group or a $C_1$-$C_{60}$ heterocyclic group, $L_{501}$ to $L_{505}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xd1 to xd3 may each independently be one of an integer from 0 to 3, a501 to a505 may each independently be one of an integer from 0 to 3, $R_{501}$ and $R_{502}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, $R_{503}$ to $R_{507}$ may each independently be a substituted or unsubstituted $C_3$-$C_{10}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, xd4 may be an integer from 1 to 6, and c11 to c13 may each independently be one of an integer from 0 to 6.

In one embodiment, $Ar_{501}$ in Formula 501 may be a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, or indeno phenanthrene group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, or any combination thereof.

In one or more embodiments, $A_{501}$ to $A_{503}$ in Formula 502 may each independently be a benzene group, a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, an indeno phenanthrene group, or a group represented by Formula 503:

Formula 503

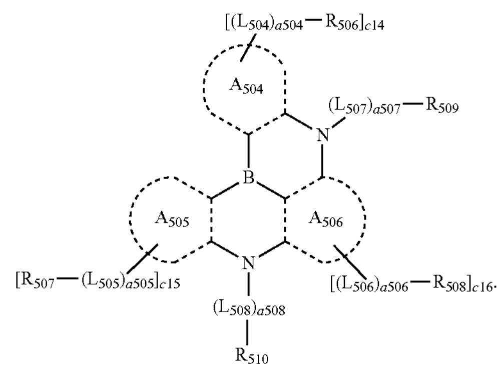

In Formula 503, $A_{504}$ to $A_{506}$ may each independently be the same as described in connection with $A_{501}$ in Formula 502, $L_{504}$ to $L_{508}$ may each independently be the same as described in connection with $L_{501}$ in Formula 502, a504 to a508 may each independently be the same as described in connection with a501 in Formula 502, $R_{506}$ to $R_{510}$ may each independently be the same as described in connection with $R_{503}$ in Formula 502, and c14 to c16 may each independently be the same as described in connection with c11 in Formula 502.

In one or more embodiments, in Formulae 501 and 502, $L_{501}$ to $L_{505}$ may each independently be a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, or a pyridinylene group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, or any combination thereof.

In one or more embodiments, $R_{501}$ and $R_{502}$ in Formula 501 may each independently be a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, or a pyridinyl group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), or any combination thereof, and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

In one or more embodiments, $R_{503}$ to $R_{507}$ in Formula 502 may each independently be a methyl group, an ethyl group, an n-propyl group, an isopropyl group, an n-butyl group, an isobutyl group, a sec-butyl group, a tert-butyl group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, or a pyridinyl group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), or any combination thereof, and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

In one or more embodiments, xd4 in Formula 501 may be 2, but embodiments of the present disclosure are not limited thereto.

In one or more embodiments, c11 to c13 in Formula 502 may be 0 or 1, but embodiments of the present disclosure are not limited thereto.

For example, the fluorescent dopant may be selected from Compounds FD1 to FD27:

FD1

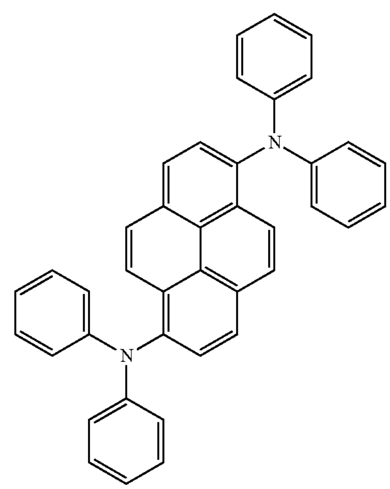

FD2

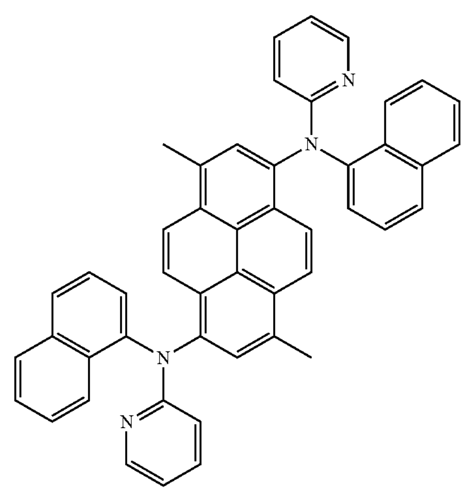

-continued
FD3
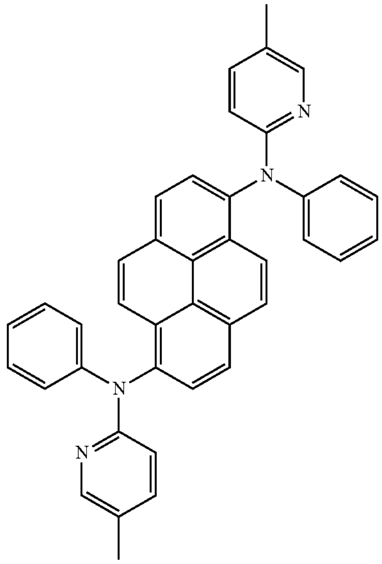
FD4
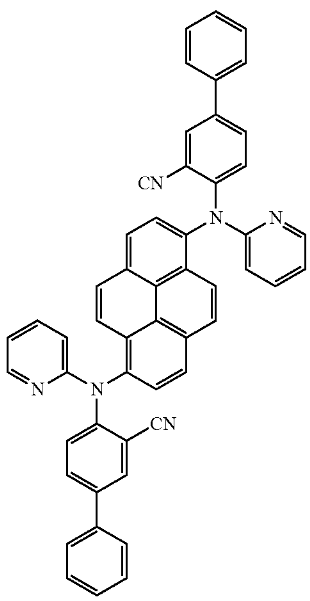
FD5
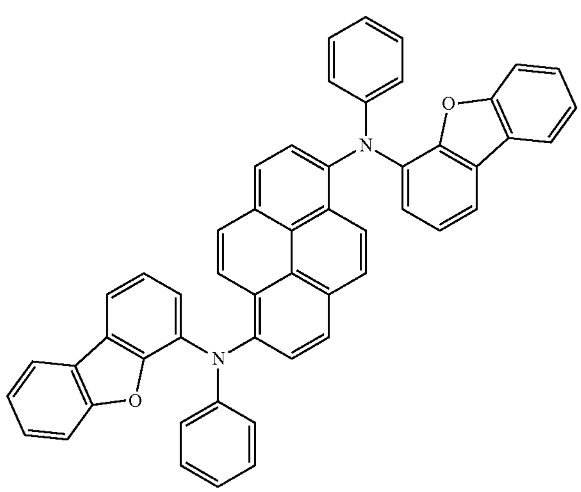
-continued
FD6
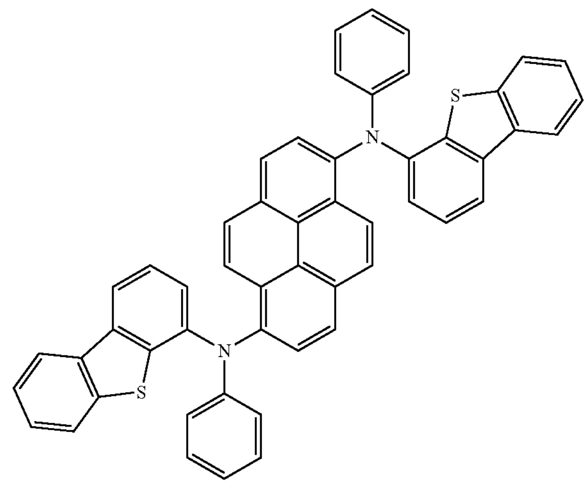
FD7
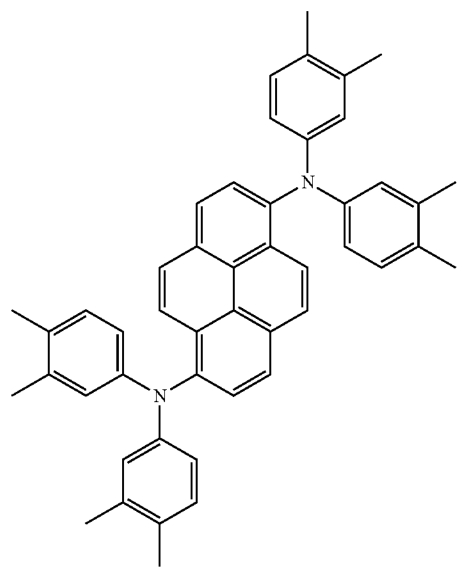
FD8
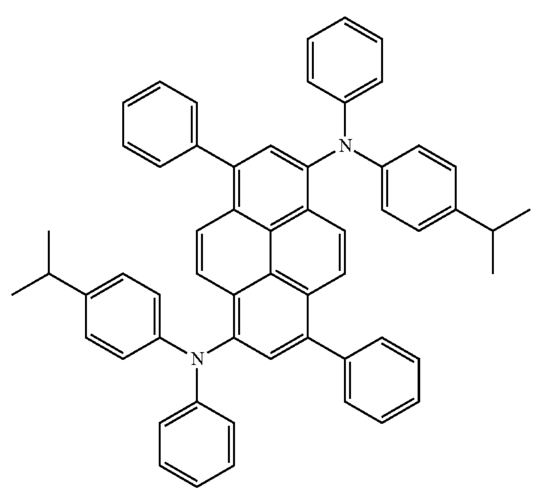

-continued
FD9
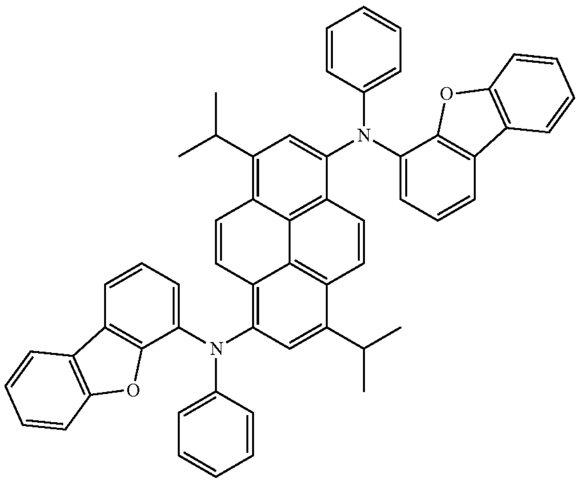
FD10
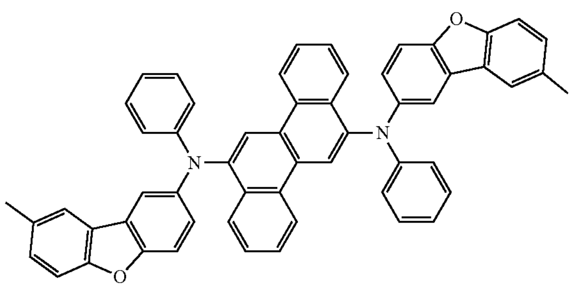
FD11
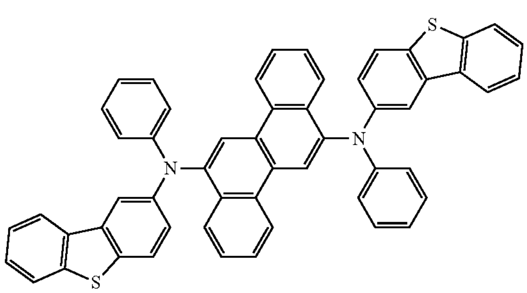
FD12
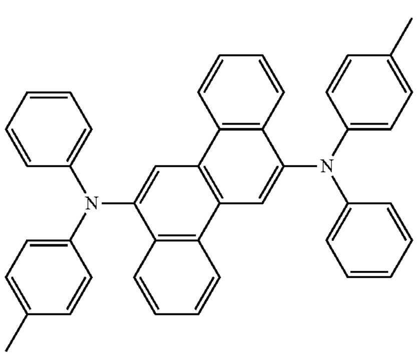
-continued
FD13
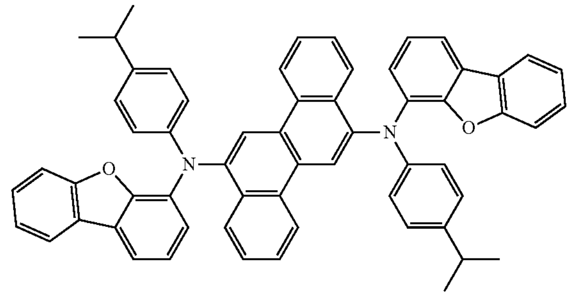
FD14
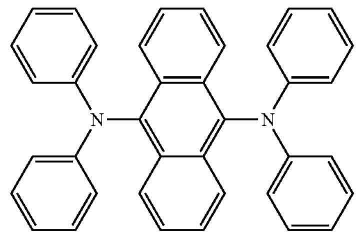
FD15
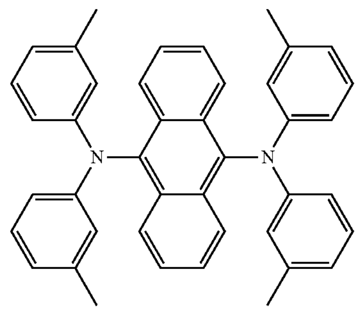
FD16
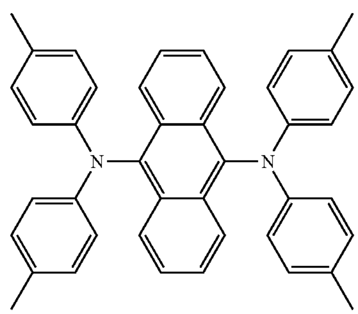
FD17
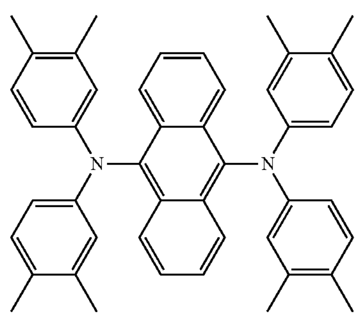

-continued
FD18
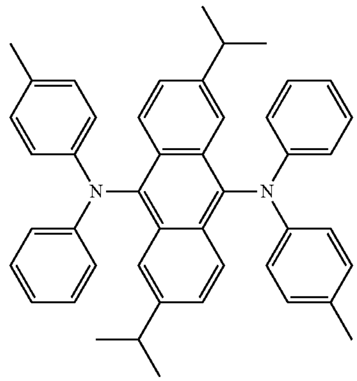
FD19
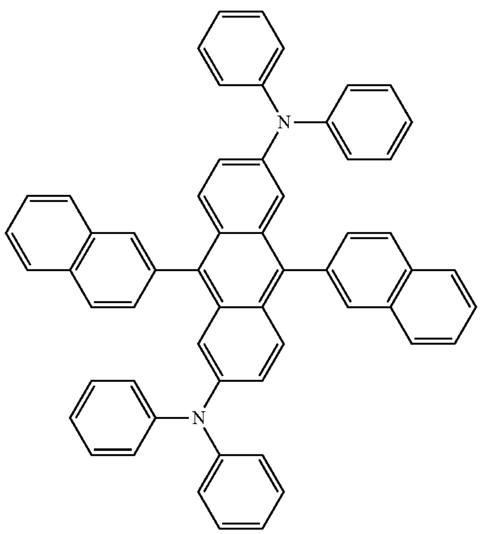
FD20
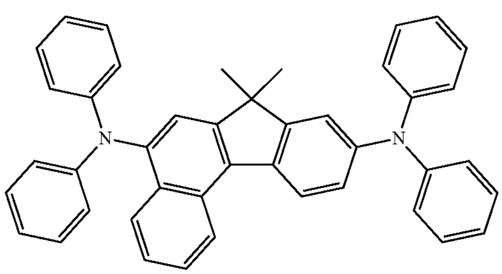
FD21
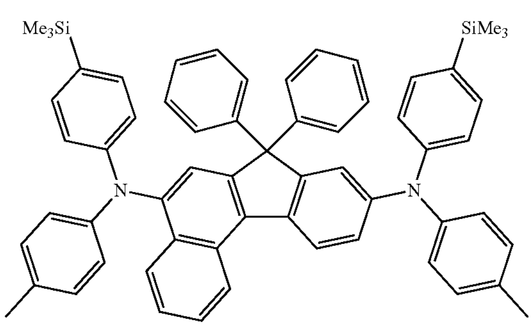
-continued
FD22
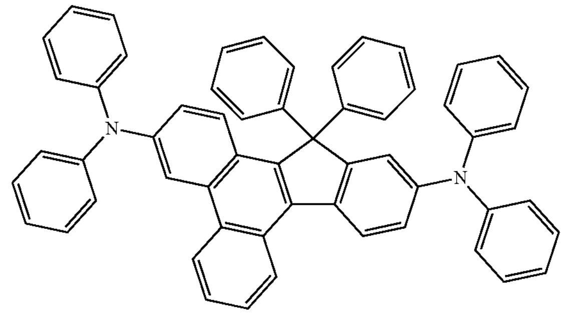
FD23
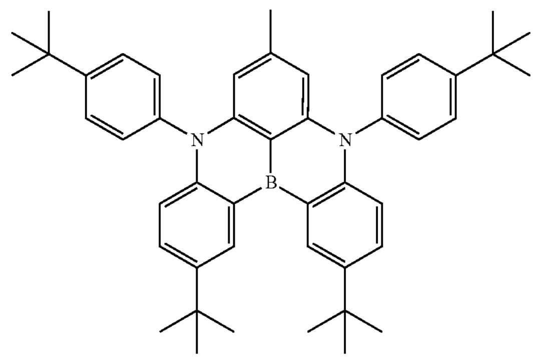
FD24
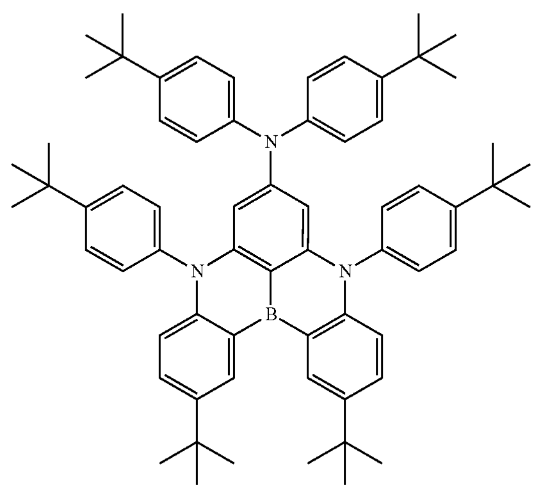
FD25
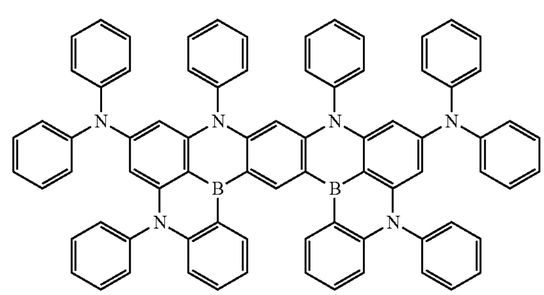

-continued
FD26
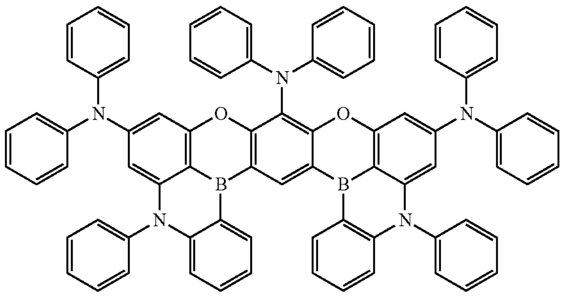
-continued
FD27
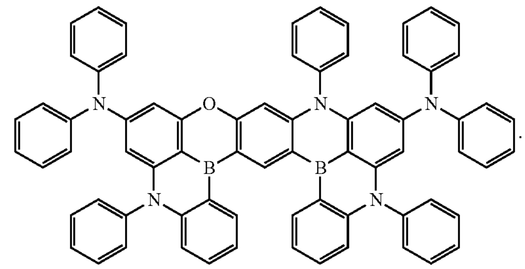
In one or more embodiments, the fluorescent dopant may be selected from the following compounds, but embodiments of the present disclosure are not limited thereto:
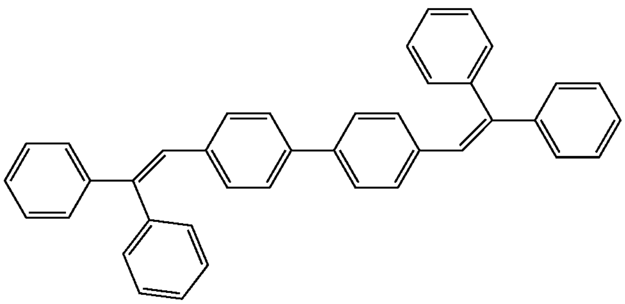
DPVBi
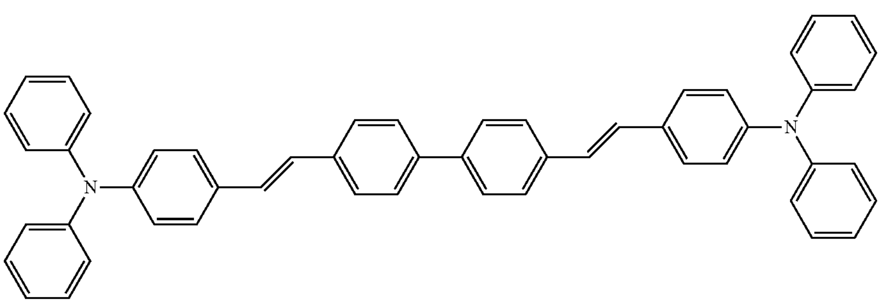
DPAVBi
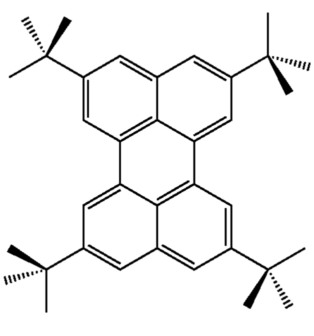
TBPe
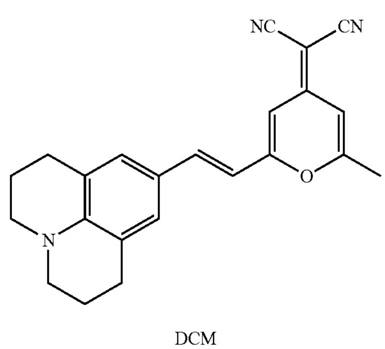
DCM
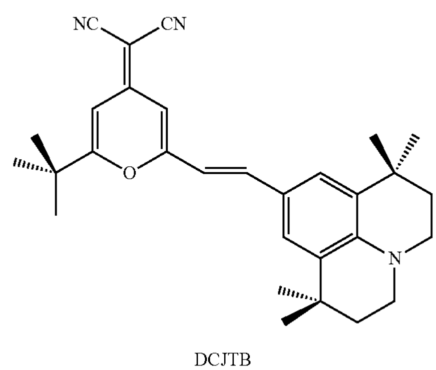
DCJTB -continued

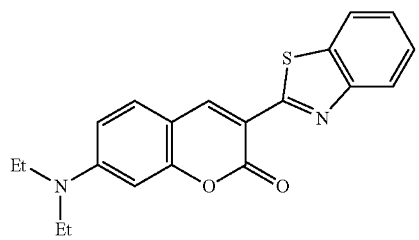

Coumarin 6

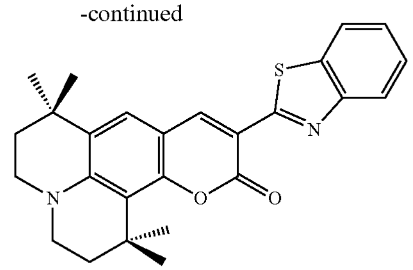

C545T

Electron Transport Region in Organic Layer 150

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include at least one selected from a buffer layer, a hole blocking layer, an electron control layer, an electron transport layer, and an electron injection layer, but embodiments of the present disclosure are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from an emission layer. However, embodiments of the structure of the electron transport region are not limited thereto.

The electron transport region may include the second compound as described above.

In one embodiment, the electron transport region may include a buffer layer. The buffer layer may directly contact (e.g., physically contact) the emission layer, and may include the second compound.

In one or more embodiments, the electron transport region may include a buffer layer, an electron transport layer, and an electron injection layer, which are stacked in this stated order on the emission layer, and the buffer layer may include the second compound as described above.

The electron transport region (for example, a hole blocking layer, an electron control layer, or an electron transport layer in the electron transport region) may include a metal-free compound containing at least one π electron-depleted nitrogen-containing ring.

The term "π electron-depleted nitrogen-containing ring," as used herein, refers to a $C_1$-$C_{60}$ heterocyclic group having at least one *—N=*' moiety as a ring-forming moiety.

For example, the "π electron-depleted nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other (e.g., combined together), or iii) a heteropolycyclic group in which at least one of 5-membered to 7-membered heteromonocyclic groups, each having at least one *—N=*' moiety, is condensed (e.g., combined together) with at least one $C_5$-$C_{60}$ carbocyclic group.

Examples of the π electron-depleted nitrogen-containing ring include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an benzoisothiazole, a benzoxazole, an benzoisoxazole, a triazole, a tetrazole, an oxadiazole, a triazine, a thiadiazole, an imidazopyridine, an imidazopyrimidine, and an azacarbazole, but are not limited thereto.

For example, the electron transport region may include a compound represented by Formula 601 below:

$$[Ar_{601}]_{xe11}\text{-}[(L_{601})_{xe1}\text{-}R_{601}]_{xe21}. \qquad \text{Formula 601}$$

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, xe1 may be one of an integer from 0 to 5, $R_{601}$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—Si(Q_{601})(Q_{602})(Q_{603})$, $—C(=O)(Q_{601})$, $—S(=O)_2(Q_{601})$, or $—P(=O)(Q_{601})(Q_{602})$, and $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be one of an integer from 1 to 5.

In one embodiment, at least one of the $Ar_{601}$(s) (e.g., $Ar_{601}$(s) in the number of xe11) and the $R_{601}$(s) (e.g., $R_{601}$(s) in the number of xe21) may include the π electron-depleted nitrogen-containing ring.

In one embodiment, $Ar_{601}$ in Formula 601 may be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an benzoisothiazole group, a benzoxazole group, an benzoisoxazole group, a triazole group, a tetrazole group, an oxadiazole group, a triazine group, a thiadiazole group, an imidazopyridine group, an imidazopyrimidine group, or an azacarbazole group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, —$Si(Q_{31})(Q_{32})(Q_{33})$, —$S(=O)_2(Q_{31})$, —$P(=O)(Q_{31})(Q_{32})$, or any combination thereof, and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

In Formula 601, when xe11 is 2 or more, two or more $Ar_{601}$(s) may be linked via a single bond.

In one or more embodiments, $Ar_{601}$ in Formula 601 may be an anthracene group.

In one or more embodiments, a compound represented by Formula 601 may be represented by Formula 601-1 below:

Formula 601-1

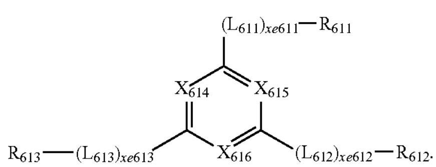

In Formula 601-1, $X_{614}$ may be N or $C(R_{614})$, $X_{615}$ may be N or $C(R_{615})$, $X_{616}$ may be N or $C(R_{616})$, and at least one selected from $X_{614}$ to $X_{616}$ may be N, $L_{611}$ to $L_{613}$ may each independently be the same as described in connection with $L_{601}$, xe611 to xe613 may each independently be defined the same as xe1, $R_{611}$ to $R_{613}$ may each independently be the same as described in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, and a naphthyl group.

In one embodiment, $L_{601}$ and $L_{611}$ to $L_{613}$ in Formulae 601 and 601-1 may each independently be a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an benzoisothiazolylene group, a benzoxazolylene group, an benzoisoxazolylene group, a triazolylene group, a tetrazolylene group, an imidazopyridinylene group, an imidazopyrimidinylene group, or an azacarbazolylene group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an benzoisothiazolyl group, a benzoxazolyl group, an benzoisoxazolyl group, a triazolyl group, a tetrazolyl group, an imidazopyridinyl group, an imidazopyrimidinyl group, an azacarbazolyl group, or any combination thereof, but embodiments of the present disclosure are not limited thereto.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formula 601 and 601-1 may each independently be a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an benzoisothiazolyl group, a benzoxazolyl group, an benzoisoxazolyl group, a triazolyl group, a tetrazolyl group, an imidazopyridinyl group, an imidazopyrimidinyl group, or an azacarbazolyl group, each unsubstituted or substituted with deuterium, —F, —Cl, —Br, —I, a hydroxyl group, a cyano group, a nitro group, an amidino group, a hydrazine group, a hydrazone group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an benzoisothiazolyl group, a benzoxazolyl group, an benzoisoxazolyl group, a triazolyl group, a tetrazolyl group, an imidazopyridinyl group, an imidazopyrimidinyl group, an azacarbazolyl group, or any combination thereof; or —S(=O)$_2$($Q_{601}$) or —P(=O)($Q_{601}$)($Q_{602}$), and $Q_{601}$ and $Q_{602}$ are the same as described herein above.

The electron transport region may include one of Compounds ET1 to ET36, or any combination thereof, but embodiments of the present disclosure are not limited thereto:

ET1

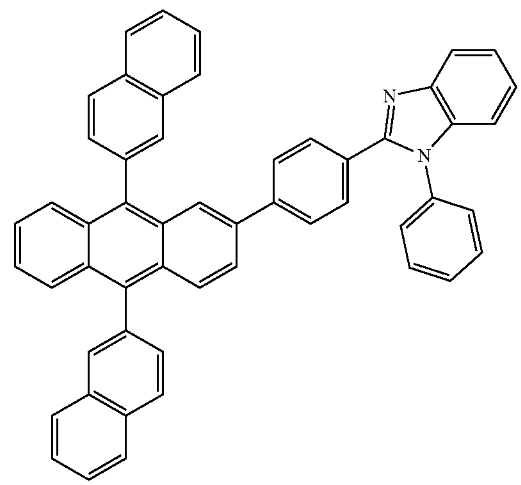

ET2

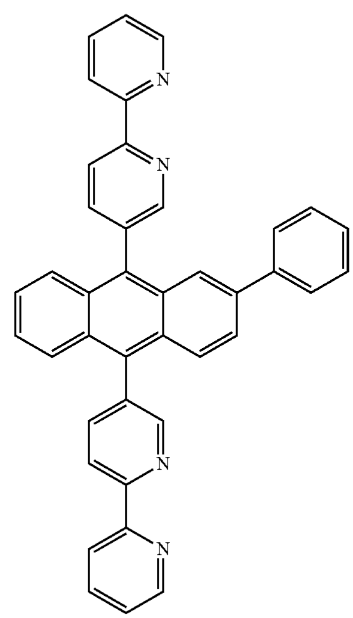

-continued
ET3
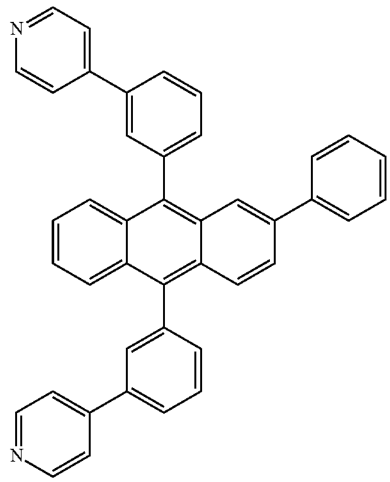
ET4
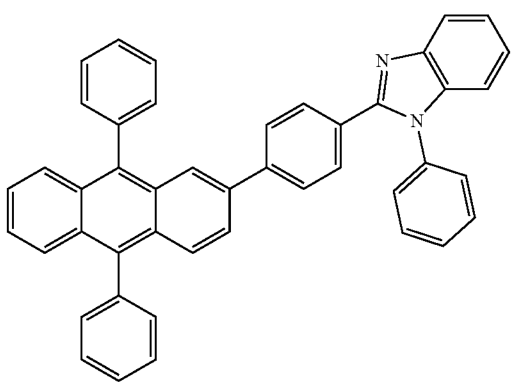
ET5
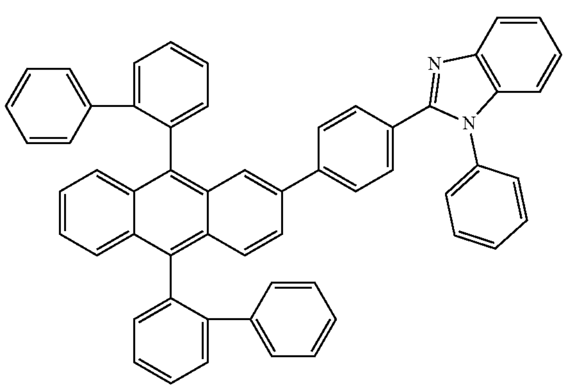
-continued
ET6
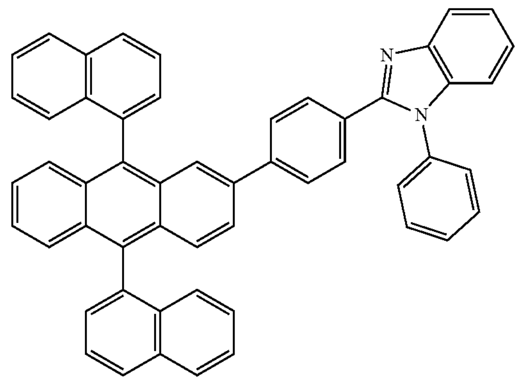
ET7
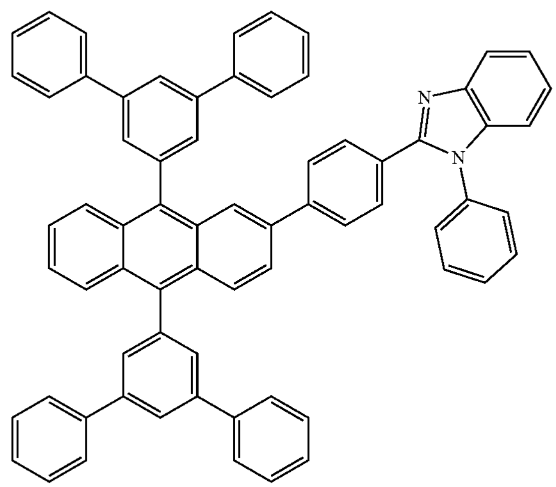
ET8
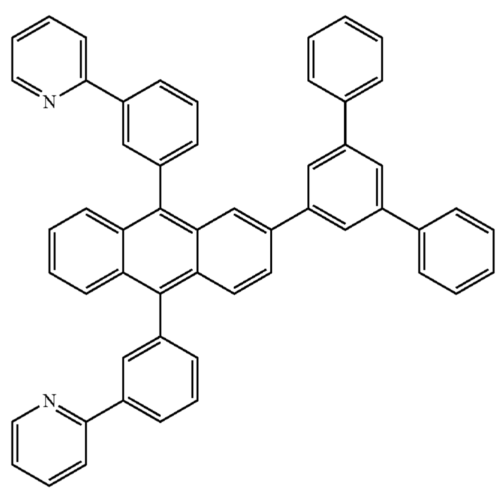

-continued
ET9
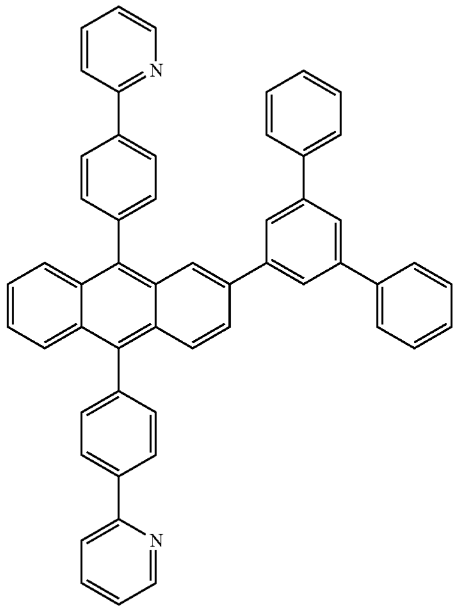
ET10
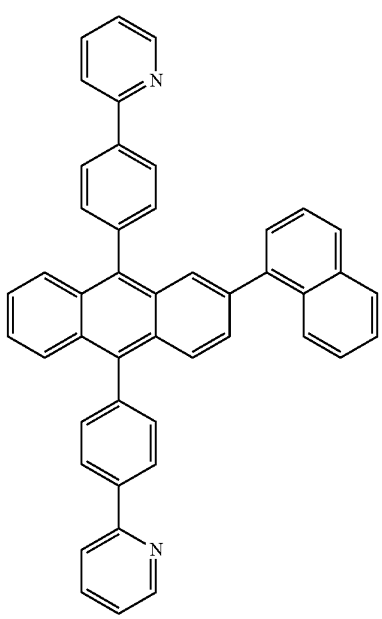
-continued
ET11
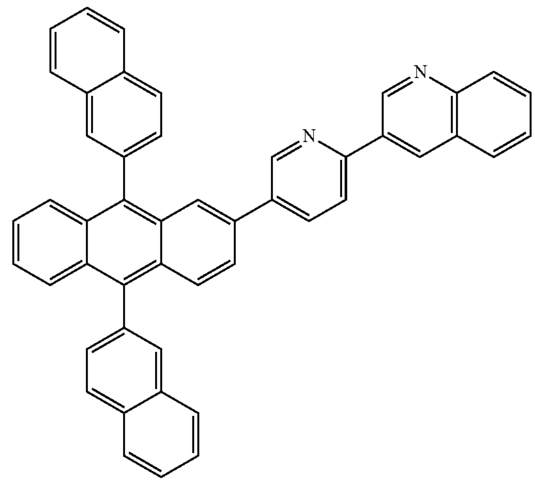
ET12
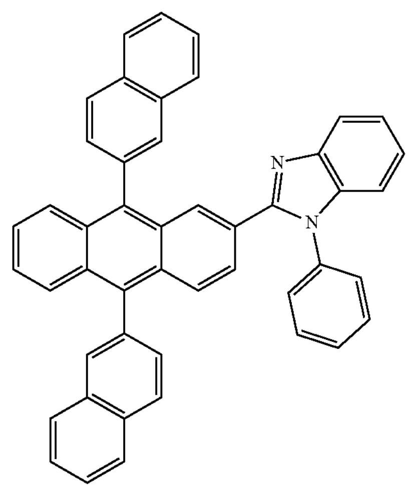
ET13
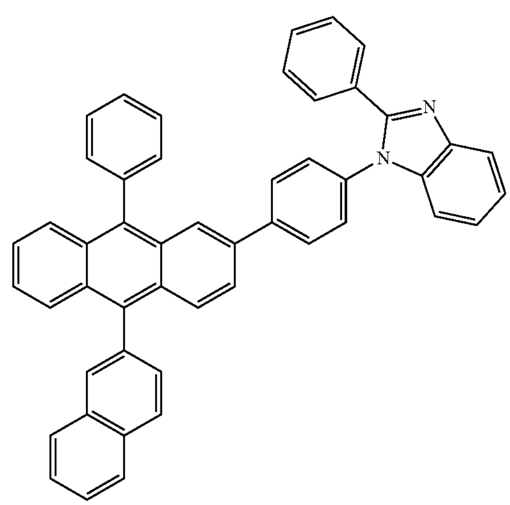

-continued
ET14
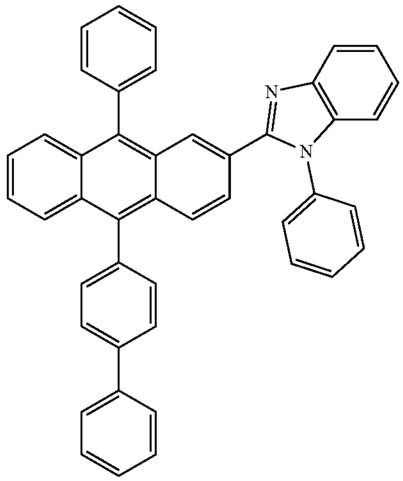
ET15
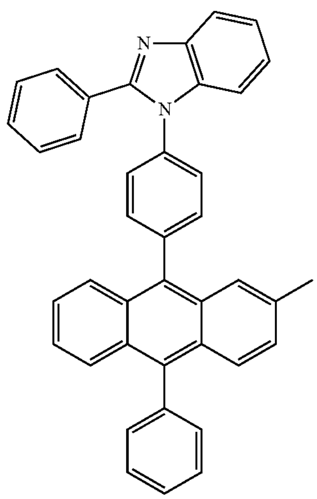
ET16
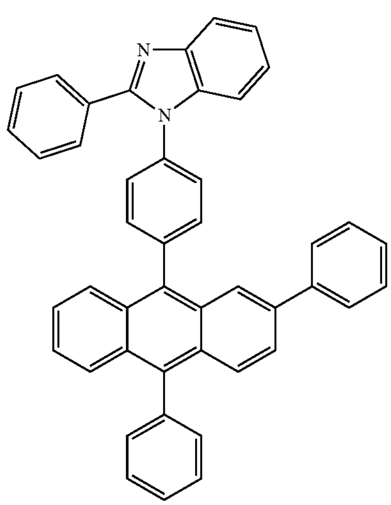
-continued
ET17
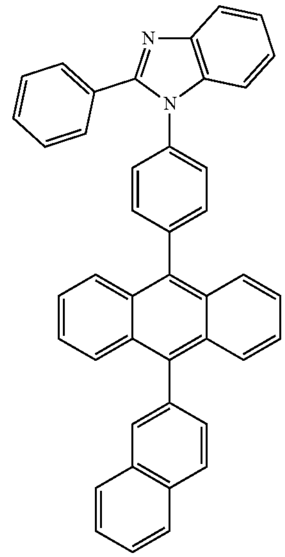
ET18
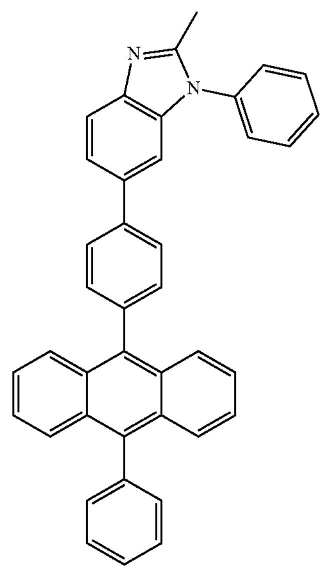
ET19
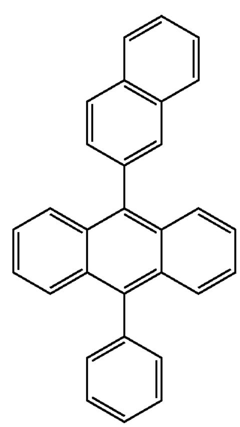

-continued
ET20
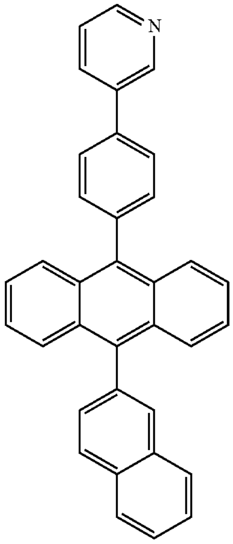
ET21
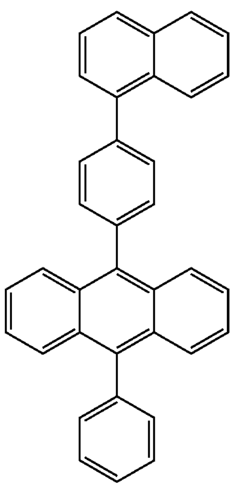
ET22
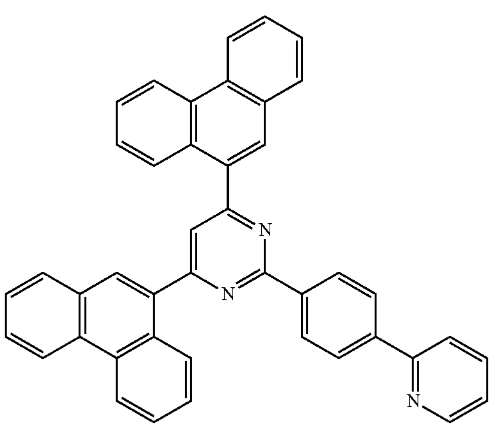
-continued
ET23
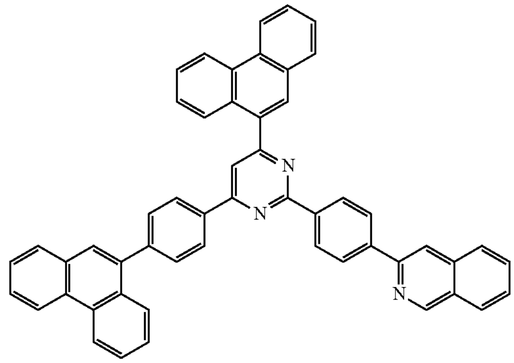
ET24
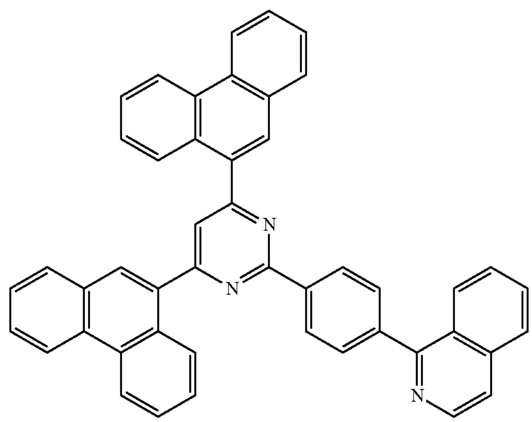
ET25
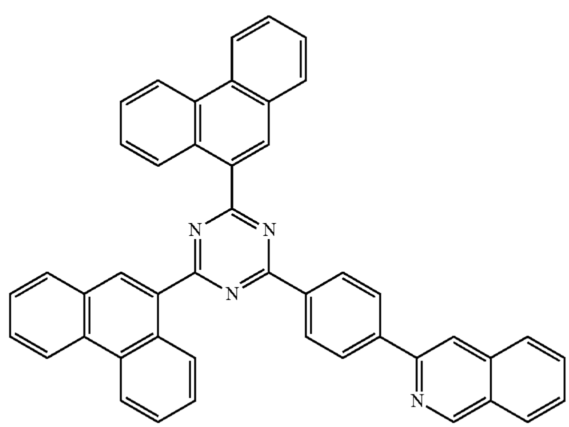

-continued
ET26
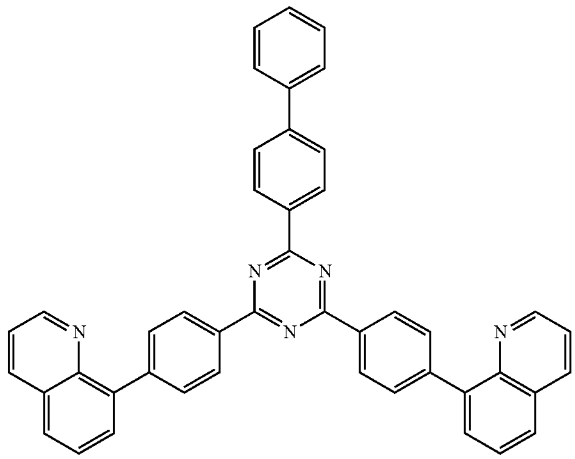
ET27
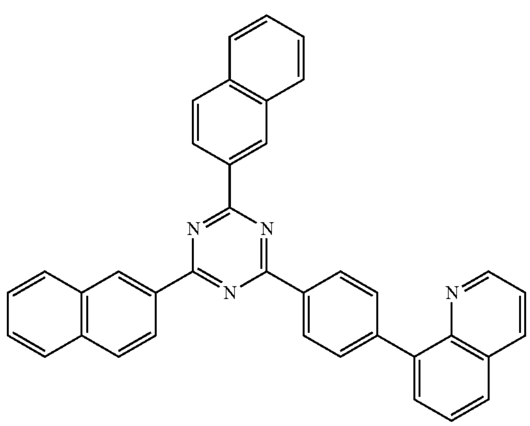
ET28
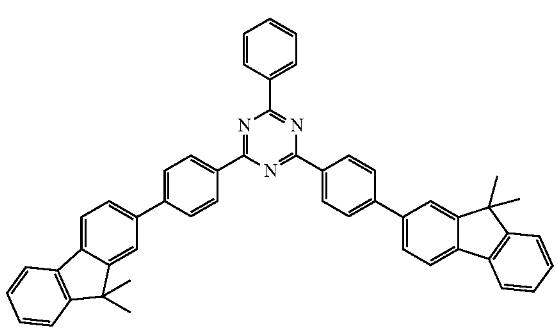
-continued
ET29
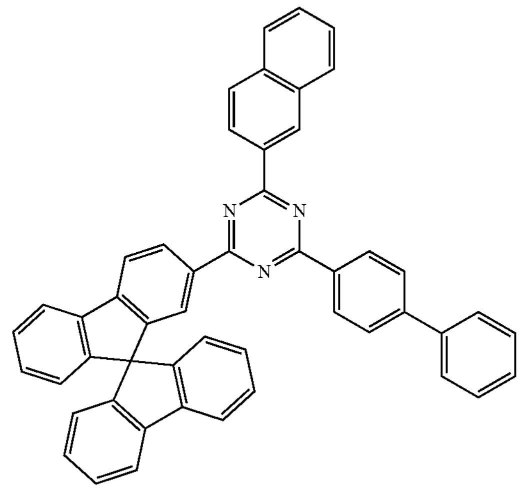
ET30
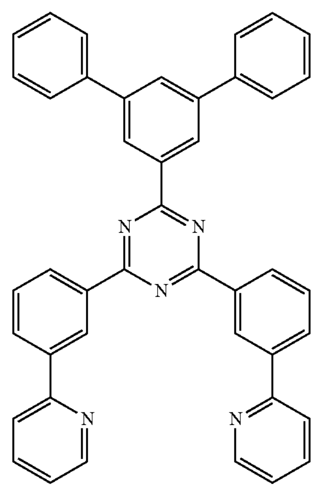
ET31
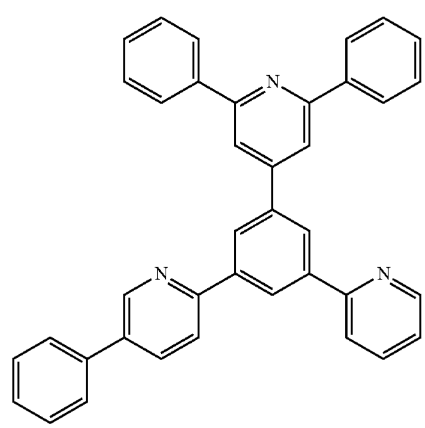

-continued
ET32
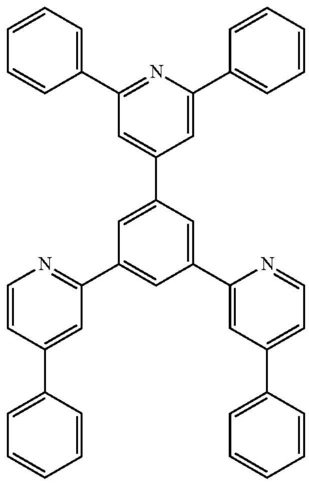
ET33
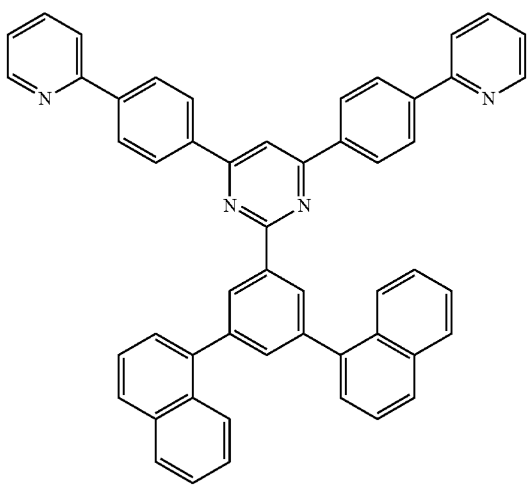
ET34
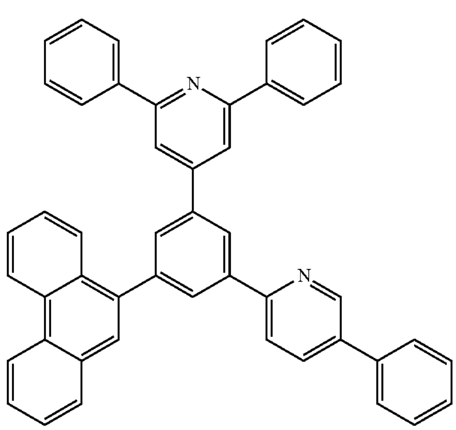
-continued
ET35
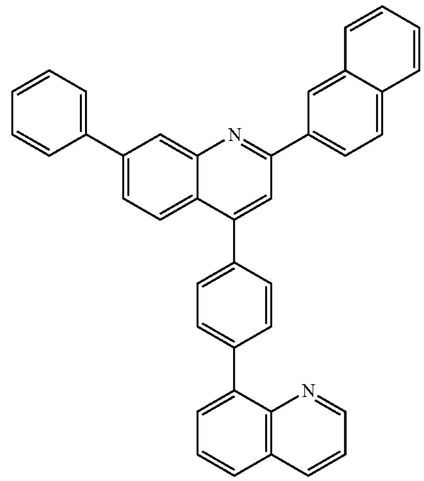
ET36
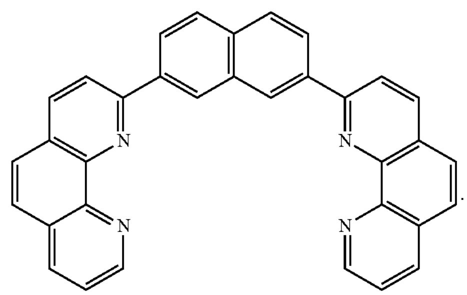
In one or more embodiments, the electron transport region may include 2,9-dimethyl-4,7-diphenyl-1, 10-phenanthroline (BCP), 4,7-diphenyl-1, 10-phenanthroline (Bphen), Alq3, BAlq, 3-(biphenyl-4-yl)-5-(4-tert-butylphenyl)-4-phenyl-4H-1,2,4-triazole (TAZ), NTAZ, or any combination thereof:
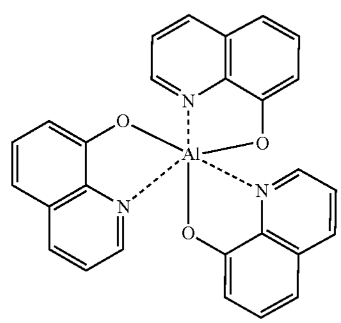
$Alq_3$
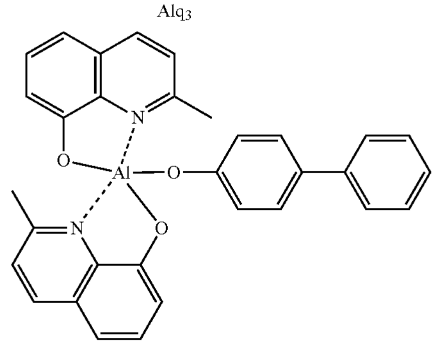
BAlq -continued

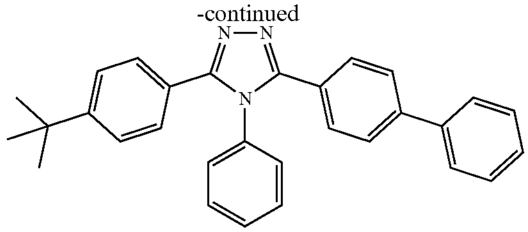

TAZ

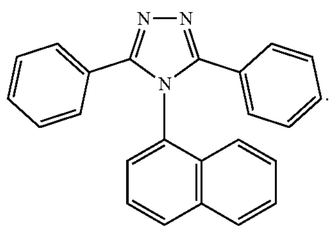

NTAZ

A thickness of the buffer layer, the hole blocking layer, or the electron control layer may be in a range of about 20 Å to about 1,000 Å, for example, about 30 Å to about 300 Å. When the thicknesses of the buffer layer, the hole blocking layer, and the electron control layer are within these ranges, the hole blocking layer or electron control layer may have excellent hole blocking characteristics or electron control characteristics without a substantial increase in driving voltage.

A thickness of the electron transport layer may be from about 100 Å to about 1,000 Å, for example, about 150 Å to about 500 Å. When the thickness of the electron transport layer is within the range described above, the electron transport layer may have suitable or satisfactory electron transport characteristics without a substantial increase in driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. The alkali metal complex may include a metal ion from a Li ion, a Na ion, a K ion, a Rb ion, or a Cs ion, and the alkaline earth-metal complex may include a metal ion from a Be ion, a Mg ion, a Ca ion, a Sr ion, or a Ba ion. A ligand coordinated with the metal ion of the alkali metal complex or the alkaline earth-metal complex may include a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy phenyloxadiazole, a hydroxy phenylthiadiazole, a hydroxy phenylpyridine, a hydroxy phenylbenzimidazole, a hydroxy phenylbenzothiazole, a bipyridine, a phenanthroline, a cyclopentadiene, or any combination thereof, but embodiments of the present disclosure are not limited thereto.

For example, the metal-containing material may include a Li complex. The Li complex may include, for example, Compound ET-D1 (LiQ) or ET-D2:

ET-D1

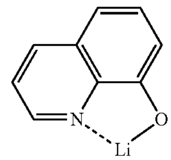

ET-D2

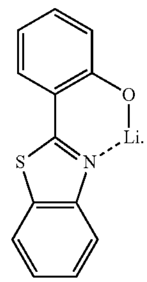

The electron transport region may include an electron injection layer that facilitates electron injection from the second electrode 190. The electron injection layer may directly contact the second electrode 190.

The electron injection layer may have i) a single-layered structure consisting of a single layer consisting of a single material, ii) a single-layered structure consisting of a single layer including a plurality of different materials, or iii) a multi-layered structure having a plurality of layers including a plurality of different materials.

The electron injection layer may include an alkali metal, alkaline earth metal, a rare earth metal, an alkali metal-containing compound, an alkaline earth metal-containing compound, a rare earth metal-containing compound, an alkali metal complex, an alkaline earth-metal complex, a rare earth-metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides and halides (for example, fluorides, chlorides, bromides, or iodides) of the alkali metal, the alkaline earth-metal, and the rare earth metal).

The alkali metal-containing compound may include alkali metal oxides, such as $Li_2$, $Cs_2O$, or $K_2O$, alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $BaxSr_{1-x}O$ ($0<x<1$), or $Ba_xCa_{1-x}O$ ($0<x<1$). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof.

The alkali metal complex, the alkaline earth-metal complex, and the rare earth-metal complex may include i) one of ions of alkali metal, alkaline earth-metal, and rare earth metal as described above and ii) a ligand coordinated with a metal ion of the alkali metal complex, the alkaline earth-metal complex, or the rare earth-metal complex, and examples of the ligand include hydroxy quinoline, hydroxy isoquinoline, hydroxy benzoquinoline, hydroxy acridine, hydroxy phenanthridine, hydroxy phenyloxazole, hydroxy phenylthiazole, hydroxy phenyloxadiazole, hydroxy phenylthiadiazole, hydroxy phenylpyridine, hydroxy phenylbenzimidazole, hydroxy phenylbenzothiazole, bipyridine, phenanthroline, and cyclopentadiene, but embodiments of the present disclosure are not limited thereto.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material (for example, a compound represented by Formula 601). When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

A thickness of the electron injection layer may be in a range of about 1 Å to about 100 Å, for example, about 3 Å to about 90 Å. When a thickness of the electron injection layer is within these ranges, suitable or satisfactory electron injection characteristics may be obtained without substantial increase in driving voltage.

Second Electrode 190

The second electrode 190 may be on the organic layer 150 having such the structure described above. The second electrode 190 may be a cathode which is an electron injection electrode, and in this regard, a material for forming the second electrode 190 may be metal, an alloy, an electrically conductive compound, or any combination thereof, which have a relatively low work function.

The second electrode 190 may include lithium (Li), silver (Ag), magnesium (Mg), aluminum (Al), aluminum-lithium (Al—Li), calcium (Ca), magnesium-indium (Mg—In), magnesium-silver (Mg—Ag), ITO, IZO, or any combination thereof, but embodiments of the present disclosure are not limited thereto. The second electrode 190 may be a transmissive electrode, a semi-transmissive electrode, or a reflective electrode.

The second electrode 190 may have a single-layered structure including a single layer, or a multi-layered structure including two or more layers.

Capping Layer

A first capping layer may be outside of the first electrode 110, and/or a second capping layer may be outside of the second electrode 190. In more detail, the light-emitting device 10 may have a structure in which the first capping layer, the first electrode 110, an organic layer 150, and the second electrode 190 are stacked in this stated order, a structure in which the first electrode 110, an organic layer 150, the second electrode 190, and the second capping layer are stacked in this stated order, or a structure in which the first capping layer, the first electrode 110, an organic layer 150, the second electrode 190, and the second capping layer are stacked in this stated order.

Light generated in an emission layer of the organic layer 150 of the organic light-emitting device 10 may pass through the first electrode 110 and the first capping layer toward the outside, wherein the first electrode 110 may be a semi-transmissive electrode or a transmissive electrode. Light generated in an emission layer of the organic layer 150 of the organic light-emitting device 10 may pass through the second capping layer toward the outside, wherein the second electrode 190 may be a semi-transmissive electrode or a transmissive electrode.

The first capping layer and the second capping layer may increase external luminescence efficiency according to the principle of constructive interference.

The first capping layer and the second capping layer may each independently be an organic capping layer including an organic material, an inorganic capping layer including an inorganic material, or a composite capping layer including an organic material and an inorganic material.

At least one of the first capping layer and the second capping layer may each independently include carbocyclic compounds, heterocyclic compounds, amine-based compounds, porphyrine derivatives, phthalocyanine derivatives, a naphthalocyanine derivatives, alkali metal complexes, and alkaline earth metal complexes. The carbocyclic compound, the heterocyclic compound, and the amine-based compound may be optionally substituted with a substituent containing O, N, S, Se, Si, F, C, Br, I, or any combination thereof.

In one embodiment, at least one of first capping layer and the second capping layer may each independently include an amine group-containing compound.

For example, at least one of first capping layer and the second capping layer may each independently include a compound represented by Formula 201, a compound represented by Formula 202, or any combination thereof.

Apparatus

The organic light-emitting device 10 may be included in various suitable apparatuses. For example, a light-emitting apparatus, an authentication apparatus, or an electronic apparatus, which includes the organic light-emitting device 10, may be provided.

The authentication apparatus may further include, in addition to the organic light-emitting device 10, a biometric information collector. The thin-film transistor may include a source electrode, a drain electrode, and an activation layer, and one of the source electrode and the drain electrode may be electrically coupled with one of the first electrode 110 and the second electrode 190 of the organic light-emitting device 10.

The thin-film transistor may further include a gate electrode, a gate insulating layer, and/or the like.

The active layer may include crystalline silicon, amorphous silicon, organic semiconductor, oxide semiconductor, and/or the like, but embodiments of the present disclosure are not limited thereto.

The apparatus including the organic light-emitting device 10 may further include a sealing member which seals the organic light-emitting device 10. The sealing member may be between the color filter and the organic light-emitting device 10. The sealing member may be a transparent glass substrate or a plastic substrate. The sealing member may be a thin-film encapsulating layer including a plurality of organic layers and/or a plurality of inorganic layers. When the sealing member is a thin-film encapsulating layer, the organic light-emitting device 10 may be flexible.

The light-emitting apparatus may be used as various suitable displays, light sources, and/or the like.

The authentication apparatus may be, for example, a biometric authentication apparatus for authenticating an individual by using biometric information of a biometric body (for example, a finger tip, a pupil, and/or the like).

The authentication apparatus may further include, in addition to the organic light-emitting device 10, a biometric information collector.

The electronic apparatus may be applied to personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram (ECG) displays, ultrasonic diagnostic devices, or endoscope displays), fish finders, various suitable measuring instruments, meters (for example, meters for a vehicle, an aircraft, and a vessel), projectors, and/or the like, but embodiments of the present disclosure are not limited thereto.

Preparation Methods

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about 10-8 torr to about 10-3 torr, and a deposition speed of about 0.01 Å/sec to about 100 Å/sec by taking into account a material to be included in a layer to be formed, and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to about 200° C. by taking into account a material to be included in a layer to be formed, and the structure of a layer to be formed.

General Definition of at Least Some of the Substituents

The term "$C_1$-$C_{10}$ alkyl group," as used herein, refers to a linear or branched aliphatic saturated hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{10}$ alkylene group," as used herein, refers to a divalent group having the substantially same structure as the $C_1$-$C_{60}$ alkyl group.

The term "$C_2$-$C_{60}$ alkenyl group," as used herein, refers to a hydrocarbon group having at least one carbon-carbon double bond at a main chain (e.g., in the middle) or at a terminal end (e.g., at the terminus) of the $C_2$-$C_{60}$ alkyl group, and examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a hydrocarbon group having at least one carbon-carbon triple bond at a main chain (e.g., in the middle) or at a terminal end (e.g., at the terminus) of the $C_2$-$C_{60}$ alkyl group, and examples thereof include an ethynyl group, and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{10}$ alkoxy group," as used herein, refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group," as used herein, refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent monocyclic group having at least one heteroatom selected from N, O, Si, P, and S as a ring-forming atom and 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent monocyclic group that has 3 to 10 carbon atoms and at least one carbon-carbon double bond in the ring thereof and no aromaticity (e.g., is not aromatic), and examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent monocyclic group that has at least one heteroatom selected from N, O, Si, P, and S as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-hydrofuranyl group, and a 2,3-hydrothiophenyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system having 6 to 60 carbon atoms, and the term "$C_6$-$C_{60}$ arylene group," as used herein, refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other (e.g., combined together). The term "$C_7$-$C_{60}$ alkylaryl group," as used herein, refers to a $C_6$-$C_{60}$ aryl group substituted with at least one $C_1$-$C_{60}$ alkyl group.

The term "$C_1$-$C_{10}$ heteroaryl group," as used herein, refers to a monovalent group having a heterocyclic aromatic system that has at least one heteroatom selected from N, O, Si, P, and S as a ring-forming atom, in addition to 1 to 60 carbon atoms. The term "$C_1$-$C_{10}$ heteroarylene group," as used herein, refers to a divalent group having a carbocyclic aromatic system that has at least one heteroatom selected from N, O, Si, P, and S as a ring-forming atom, in addition to 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be condensed with each other (e.g., combined together). The term "$C_2$-$C_{60}$ alkylheteroaryl group," as used herein, refers to a $C_1$-$C_{60}$ heteroaryl group substituted with at least one $C_1$-$C_{60}$ alkyl group.

The term "$C_6$-$C_{60}$ aryloxy group," as used herein, refers to —$OA_{102}$ (wherein $A_{102}$ is the $C_6$-$C_{60}$ aryl group), and the term "$C_6$-$C_{60}$ arylthio group," as used herein, indicates —$SA_{103}$ (wherein $A_{103}$ is the $C_6$-$C_{60}$ aryl group).

The term "monovalent non-aromatic condensed polycyclic group," as used herein, refers to a monovalent group (for example, having 8 to 60 carbon atoms) having two or more rings condensed with each other (e.g., combined together), only carbon atoms as ring-forming atoms, and no aromaticity in its entire molecular structure (e.g., the entire molecular structure is not aromatic). An example of the monovalent non-aromatic condensed polycyclic group is a fluorenyl group. The term "divalent non-aromatic condensed polycyclic group," as used herein, refers to a divalent group having substantially the same structure as the monovalent non-aromatic condensed polycyclic group.

The term "monovalent non-aromatic condensed heteropolycyclic group," as used herein, refers to a monovalent group (for example, having 1 to 60 carbon atoms) having two or more rings condensed to each other (e.g., combined together), at least one heteroatom selected from N, O, Si, P, S, and B, other than carbon atoms, as a ring-forming atom, and no aromaticity in its entire molecular structure (e.g., the entire molecular structure is not aromatic). An example of the monovalent non-aromatic condensed heteropolycyclic group is a carbazolyl group. The term "divalent non-aromatic condensed heteropolycyclic group," as used herein, refers to a divalent group having substantially the same structure as the monovalent non-aromatic condensed heteropolycyclic group.

The term "$C_5$-$C_{60}$ carbocyclic group," as used herein, refers to a monocyclic or polycyclic group having 5 to 60 carbon atoms in which a ring-forming atom is a carbon atom only. The term "$C_5$-$C_{60}$ carbocyclic group," as used herein, refers to an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In one or more embodiments, depending on the number of substituents connected to the $C_5$-$C_{60}$ carbocyclic group, the $C_5$-$C_{60}$ carbocyclic group may be a trivalent group or a quadrivalent group. In one or more embodiments, a $C_5$-$C_{30}$ carbocyclic group is preferred to be used.

The term "$C_1$-$C_{10}$ heterocyclic group," as used herein, refers to a group having substantially the same structure as the $C_5$-$C_{60}$ carbocyclic group, except that as a ring-forming atom, at least one heteroatom selected from N, O, Si, P, and S is used in addition to carbon (the number of carbon atoms may be in a range of 1 to 60). In one or more embodiments, a $C_1$-$C_{30}$ heterocyclic group is preferred to be used.

In the present specification, at least one substituent of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, and the substituted monovalent non-aromatic condensed heteropolycyclic group may be:

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —$O(Q_{11})$, —$S(Q_{11})$, —$Si(Q_{11})(Q_{12})(Q_{13})$, —$N(Q_{11})(Q_{12})$, —$B(Q_{11})(Q_{12})$, —$P(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, or a monovalent non-aromatic condensed heteropolycyclic group, each unsubstituted or substituted with deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —$O(Q_{21})$, —$S(Q_{21})$, —$Si(Q_{21})(Q_{22})(Q_{23})$, —$N(Q_{21})(Q_{22})$, —$B(Q_{21})(Q_{22})$, —$P(Q_{21})(Q_{22})$, —$C(=O)(Q_{21})$, —$S(=O)_2(Q_{21})$, —$P(=O)(Q_{21})(Q_{22})$, or any combination thereof;

—$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, or —$P(=O)(Q_{31})(Q_{32})$; or any combination thereof.

In the present specification, $Q_1$ to $Q_3$, $Q_{11}$ to $Q_{13}$, $Q_{21}$ to $Q_{23}$, and $Q_{31}$ to $Q_{33}$ may each independently be hydrogen; deuterium; —F; —Cl; —Br; —I; a hydroxyl group; a cyano group; a nitro group; an amidino group; a hydrazine group; a hydrazone group; $C_1$-$C_{60}$ alkyl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; $C_2$-$C_{60}$ alkenyl group; $C_2$-$C_{60}$ alkynyl group; $C_1$-$C_{60}$ alkoxy group;

$C_3$-$C_{10}$ cycloalkyl group; $C_1$-$C_{10}$ heterocycloalkyl group; $C_3$-$C_{10}$ cycloalkenyl group; $C_1$-$C_{10}$ heterocycloalkenyl group; $C_6$-$C_{60}$ aryl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; $C_6$-$C_{60}$ aryloxy group; $C_6$-$C_{60}$ arylthio group; $C_1$-$C_{60}$ heteroaryl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; a monovalent non-aromatic condensed polycyclic group; or a monovalent non-aromatic condensed heteropolycyclic group.

The term "Ph," as used herein, refers to a phenyl group, the term "Me," as used herein, refers to a methyl group, the term "Et," as used herein, refers to an ethyl group, the term "ter-Bu" or "$Bu^t$," as used herein, refers to a tert-butyl group, and the term "OMe," as used herein, refers to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group." In other words, the "terphenyl group" is a substituted phenyl group having, as a substituent, a $C_6$-$C_{60}$ aryl group substituted with a $C_6$-$C_{60}$ aryl group.

* and *', as used herein, unless defined otherwise, each refer to a binding site to a neighboring atom in a corresponding formula.

Hereinafter, a compound according to embodiments and an organic light-emitting device according to embodiments will be described in more detail with reference to Synthesis Examples and Examples. The wording "B was used instead of A" used in describing Synthesis Examples refers to that an identical molar equivalent of B was used in place of A.

EXAMPLES

Synthesis Example 1 (Synthesis of Compound BD2)

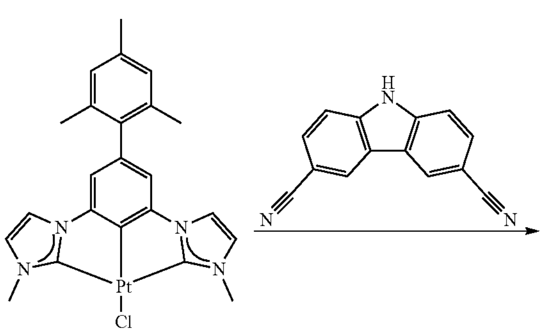

BD2(1)

-continued

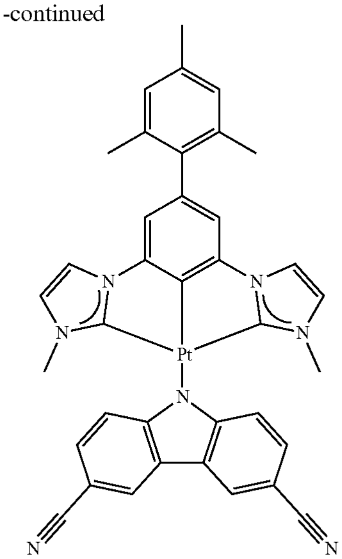

BD2

Compound BD2(1) (1.00 g, 1.71 mmol), 9H-carbazole-3,6-dicarbonitrile (0.45 g, 2.05 mmol), and NaOH (0.10 g, 2.57 mmol) were mixed with acetone (300 mL) and stirred at room temperature for 3 hours, and an organic layer was extracted therefrom three times by adding dichloromethane and water thereto. The extracted organic layer was dried by using magnesium sulfate and filtered by using celite, and chromatography was performed thereon to obtain Compound BD2 (0.79 g, 1.03 mmol) (yield=60%).

Synthesis Example 2 (Synthesis of Compound BD7)

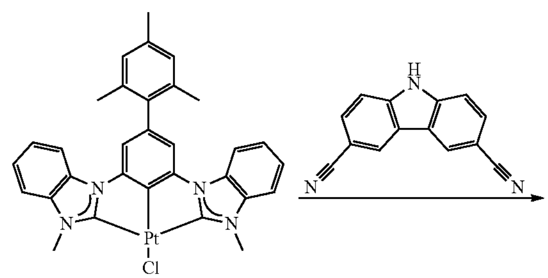

BD7(1)

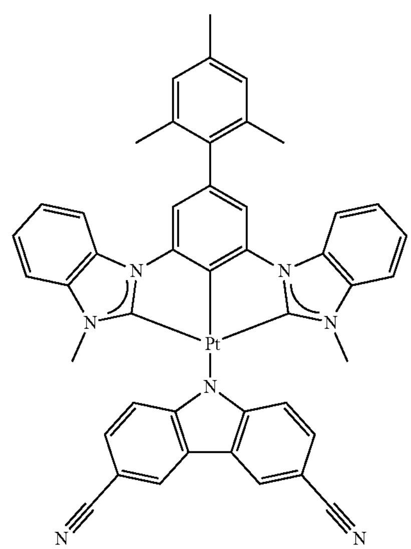

BD7

Compound BD7 (0.94 g, 1.08 mmol) (yield=63%) was synthesized in substantially the same manner as in Synthesis Example 1, except that Compound BD7(1) (1.17 g, 1.71 mmol) was used instead of Compound BD2(1).

Synthesis Example 3 (Synthesis of Compound BD67)

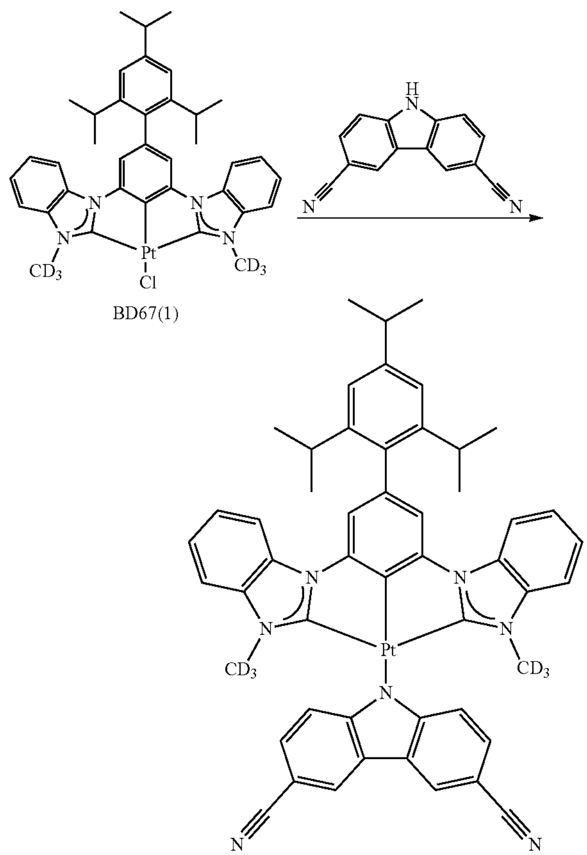

BD67(1)

BD67

Compound BD67 (0.85 g, 0.89 mmol) (yield=52%) was synthesized in substantially the same manner as in Synthesis Example 1, except that Compound BD67(1) (1.33 g, 1.71 mmol) was used instead of Compound BD2(1).

Synthesis Example 4 (Synthesis of Compound BD102)

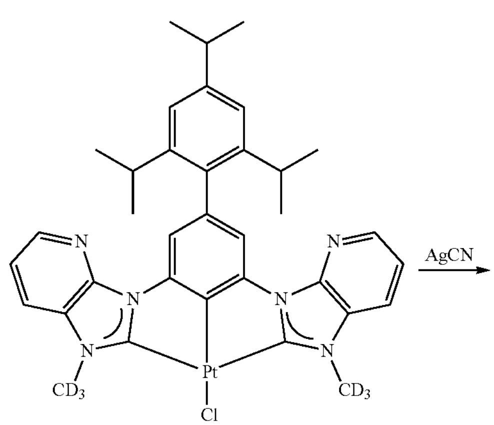

BD102(1)

-continued

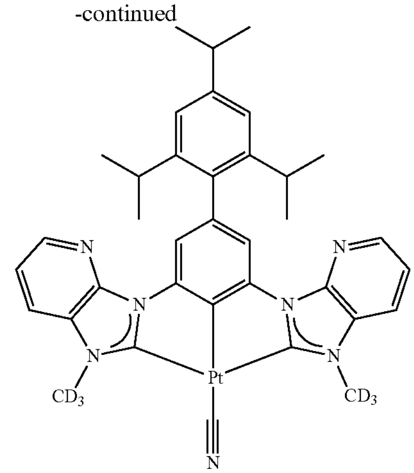

BD102

Compound BD102(1) (1.33 g, 1.71 mmol) and AgCN (0.27 g, 2.05 mmol) were mixed with dichloromethane (300 mL) and stirred at room temperature for 12 hours, and an organic layer was extracted therefrom three times by adding water thereto. The extracted organic layer was dried by using magnesium sulfate and filtered by using celite, and chromatography was performed thereon to obtain Compound BD102 (0.92 g, 1.20 mmol) (yield=70%).

$^1$H NMR and MALDI-TOF MS data of Compounds synthesized according to Synthesis Examples 1 to 4 are shown in Table 1.

Compounds other than Compounds synthesized according to Synthesis Examples 1 to 4 may also be synthesized by referring to the synthesis mechanisms and source materials described above.

TABLE 1

| Compound | | MALDI-TOF MS [M+] | |
|---|---|---|---|
| No. | $^1$H NMR ($CDCl_3$, 500 MHz) | found | calc. |
| BD2 | δδ 8.45 (s, 2H), 7.97 (s, 1H), 7.89 (s, 1H), 7.70 (d, 1H, $^3J_{H-H}$ = 7.8), 7.58 (d, 1H, $^3J_{H-H}$ = 7.9), 7.50 (d, 1H, $^3J_{H-H}$ = 8.3), 7.42 (d, 1H, $^3J_{H-H}$ = 8.5), 7.40 (d, 2H, $^3J_{H-H}$ = 3.2), 7.01 (s, 2H), 2.92 (s, 6H), 6.79 (d, 2H, $^3J_{H-H}$ = 3.2), 2.84 (s, 6H), 2.48 (s, 3H). | 766.23 | 766.21 |
| BD7 | δδ 8.56 (d, 2H, $^3J_{H-H}$ = 8.2), 8.43 (s, 2H), 8.10 (s, 2H), 7.64-7.58 (m, 2H), 7.50 (m, 1H), 7.42 (m, 1H), 7.40 (d, 2H, $^3J_{H-H}$ = 3.2), 7.27-7.28 (m, 2H), 7.01 (s, 2H), 6.78 (d, 2H, $^3J_{H-H}$ = 3.2), 2.93 (s, 6H), 2.72 (s, 6H), 2.48 (s, 3H). | 866.25 | 866.24 |
| BD67 | δδ 8.54 (d, 2H, $^3J_{H-H}$ = 8.3), 8.41 (s, 2H), 8.12 (s, 2H), 7.64-7.58 (m, 2H), 7.50 (m, 1H), 7.42 (m, 1H), 7.40 (d, 2H, $^3J_{H-H}$ = 3.1), 7.27-7.28 (m, 2H), 7.02 (s, 2H), 6.79 (d, 2H, $^3J_{H-H}$ = 3.2), 2.99 (m, 3H), 1.35 (m, 6H), 1.14 (dd, 12H, $^3J_{H-H}$ = 6.8, $^4J_{H-H}$ = 3.0). | 956.38 | 956.37 |
| BD102 | δδ 8.42 (d, 2H, $^3J_{H-H}$ = 8.7), 8.11 (s, 2H), 8.00 (d, 2H, $^3J_{H-H}$ = 8.6), 7.24-7.22 (m, 4H), 2.98 (m, 3H), 1.36 (m, 6H), 1.13 (dd, 12H, $^3J_{H-H}$ = 6.8, $^4J_{H-H}$ = 3.0). | 768.34 | 768.31 |

Evaluation Example 1

HOMO and LUMO energy levels of Compounds BD2, BD7, BD67, BD102, ETH2, ETH77, HTH2, and HTH4 were evaluated according to methods of Table 2, and results thereof are shown in Table 3.

TABLE 2

| | |
|---|---|
| HOMO energy level evaluation method | A voltage-current (V-A) graph of each Compound was obtained by using cyclic voltammetry (CV) (electrolyte: 0.1M $Bu_4NPF_6$/solvent: dimethylformamide (DMF)/ electrode: 3-electrode system (work electrode: GC, reference electrode: Ag/AgCl, auxiliary electrode: Pt)), and a HOMO energy level of each Compound was calculated from oxidation onset of the graph. |
| LUMO Energy level evaluation method | A voltage-current (V-A) graph of each Compound was obtained by using cyclic voltammetry (CV) (electrolyte: 0.1M $Bu_4NPF_6$/solvent: DMF/electrode: 3-electrode system (work electrode: GC, reference electrode: Ag/AgCl, auxiliary electrode: Pt)), and a LUMO energy level of each Compound was calculated from reduction onset of the graph. |

TABLE 3

| Compound No. | HOMO (eV) | LUMO (eV) |
|---|---|---|
| BD2 | −5.20 | −2.08 |
| BD7 | −5.23 | −2.13 |
| BD67 | −5.25 | −2.16 |
| BD102 | −5.30 | −2.32 |
| ETH2 | −6.50 | −2.72 |
| ETH77 | −5.75 | −2.65 |
| HTH2 | −5.51 | −1.91 |
| HTH4 | −5.64 | −2.13 |

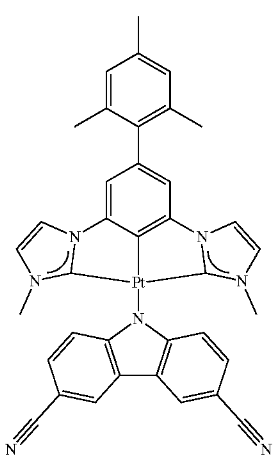

BD2

TABLE 3-continued

| Compound No. | HOMO (eV) | LUMO (eV) |
|---|---|---|

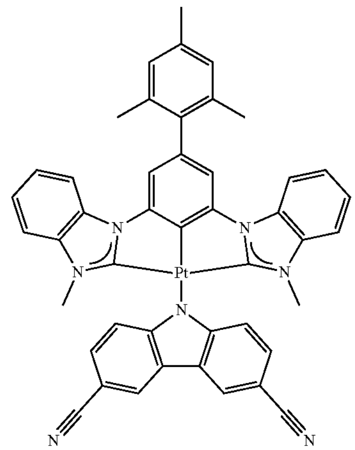

BD7

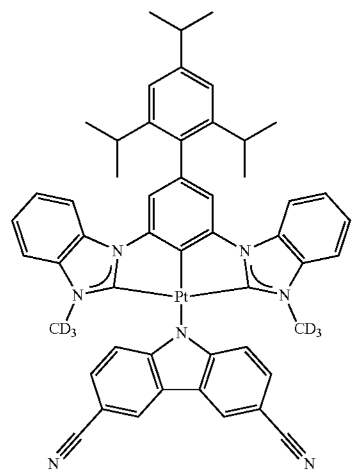

BD67

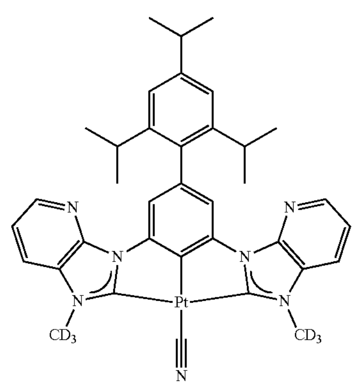

BD102

TABLE 3-continued

| Compound No. | HOMO (eV) | LUMO (eV) |
|---|---|---|

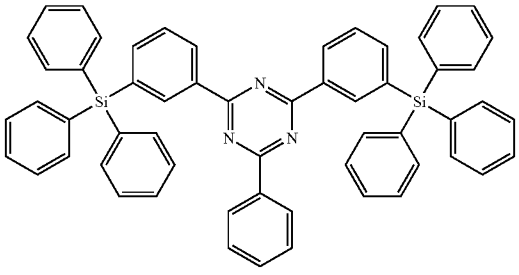

ETH2

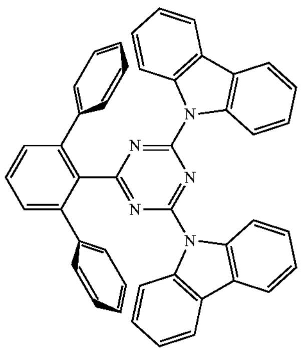

ETH77

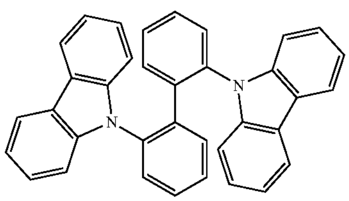

HTH2

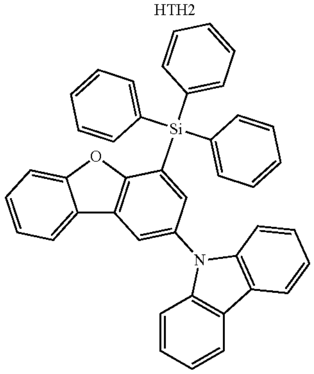

HTH4

From Table 3, it can be seen that Compounds BD2, BD7, BD67, BD102, ETH2, ETH77, HTH2, and HTH4 have HOMO and LUMO energy levels suitable for manufacturing an organic light-emitting device.

Example 1

As an anode, a Corning 15 Ω/cm$^2$ (1,200 Å) ITO glass substrate was cut to a size of 50 mm×50 mm×0.7 mm, sonicated with isopropyl alcohol and pure water each for 5 minutes, and then cleaned by exposure to ultraviolet rays and ozone for 30 minutes. Then, the ITO glass substrate was provided to a vacuum deposition apparatus.

2-TNATA was vacuum-deposited on the anode to form a hole injection layer having a thickness of 600 Å, and 4,4'-bis[N-(1-naphthyl)-N-phenyl amino]biphenyl (NPB) was vacuum-deposited on the hole injection layer to form a hole transport layer having a thickness of 300 Å.

Compound BD2 (first compound), Compound ETH2 (second compound), and Compound HTH2 (third compound) were vacuum-deposited on the hole transport layer to form an emission layer having a thickness of 300 Å. An amount of Compound BD2 was 10 wt % based on 100 wt % of the emission layer, and a weight ratio of Compound ETH2 to Compound HTH2 was adjusted to 5:5.

Compound ETH2 was vacuum-deposited on the emission layer to forma buffer layer having a thickness of 50 Å, Alq3 was vacuum-deposited on the buffer layer to form an electron transport layer having a thickness of 300 Å, LiF was vacuum-deposited on the electron transport layer to form an electron injection layer having a thickness of 10 Å, and A1 was vacuum-deposited on the electron injection layer to form a cathode having a thickness of 3,000 Å, thereby completing the manufacture of an organic light-emitting device.

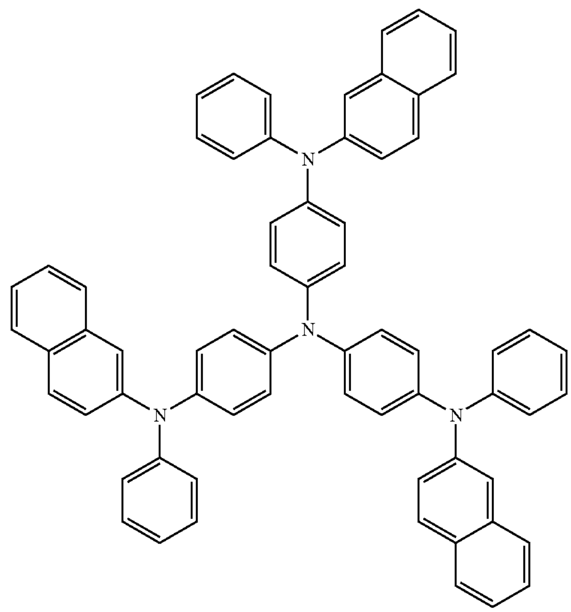

2-TNATA

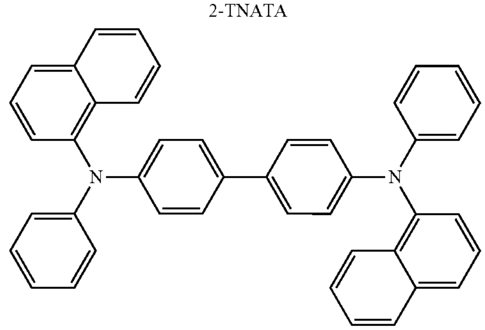

NPB

Examples 2 to 7 and Comparative Examples 1 and 2

Organic light-emitting devices were manufactured in substantially the same manner as in Example 1, except that Compounds shown in Table 4 were respectively used as a first compound, a second compound, and a third compound in forming an emission layer.

Evaluation Example 2

Figure 2:
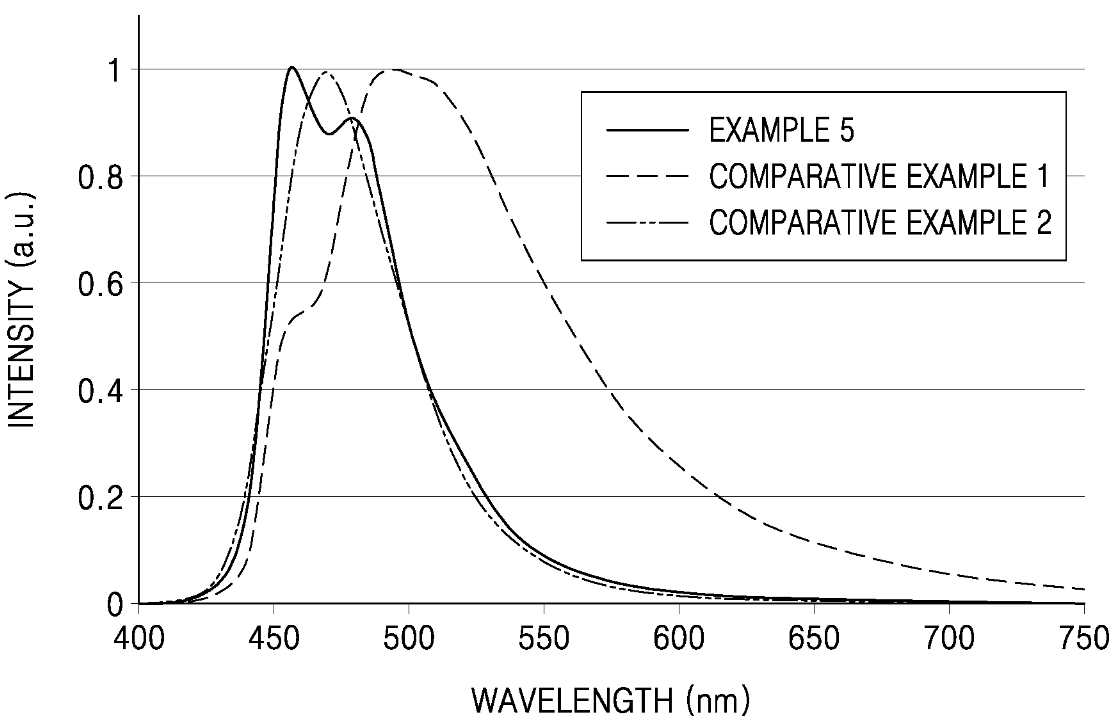
FIG. 2 is a wavelength-emission intensity graph of organic light-emitting devices manufactured according to Example 5 and Comparative Examples 1 and 2.
Figure 3:
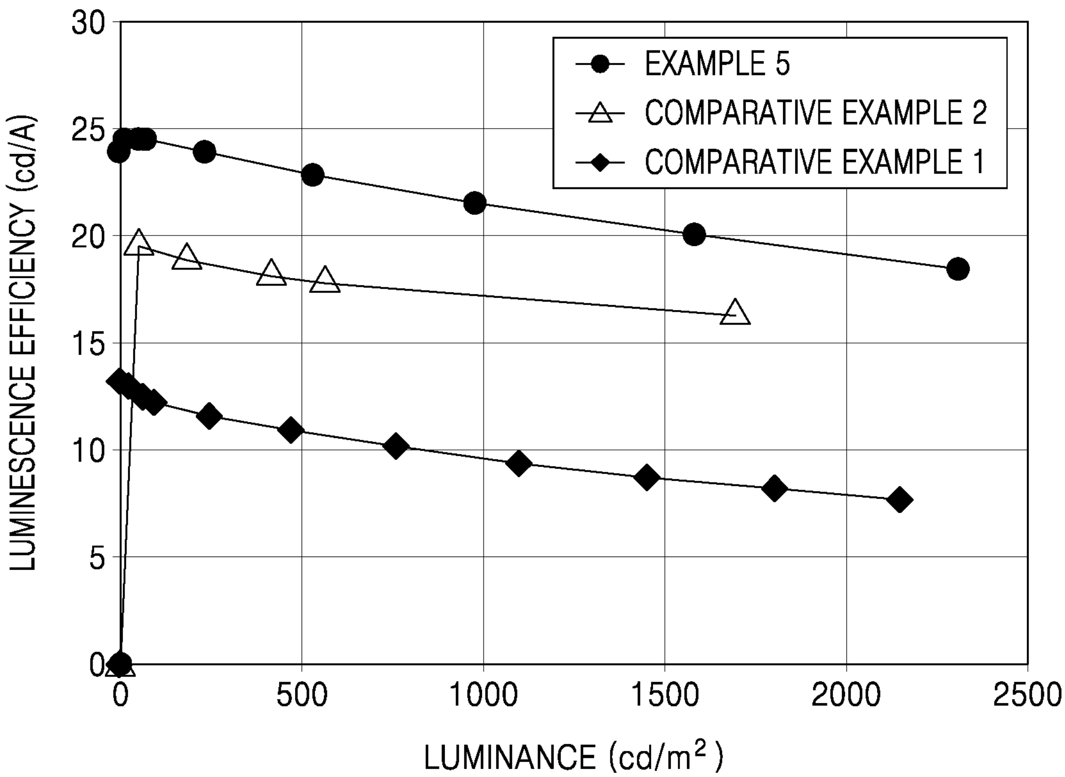
FIG. 3 is a luminance-luminescence efficiency graph of organic light-emitting devices manufactured according to Example 5 and Comparative Examples 1 and 2.
Figure 4:
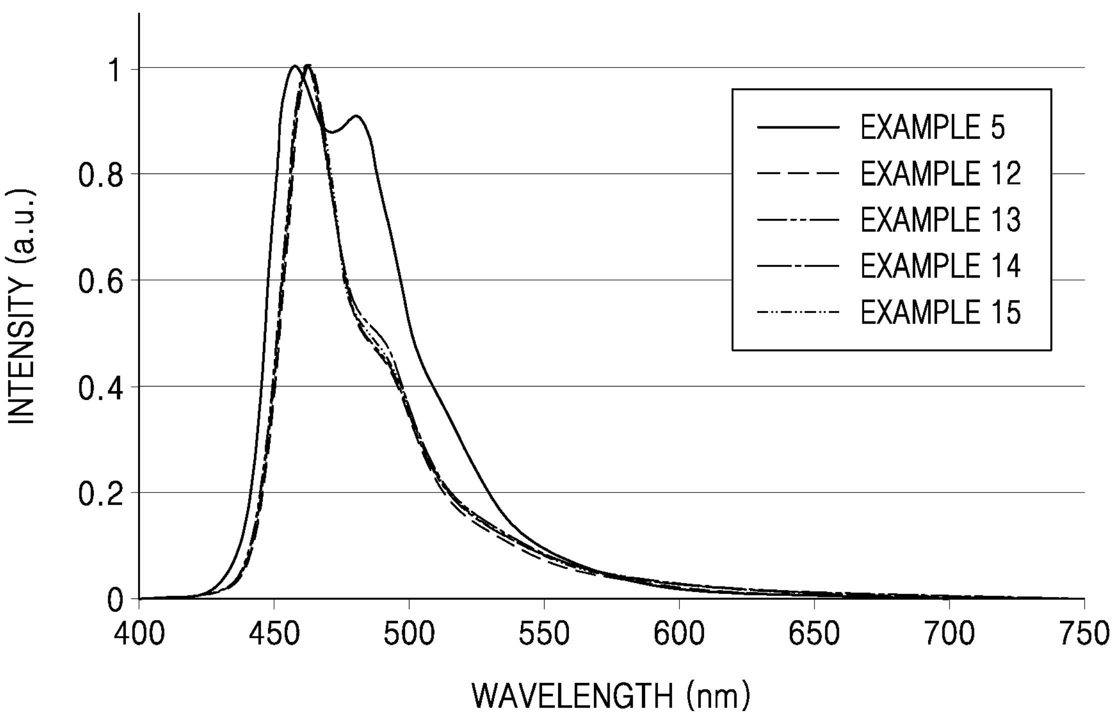
FIG. 4 is a wavelength-emission intensity graph of organic light-emitting devices manufactured according to Examples 5 and 12 to 15.
Figure 5:
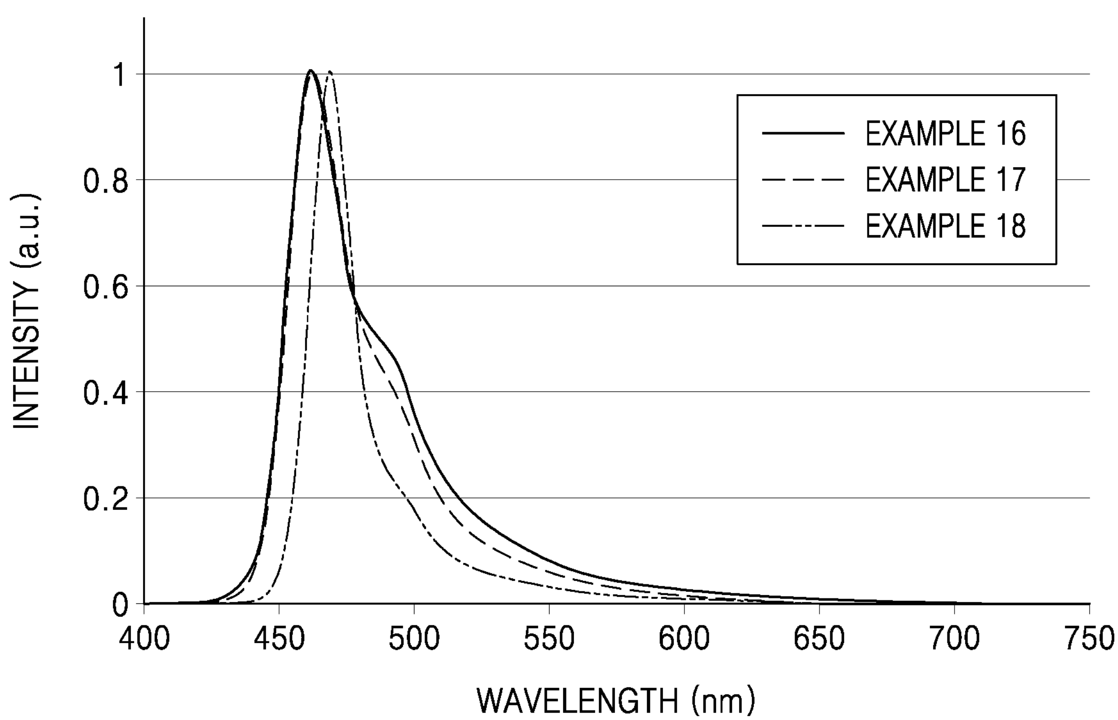
FIG. 5 is a wavelength-emission intensity graph of organic light-emitting devices manufactured according to Examples 16 to 18.
Figure 6:
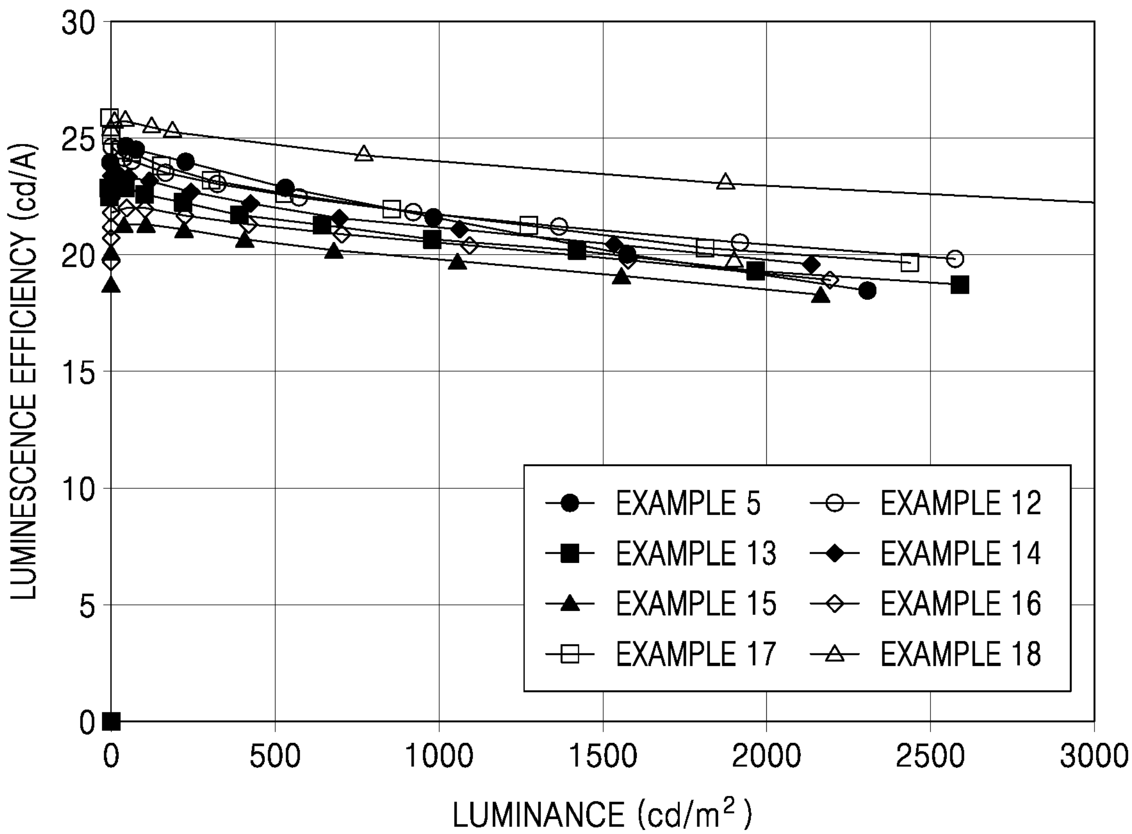
FIG. 6 is a luminance-luminescence efficiency graph of organic light-emitting devices manufactured according to Examples 5 and 12 to 18.
Figure 7:
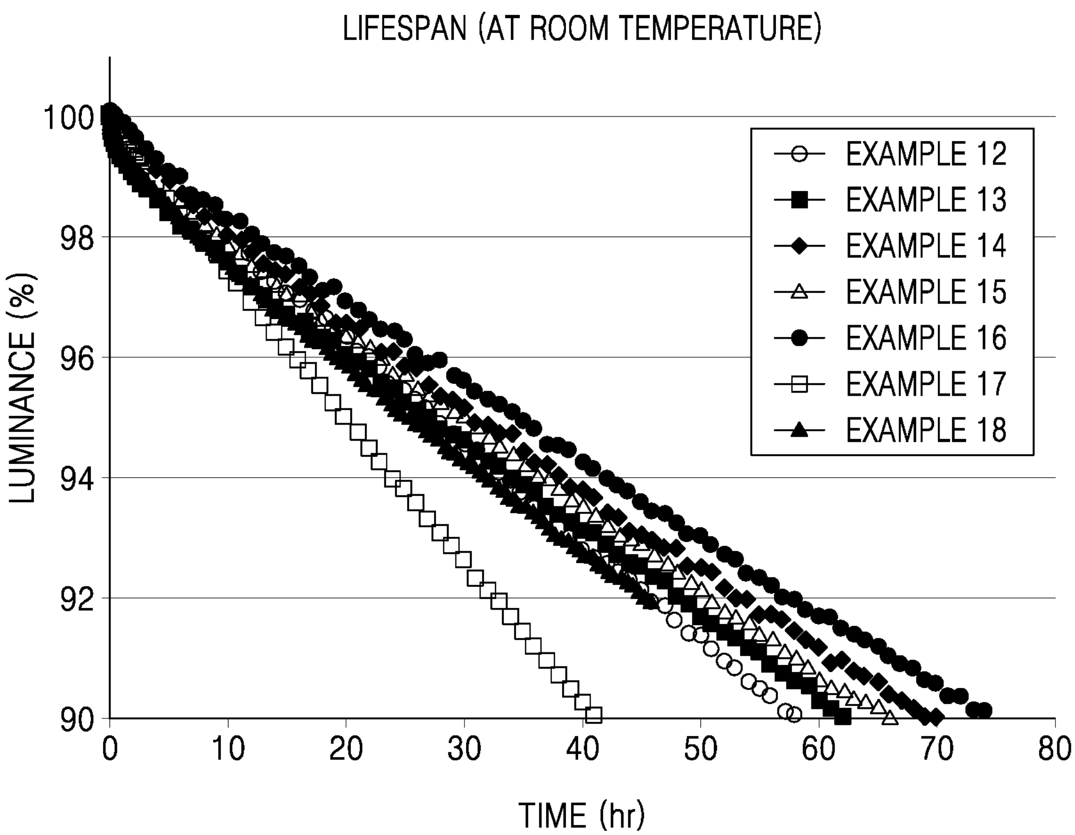
FIG. 7 is a time-luminance graph of organic light-emitting devices manufactured according to Examples 12 to 18.

The driving voltage (V), current density (mA/cm$^2$), luminescence efficiency (cd/A), maximum emission wavelength (nm), and lifespan ($T_{90}$) of the organic light-emitting devices manufactured according to Examples 1 to 7 and Comparative Examples 1 and 2 were measured at 1,000 cd/m$^2$ by using Keithley MU236 and a luminance meter PR650, and results thereof are shown in Table 4. In Table 4, the lifespan (To) indicates an amount of time (hr) that lapsed when luminance was 90% of initial luminance (100%). A wavelength-emission intensity graph and luminance-luminescence efficiency graph of the organic light-emitting devices manufactured according to Example 5 and Comparative Examples and are shown in FIGS. 2 and 3, respectively.

TABLE 4

| Example No. | Dopant First compound | Host Second compound | Third compound | Luminance (cd/m$^2$) | Driving voltage (V) | Current density (mA/cm$^2$) | Luminescence efficiency (cd/A) | Maximum emission wavelength (nm) | Lifespan ($T_{90}$, hr) (at 1,000 cd/m$^2$) |
|---|---|---|---|---|---|---|---|---|---|
| Example 1 | BD2 | ETH2 | HTH2 | 1000 | 4.40 | 5.4 | 18.7 | 460 | 12.0 |
| Example 2 | BD7 | ETH2 | HTH2 | 1000 | 4.10 | 4.7 | 21.2 | 464 | 15.0 |
| Example 3 | BD67 | ETH2 | HTH2 | 1000 | 4.00 | 4.8 | 21.1 | 466 | 16.0 |
| Example 4 | BD102 | ETH2 | HTH2 | 1000 | 4.00 | 4.8 | 21.0 | 458 | 18.5 |
| Example 5 | BD67 | ETH77 | HTH2 | 1000 | 3.80 | 4.6 | 22.0 | 466 | 15.5 |
| Example 6 | BD67 | ETH2 | HTH4 | 1000 | 3.90 | 4.8 | 22.0 | 466 | 17.7 |
| Example 7 | BD67 | ETH77 | HTH4 | 1000 | 4.30 | 5.3 | 21.2 | 466 | 20.2 |
| Comparative Example 1 | Pt-16 | ETH2 | HTH2 | 1000 | 4.40 | 9.6 | 10.5 | 496 | 0.1 |
| Comparative Example 2 | Ir-D | ETH2 | HTH2 | 1000 | 4.00 | 4.9 | 17.5 | 468 | 3.0 |

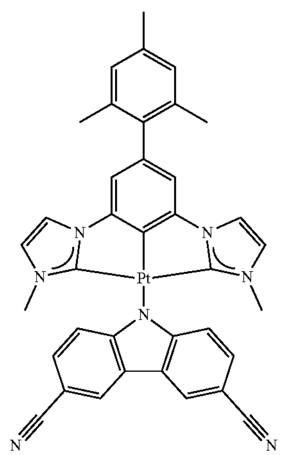

BD2

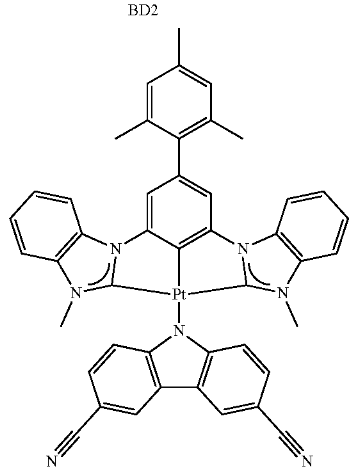

BD7

TABLE 4-continued
| | Dopant | Host | | | | | | | |
|---|---|---|---|---|---|---|---|---|---|
| Example No. | First compound | Second compound | Third compound | Luminance ($cd/m^2$) | Driving voltage (V) | Current density ($mA/cm^2$) | Luminescence efficiency (cd/A) | Maximum emission wavelength (nm) | Lifespan ($T_{90}$, hr) (at 1,000 $cd/m^2$) |
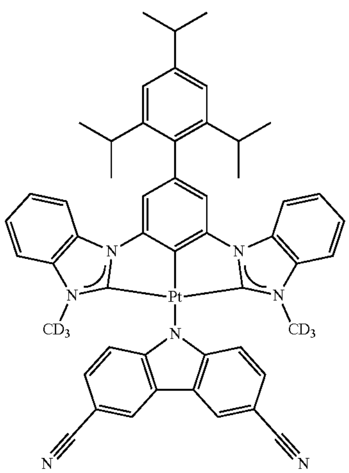
BD67
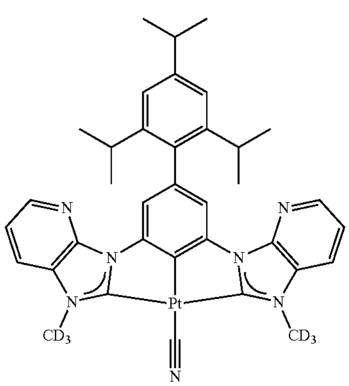
BD102
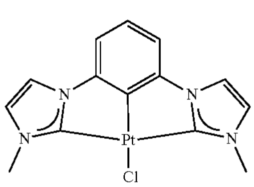
Pt-16

TABLE 4-continued
| | Dopant | Host | | | | | | | |
|---|---|---|---|---|---|---|---|---|---|
| Example No. | First compound | Second compound | Third compound | Luminance (cd/m$^2$) | Driving voltage (V) | Current density (mA/cm$^2$) | Luminescence efficiency (cd/A) | Maximum emission wavelength (nm) | Lifespan ($T_{90}$, hr) (at 1,000 cd/m$^2$) |
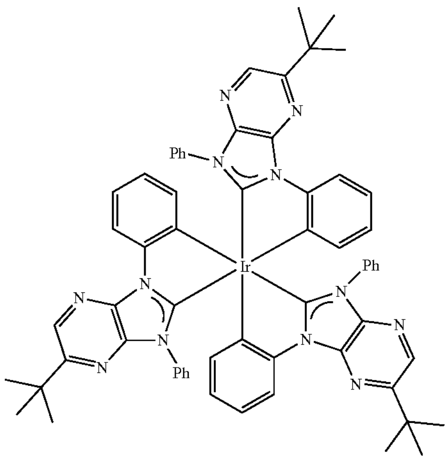
Ir-D
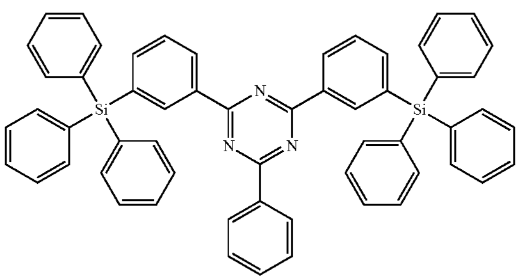
ETH2
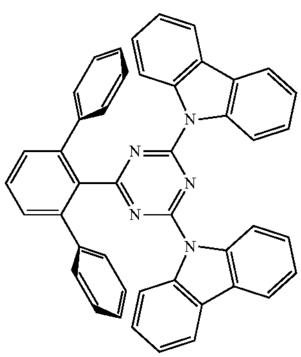
ETH77
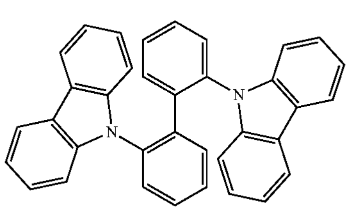
HTH2

TABLE 4-continued

| Example No. | Dopant First compound | Host Second compound | Third compound | Luminance (cd/m$^2$) | Driving voltage (V) | Current density (mA/cm$^2$) | Luminescence efficiency (cd/A) | Maximum emission wavelength (nm) | Lifespan ($T_{90}$, hr) (at 1,000 cd/m$^2$) |
|---|---|---|---|---|---|---|---|---|---|

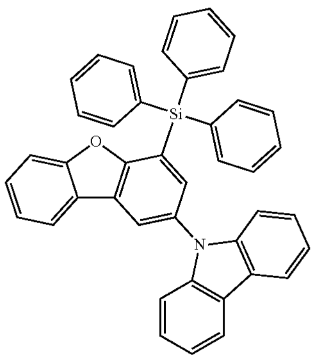

HTH4

From Table 4, it can be seen that the organic light-emitting devices of Examples 1 to 7 have excellent or equivalent driving voltage and current density, as compared with the organic light-emitting devices of Comparative Examples 1 and 2, and have excellent luminescence efficiency and lifespan characteristics, as compared with the organic light-emitting devices of Comparative Examples 1 and 2.

Example 8

An organic light-emitting device was manufactured in substantially the same manner as in Example 1, except that Compound BD2 (first compound or dopant) and Compound HTH4 (host) were vacuum-deposited on the hole transport layer to form an emission layer having a thickness of 300 Å instead of vacuum-depositing Compound BD2 (first compound), Compound ETH2 (second compound), and Compound HTH2 (third compound) on the hole transport layer to form an emission layer having a thickness of 300 Å. In forming the emission layer, an amount of Compound BD2 was adjusted to 10 wt % based on 100 wt % of the emission layer.

Examples 9 to 11 and Comparative Examples 3 and 4

Organic light-emitting devices were manufactured in substantially the same manner as in Example 8, except that Compounds shown in Table 5 were respectively used as a dopant and a host in forming an emission layer.

Evaluation Example 3

The driving voltage (V), current density (mA/cm$^2$), luminescence efficiency (cd/A), maximum emission wavelength (nm), and lifespan (To) of the organic light-emitting devices manufactured at 300 cd/m$^2$ according to Examples 8 to 11 and Comparative Examples 3 and 4 were measured at 300 cd/m$^2$ by using a Keithley MU 236 and a luminance meter PR650, and results thereof are shown in Table 5. In Table 5, the lifespan ($T_{90}$) indicates an amount of time (hr) that lapsed when luminance was 90% of initial luminance (100%)

TABLE 5

| Example No. | Dopant (first compound) | Host | Luminance (cd/m$^2$) | Driving voltage (V) | Current density (mA/cm$^2$) | Luminescence efficiency (cd/A) | Maximum emission wavelength (nm) | Lifespan ($T_{90}$, Hr) (at 300 cd/m$^2$) |
|---|---|---|---|---|---|---|---|---|
| Example 8 | BD2 | HTH 4 | 300 | 5.20 | 5.8 | 22.6 | 460 | 21.5 |
| Example 9 | BD7 | HTH 4 | 300 | 5.15 | 5.2 | 24.6 | 464 | 32.0 |
| Example 10 | BD67 | HTH 4 | 300 | 5.23 | 5.4 | 24.8 | 466 | 35.5 |
| Example 11 | BD102 | HTH 4 | 300 | 5.31 | 5.4 | 24.7 | 458 | 34.5 |
| Comparative Example 3 | Pt-16 | HTH 4 | 300 | 5.84 | 9.4 | 12.5 | 496 | 0.5 |
| Comparative Example 4 | Ir-D | HTH 4 | 300 | 5.10 | 5.3 | 22.0 | 468 | 5.0 |

From Table 5, it can be seen that the organic light-emitting devices of Examples 8 to 11 have excellent or equivalent driving voltage and current density, as compared with the organic light-emitting devices of Comparative Examples 3 and 4, and have excellent luminescence efficiency and lifespan characteristics, as compared with the organic light-emitting devices of Comparative Examples 3 and 4.

Example 12

Organic light-emitting devices were manufactured in substantially the same manner as in Example 1, except that Compound BD2 (first compound, auxiliary dopant), Compound ETH2 (second compound), Compound HTH2 (third compound), and Compound FD24 (fluorescent dopant, fluorescent emitter) were vacuum-deposited on the hole transport layer to form an emission layer having a thickness of 300 Å instead of vacuum-depositing Compound BD2 (first compound), Compound ETH2 (second compound), and Compound HTH2 (third compound) on the hole transport layer to form an emission layer having a thickness of 300 Å. An amount of the fluorescent dopant Compound FD24 in forming the emission layer was adjusted to 0.5 wt % based on 100 wt % of the emission layer, and a weight ratio of Compound BD2 (first compound), Compound ETH2 (second compound), and Compound HTH2 (third compound) was adjusted to 9.5:45:45.

Examples 13 to 18

Organic light-emitting devices were manufactured in substantially the same manner as in Example 12, except that Compounds shown in Table 6 were respectively used as a first compound, a second compound, a third compound, and a fluorescent dopant in forming an emission layer.

Evaluation Example 4

The driving voltage (V), current density ($mA/cm^2$), luminescence efficiency (cd/A), maximum emission wavelength (nm), and lifespan ($T_{90}$) of the organic light-emitting devices of Examples 12 to 18 were measured at 1,000 $cd/m^2$ by using a Keithley MU 236 and a luminance meter PR650, and results thereof are shown in Table 6. In Table 6, the lifespan ($T_{90}$) indicates an amount of time (hr) that lapsed when luminance was 90% of initial luminance (100%). A wavelength-emission intensity graph of the organic light-emitting devices manufactured according to Examples 5 and 12 to 15, a wavelength-emission intensity graph of the organic light-emitting devices manufactured according to Examples 16 to 18, a luminance-luminescence efficiency graph of the organic light-emitting devices manufactured according to Examples 5 and 12 to 18, and a time-luminance graph of the organic light-emitting devices manufactured according to Examples 12 to 18 are illustrated in FIGS. 4 to 7.

TABLE 6

| | | Auxiliary dopant | Host | | | Driving | Current | Luminescence | Maximum emission | Lifespan ($T_{90}$, Hr) |
|---|---|---|---|---|---|---|---|---|---|---|
| Example No. | Fluorescent dopant | First compound | Second compound | Third compound | Luminance ($cd/m^2$) | voltage (V) | density ($mA/cm^2$) | efficiency (cd/A) | wavelength (nm) | (at 1,000 $cd/m^2$) |
| Example 12 | FD24 | BD2 | ETH2 | HTH2 | 1000 | 4.9 | 4.6 | 21.7 | 463 | 52.4 |
| Example 13 | FD24 | BD7 | ETH2 | HTH2 | 1000 | 5.4 | 4.9 | 20.6 | 462 | 62.1 |
| Example 14 | FD24 | BD67 | ETH2 | HTH2 | 1000 | 5.3 | 4.7 | 21.2 | 462 | 70.1 |
| Example 15 | FD24 | BD102 | ETH2 | HTH2 | 1000 | 5.6 | 5.0 | 19.9 | 461 | 66.2 |
| Example 16 | FD24 | BD67 | ETH77 | HTH4 | 1000 | 5.6 | 4.9 | 20.5 | 462 | 74.1 |
| Example 17 | FD23 | BD67 | ETH2 | HTH2 | 1000 | 4.9 | 4.6 | 21.6 | 462 | 41.1 |
| Example 18 | FD25 | BD67 | ETH2 | HTH2 | 1000 | 4.1 | 4.2 | 24.2 | 469 | 46.0 |

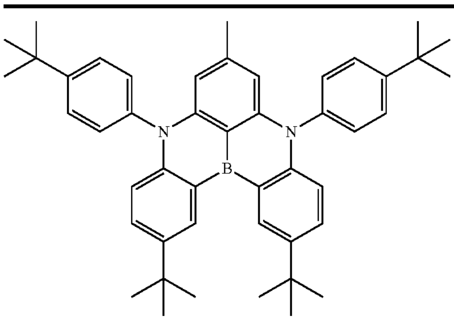

FD23

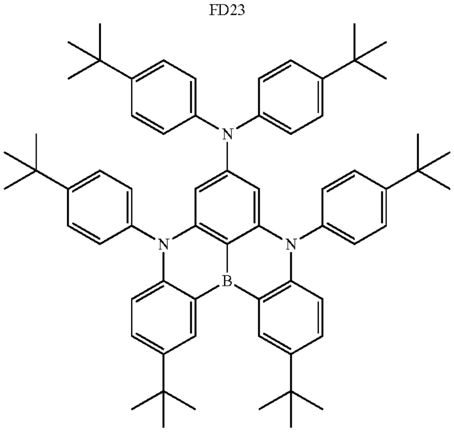

FD24

TABLE 6-continued

| Example No. | Fluorescent dopant | Auxiliary dopant First compound | Host Second compound | Host Third compound | Luminance ($cd/m^2$) | Driving voltage (V) | Current density ($mA/cm^2$) | Luminescence efficiency (cd/A) | Maximum emission wavelength (nm) | Lifespan ($T_{90}$, Hr) (at 1,000 $cd/m^2$) |
|---|---|---|---|---|---|---|---|---|---|---|

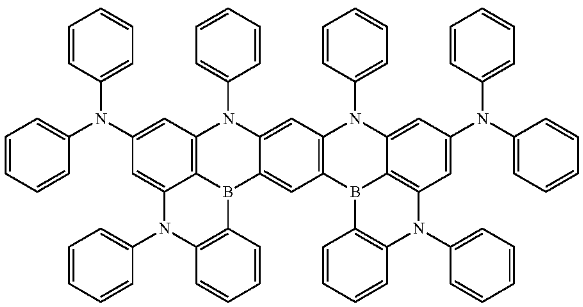

FD25

From Table 6, it can be seen that the organic light-emitting devices of Examples 12 to 18 have excellent driving voltage, current density, luminescence efficiency, and lifespan characteristics.

Evaluation Example 5

Figure 8:
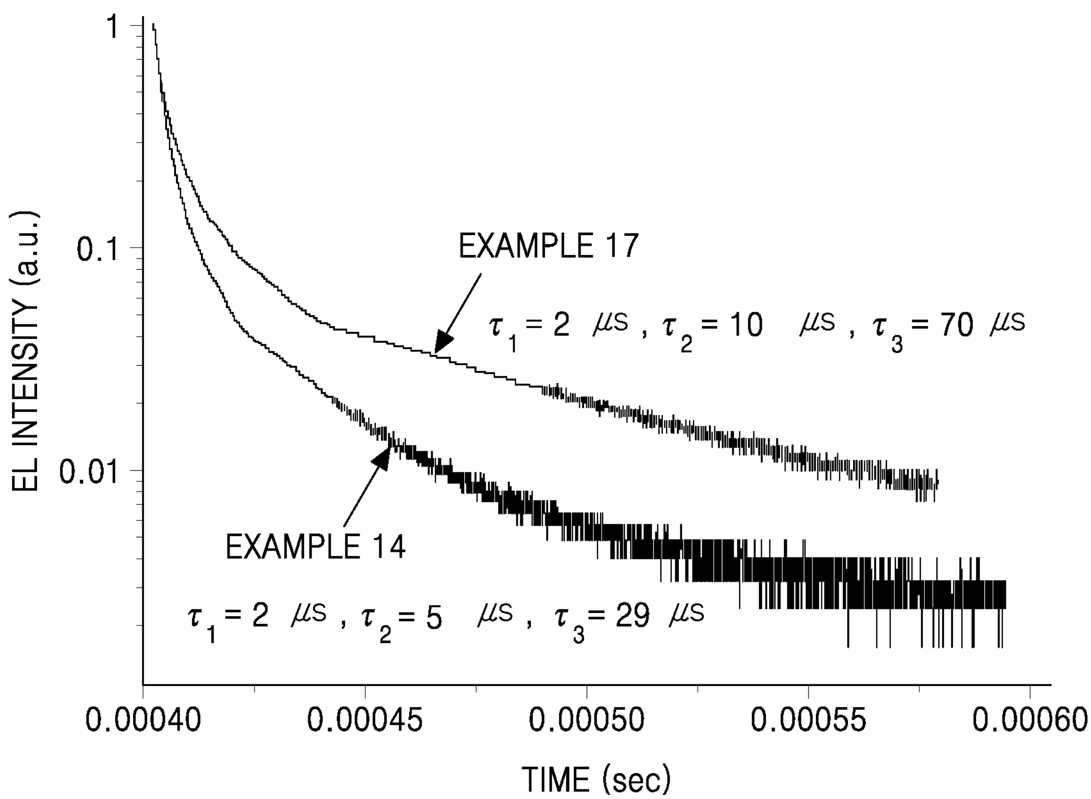
FIG. 8 is a time-resolved electroluminescence (TREL) spectrum of organic light-emitting devices manufactured according to Examples 14 and 17.

A time-resolved electroluminescence (TREL) spectrum of each of the organic light-emitting devices of Examples 14 and 17 was measured by using a Tektronix TDS 460 Four Channel Digitizing Oscilloscope while a voltage pulse (a pulse width was in a range of 100 ns to 1 ms) was applied by using an AVTECCH AV-1011-B pulse generator, and results thereof are shown in FIG. 8. A decay time calculated from the TREL spectrum of FIG. 8 is shown in Table 7.

TABLE 7

| Decay time | $T_1$ (μs) | $T_2$ (μs) | $T_3$ (μs) |
|---|---|---|---|
| Example 14 | 2 | 5 | 29 |
| Example 17 | 2 | 10 | 70 |

From FIG. 8 and Table 7, it can be seen that the organic light-emitting devices of Examples 14 and 17 emitted both phosphorescence light and delayed fluorescence light.

The organic light-emitting device may have a low driving voltage, high current density, high luminescence efficiency, and a long lifespan and may be used for manufacturing high-quality electronic apparatuses. The organometallic compound may be used for manufacturing an organic light-emitting device having high luminescence efficiency and a long lifespan.

It should be understood that embodiments described herein should be considered in a descriptive sense only and not for purposes of limitation. Descriptions of features or aspects within each embodiment should be considered as available for other similar features or aspects in other embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the figures, it will be understood by those of ordinary skill in the art that various changes in form and details may be made therein without departing from the spirit and scope of the present disclosure as defined by the appended claims, and equivalents thereof.

What is claimed is:

1. An organic light-emitting device comprising:

a first electrode;

a second electrode facing the first electrode; and an organic layer between the first electrode and the second electrode and comprising an emission layer, wherein the organic layer comprises a first compound represented by Formula 1:

Formula 1

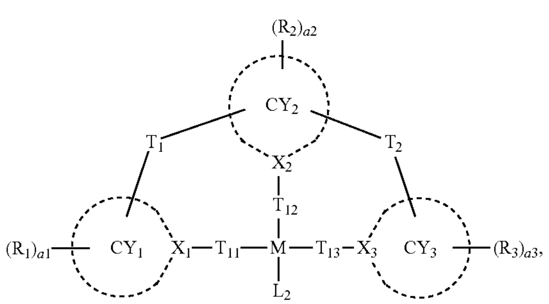

wherein, in Formula 1,

M is Pt, Pd, or Au, and $L_2$ is a monodentate ligand represented by Formula 2-1:

2-1

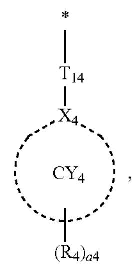

wherein, in Formulae 1 and 2-1

$X_1$ to $X_3$ are C, and $X_4$ is N or C, $T_{11}$ to $T_{13}$ are each a chemical bond, $T_{14}$ is a chemical bond, *—O—*', *—S—*', *—B(R')—*', *—N(R')—*', *—P(R')—*', *—C(R')(R")—*', *—Si(R')(R")—*', *—Ge(R')(R")—*', *—C(=O)—*', or *—C(=S)—*', $X_1$ and M are directly linked to each other, $X_2$ and M are directly linked to each other, $X_3$ and M are directly linked to each other, and when $T_{14}$ is a chemical bond, $X_4$ and M are directly linked to each other, two bonds selected from i) a bond between $X_1$ or $T_{11}$ and M, ii) a bond between $X_2$ or $T_{12}$ and M, iii) a bond between $X_3$ or $T_{13}$ and M, and iv) a bond between $X_4$ or $T_{14}$ and M are each a coordinate bond, and the other two bonds are each a covalent bond, $T_1$ is a single bond, $T_2$ is a single bond, ring $CY_1$ and ring $CY_3$ are each independently i) an imidazole group, or ii) a condensed ring in which an imidazole group is condensed with one or more 6-membered rings, ring $CY_2$ is a benzene group, ring $CY_4$ is a $C_5$-$C_{30}$ carbocyclic group or a $C_1$-$C_{30}$ heterocyclic group, $R_1$ to $R_4$, R', and R" are each independently hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —C($Q_1$)($Q_2$)($Q_3$), —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), a1 to a4 are each independently an integer from 0 to 20,

* and *' each indicate a binding site to a neighboring atom, a substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, and the substituted monovalent non-aromatic condensed heteropolycyclic group is(are):

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —O($Q_{11}$), —S($Q_{11}$), —Si($Q_{11}$)($Q_{12}$)($Q_{13}$), —N($Q_{11}$)($Q_{12}$), —B($Q_{11}$)($Q_{12}$), —P($Q_{11}$)($Q_{12}$), —C(═O)($Q_{11}$), —S(═O)$_2$($Q_{11}$), —P(═O)($Q_{11}$)($Q_{12}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, or a monovalent non-aromatic condensed heteropolycyclic group, each unsubstituted or substituted with deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —O($Q_{21}$), —S($Q_{21}$), —Si($Q_{21}$)($Q_{22}$)($Q_{23}$), —N($Q_{21}$)($Q_{22}$), —B($Q_{21}$)($Q_{22}$), —P($Q_{21}$)($Q_{22}$), —C(═O)($Q_{21}$), —S(═O)$_2$($Q_{21}$), —P(═O)($Q_{21}$)($Q_{22}$), or any combination thereof;

—O($Q_{31}$), —S($Q_{31}$), —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(═O)($Q_{31}$), —S(═O)$_2$($Q_{31}$), or —P(═O)($Q_{31}$)($Q_{32}$); or any combination thereof, and $Q_1$ to $Q_3$, $Q_{11}$ to $Q_{13}$, $Q_{21}$ to $Q_{23}$, and $Q_{31}$ to $Q_{33}$ are each independently hydrogen; deuterium; —F; —Cl; —Br; —I; a hydroxyl group; a cyano group; a nitro group; an amidino group; a hydrazine group; a hydrazone group; $C_1$-$C_{60}$ alkyl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; $C_2$-$C_{60}$ alkenyl group; $C_2$-$C_{60}$ alkynyl group; $C_1$-$C_{60}$ alkoxy group; $C_3$-$C_{10}$ cycloalkyl group; $C_1$-$C_{10}$ heterocycloalkyl group; $C_3$-$C_{10}$ cycloalkenyl group; $C_1$-$C_{10}$ heterocycloalkenyl group; $C_6$-$C_{60}$ aryl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; $C_6$-$C_{60}$ aryloxy group; $C_6$-$C_{60}$ arylthio group; $C_1$-$C_{60}$ heteroaryl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; a monovalent non-aromatic condensed polycyclic group; or a monovalent non-aromatic condensed heteropolycyclic group.

2. The organic light-emitting device of claim 1, wherein, the organic layer further comprises a second compound represented by Formula 2, a third compound comprising a group represented by Formula 3, or any combination thereof, and the second compound is different from the third compound:

Formula 2

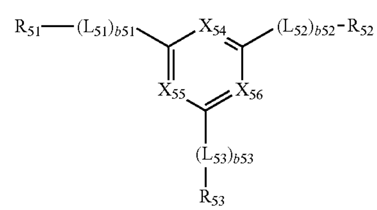

Formula 3

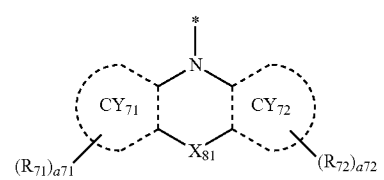

wherein, in Formulae 2 and 3, ring $CY_{71}$ and ring $CY_{72}$ are each independently a $C_5$-$C_{30}$ carbocyclic group or a $C_1$-$C_{30}$ heterocyclic group, $L_{51}$ to $L_{53}$ are each independently a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, $R_{10a}$ is the same as defined in connection with $R_1$, and $R_{10a}$ is not hydrogen, b51 to b53 are each independently an integer from 0 to 5, wherein, when b51 is 0, *-$(L_{51})_{b51}$-*' is a single bond, when b52 is 0, *-$(L_{52})_{b52}$-*' is a single bond, and when b53 is 0, *-$(L_{53})_{b53}$-*' is a single bond, $X_{54}$ is N or C($R_{54}$), $X_{55}$ is N or C($R_{55}$), $X_{56}$ is N or C($R_{56}$), and at least one of $X_{54}$ to $X_{56}$ is N, $X_{81}$ is a single bond, O, S, N($R_{81}$), B($R_{81}$), C($R_{81a}$)($R_{81b}$), or Si($R_{81a}$)($R_{81b}$), $R_{51}$ to $R_{56}$, $R_{71}$, $R_{72}$, $R_{81}$, $R_{81a}$, and $R_{81b}$ are each independently hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, a71 and a72 are each independently an integer from 0 to 20,

* and *' each indicate a binding site to a neighboring atom, a substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, and the substituted monovalent non-aromatic condensed heteropolycyclic group is(are):

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —$O(Q_{11})$, —$S(Q_{11})$, —$Si(Q_{11})(Q_{12})(Q_{13})$, —$N(Q_{11})(Q_{12})$, —$B(Q_{11})(Q_{12})$, —$P(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, or a monovalent non-aromatic condensed heteropolycyclic group, each unsubstituted or substituted with deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —$O(Q_{21})$, —$S(Q_{21})$, —$Si(Q_{21})(Q_{22})(Q_{23})$, —$N(Q_{21})(Q_{22})$, —$B(Q_{21})(Q_{22})$, —$P(Q_{21})(Q_{22})$, —$C(=O)(Q_{21})$, —$S(=O)_2(Q_{21})$, —$P(=O)(Q_{21})(Q_{22})$, or any combination thereof;

—$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, or —$P(=O)(Q_{31})(Q_{32})$; or any combination thereof, and $Q_1$ to $Q_3$, $Q_{11}$ to $Q_{13}$, $Q_{21}$ to $Q_{23}$, and $Q_{31}$ to $Q_{33}$ are each independently hydrogen; deuterium; —F; —Cl; —Br; —I; a hydroxyl group; a cyano group; a nitro group; an amidino group; a hydrazine group; a hydrazone group; $C_1$-$C_{60}$ alkyl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; $C_2$-$C_{60}$ alkenyl group; $C_2$-$C_{60}$ alkynyl group; $C_1$-$C_{60}$ alkoxy group; $C_3$-$C_{10}$ cycloalkyl group; $C_1$-$C_{10}$ heterocycloalkyl group; $C_3$-$C_{10}$ cycloalkenyl group; $C_1$-$C_{10}$ heterocycloalkenyl group; $C_6$-$C_{60}$ aryl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; $C_6$-$C_{60}$ aryloxy group; $C_6$-$C_{60}$ arylthio group; $C_1$-$C_{60}$ heteroaryl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; a monovalent non-aromatic condensed polycyclic group; or a monovalent non-aromatic condensed heteropolycyclic group.

3. The organic light-emitting device of claim 1, wherein, at least one of $R_2$(S) in Formula 1 is a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, or a substituted or unsubstituted monovalent non-aromatic condensed heteropolycyclic group.

4. The organic light-emitting device of claim 1, wherein, $L_2$ in Formula 1 is a ligand represented by one of Formulae A4-1 and A4-1(2):

A4-1(1)

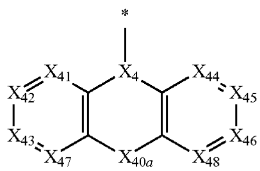

A4-1(2)

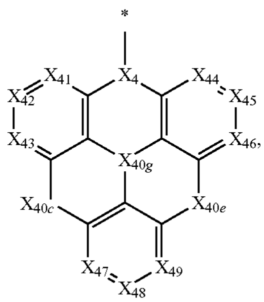

wherein, in Formulae A4-1(1) and A4-1(2), $X_4$ is the same as described in claim 1, $X_{40}$a is a single bond, O, S, $S(=O)_2$, $C(R_{40a})(R_{40b})$, $Si(R_{40a})(R_{40b})$, $N(R_{40a})$, or $B(R_{40a})$, $X_{40c}$ is O, S, $C(R_{40c})(R_{40d})$, $Si(R_{40c})(R_{40d})$, or $N(R_{40c})$, $X_{40e}$ is O, S, $C(R_{40e})(R_{40f})$, $Si(R_{40e})(R_{40f})$, or $N(R_{40e})$, $X_{40g}$ is N, B, or P, $X_{41}$ is N or $C(R_{41})$, $X_{42}$ is N or $C(R_{42})$, $X_{43}$ is N or $C(R_{43})$, $X_{44}$ is N or $C(R_{44})$, $X_{45}$ is N or $C(R_{45})$, $X_{46}$ is N or $C(R_{46})$, $X_{47}$ is N or $C(R_{47})$, $X_{48}$ is N or $C(R_{48})$, and $X_{49}$ is N or $C(R_{49})$, $R_{40a}$ to $R_{40f}$ and $R_{41}$ to $R_{49}$ are each independently the same as defined in connection with $R_4$, and

* indicates a binding site to M in Formula 1.

5. The organic light-emitting device of claim 1, wherein, the first compound is represented by Formula 1A, 1B, or 1C:

1A

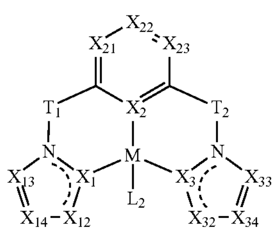

1B

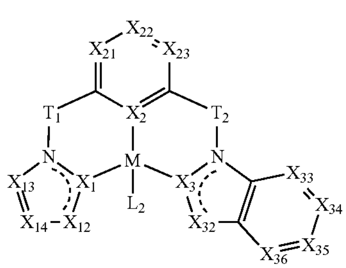

-continued

1C

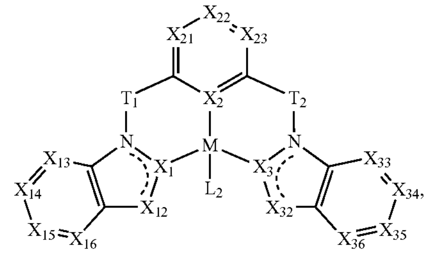

wherein, in Formulae 1A to 1C,

M, $L_2$, $X_1$ to $X_3$, $T_1$, and $T_2$ are each independently the same as described in claim 1, $X_{12}$ is $N(R_{12})$, $X_{13}$ is $C(R_{13})$, $X_{14}$ is $C(R_{14})$, $X_{15}$ is N or $C(R_{15})$, $X_{16}$ is N or $C(R_{16})$, and $R_{12}$ to $R_{16}$ are each independently the same as defined in connection with $R_1$ in claim 1, $X_{21}$ is $C(R_{21})$, $X_{22}$ is $C(R_{22})$, $X_{23}$ is $C(R_{23})$, and $R_{21}$ to $R_{23}$ are each independently the same as defined in connection with $R_2$ in claim 1, $X_{32}$ is $N(R_{32})$, $X_{33}$ is $C(R_{33})$, $X_{34}$ is $C(R_{34})$, $X_{35}$ is N or $C(R_{35})$, $X_{36}$ is N or $C(R_{36})$, and $R_{32}$ to $R_{36}$ are each independently the same as defined in connection with $R_3$ in claim 1.

6. The organic light-emitting device of claim 5, wherein, in Formulae 1A to 1C, $X_{22}$ is $C(R_{22})$, and $R_{22}$ is a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, or a substituted or unsubstituted monovalent non-aromatic condensed heteropolycyclic group.

7. The organic light-emitting device of claim 2, wherein, a group represented by $*\text{-}(L_{51})_{b51}\text{-}R_{51}$ in Formula 2 is a group represented by one of Formulae CY51-1 to CY51-22, a group represented by $*\text{-}(L_{52})_{b52}\text{-}R_{52}$ in Formula 2 is a group represented by one of Formulae CY52-1 to CY52-22, and a group represented by $*\text{-}(L_{53})_{b53}\text{-}R_{53}$ in Formula 2 is a group represented by one of Formulae CY53-1 to CY53-18, $—C(Q_1)(Q_2)(Q_3)$, or $—Si(Q_1)(Q_2)(Q_3)$:

CY51-1

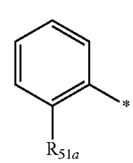

CY51-2

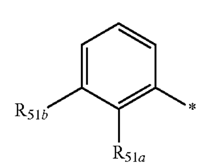

-continued
CY51-3
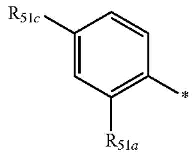
CY51-4
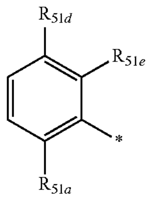
CY51-5
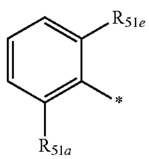
CY51-6
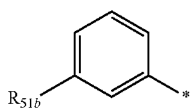
CY51-7
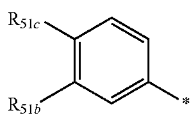
CY51-8
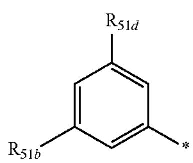
CY51-9
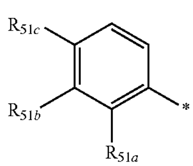
CY51-10
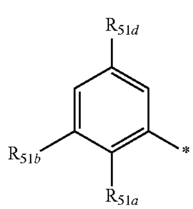
CY51-11
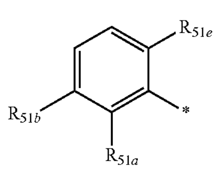
-continued
CY51-12
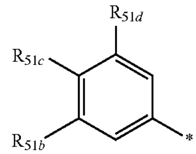
CY51-13
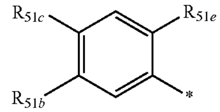
CY51-14
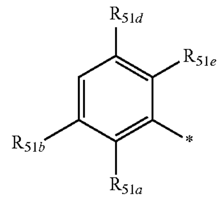
CY51-15
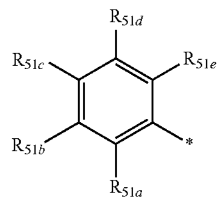
CY51-16
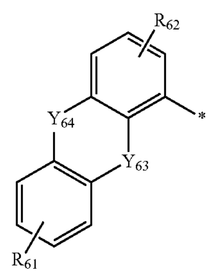
CY51-17
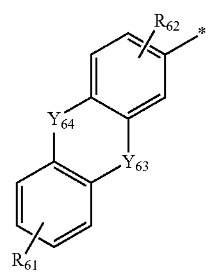
CY51-18
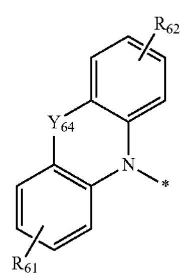

-continued
CY51-19
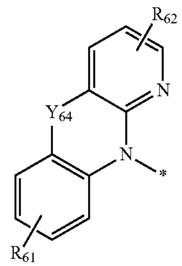
CY51-20
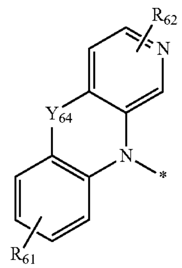
CY51-21
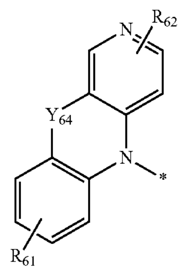
CY51-22
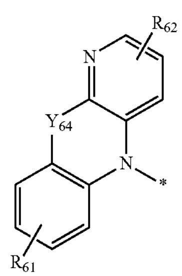
CY52-1
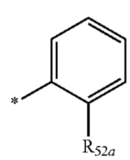
CY52-2
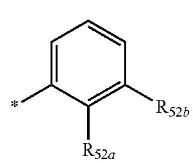
CY52-3
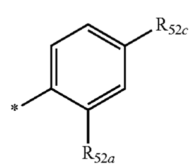
-continued
CY52-4
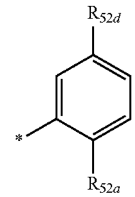
CY52-5
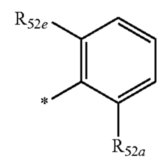
CY52-6
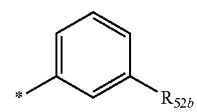
CY52-7
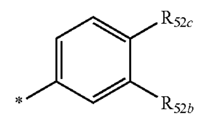
CY52-8
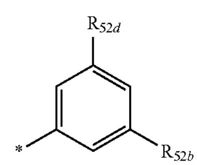
CY52-9
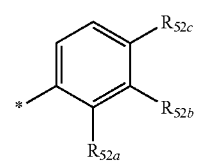
CY52-10
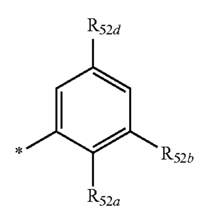
CY52-11
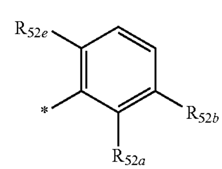
CY52-12
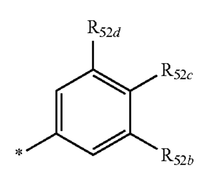
CY52-13
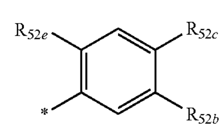

-continued
CY52-14
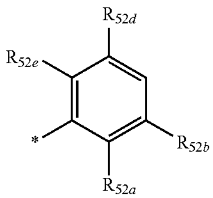
CY52-15
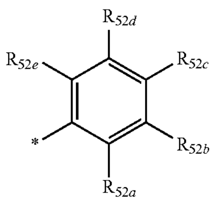
CY52-16
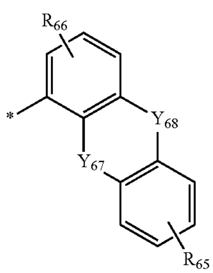
CY52-17
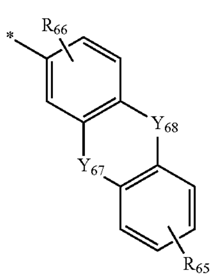
CY52-18
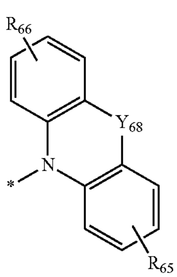
CY52-19
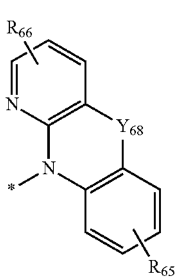
-continued
CY52-20
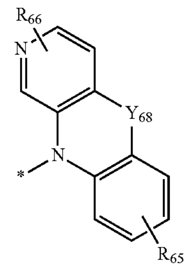
CY52-21
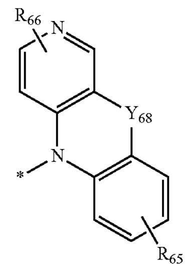
CY52-22
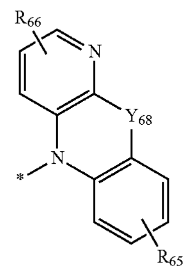
CY53-1
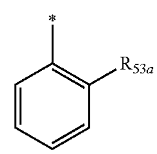
CY53-2
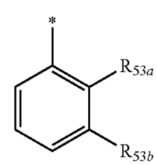
CY53-3
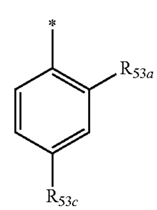
CY53-4
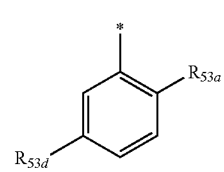

-continued

CY53-5

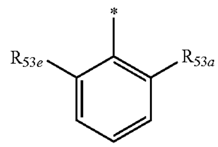

CY53-6

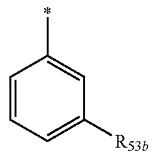

CY53-7

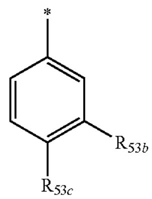

CY53-8

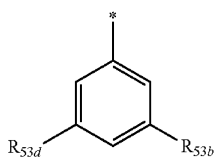

CY53-9

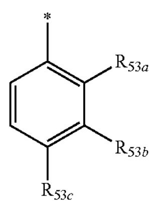

CY53-10

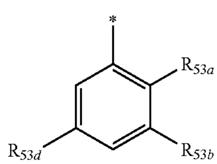

CY53-11

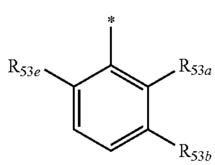

CY53-12

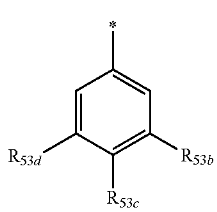

-continued

CY53-13

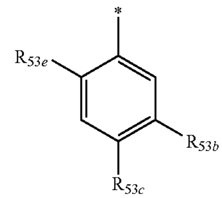

CY53-14

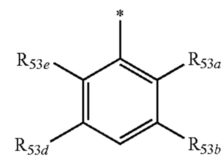

CY53-15

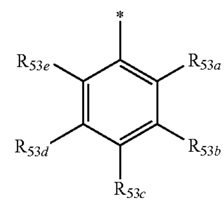

CY53-16

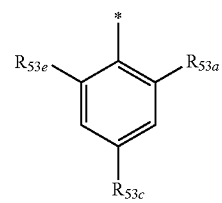

CY53-17

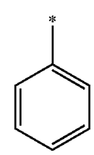

CY53-18

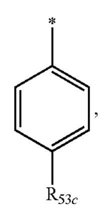

wherein, in Formulae CY51-1 to CY51-22, CY52-1 to CY52-22, and CY53-1 to CY53-18, $Y_{63}$ is a single bond, O, S, N($R_{63}$), B($R_{63}$), C($R_{63a}$)($R_{63b}$), or Si($R_{63a}$)($R_{63b}$), $Y_{64}$ is a single bond, O, S, N($R_{64}$), B($R_{64}$), C($R_{64a}$)($R_{64b}$), or Si($R_{64a}$)($R_{64b}$), $Y_{67}$ is a single bond, O, S, N($R_{67}$), B($R_{67}$), C($R_{67a}$)($R_{67b}$), or Si($R_{67a}$)($R_{67b}$), $Y_{68}$ is a single bond, O, S, N($R_{68}$), B($R_{68}$), C($R_{68a}$)($R_{68b}$), or Si($R_{68a}$)($R_{68b}$), $Y_{63}$ and $Y_{64}$ in Formulae CY51-16 and CY51-17 are not a single bond at the same time, $Y_{67}$ and $Y_{68}$ in Formulae CY52-16 and CY52-17 are not a single bond at the same time, $R_{51a}$ to $R_{51e}$, $R_{61}$ to $R_{64}$, $R_{63a}$, $R_{63b}$, $R_{64a}$, and $R_{64b}$ are each independently the same as defined in connection with $R_{51}$ in claim 2, wherein each of $R_{51a}$ to $R_{51e}$ is not hydrogen, $R_{52a}$ to $R_{52e}$, $R_{65}$ to $R_{68}$, $R_{67a}$, $R_{67b}$, $R_{68a}$, and $R_{68b}$ are each independently the same as defined in connection with $R_{52}$ in claim 2, wherein each of $R_{52a}$ to $R_{52e}$ is not hydrogen, $R_{53a}$ to $R_{53e}$ are each independently the same as defined in connection with $R_{53}$ in claim 2, wherein each of $R_{53a}$ to $R_{53e}$ is not hydrogen, and

* indicates a binding site to a neighboring atom.

8. The organic light-emitting device of claim 2, wherein, the third compound is represented by one of Formulae 3-1 to 3-5:

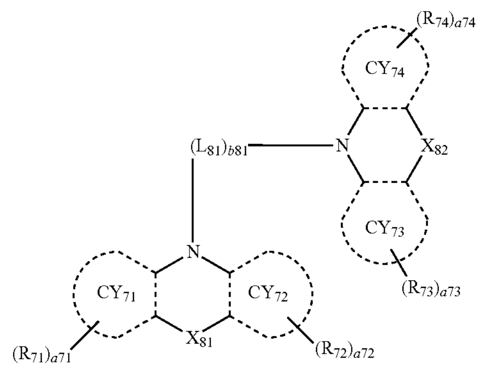

3-1

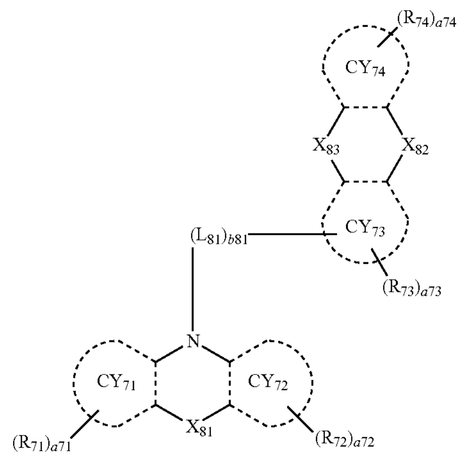

3-2

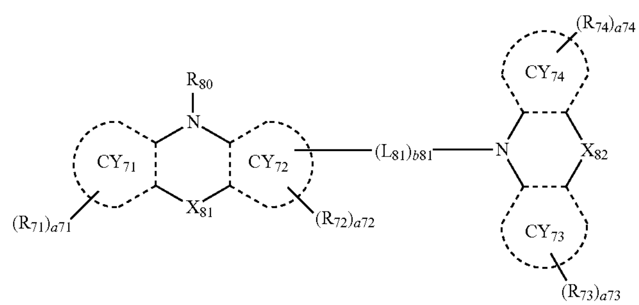

3-3

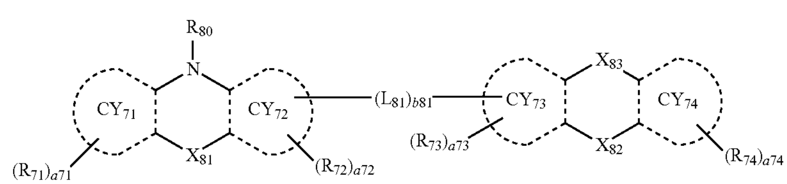

3-4

-continued 3-5

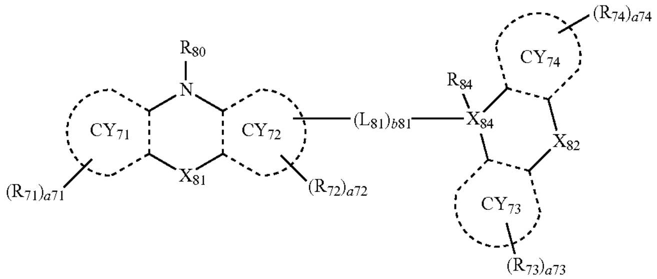

wherein, in Formulae 3-1 to 3-5, ring $CY_{71}$, ring $CY_{72}$, $X_{81}$, $R_{71}$, $R_{72}$, a71, and a72 are each independently the same as described in claim 2, ring $CY_{73}$, ring $CY_{74}$, $R_{73}$, $R_{74}$, a73, and a74 are each independently the same as defined in connection with ring $CY_{71}$, ring $CY_{72}$, $R_{71}$, $R_{72}$, a71, and a72 in claim 2, $L_{81}$ is *—C($Q_4$)($Q_5$)-*', *—Si($Q_4$)($Q_5$)-*', a $C_5$-$C_{30}$ carbocyclic group that is unsubstituted or substituted with at least one $R_{10a}$, or a $C_1$-$C_{30}$ heterocyclic group that is unsubstituted or substituted with at least one $R_{10a}$, wherein $Q_4$ and $Q_5$ are each independently the same as defined in connection with $Q_1$ in claim 2, b81 is an integer from 0 to 5, wherein, when b81 is 0, *-$(L_{81})_{b81}$-*' is a single bond, and when b81 is 2 or more, two or more $L_{81}$(s) are identical to or different from each other, $X_{82}$ is a single bond, O, S, N($R_{82}$), B($R_{82}$), C($R_{82a}$)($R_{82b}$), or Si($R_{82a}$)($R_{82b}$), $X_{83}$ is a single bond, O, S, N($R_{83}$), B($R_{83}$), C($R_{83a}$)($R_{83b}$), or Si($R_{83a}$)($R_{83b}$), $X_{82}$ and $X_{83}$ in Formulae 3-2 and 3-4 are not a single bond at the same time, $X_{84}$ is C or Si, $R_{80}$, $R_{82}$, $R_{83}$, $R_{82a}$, $R_{82b}$, $R_{83a}$, $R_{83b}$, and $R_{84}$ are each independently the same as defined in connection with $R_{81}$ in claim 2, $R_{10a}$ is the same as defined in claim 2, and

* and *' each indicate a binding site to a neighboring atom.

9. The organic light-emitting device of claim 8, wherein, a group represented by

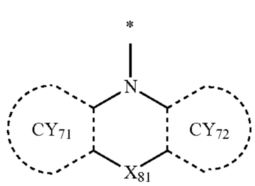

in Formulae 3-1 and 3-2 is a group represented by one of Formulae CY71-1(1) to CY71-1 (8), a group represented by

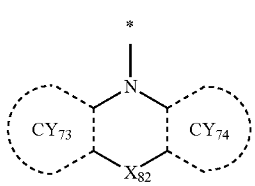

in Formulae 3-1 and 3-3 is a group represented by one of Formulae CY71-2(1) to CY71-2(8), a group represented by

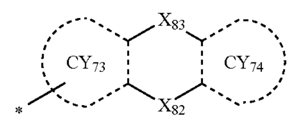

in Formulae 3-2 and 3-4 is a group represented by one of Formulae CY71-3(1) to CY71-3(32), a group represented by

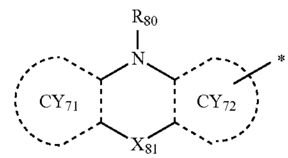

in Formulae 3-3 to 3-5 is a group represented by one of Formulae CY71-4(1) to CY71-4(32), and a group represented by

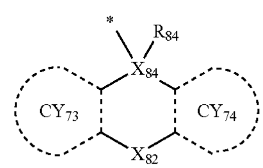

in Formula 3-5 is a group represented by one of Formulae CY71-5(1) to CY71-5(8):

CY71-1(1)

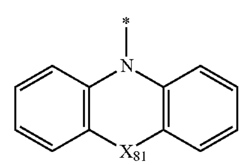

CY71-1(2)

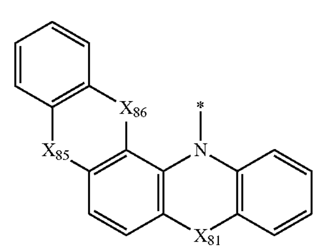

-continued
CY71-1(3)
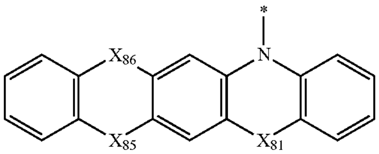
CY71-1(4)
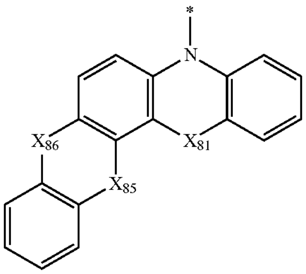
CY71-1(5)
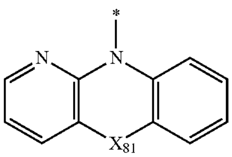
CY71-1(6)
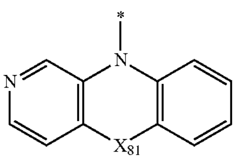
CY71-1(7)
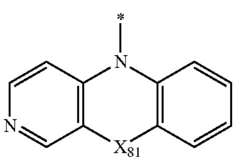
CY71-1(8)
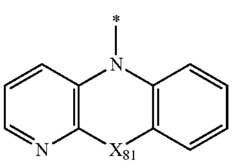
CY71-2(1)
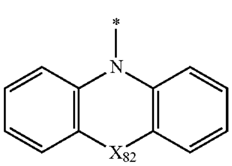
CY71-2(2)
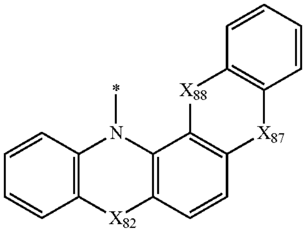
-continued
CY71-2(3)
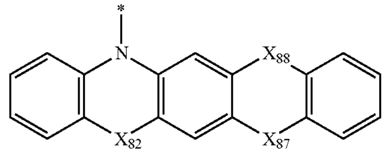
CY71-2(4)
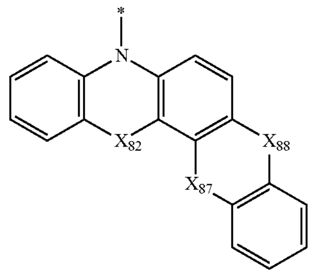
CY71-2(5)
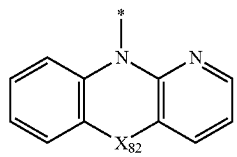
CY71-2(6)
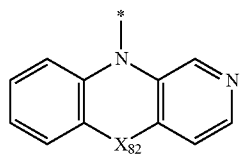
CY71-2(7)
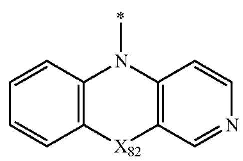
CY71-2(8)
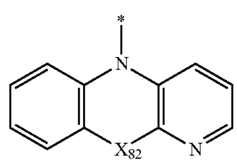
CY71-3(1)
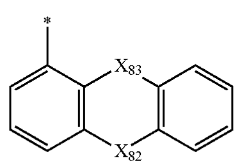
CY71-3(2)
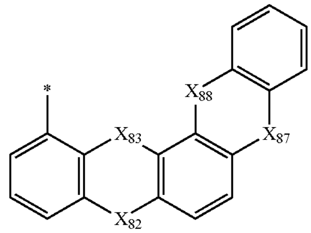

CY71-3(3)
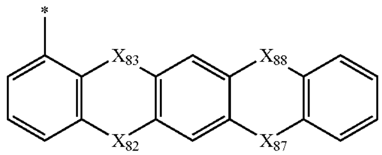
CY71-3(4)
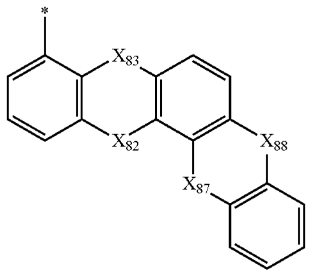
CY71-3(5)
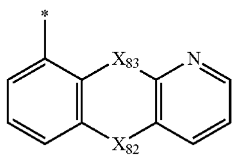
CY71-3(6)
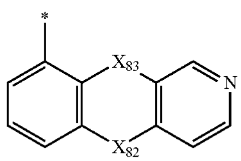
CY71-3(7)
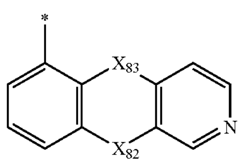
CY71-3(8)
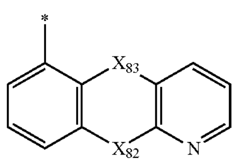
CY71-3(9)
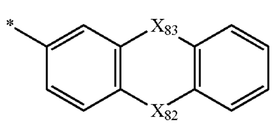
CY71-3(10)
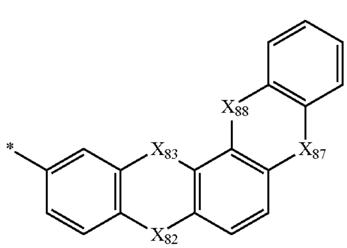
CY71-3(11)
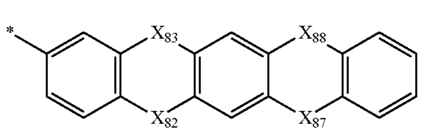
CY71-3(12)
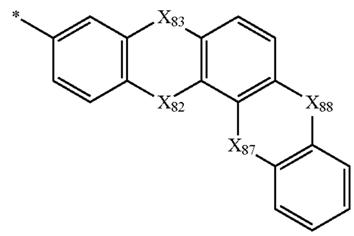
CY71-3(13)
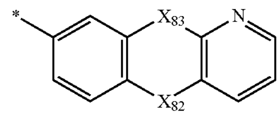
CY71-3(14)
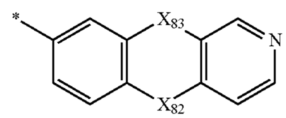
CY71-3(15)
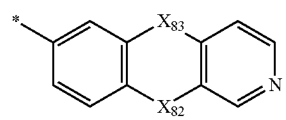
CY71-3(16)
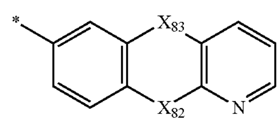
CY71-3(17)
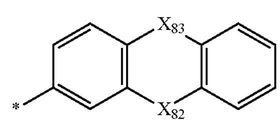
CY71-3(18)
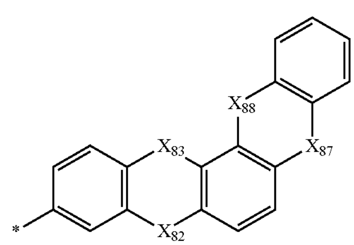
CY71-3(19)
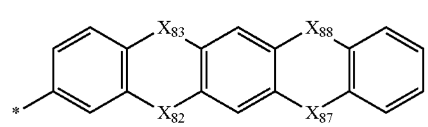
CY71-3(20)
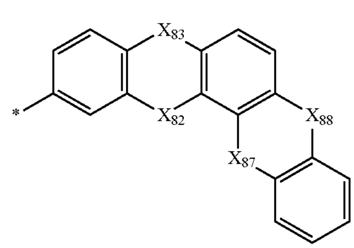
CY71-3(21)
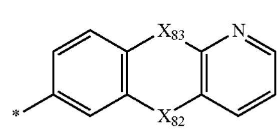

-continued
CY71-3(22)
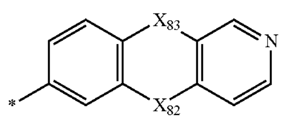
CY71-3(23)
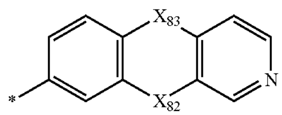
CY71-3(24)
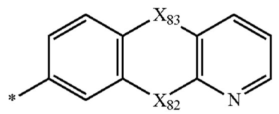
CY71-3(25)
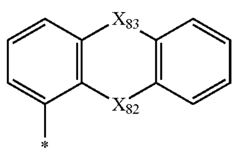
CY71-3(26)
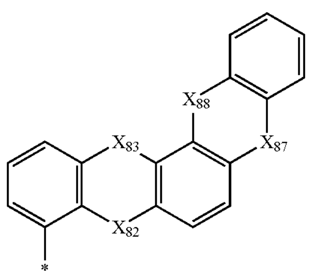
CY71-3(27)
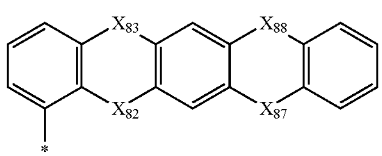
CY71-3(28)
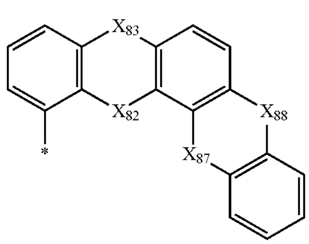
CY71-3(29)
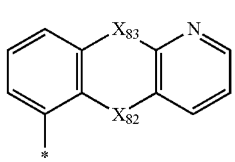
CY71-3(30)
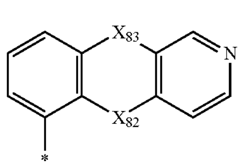
-continued
CY71-3(31)
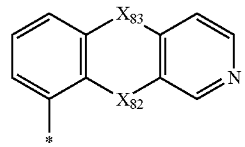
CY71-3(32)
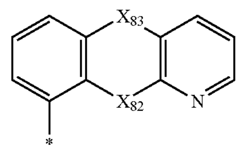
CY71-4(1)
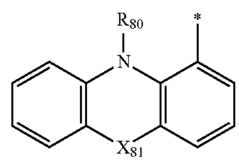
CY71-4(2)
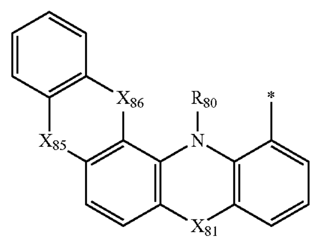
CY71-4(3)
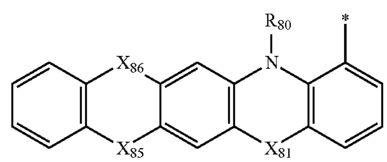
CY71-4(4)
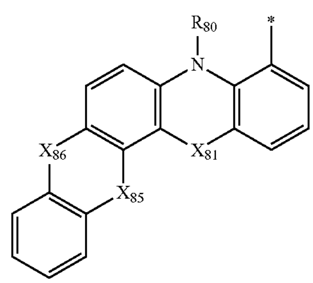
CY71-4(5)
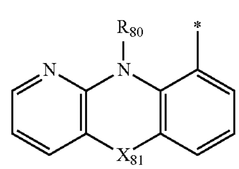
CY71-4(6)
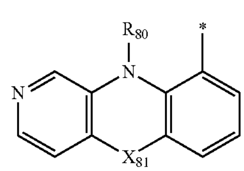

-continued
CY71-4(7)
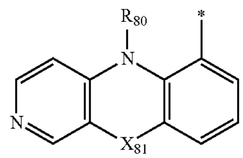
CY71-4(8)
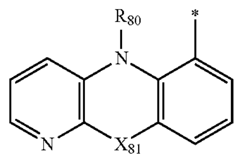
CY71-4(9)
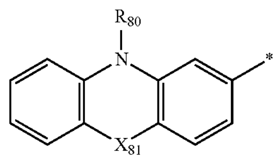
CY71-4(10)
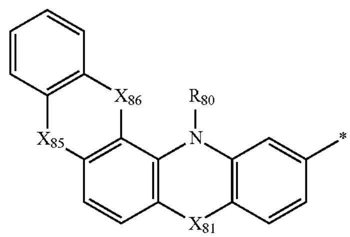
CY71-4(11)
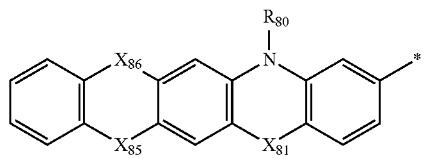
CY71-4(12)
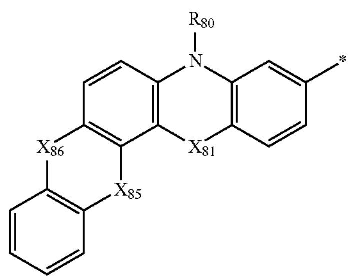
CY71-4(13)
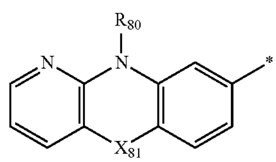
CY71-4(14)
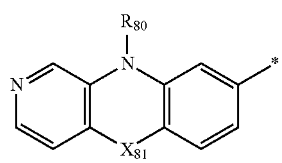
-continued
CY71-4(15)
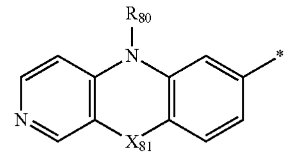
CY71-4(16)
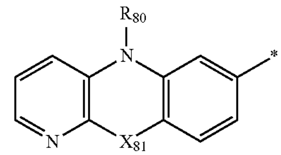
CY71-4(17)
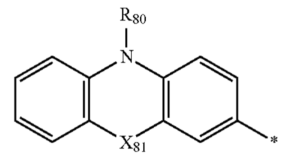
CY71-4(18)
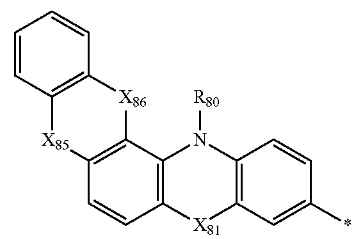
CY71-4(19)
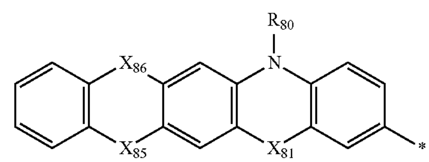
CY71-4(20)
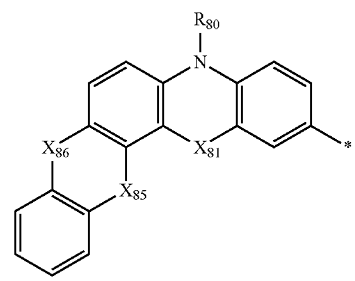
CY71-4(21)
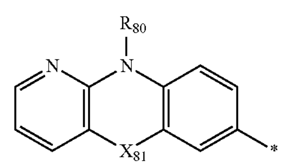
CY71-4(22)
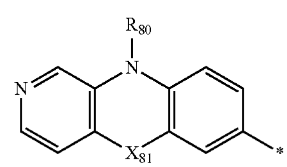

CY71-4(23)
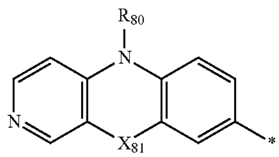
CY71-4(24)
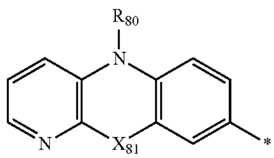
CY71-4(25)
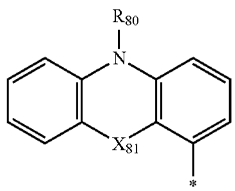
CY71-4(26)
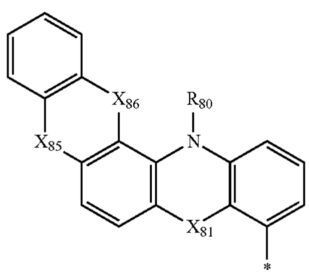
CY71-4(27)
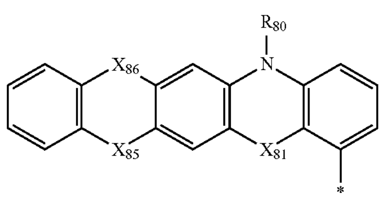
CY71-4(28)
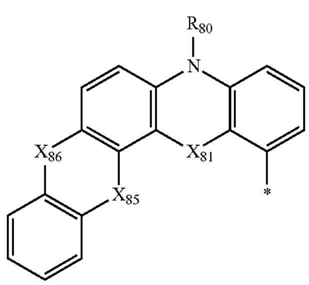
CY71-4(29)
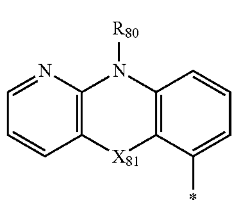
CY71-4(30)
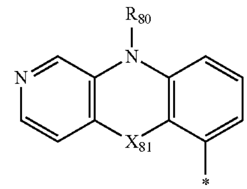
CY71-4(31)
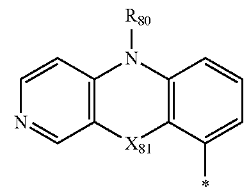
CY71-4(32)
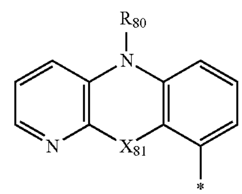
CY71-5(1)
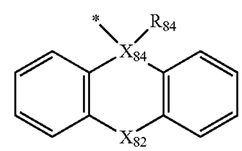
CY71-5(2)
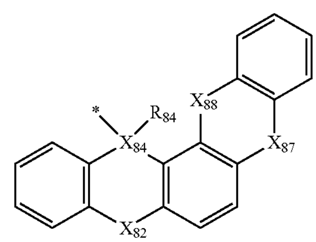
CY71-5(3)
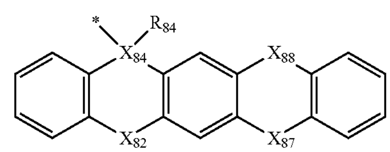
CY71-5(4)
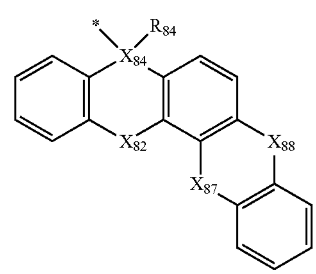
CY71-5(5)
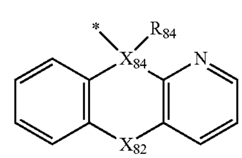

-continued

CY71-5(6)

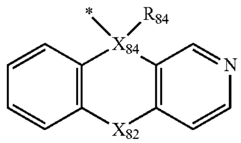

CY71-5(7)

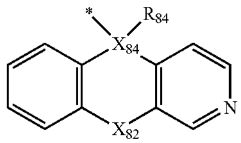

CY71-5(8)

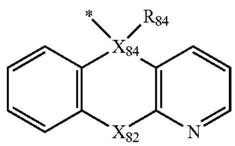

, wherein, in Formulae CY71-1(1) to CY71-1(8), CY71-2(1) to CY71-2(8), CY71-3(1) to CY71-3(32), CY71-4(1) to CY71-4(32), and CY71-5(1) to CY71-5(8), $X_{81}$ to $X_{84}$, $R_{80}$, and $R_{84}$ are each independently the same as described in claim 8, $X_{85}$ is a single bond, O, S, $N(R_{85})$, $B(R_{85})$, $C(R_{85a})(R_{85b})$, or $Si(R_{85a})(R_{85b})$, $X_{86}$ is a single bond, O, S, $N(R_{86})$, $B(R_{86})$, $C(R_{86a})(R_{86b})$, or $Si(R_{86a})(R_{86b})$, $X_{85}$ and $X_{86}$ in Formulae CY71-1(1) to CY71-1(8) and CY71-4(1) to CY71-4(32) are not a single bond at the same time, $X_{87}$ is a single bond, O, S, $N(R_{87})$, $B(R_{87})$, $C(R_{87a})(R_{87b})$, or $Si(R_{87a})(R_{87b})$, $X_{88}$ is a single bond, O, S, $N(R_{88})$, $B(R_{88})$, $C(R_{88a})(R_{88b})$, or $Si(R_{88a})(R_{88b})$, $X_{87}$ and $X_{88}$ in Formulae CY71-2(1) to CY71-2(8), CY71-3(1) to CY71-3(32), and CY71-5(1) to CY71-5(8) are not a single bond at the same time, and $R_{85}$ to $R_{88}$, $R_{85a}$, $R_{85b}$, $R_{86a}$, $R_{86b}$, $R_{87a}$, $R_{87b}$, $R_{88a}$, and $R_{88b}$ are each independently the same as defined in connection with $R_{81}$ in claim 2.

10. The organic light-emitting device of claim 1, wherein, the emission layer comprises the first compound, the emission layer further comprises a host, the first compound and the host are different from each other, and the emission layer is configured to emit blue light emitted from the first compound.

11. The organic light-emitting device of claim 1, wherein, the emission layer comprises the first compound, the emission layer further comprises a host and a dopant, the first compound, the host, and the dopant are different from each other, and the emission layer is configured to emit phosphorescence light or fluorescence light emitted from the dopant.

12. An organometallic compound represented by Formula 1:

Formula 1

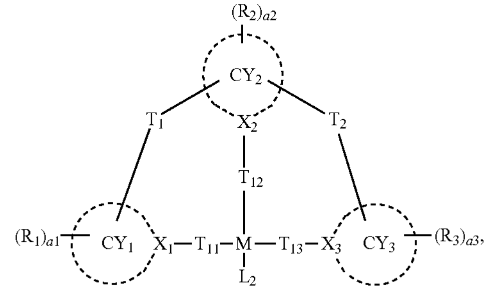

wherein, in Formula 1,

M is Pt, Pd, or Au, and $L_2$ is a monodentate ligand represented by Formula 2-1:

2-1

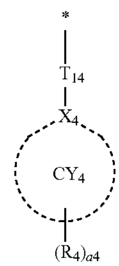

, wherein, in Formulae 1 and 2-1, $X_1$ to $X_3$ are C, and $X_4$ is N or C, $T_{11}$ to $T_{13}$ are each a chemical bond, $T_{14}$ is a chemical bond, *—O—*', *—S—*', *—B(R')—*', *—N(R')—*', *—P(R')—*', *—C(R')(R")—*', *—Si(R')(R")—*', *—Ge(R')(R")—*', *—C(=O)—*', or *—C(=S)—*', $X_1$ and M are directly linked to each other, $X_2$ and M are directly linked to each other, $X_3$ and M are directly linked to each other, and when $T_{14}$ is a chemical bond, $X_4$ and M are directly linked to each other, two bonds selected from i) a bond between $X_1$ or $T_{11}$ and M, ii) a bond between $X_2$ or $T_{12}$ and M, iii) a bond between $X_3$ or $T_{13}$ and M, and iv) a bond between $X_4$ or $T_{14}$ and M are each a coordinate bond, and the other two bonds are each a covalent bond, $T_1$ is a single bond, $T_2$ is a single bond, ring $CY_1$ and ring $CY_3$ are each independently i) an imidazole group, or ii) a condensed ring in which an imidazole group is condensed with one or more 6-membered rings, ring $CY_2$ is a benzene group, ring $CY_4$ is a $C_5$-$C_{30}$ carbocyclic group or a $C_1$-$C_{30}$ heterocyclic group, $R_1$ to $R_4$, R', and R" are each independently hydrogen, deuterium, —F, —Cl, —Br, —I, a hydroxyl group, a cyano group, a nitro group, an amidino group, a hydrazine group, a hydrazone group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$C(Q_1)(Q_2)(Q_3)$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, a1 to a4 are each independently an integer from 0 to 20,

* and *' each indicate a binding site to a neighboring atom, a substituent(s) of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, and the substituted monovalent non-aromatic condensed heteropolycyclic group is(are):

deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, a hydroxyl group, a cyano group, a nitro group, an amidino group, a hydrazine group, a hydrazone group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —$O(Q_{11})$, —$S(Q_{11})$, —$Si(Q_{11})(Q_{12})(Q_{13})$, —$N(Q_{11})(Q_{12})$, —$B(Q_{11})(Q_{12})$, —$P(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, or a monovalent non-aromatic condensed heteropolycyclic group, each unsubstituted or substituted with deuterium, —F, —Cl, —Br, —I, a hydroxyl group, a cyano group, a nitro group, an amidino group, a hydrazine group, a hydrazone group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, —$O(Q_{21})$, —$S(Q_{21})$, —$Si(Q_{21})(Q_{22})(Q_{23})$, —$N(Q_{21})(Q_{22})$, —$B(Q_{21})(Q_{22})$, —$P(Q_{21})(Q_{22})$, —$C(=O)(Q_{21})$, —$S(=O)_2(Q_{21})$, —$P(=O)(Q_{21})(Q_{22})$, or any combination thereof;

—$O(Q_{31})$, —$S(Q_{31})$, —$Si(Q_{31})(Q_{32})(Q_{33})$, —$N(Q_{31})(Q_{32})$, —$B(Q_{31})(Q_{32})$, —$P(Q_{31})(Q_{32})$, —$C(=O)(Q_{31})$, —$S(=O)_2(Q_{31})$, or —$P(=O)(Q_{31})(Q_{32})$; or any combination thereof, and $Q_1$ to $Q_3$, $Q_{11}$ to $Q_{13}$, $Q_{21}$ to $Q_{23}$, and $Q_{31}$ to $Q_{33}$ are each independently hydrogen; deuterium; —F; —Cl; —Br; —I; a hydroxyl group; a cyano group; a nitro group; an amidino group; a hydrazine group; a hydrazone group; $C_1$-$C_{60}$ alkyl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; $C_2$-$C_{60}$ alkenyl group; $C_2$-$C_{60}$ alkynyl group; $C_1$-$C_{60}$ alkoxy group; $C_3$-$C_{10}$ cycloalkyl group; $C_1$-$C_{10}$ heterocycloalkyl group; $C_3$-$C_{10}$ cycloalkenyl group; $C_1$-$C_{10}$ heterocycloalkenyl group; $C_6$-$C_{60}$ aryl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; $C_6$-$C_{60}$ aryloxy group; $C_6$-$C_{60}$ arylthio group; $C_1$-$C_{60}$ heteroaryl group unsubstituted or substituted with deuterium, —F, a cyano group, a $C_1$-$C_{60}$ alkyl group, a phenyl group, a biphenyl group, a pyridinyl group, a pyrimidinyl group, a pyridazinyl group, a pyrazinyl group, a triazinyl group, or any combination thereof; a monovalent non-aromatic condensed polycyclic group; or a monovalent non-aromatic condensed heteropolycyclic group.

13. The organometallic compound of claim 12, wherein, at least one of $R_2$(s) in Formula 1 is a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, or a substituted or unsubstituted monovalent non-aromatic condensed heteropolycyclic group.

14. The organometallic compound of claim 12, wherein, $L_2$ in Formula 1 is a ligand represented by one of Formulae A4-1(1) and A4-1(2):

A4-1(1)

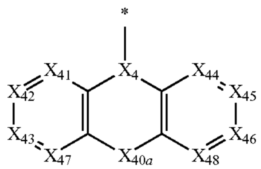

A4-1(2)

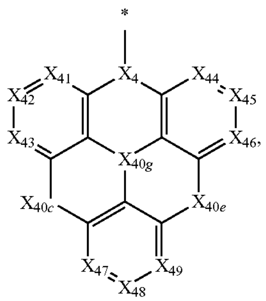

wherein, in Formulae A4-1(1) and A4-1 (2), $X_4$ is the same as described in claim 12, $X_{40a}$ is a single bond, O, S, S(=O)$_2$, C($R_{40a}$)($R_{40b}$), Si($R_{40a}$)($R_{40b}$), N($R_{40a}$), or B($R_{40a}$), $X_{40c}$ is O, S, C($R_{40c}$)($R_{40d}$), Si($R_{40c}$)($R_{40d}$), or N($R_{40c}$), $X_{40e}$ is O, S, C($R_{40e}$)($R_{40f}$), Si($R_{40e}$)($R_{40f}$), or N($R_{40e}$), $X_{40g}$ is N, B, or P, $X_{41}$ is N or C($R_{41}$), $X_{42}$ is N or C($R_{42}$), $X_{43}$ is N or C($R_{43}$), $X_{44}$ is N or C($R_{44}$), $X_{45}$ is N or C($R_{45}$), $X_{46}$ is N or C($R_{46}$), $X_{47}$ is N or C($R_{47}$), $X_{48}$ is N or C($R_{48}$), and $X_{49}$ is N or C($R_{49}$), $R_{40a}$ to $R_{40f}$ and $R_{41}$ to $R_{49}$ are each independently the same as defined in connection with $R_4$, and indicates a binding site to M in Formula 1.

15. The organometallic compound of claim 12, wherein, the organometallic compound is represented by Formula 1A, 1B, or 1C:

1A

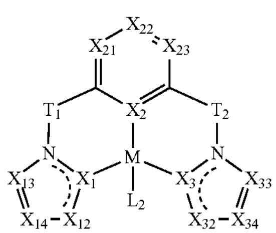

1B

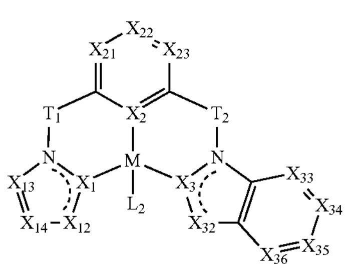

-continued

1C

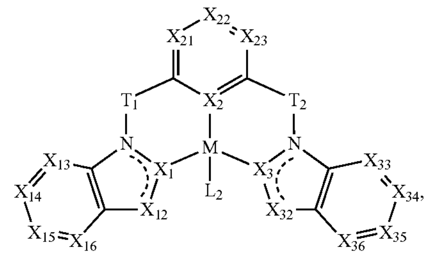

wherein, in Formulae 1A to 1C,

M, $L_2$, $X_1$ to $X_3$, $T_1$, and $T_2$ are each independently the same as described in claim 12, $X_{12}$ is N($R_{12}$), $X_{13}$ is C($R_{13}$), $X_{14}$ is C($R_{14}$), $X_{15}$ is N or C($R_{15}$), $X_{16}$ is N or C($R_{16}$), and $R_{12}$ to $R_{16}$ are each independently the same as defined in connection with $R_1$ in claim 12, $X_{21}$ is C($R_{21}$), $X_{22}$ is C($R_{22}$), $X_{23}$ is C($R_{23}$), and $R_{21}$ to $R_{23}$ are each independently the same as defined in connection with $R_2$ in claim 12, $X_{32}$ is N($R_{32}$), $X_{33}$ is C($R_{33}$), $X_{34}$ is C($R_{34}$), $X_{35}$ is N or C($R_{35}$), $X_{36}$ is N or C($R_{36}$), and $R_{32}$ to $R_{36}$ are each independently the same as defined in connection with $R_3$ in claim 12.

16. An organometallic compound selected from Compounds BD1 to BD105:

BD1

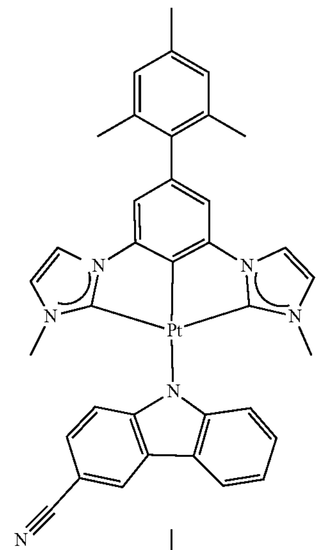

BD2

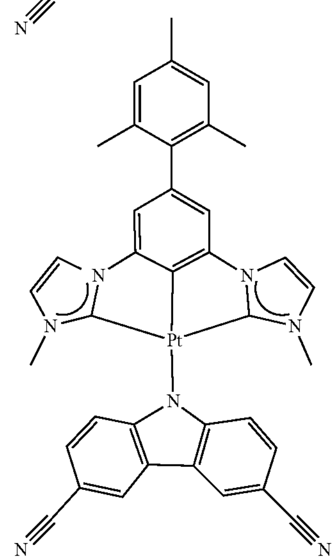

-continued
BD3
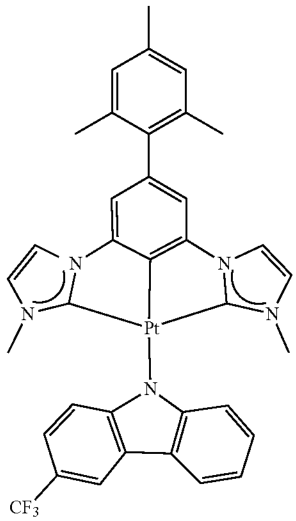
BD4
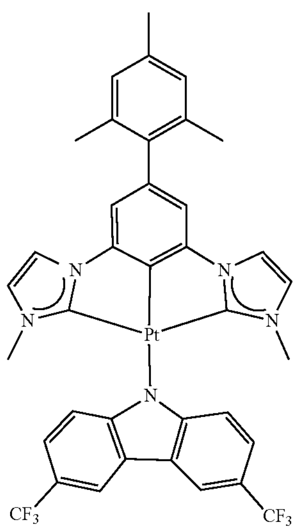
BD5
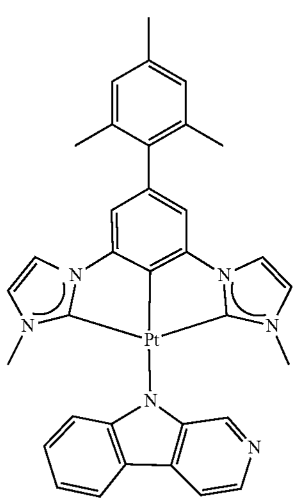
-continued
BD6
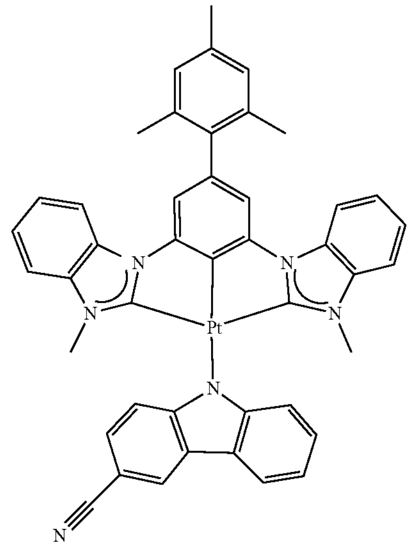
BD7
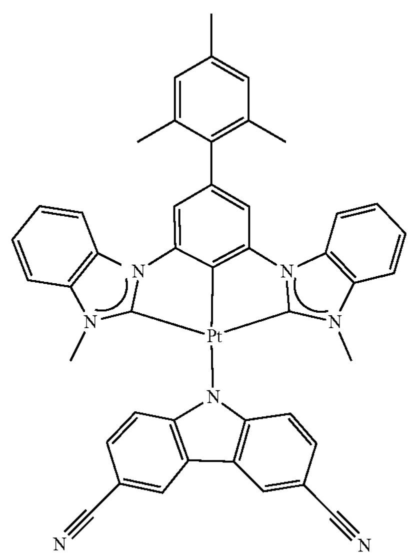
BD8
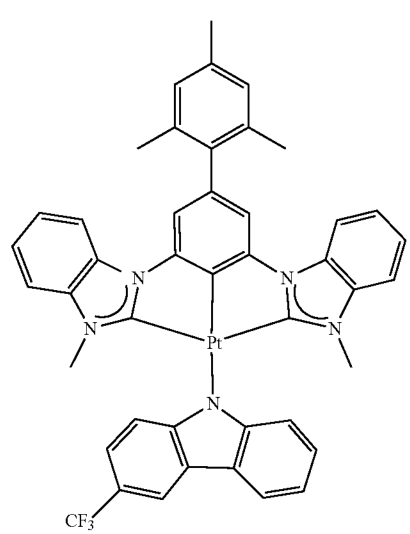

-continued
BD9
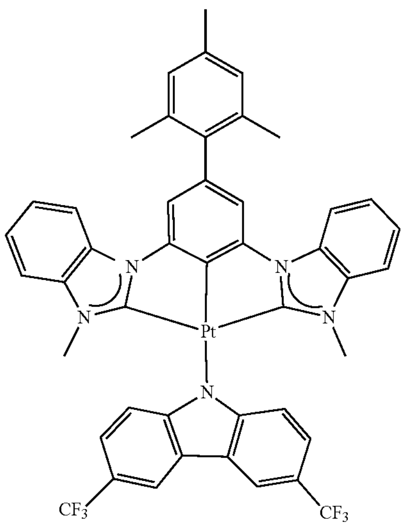
BD10
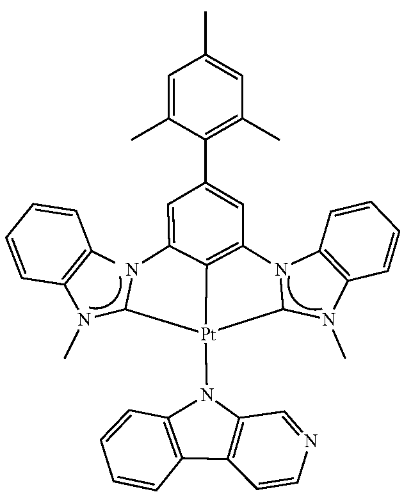
BD11
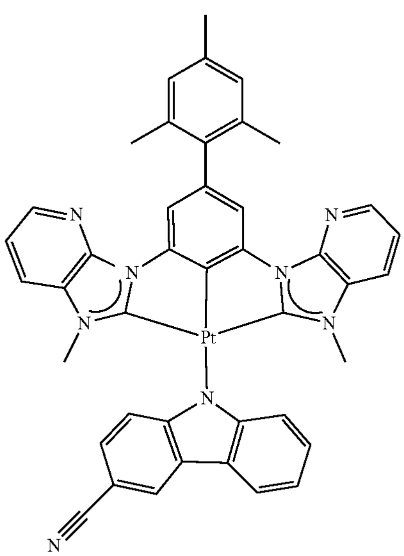
-continued
BD12
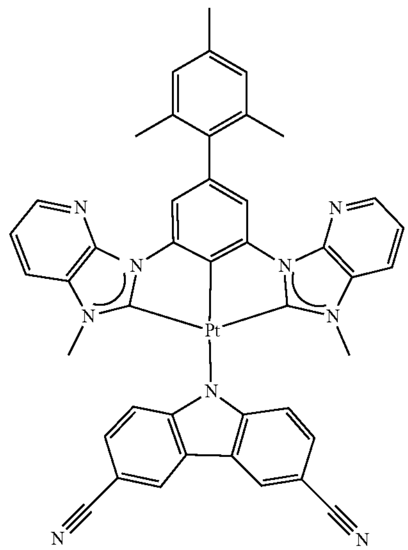
BD13
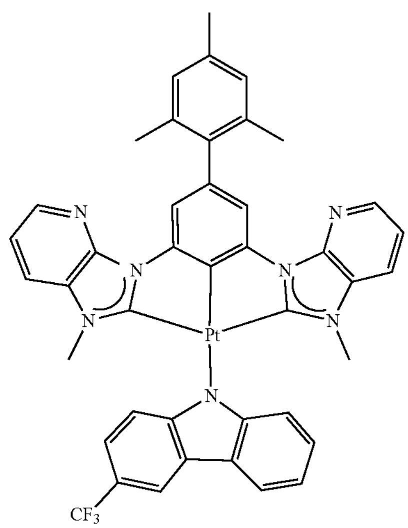
BD14
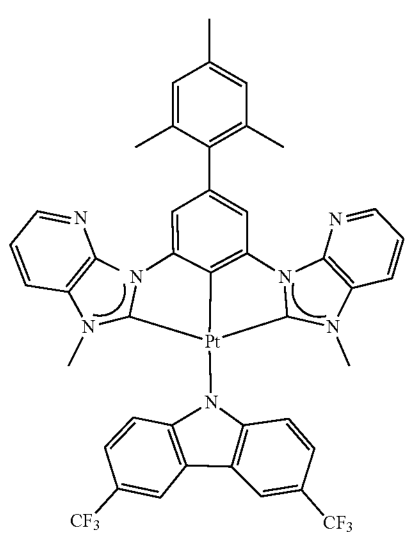

-continued
BD15
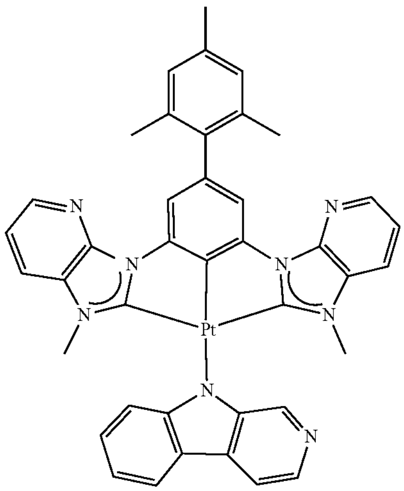
BD16
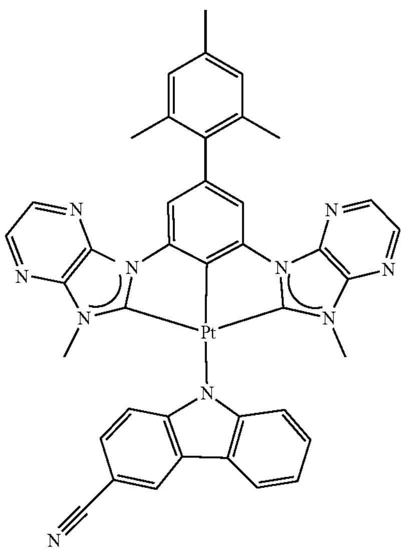
BD17
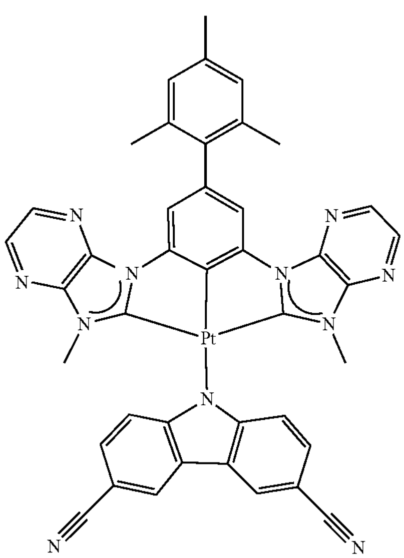
-continued
BD18
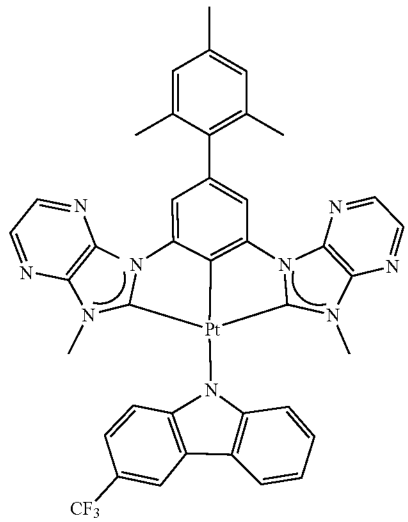
BD19
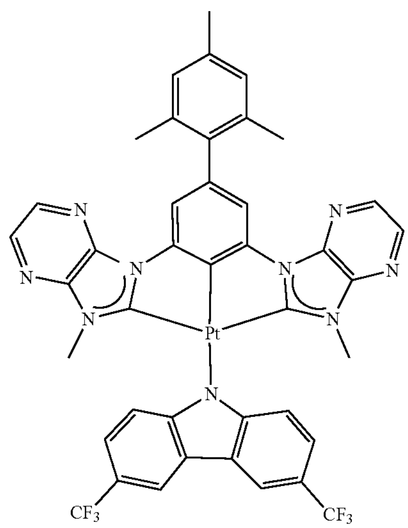
BD20
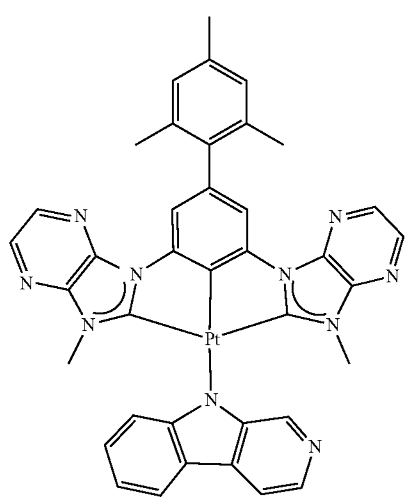

-continued
BD21
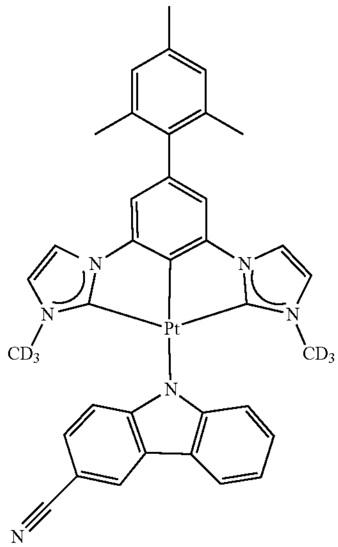
BD22
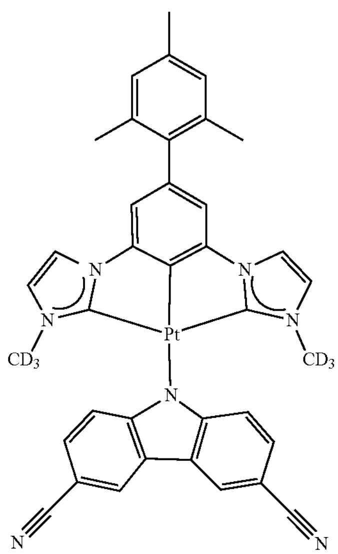
BD23
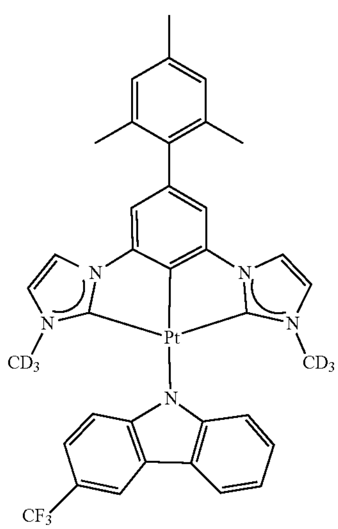
-continued
BD24
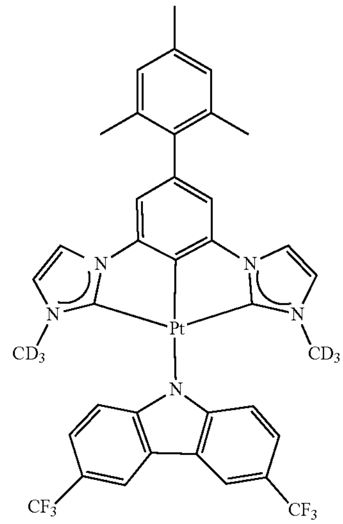
BD25
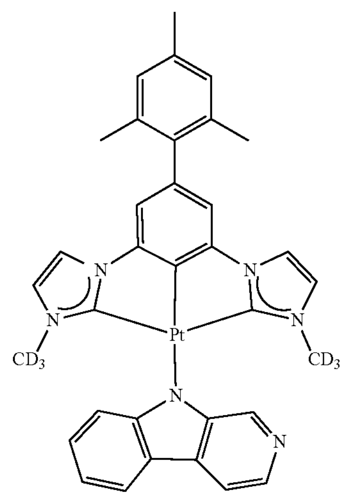
BD26
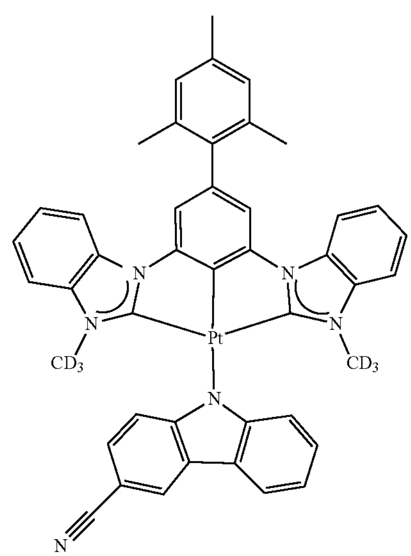

-continued
BD27
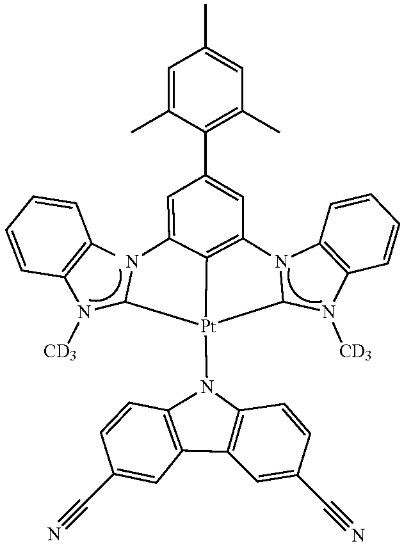
BD28
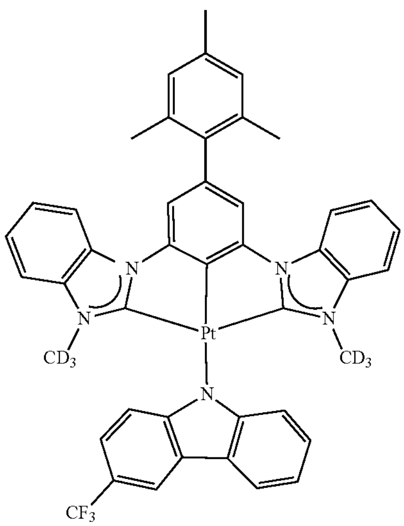
BD29
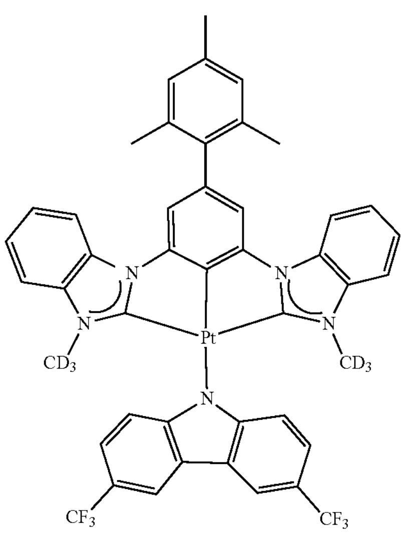
-continued
BD30
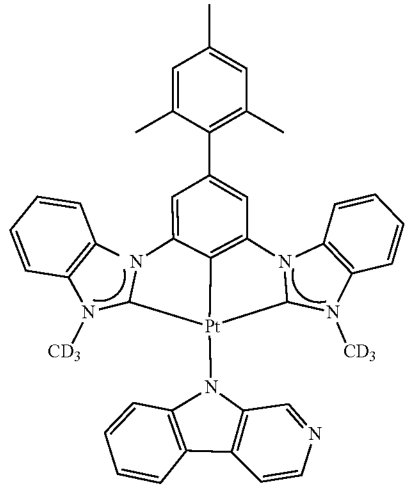
BD31
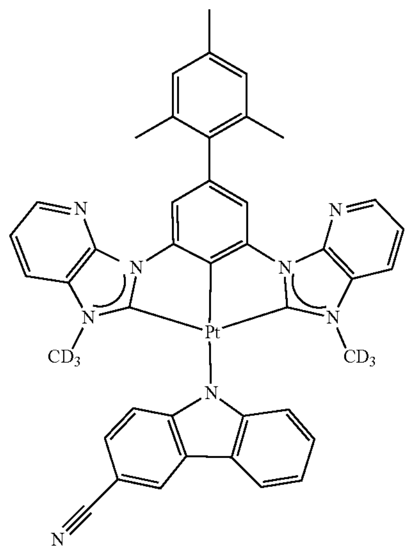
BD32
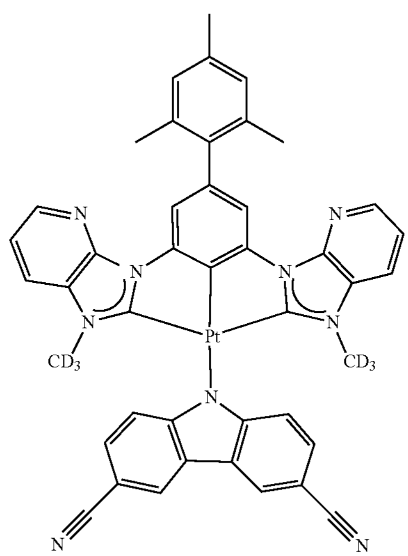

-continued
BD33
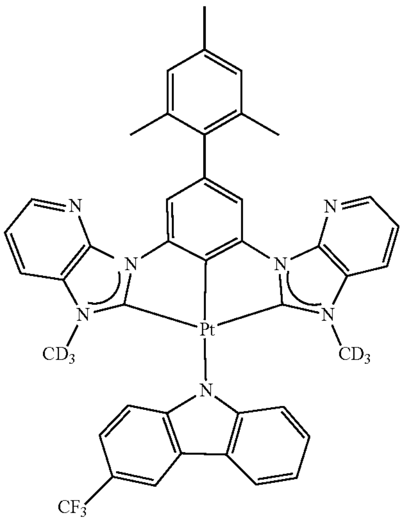
BD34
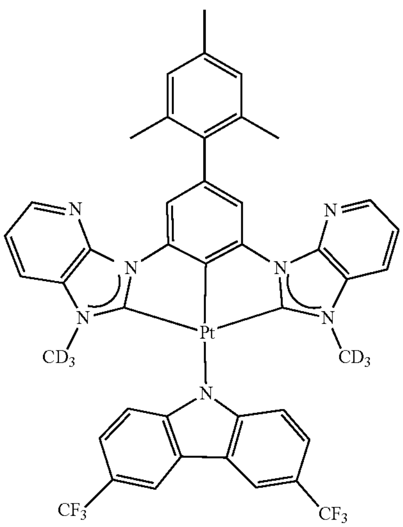
BD35
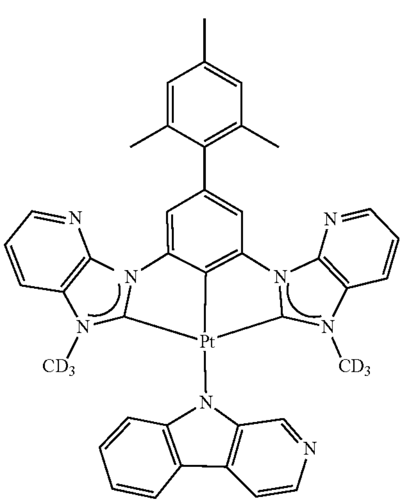
-continued
BD36
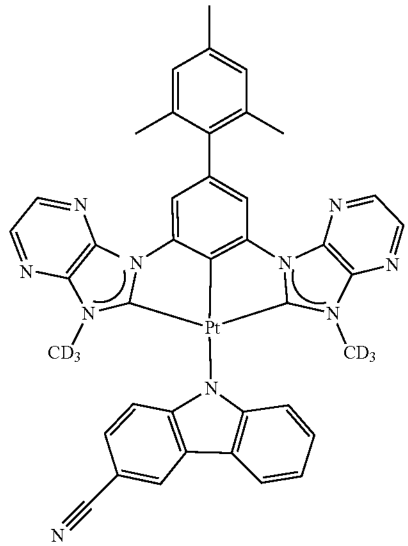
BD37
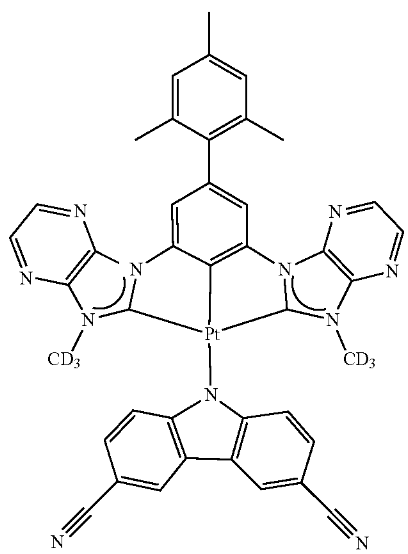
BD38
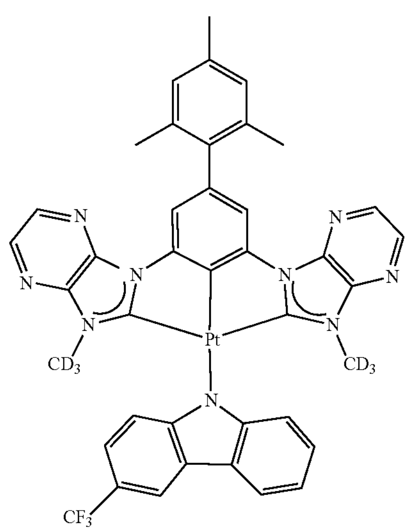

-continued
BD39
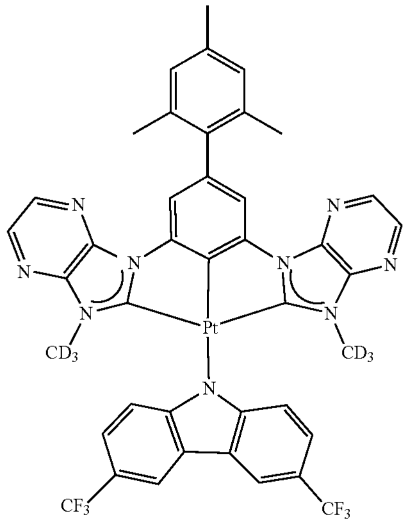
BD40
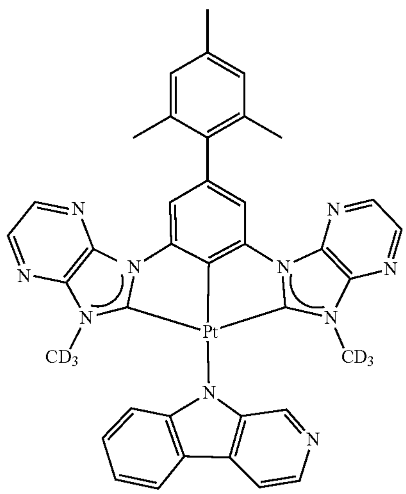
BD41
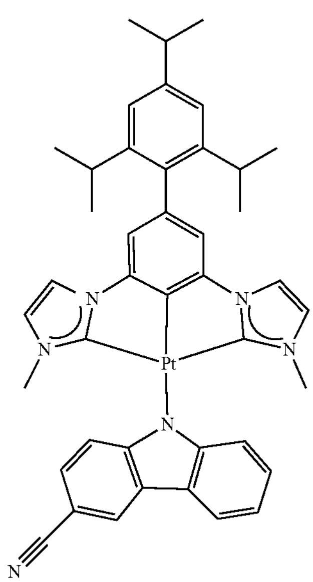
-continued
BD42
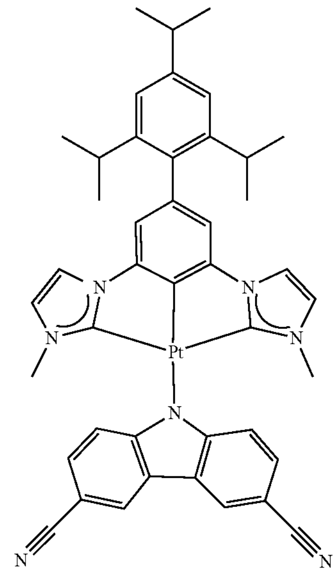
BD43
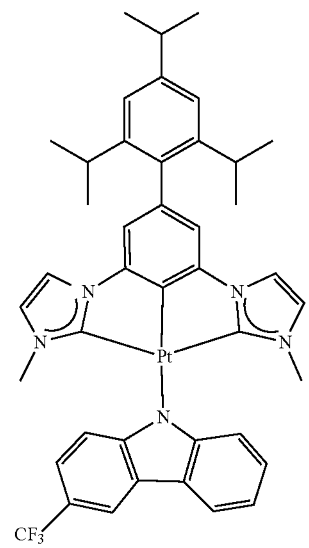
BD44
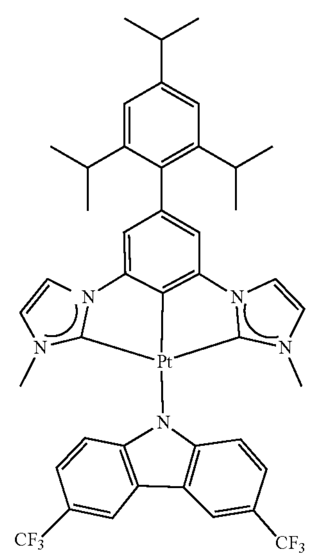

-continued
BD45
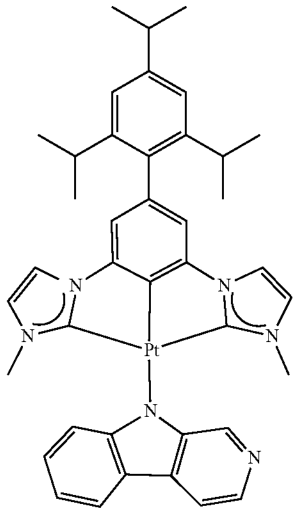
BD46
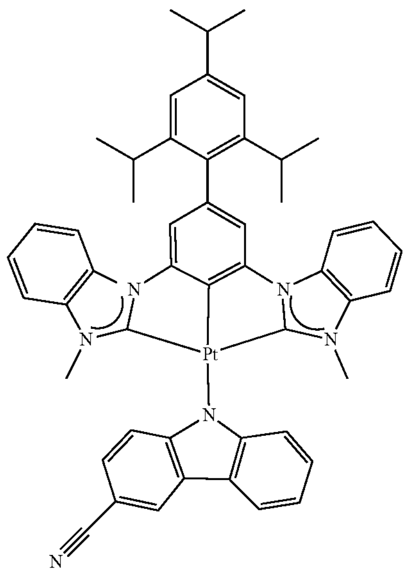
BD47
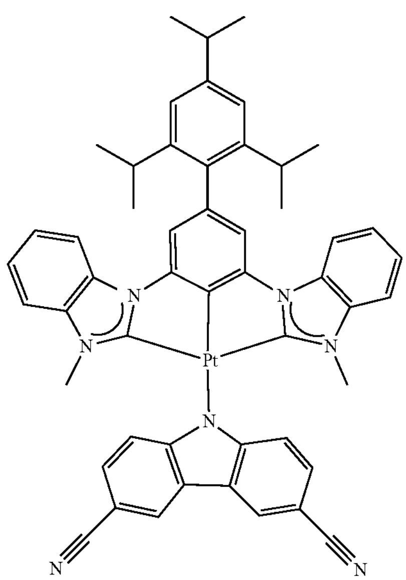
-continued
BD48
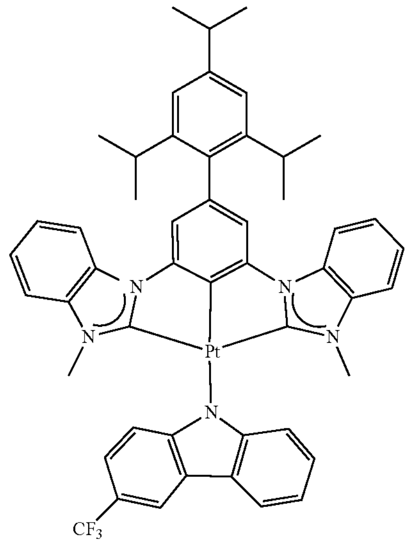
BD49
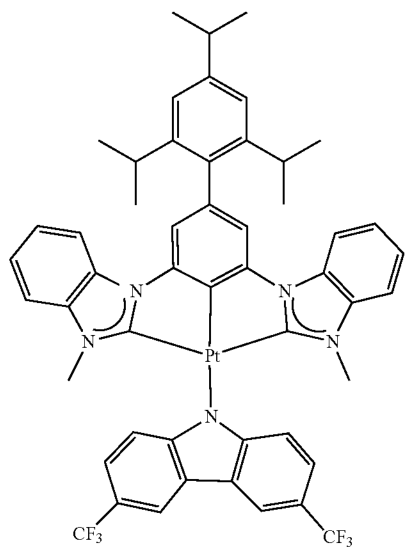
BD50
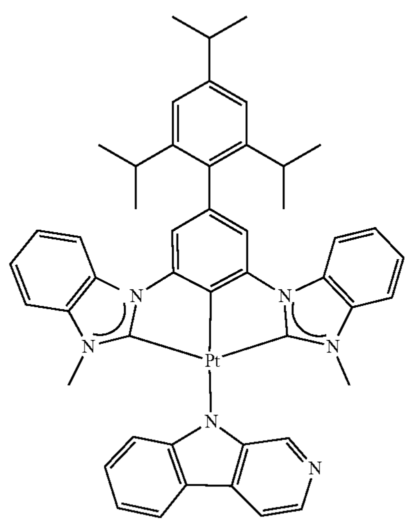

-continued
BD51
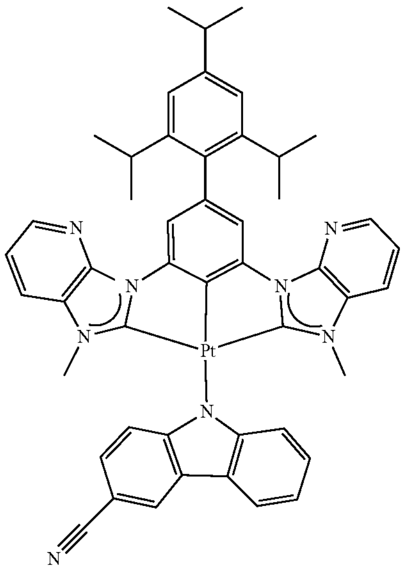
BD52
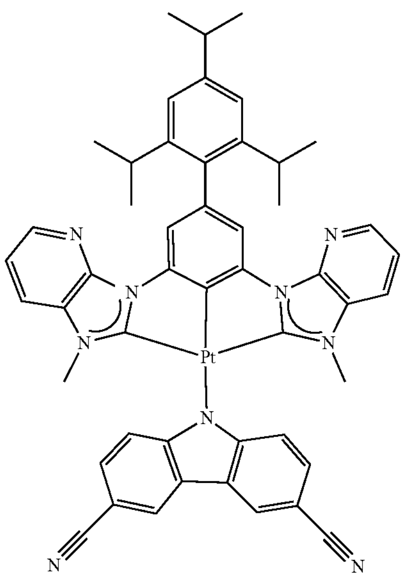
BD53
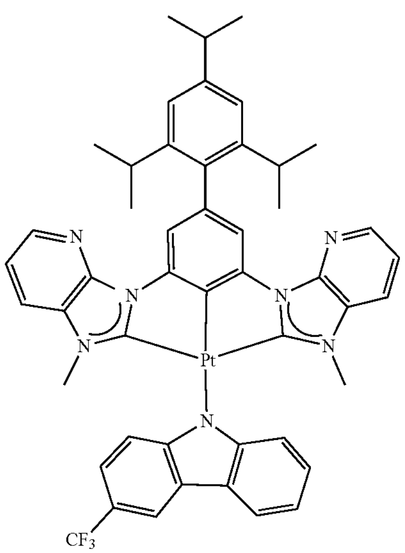
-continued
BD54
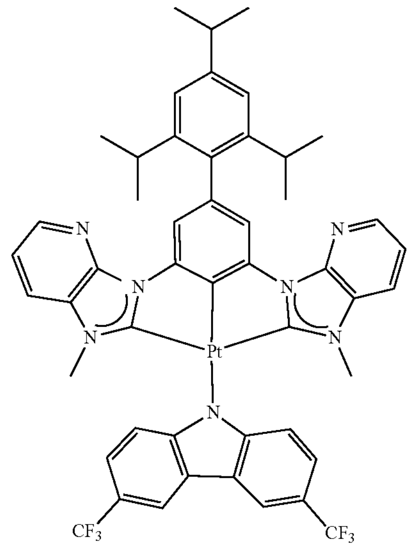
BD55
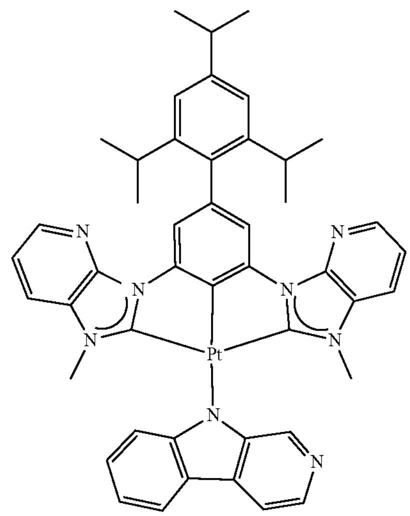
BD56
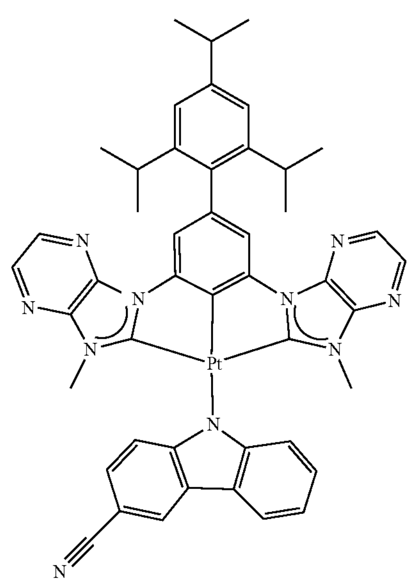

-continued
BD57
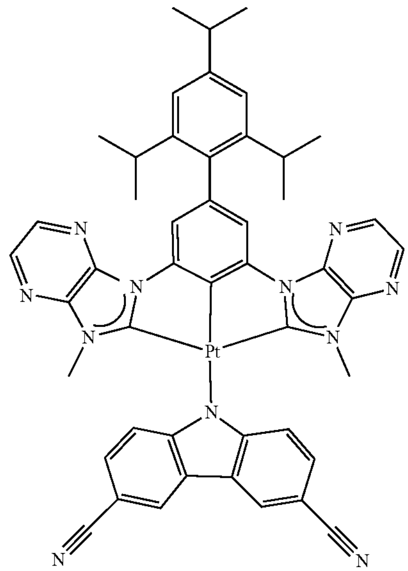
BD58
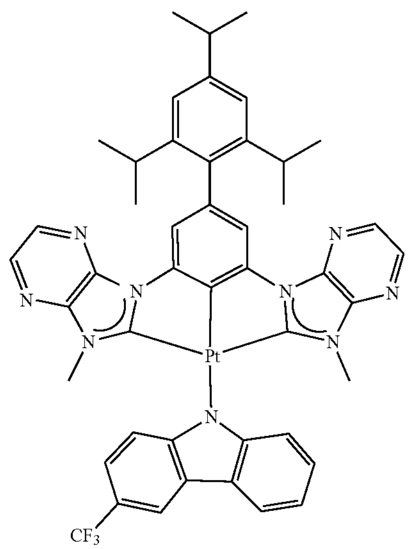
BD59
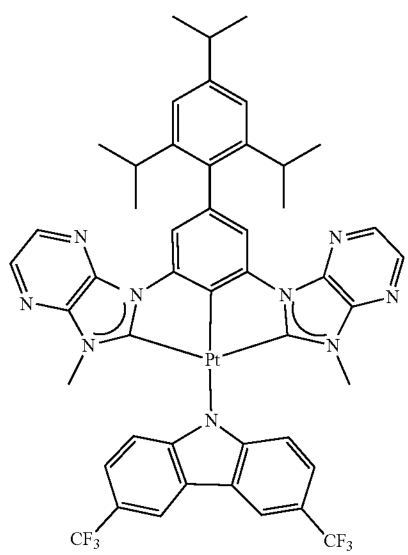
-continued
BD60
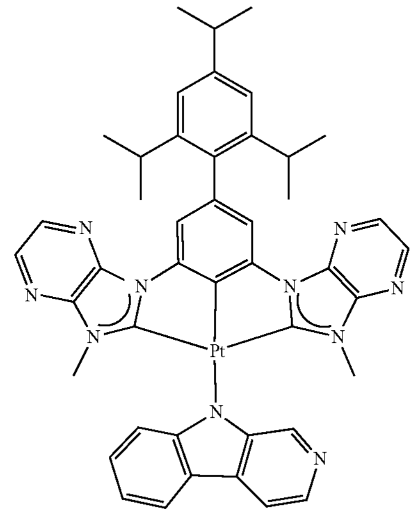
BD61
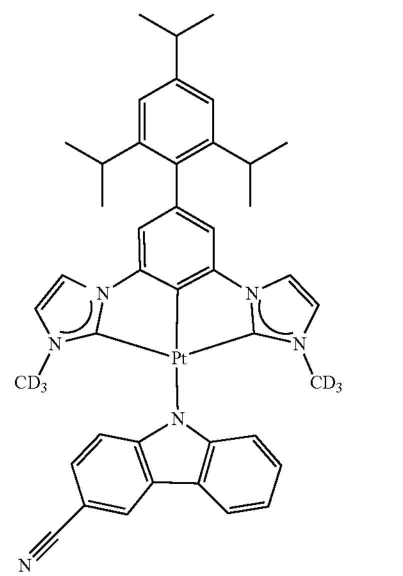
BD62
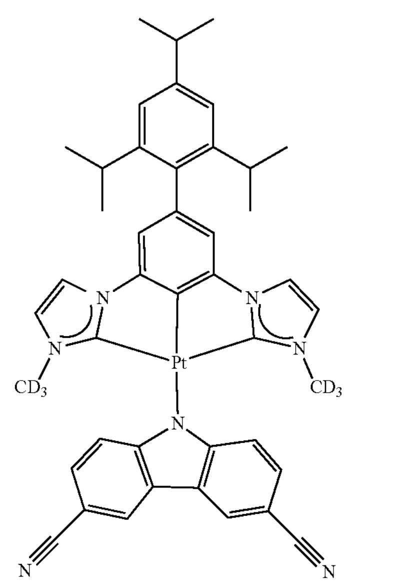

-continued
BD63
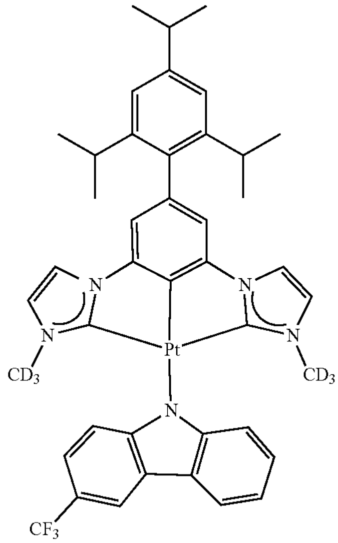
BD64
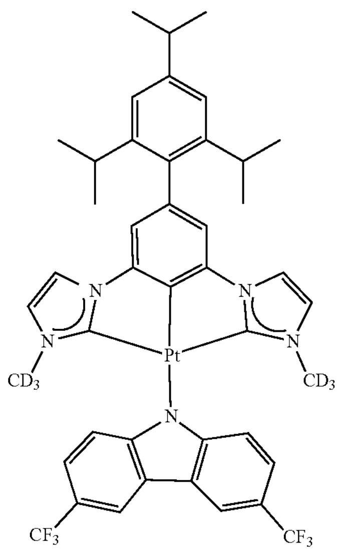
BD65
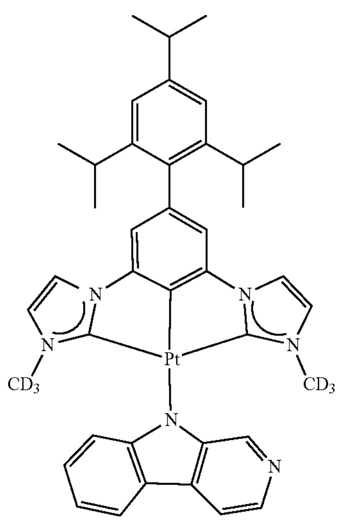
-continued
BD66
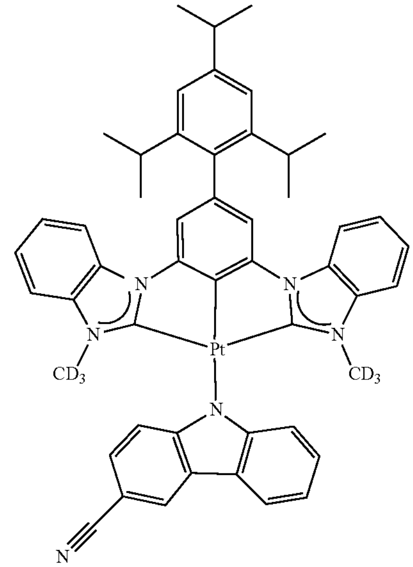
BD67
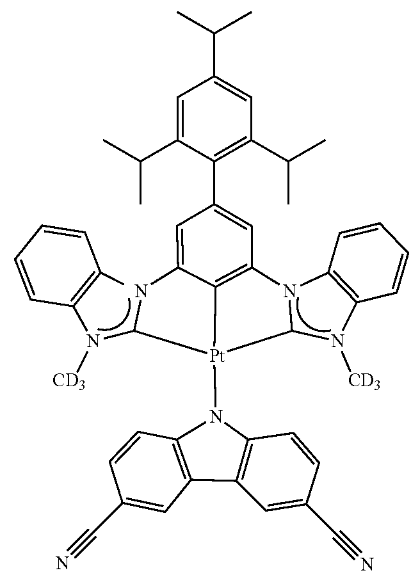
BD68
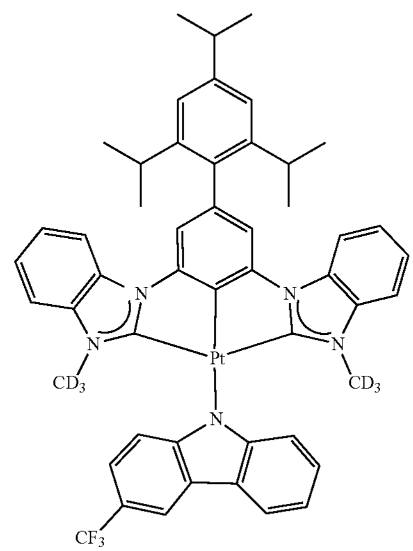

-continued
BD69
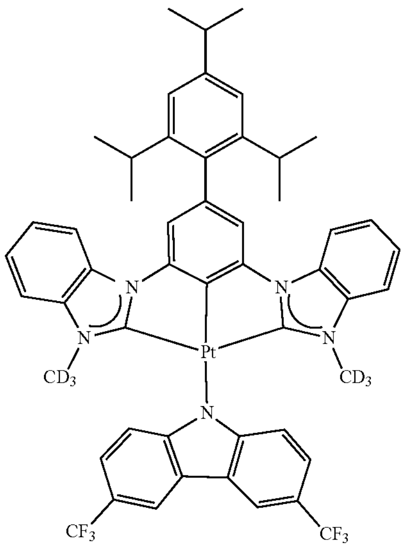
BD70
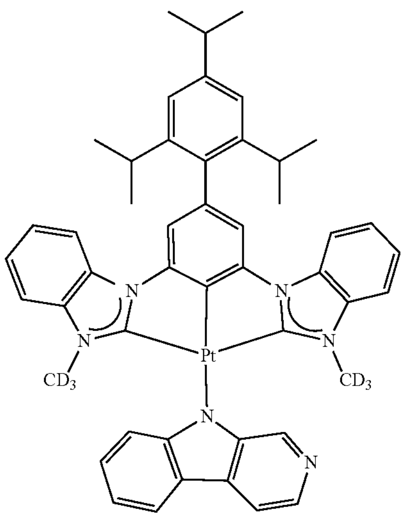
BD71
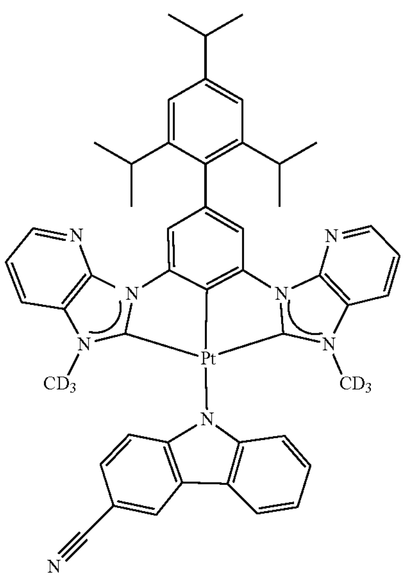
-continued
BD72
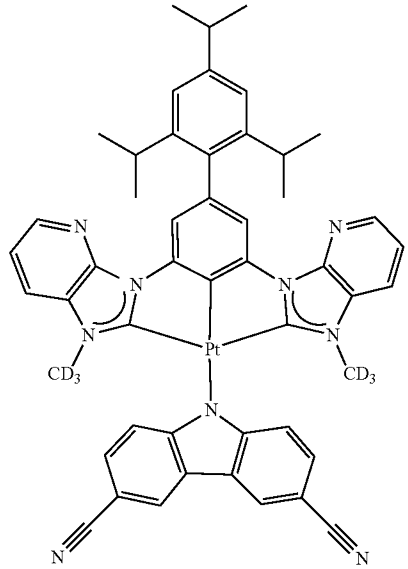
BD73
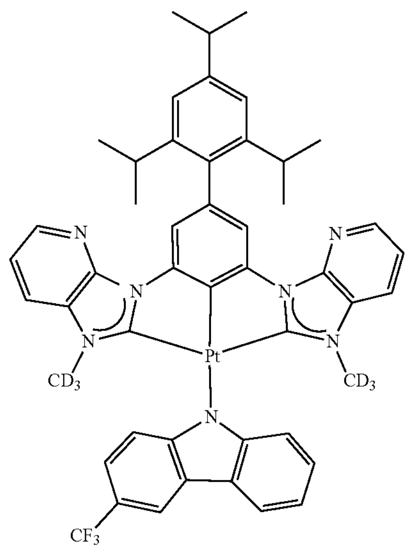
BD74
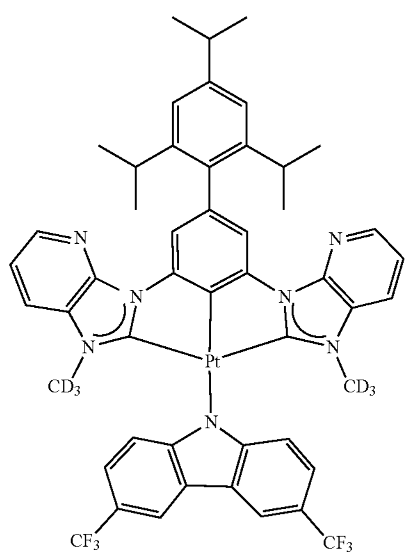

BD75
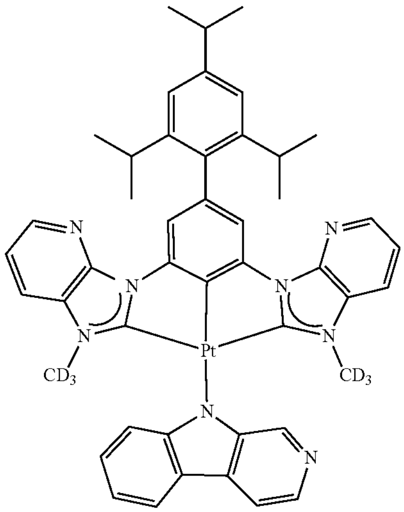
BD76
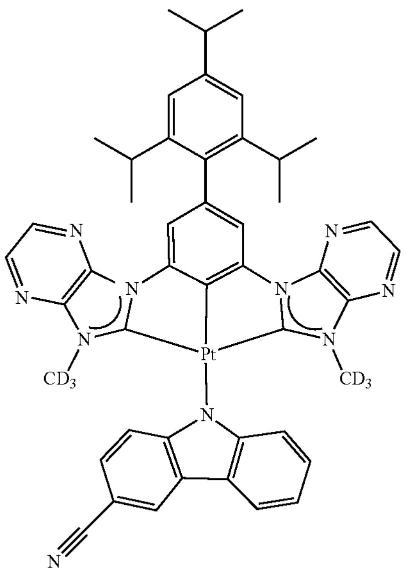
BD77
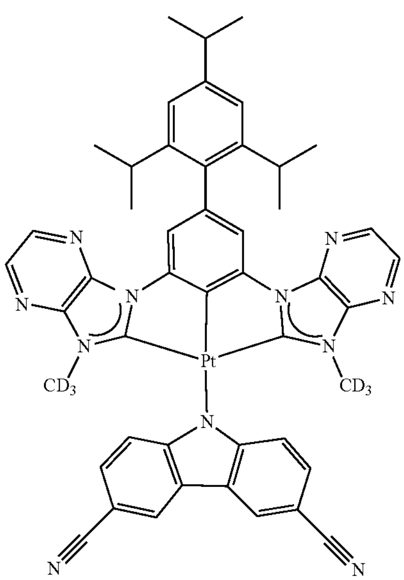
BD78
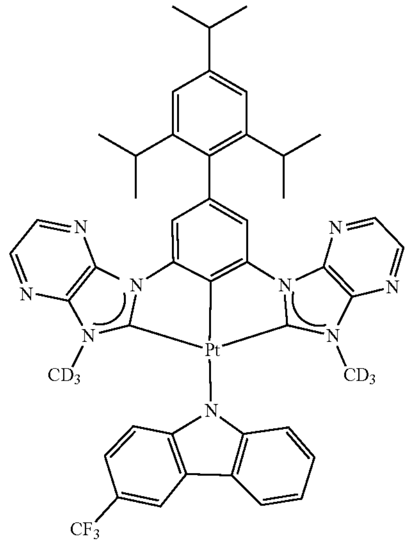
BD79
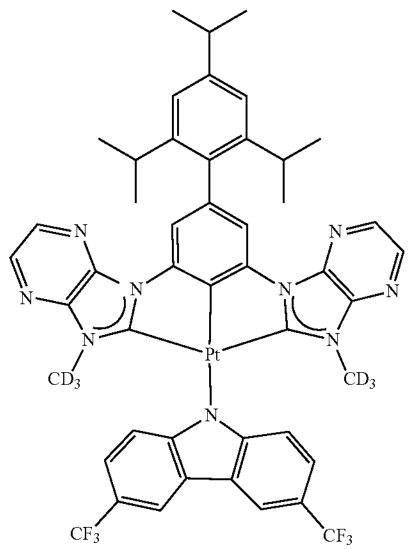
BD80
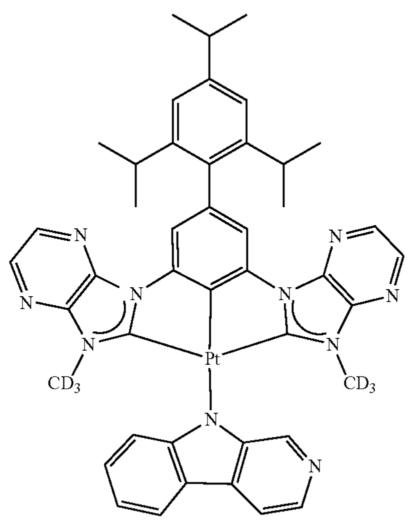

-continued
BD81
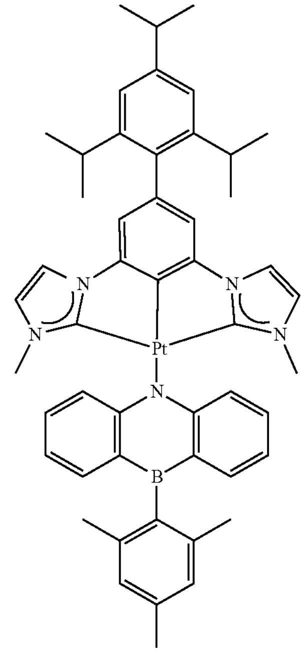
BD82
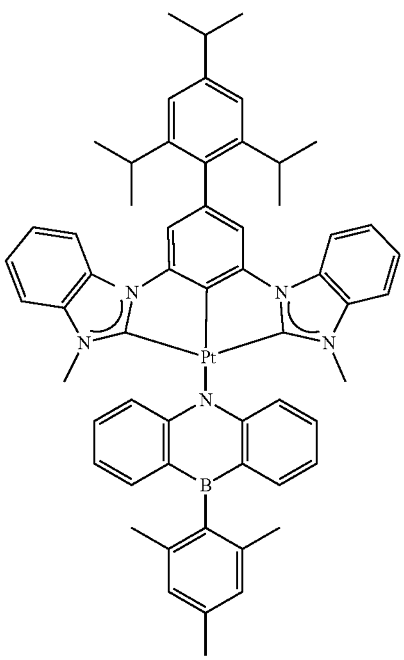
-continued
BD83
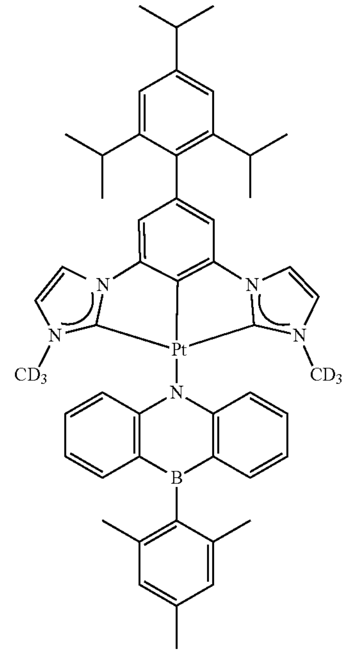
BD84
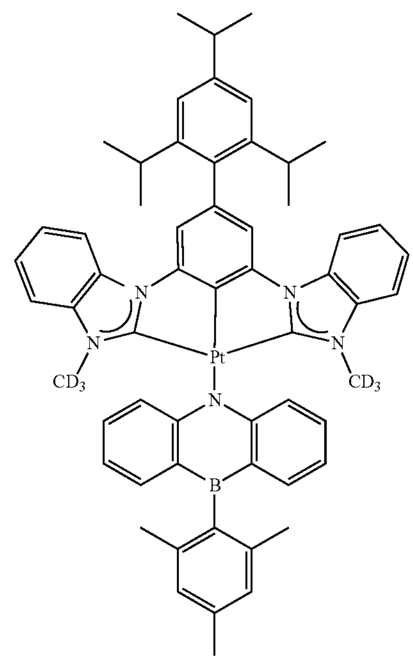

BD85
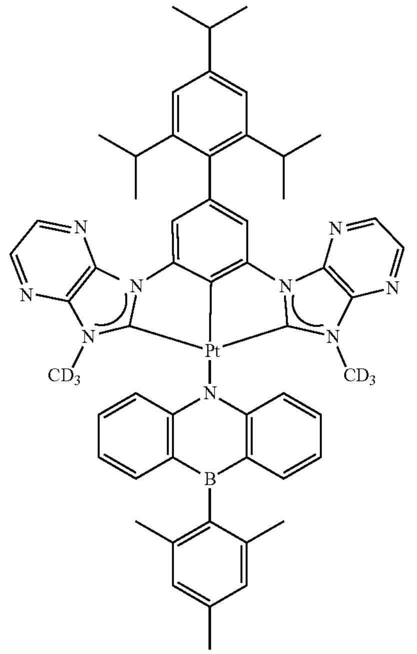
BD87
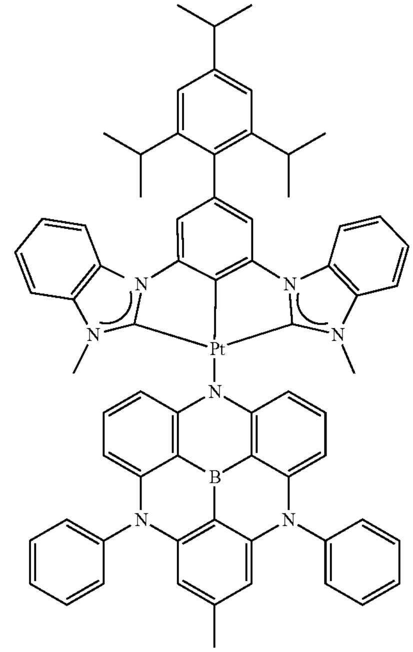
BD86
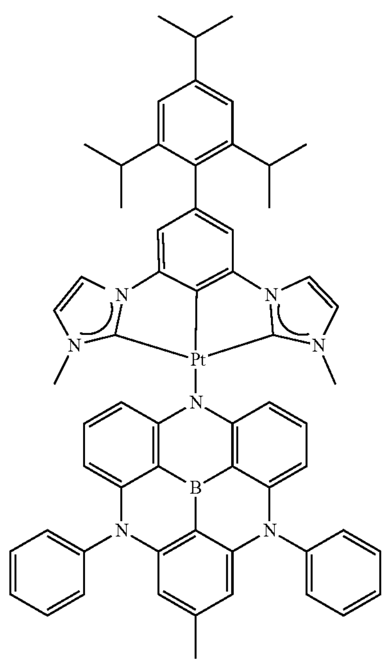
BD88
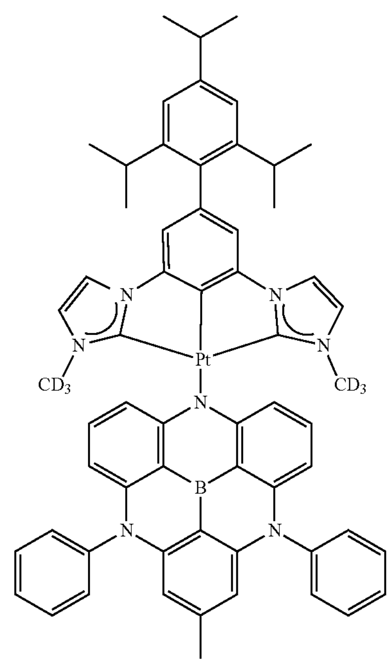

BD89
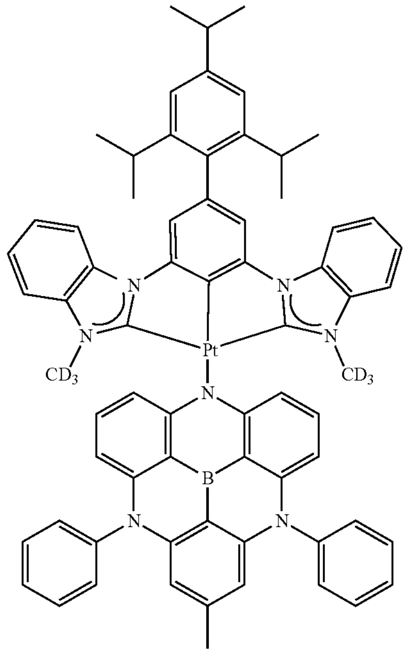
BD90
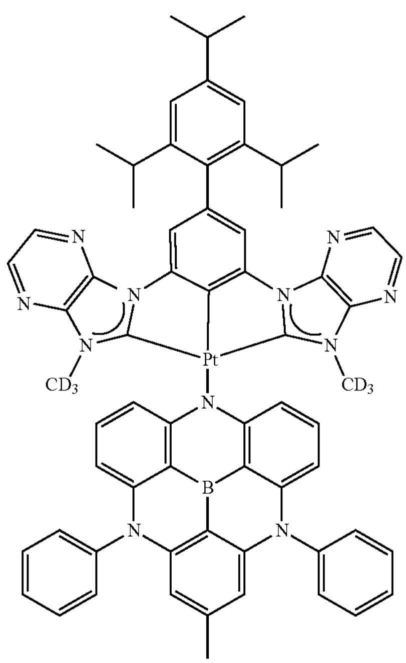
BD91
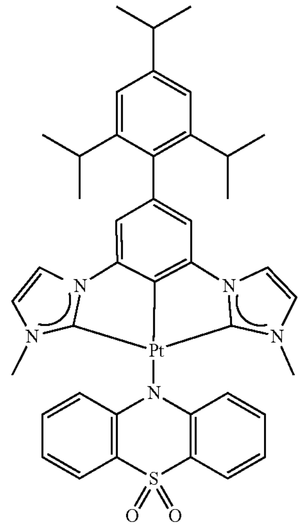
BD92
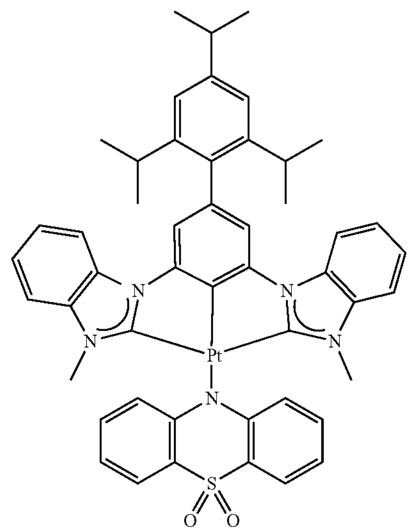
BD93
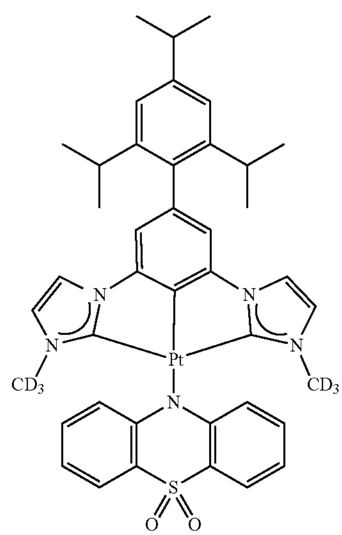

-continued
BD94
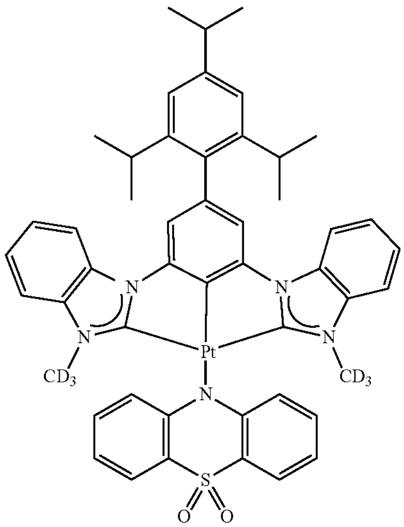
BD95
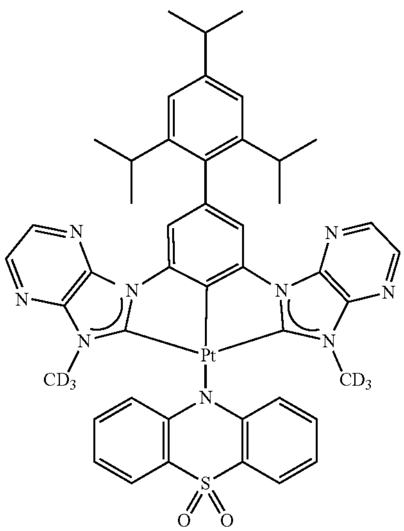
BD96
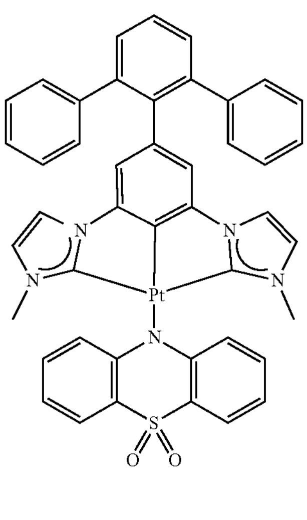
-continued
BD97
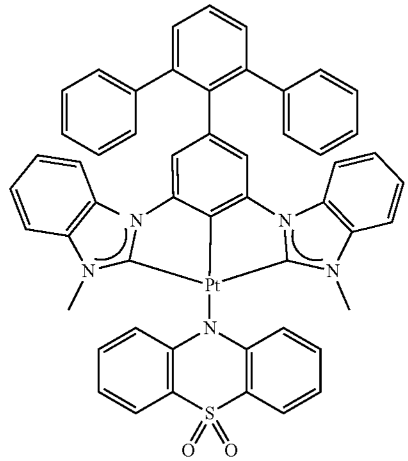
BD98
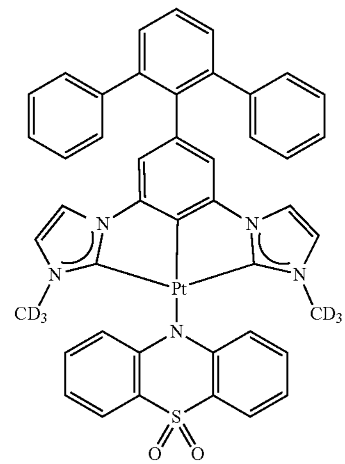
BD99
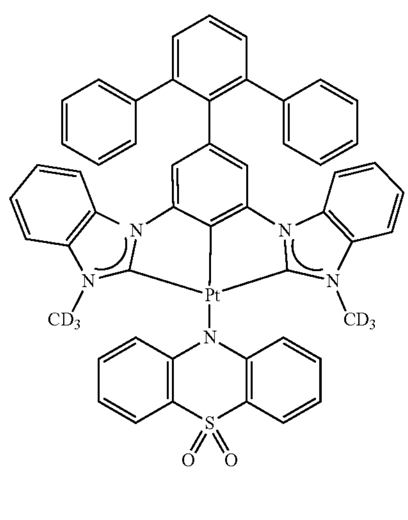

-continued
BD100
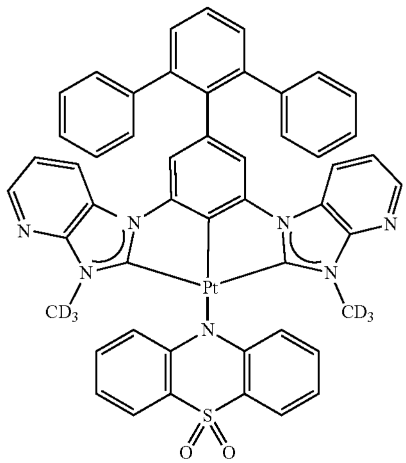
BD101
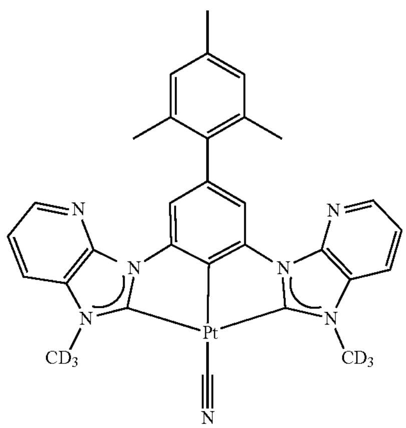
BD102
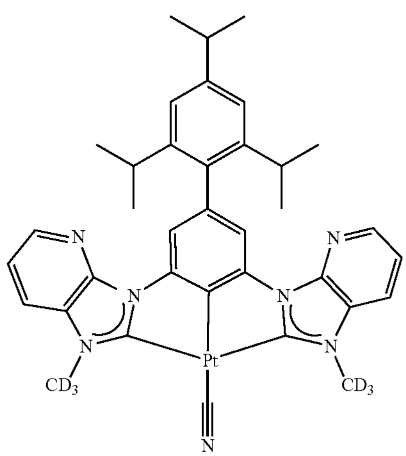
-continued
BD103
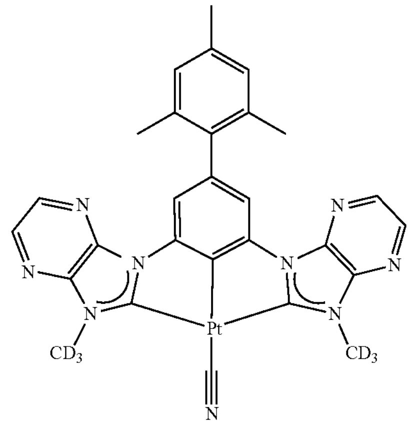
BD104
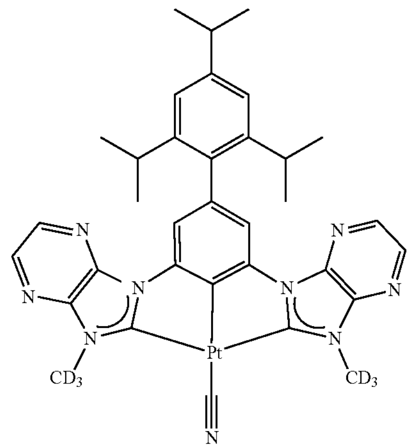
BD105
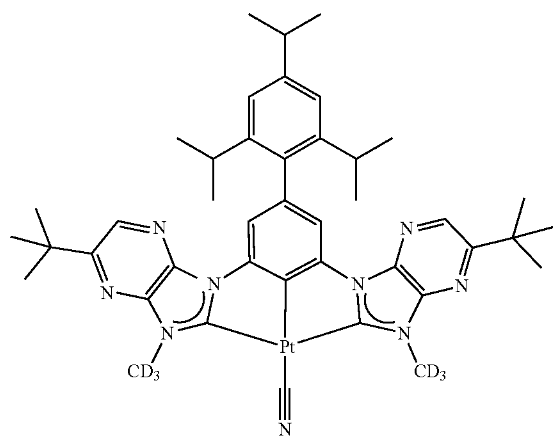
* * * * *